US011621397B2

(12) United States Patent
Kim et al.

(10) Patent No.: US 11,621,397 B2
(45) Date of Patent: Apr. 4, 2023

(54) IRIDIUM COMPLEXES CONTAINING A LIGAND INCLUDING A (DIBENZO [B,D] FURANYL) PYRIDINE SKELETON HAVING DEUTERIUM SUBSTITUTIONS PARA AND META TO THE N RING ATOM AND ORGANIC LIGHT EMITTING DEVICE COMPRISING THE SAME

(71) Applicant: LG CHEM, LTD., Seoul (KR)

(72) Inventors: Seoyeon Kim, Daejeon (KR); Dong Hoon Lee, Daejeon (KR); Tae Yoon Park, Daejeon (KR); Sang Young Jeon, Daejeon (KR); Jungha Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 572 days.

(21) Appl. No.: 16/621,192

(22) PCT Filed: Jan. 17, 2019

(86) PCT No.: PCT/KR2019/000716

§ 371 (c)(1),
(2) Date: Dec. 10, 2019

(87) PCT Pub. No.: WO2019/143153

PCT Pub. Date: Jul. 25, 2019

(65) Prior Publication Data

US 2020/0212318 A1 Jul. 2, 2020

(30) Foreign Application Priority Data

Jan. 17, 2018 (KR) ........................ 10-2018-0006020
Jan. 16, 2019 (KR) ........................ 10-2019-0005758

(51) Int. Cl.
*H01L 51/00* (2006.01)
*C07F 15/00* (2006.01)
(Continued)

(52) U.S. Cl.
CPC ...... *H01L 51/0085* (2013.01); *C07F 15/0033* (2013.01); *C09K 11/06* (2013.01);
(Continued)

(58) Field of Classification Search
CPC .................................................. H01L 51/0085
See application file for complete search history.

(56) References Cited

U.S. PATENT DOCUMENTS 7,274,141 B2 9/2007 Leo et al.
8,709,615 B2 4/2014 Kottas et al.
(Continued)

FOREIGN PATENT DOCUMENTS

CN 105461754 4/2016
CN 106831884 6/2017
(Continued)

OTHER PUBLICATIONS

Wang et al., "Synthesis of all deuterated tris(2-phenylpyridine) iridium for highly stable electrophosphorescence: the 'deuterium effect'," Journal of Materials Chemistry C. 1: 4821-4825 (2013).
(Continued)

*Primary Examiner* — Caleb E Henry
(74) *Attorney, Agent, or Firm* — Dentons US LLP

(57) ABSTRACT

Provided is a compound of Chemical Formula 1:

[Chemical Formula 1]

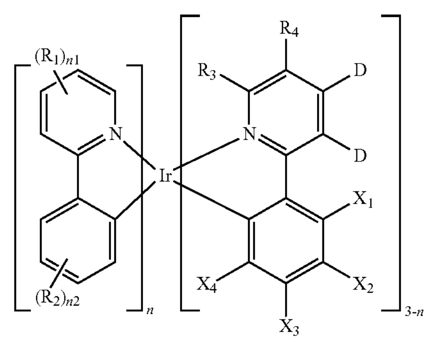

and to an organic light emitting device comprising the same.

10 Claims, 1 Drawing Sheet

(51) Int. Cl.
*C09K 11/06* (2006.01)
*H01L 51/50* (2006.01)

(52) U.S. Cl.
CPC ................ *C09K 2211/1029* (2013.01); *C09K 2211/1088* (2013.01); *C09K 2211/185* (2013.01); *H01L 51/5012* (2013.01); *H01L 51/5056* (2013.01); *H01L 51/5072* (2013.01); *H01L 51/5088* (2013.01); *H01L 51/5092* (2013.01)

(56) References Cited

U.S. PATENT DOCUMENTS

| | | | | |
|---|---|---|---|---|
| 8,946,697 | B1 | 2/2015 | Ma et al. | |
| 9,865,825 | B2 * | 1/2018 | Li | C07F 15/0033 |
| 2008/0194853 | A1 | 8/2008 | Kim et al. | |
| 2010/0244004 | A1 | 9/2010 | Xia et al. | |
| 2013/0181190 | A1 | 7/2013 | Ma et al. | |
| 2014/0131676 | A1 | 5/2014 | Beers et al. | |
| 2014/0231755 | A1 | 8/2014 | Xia et al. | |
| 2014/0231756 | A1 | 8/2014 | Alleyne et al. | |
| 2015/0171349 | A1 | 6/2015 | Ma et al. | |
| 2016/0049599 | A1 | 2/2016 | Ma et al. | |
| 2016/0133859 | A1 | 5/2016 | Boudreault et al. | |
| 2016/0133860 | A1 | 5/2016 | Boudreault et al. | |
| 2016/0133861 | A1 * | 5/2016 | Li | C07F 15/0073 546/4 |
| 2016/0133862 | A1 * | 5/2016 | Li | C07F 7/0816 546/4 |
| 2016/0204362 | A1 * | 7/2016 | Park | C07F 15/004 546/10 |
| 2016/0211469 | A1 | 7/2016 | Ma et al. | |
| 2016/0268519 | A1 | 9/2016 | Choi et al. | |
| 2017/0012226 | A1 | 1/2017 | Hwang et al. | |
| 2018/0248126 | A1 * | 8/2018 | Huh | H01L 51/0058 |
| 2018/0315930 | A1 * | 11/2018 | Han | C07D 405/10 |
| 2018/0337341 | A1 * | 11/2018 | Heo | C07D 405/10 |
| 2018/0337348 | A1 * | 11/2018 | Jung | C07F 7/0812 |
| 2019/0006602 | A1 * | 1/2019 | Chun | C07C 211/61 |

FOREIGN PATENT DOCUMENTS

| | | | |
|---|---|---|---|
| EP | 2730583 | A1 | 5/2014 |
| EP | 3045465 | A1 | 7/2016 |
| KR | 10-20000051826 | | 8/2000 |
| KR | 10-2006-0097320 | | 9/2006 |
| KR | 10-20110130475 | | 12/2011 |
| KR | 10-20130018550 | | 2/2013 |
| KR | 10-1252603 | | 4/2013 |
| KR | 10-20130084615 | | 7/2013 |
| KR | 10-20140060241 | | 5/2014 |
| KR | 10-20140104926 | | 8/2014 |
| KR | 10-20160018433 | | 2/2016 |
| KR | 10-20160046078 | | 4/2016 |
| KR | 10-20160088244 | | 7/2016 |
| WO | 03012890 | | 2/2003 |
| WO | 2015046916 | | 4/2015 |
| WO | 2015056993 | | 4/2015 |

OTHER PUBLICATIONS

Abe et al., “Deuteration isotope effect on nonradiative transition of fac-tris(2-phenylpyridinato) iridium (III) complexes,” Chemical Physics Letters 491: 199-202 (2010), published Apr. 2, 2010.

* cited by examiner

[FIG. 1]
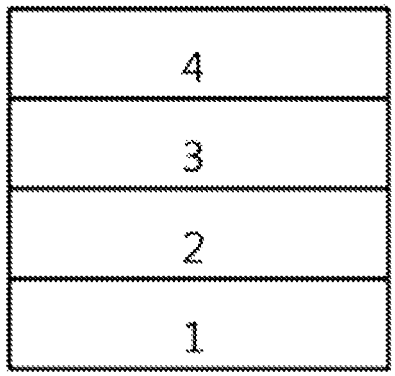
[FIG. 2]
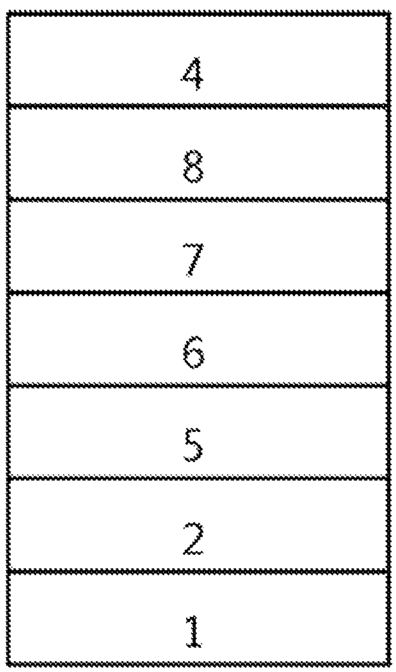

IRIDIUM COMPLEXES CONTAINING A LIGAND INCLUDING A (DIBENZO [B,D] FURANYL) PYRIDINE SKELETON HAVING DEUTERIUM SUBSTITUTIONS PARA AND META TO THE N RING ATOM AND ORGANIC LIGHT EMITTING DEVICE COMPRISING THE SAME

CROSS-REFERENCE TO RELATED APPLICATION(S)

This application is a National Stage Application of International Application No. PCT/KR2019/000716 filed on Jan. 17, 2019, which claims the benefits of the filing dates of Korean Patent Application No. 10-2018-0006020 filed with Korean Intellectual Property Office on Jan. 17, 2018, and Korean Patent Application No. 10-2019-0005758 filed with Korean Intellectual Property Office on Jan. 16, 2019, the entire contents of which are incorporated herein by reference.

TECHNICAL FIELD

The present invention relates to a novel compound and to an organic light emitting device comprising the same.

BACKGROUND

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer can be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in these organic light emitting devices.

PRIOR ART LITERATURE

Patent Literature (Patent Literature 0001) Korean Patent Laid-open Publication No. 10-2000-0051826.

DETAILED DESCRIPTION OF THE INVENTION

Technical Problem

It is an object of the present invention to provide a novel compound and an organic light emitting device including the same.

Technical Solution

In one aspect of the invention, there is provided a compound of Chemical Formula 1:

[Chemical Formula 1]

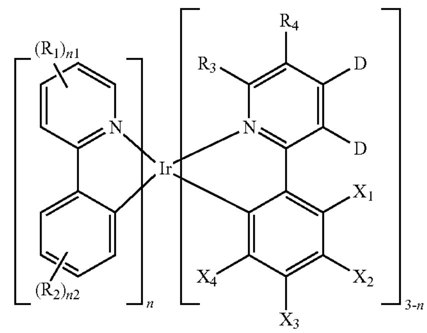

wherein in Chemical Formula 1:

for $X_1$ to $X_4$, one of $X_1$ and $X_2$, $X_2$ and $X_3$, or $X_3$ and $X_4$ are linked with * in the following Chemical Formula 2, and the rest are $R_5$:

[Chemical Formula 2]

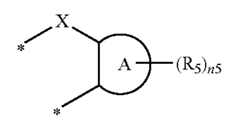

X is O, or S;

A is a benzene ring or a pyridine ring;

n is 1 or 2;

n1 is an integer of 1 to 4;

n2 is an integer of 1 to 4;

n5 is an integer of 1 to 4 when A is a benzene ring, and n5 is an integer of 1 to 3 when A is a pyridine ring;

$R_1$ to $R_4$ are each independently hydrogen, deuterium, cyano, amino, a substituted or unsubstituted $C_{1-60}$ alkyl, a substituted or unsubstituted $C_{1-60}$ haloalkyl, a substituted or unsubstituted $C_{3-60}$ cycloalkyl, a substituted or unsubstituted $C_{2-60}$ alkenyl, or a substituted or unsubstituted $C_{6-60}$ aryl;

one of $R_5$ is hydrogen, deuterium, cyano, amino, a substituted or unsubstituted $C_{1-60}$ alkyl, a substituted or unsubstituted $C_{1-60}$ haloalkyl, a substituted or unsubstituted $C_{3-60}$ cycloalkyl, a substituted or unsubstituted $C_{2-60}$ alkenyl, or a substituted or unsubstituted $C_{6-60}$ aryl, and the rest of $R_5$ is hydrogen, or deuterium.

In another aspect of the invention, there is provided an organic light emitting device including a first electrode; a second electrode provided opposite to the first electrode; and one or more organic material layers provided between the first electrode and the second electrode, wherein one or more layers of the organic material layers includes the compound of Chemical Formula 1.

Advantageous Effects

The compound of Chemical Formula 1 described above can be used as a material of an organic material layer of an organic light emitting device, and can improve the efficiency, achieve low driving voltage and/or improve lifetime characteristics in the organic light emitting device. In particular, the compound of Chemical Formula 1 described above can be used as a material for hole injection, hole transport, hole injection and transport, light emitting, electron transport, or electron injection.

BRIEF DESCRIPTION OF DRAWINGS

FIG. 1 shows an example of an organic light emitting device comprising a substrate 1, an anode 2, a light emitting layer 3, and a cathode 4.

FIG. 2 shows an example of an organic light emitting device comprising a substrate 1, an anode 2, a hole injection layer 5, a hole transport layer 6, a light emitting layer 7, an electron transport layer 8 and a cathode 4.

DETAILED DESCRIPTION OF THE EMBODIMENTS

Hereinafter, the present invention will be described in more detail to help understanding of the present invention.

In one embodiment of the invention, there is provided a compound of Chemical Formula 1.

As used herein, the notation, -⌇- or ⌇ means a bond linked to another substituent group.

As used herein, the term "substituted or unsubstituted" means being unsubstituted or substituted with one or more substituents selected from the group consisting of deuterium, a halogen group, a nitrile group, a nitro group, a hydroxy group, a carbonyl group, an ester group, an imide group, an amino group, a phosphine oxide group, an alkoxy group, an aryloxy group, an alkylthioxy group, an arylthioxy group, an alkylsulfoxy group, an arylsulfoxy group, a silyl group, a boron group, an alkyl group, a cycloalkyl group, an alkenyl group, an aryl group, an aralkyl group, an aralkenyl group, an alkylaryl group, an alkylamine group, an aralkylamine group, a heteroarylamine group, an arylamine group, an arylphosphine group, and a hetero-cyclic group containing at least one of N, O and S atoms, or being unsubstituted or substituted with a substituent to which two or more substituents are linked among the substituents exemplified above. For example, "the substituent to which two or more substituents are linked" can be a biphenyl group. That is, the biphenyl group can also be an aryl group, and can be interpreted as a substituent to which two phenyl groups are linked.

In the present specification, the number of carbon atoms of a carbonyl group is not particularly limited, but is preferably 1 to 40. Specifically, the carbonyl group can be a compound having the following structural formulae, but is not limited thereto:

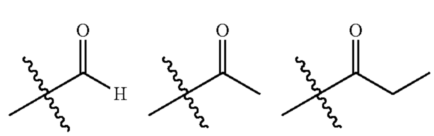

-continued

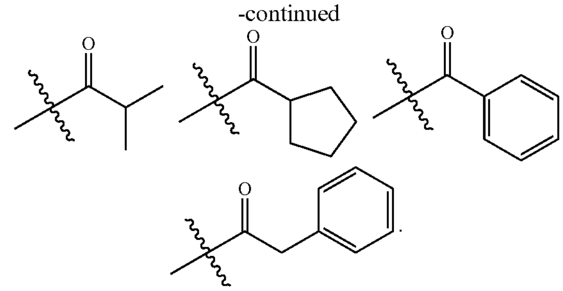

In the present specification, an ester group can have a structure in which oxygen of the ester group can be substituted by a straight-chain, branched-chain, or cyclic alkyl group having 1 to 25 carbon atoms, or an aryl group having 6 to 25 carbon atoms. Specifically, the ester group can be a compound having the following structural formulae, but is not limited thereto:

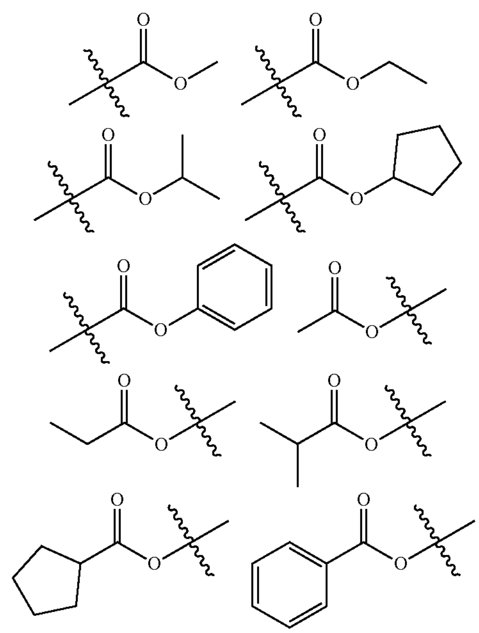

In the present specification, the number of carbon atoms of an imide group is not particularly limited, but is preferably 1 to 25. Specifically, the imide group can be a compound having the following structural formulae, but is not limited thereto:

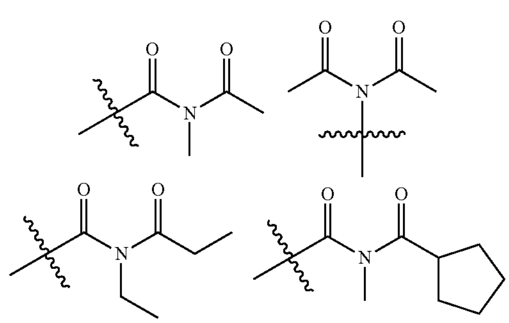

-continued

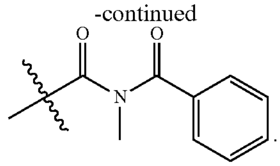

In the present specification, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present specification, a boron group specifically includes a trimethylboron group, a triethylboron group, a t-butyldimethylboron group, a triphenylboron group, and a phenylboron group, but is not limited thereto.

In the present specification, examples of a halogen group include fluorine, chlorine, bromine, or iodine.

In the present specification, the alkyl group can be a straight chain or branched chain, and the number of carbon atoms thereof is not particularly limited, but is preferably 1 to 40. According to one embodiment, the number of carbon atoms of the alkyl group is 1 to 20. According to another embodiment, the number of carbon atoms of the alkyl group is 1 to 10. According to another embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cycloheptylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, the alkenyl group can be a straight chain or branched chain, and the number of carbon atoms thereof is not particularly limited, but is preferably 2 to 40. According to one embodiment, the number of carbon atoms of the alkenyl group is 2 to 20. According to another embodiment, the number of carbon atoms of the alkenyl group is 2 to 10. According to still another embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but the number of carbon atoms thereof is preferably 3 to 60. According to one embodiment, the number of carbon atoms of the cycloalkyl group is 3 to 30. According to another embodiment, the number of carbon atoms of the cycloalkyl group is 3 to 20. According to still another embodiment, the number of carbon atoms of the cycloalkyl group is 3 to 6. Specific examples thereof include cyclopropyl, cyclobutyl, cyclopentyl, 3-methylcyclopentyl, 2,3-dimethyl-cyclopentyl, cyclohexyl, 3-methylcyclohexyl, 4-methylcyclohexyl, 2,3-dimethyl-cyclohexyl, 3,4,5-trimethylcyclohexyl, 4-tert-butylcyclohexyl, cycloheptyl, cyclooctyl, and the like, but are not limited thereto.

In the present specification, an aryl group is not particularly limited, but preferably has 6 to 60 carbon atoms, and can be a monocyclic aryl group or a polycyclic aryl group. According to one embodiment, the number of carbon atoms of the aryl group is 6 to 30. According to one embodiment, the number of carbon atoms of the aryl group is 6 to 20. The aryl group can be a phenyl group, a biphenyl group, a terphenyl group or the like as the monocyclic aryl group, but is not limited thereto. Examples of the polycyclic aryl group include a naphthyl group, an anthracenyl group, a phenanthryl group, a pyrenyl group, a perylenyl group, a chrysenyl group and a fluorenyl group or the like, but is not limited thereto.

In the present specification, a fluorenyl group can be substituted, and two substituent groups can be bonded to each other to form a Spiro structure. In the case where the fluorenyl group is substituted,

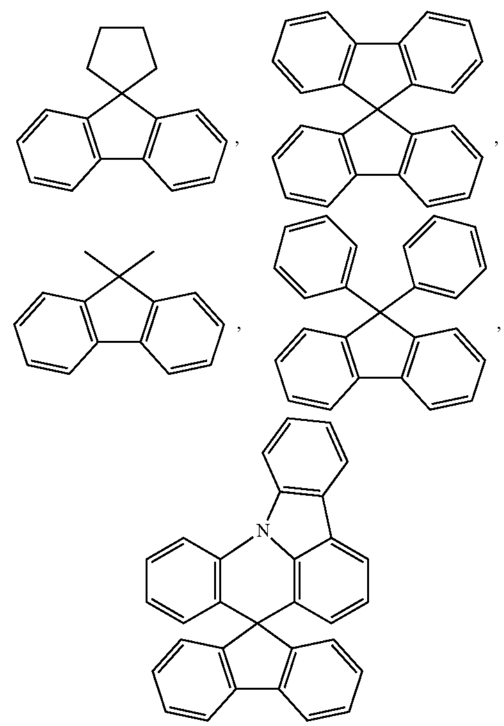

and the like can be formed. However, the structure is not limited thereto.

In the present specification, a heterocyclic group is a heterocyclic group including one or more of O, N, Si and S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present specification, the aryl group in the aralkyl group, the aralkenyl group, the alkylaryl group, and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamine can be applied to the aforementioned description of the heterocyclic group. In the present specification, the alkenyl group in the aralkenyl group is the same as the aforementioned examples of the alkenyl group. In the present specification, the aforementioned description of the aryl group can be applied except that the arylene is a divalent group. In the present specification, the aforementioned description of the heterocyclic group can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heterocyclic group can be applied, except that the heterocycle is not a monovalent group but formed by combining two substituent groups.

Preferably, in Chemical Formula 1, the Chemical Formula 1 is of any one of the following Chemical Formulas 1-1 to 1-10 according to the bonding position of Chemical Formula 2 and A.

1-1

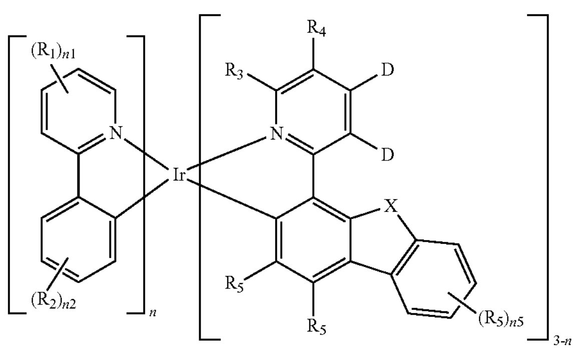

1-2

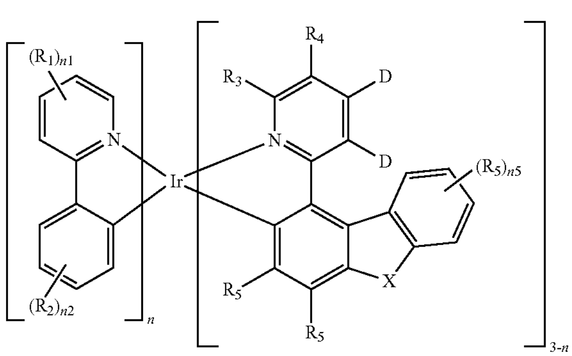

-continued 1-3

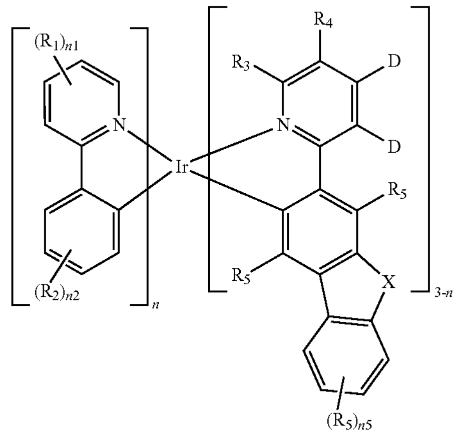

1-4

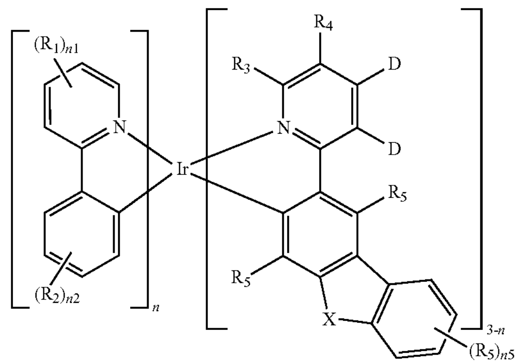

1-5

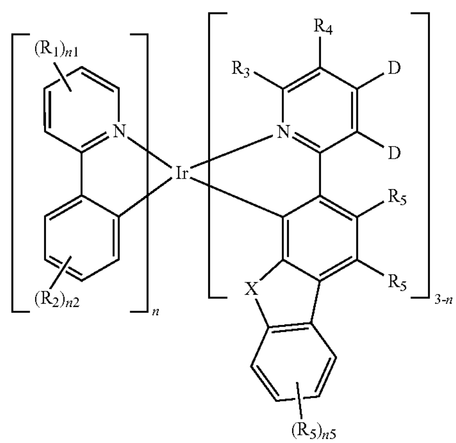

1-6

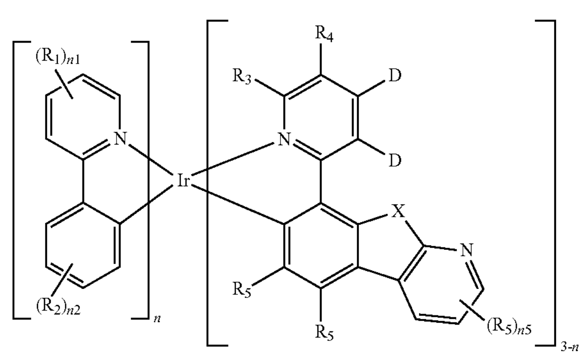

-continued 1-7

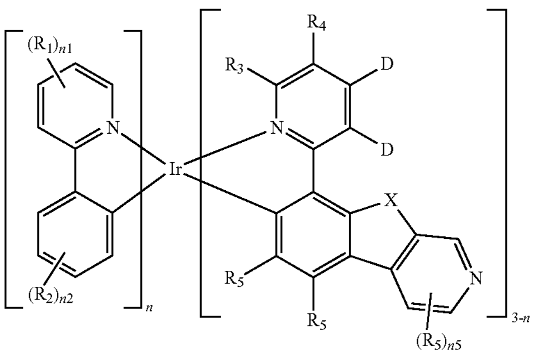

1-8

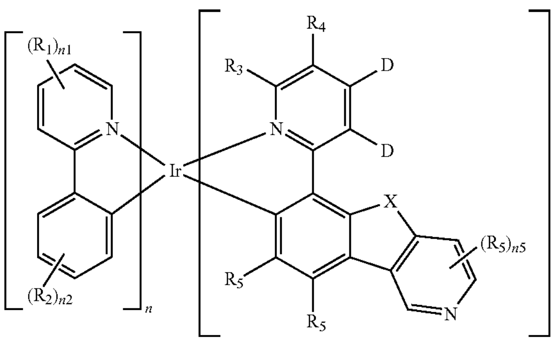

1-9

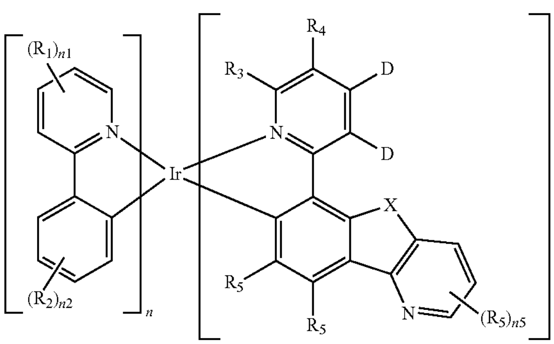

1-10

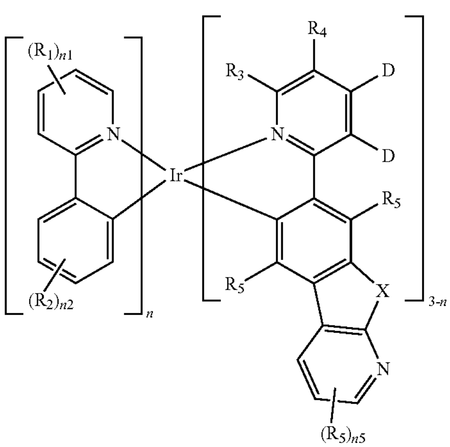

Preferably, each $R_1$ is independently hydrogen, deuterium, methyl, ethyl, propyl, or isopropyl which is unsubstituted or substituted by one or more deuterium, or cyclopropyl, cyclobutyl, cyclopentyl, or cyclohexyl which is unsubstituted or substituted by one or more deuterium.

Preferably, each $R_2$ is independently hydrogen, deuterium, methyl, ethyl, propyl, or isopropyl which is unsubstituted or substituted by one or more deuterium, or cyclopropyl, cyclobutyl, cyclopentyl, or cyclohexyl which is unsubstituted or substituted by one or more deuterium.

Preferably, $R_3$ is hydrogen or deuterium.

Preferably, $R_4$ is hydrogen, deuterium, methyl, ethyl, propyl, or isopropyl which is substituted or substituted by one or more deuterium, or cyclopropyl, cyclobutyl, cyclopentyl, or cyclohexyl which is unsubstituted or substituted by one or more deuterium.

Further, in Chemical Formula 1, a plurality of $R_5$ exist in accordance with n5, preferably one of $R_5$ is hydrogen, deuterium, methyl, ethyl, propyl, or isopropyl which is unsubstituted or substituted by one or more deuterium, or cyclopropyl, cyclobutyl, cyclopentyl, or cyclohexyl which is unsubstituted or substituted by one or more deuterium, and the rest of $R_5$ are each independently hydrogen or deuterium.

When $R_1$ to $R_5$ are respectively a $C_{1-60}$ alkyl substituted by deuterium, or methyl, ethyl, propyl, or isopropyl which is substituted by one or more deuterium, preferably, they are $CD_3$, or $CD(CH_3)_2$.

When $R_1$ to $R_5$ are respectively a $C_{3-60}$ cycloalkyl substituted by deuterium, or cyclopropyl, cyclobutyl, cyclopentyl or cyclohexyl which is substituted by one or more deuterium, preferably, they have the following structure:

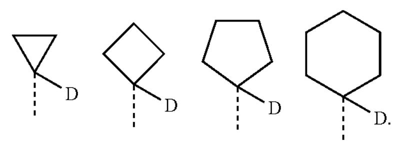

Representative examples of the compound of Chemical Formula 1 are as follows:

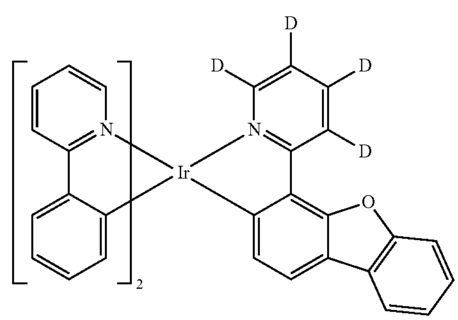

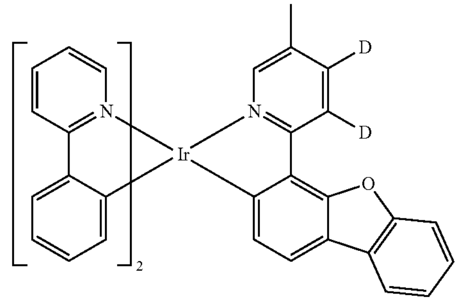

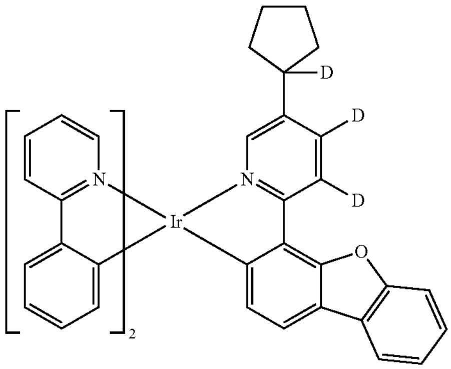
D
D
D
N
N
Ir
O
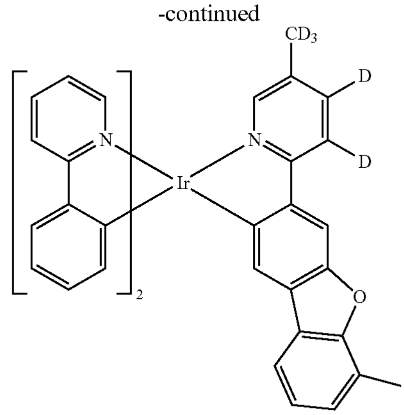
CD3
D
D
N
N
Ir
O
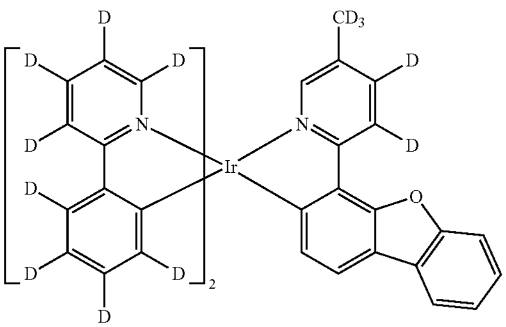
D
D
D
D
D
D
D
D
N
CD3
D
D
N
Ir
O
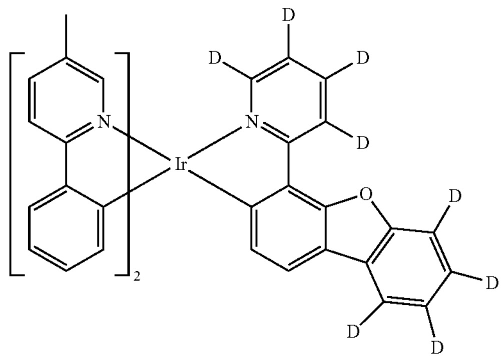
D
D
D
D
N
N
Ir
O
D
D
D
D
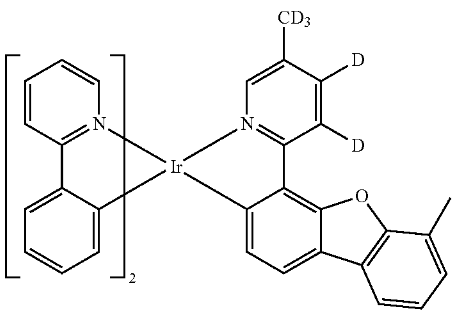
CD3
D
D
N
N
Ir
O
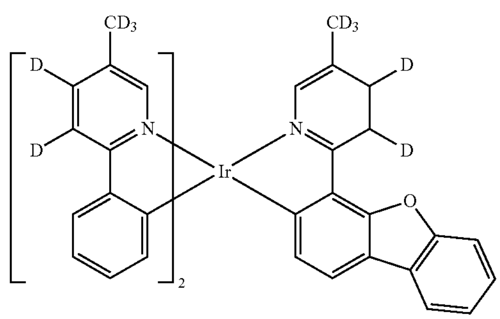
CD3
CD3
D
D
N
D
D
N
Ir
O
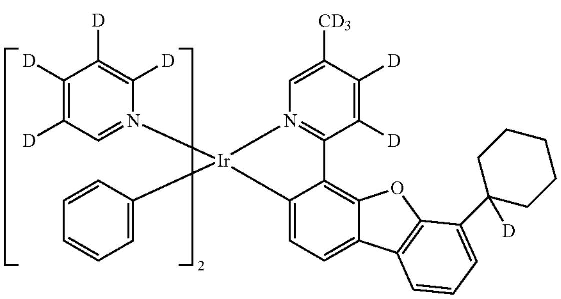
D
D
D
D
N
CD3
D
D
N
Ir
O
D
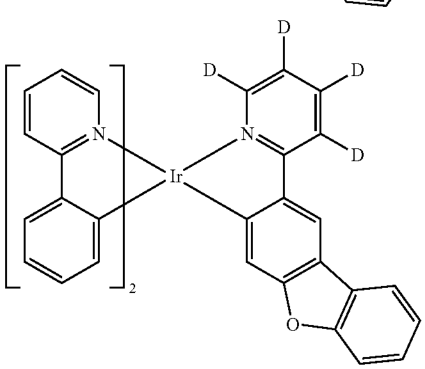
D
D
D
D
N
N
Ir
O
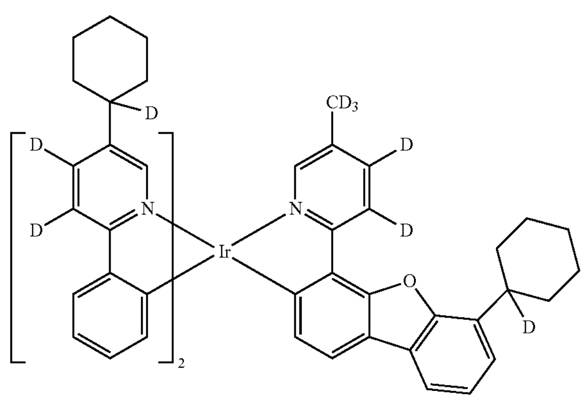
D
D
D
CD3
D
D
N
N
Ir
O
D

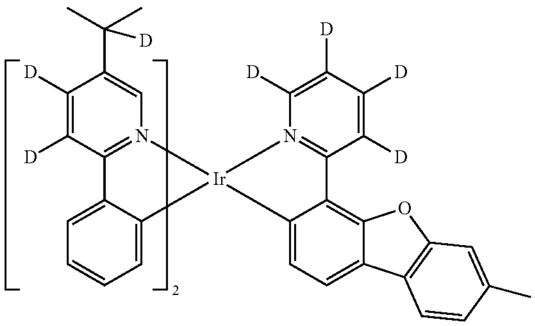
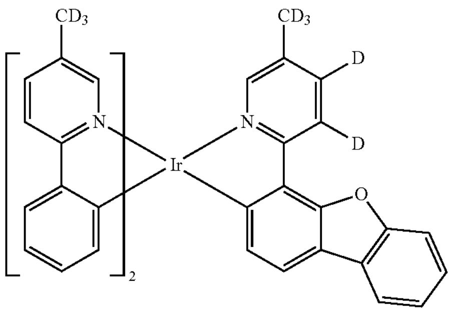
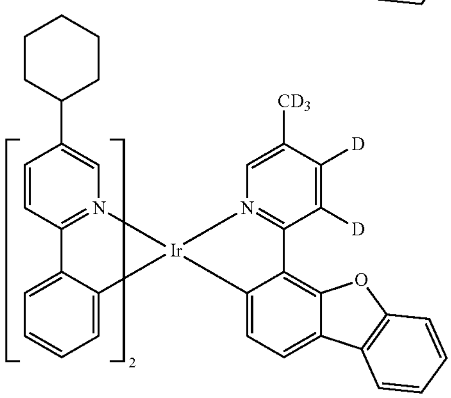
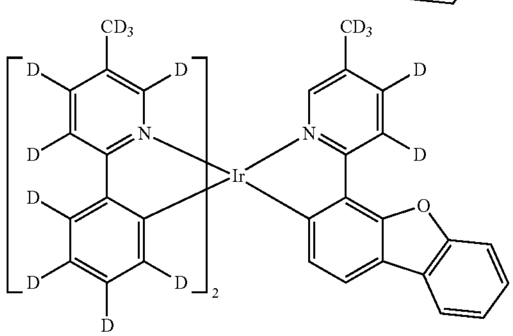
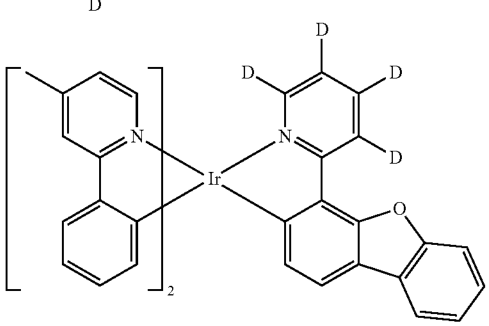
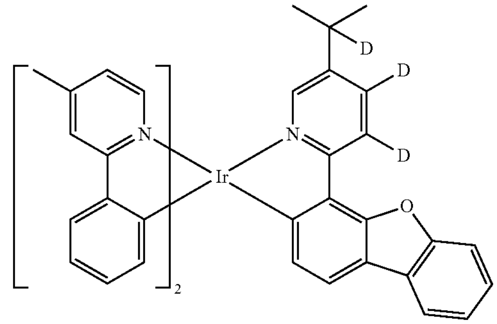
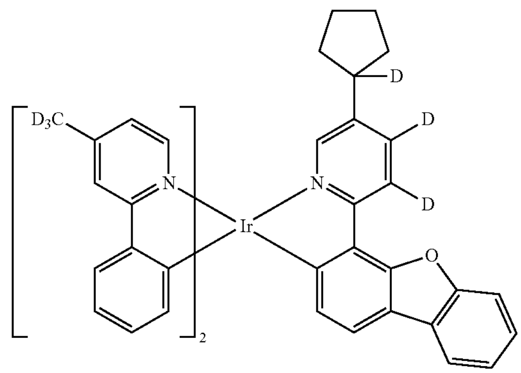
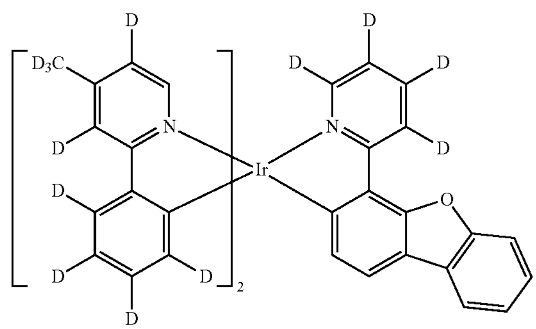
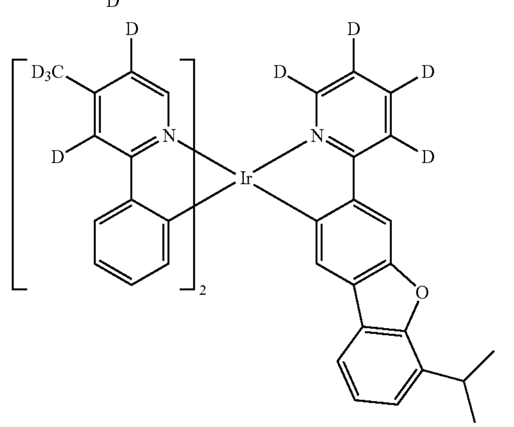

-continued
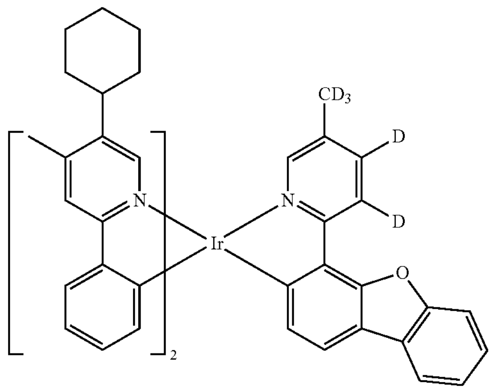
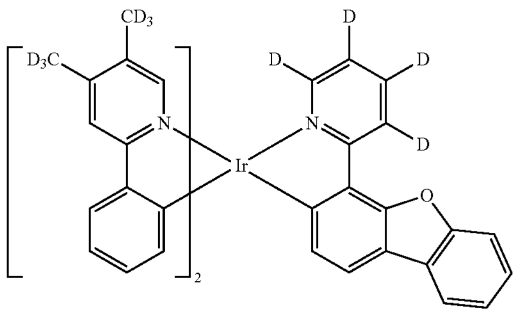
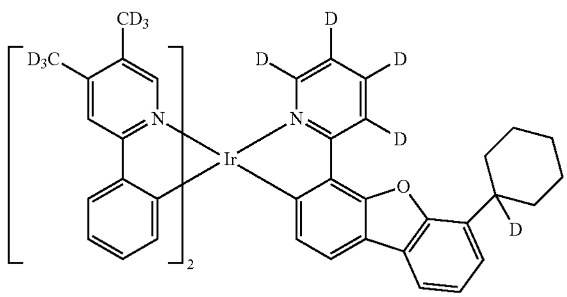
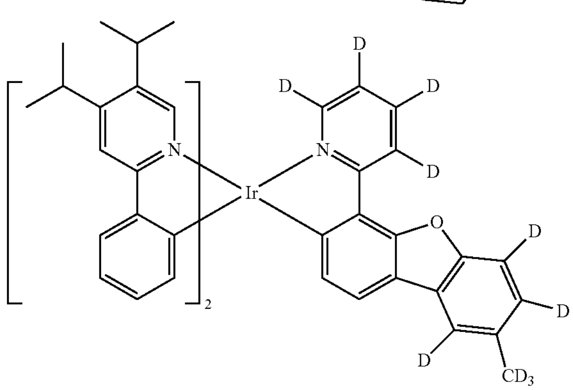
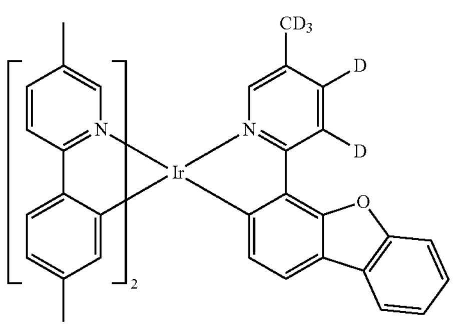
-continued
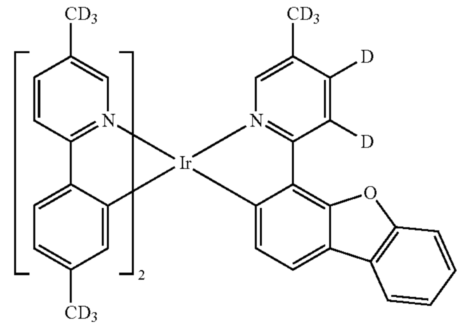
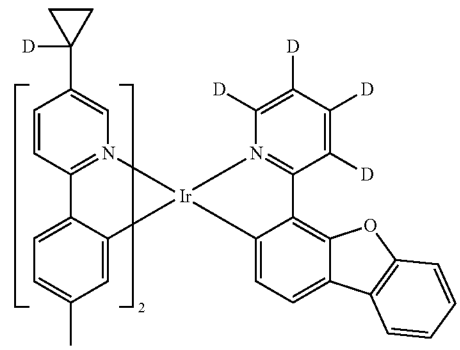
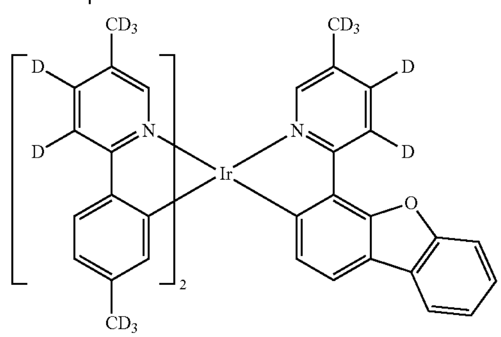
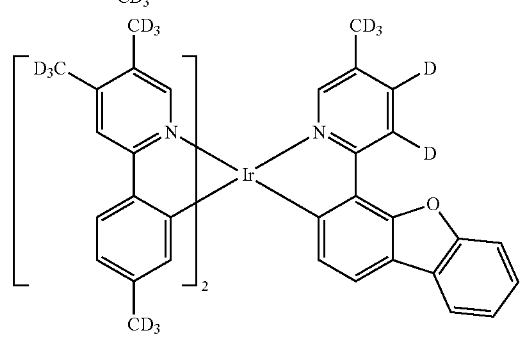
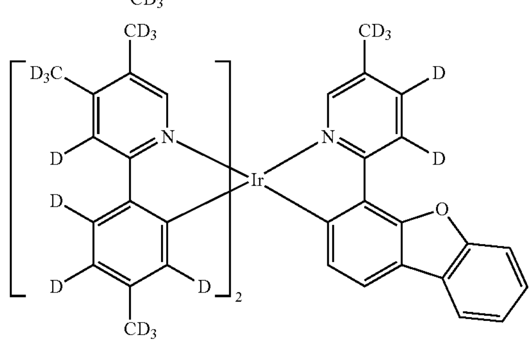

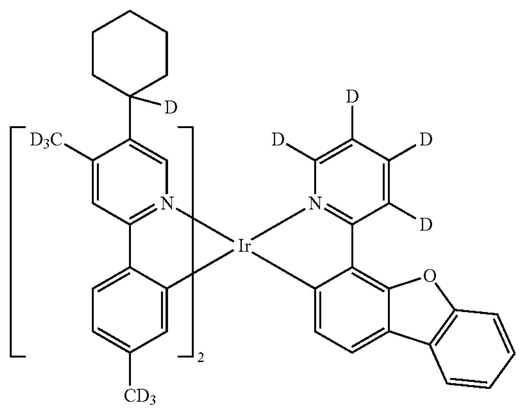
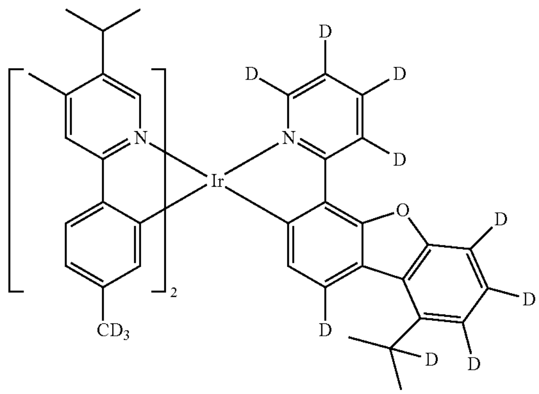
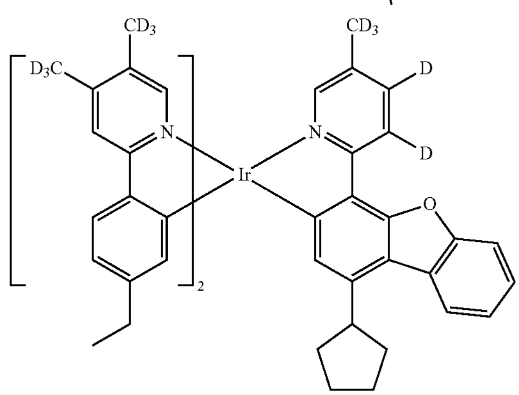
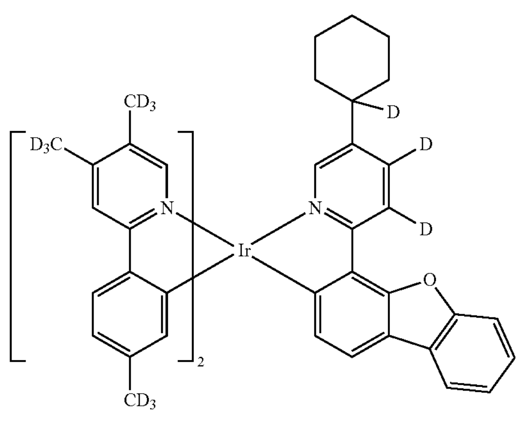
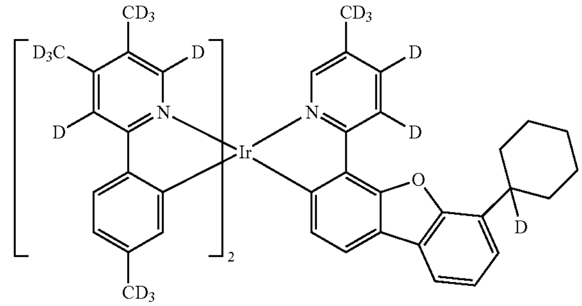
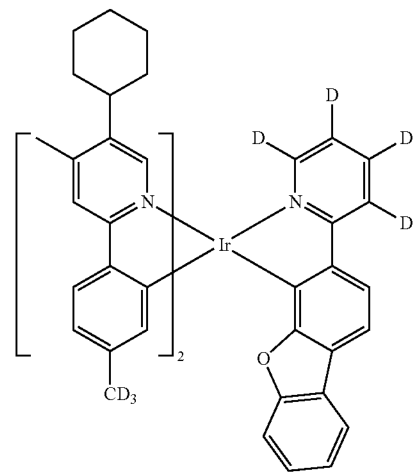
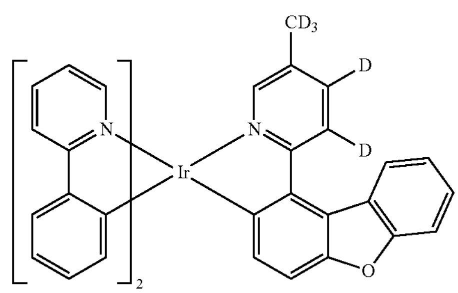
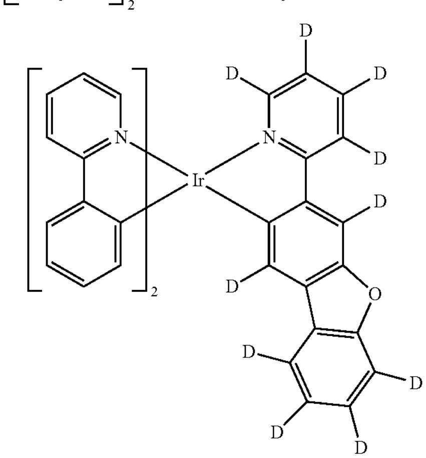

-continued
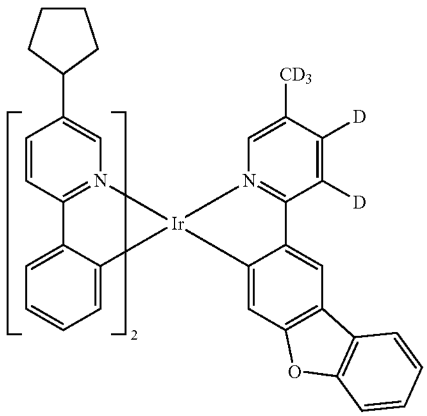
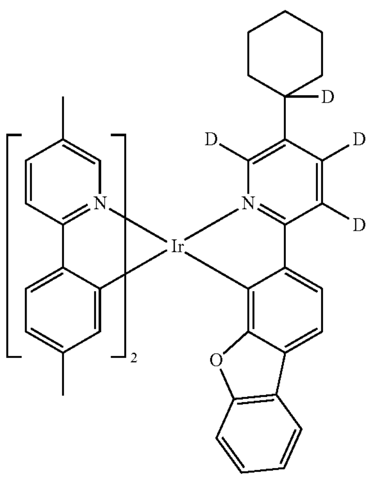
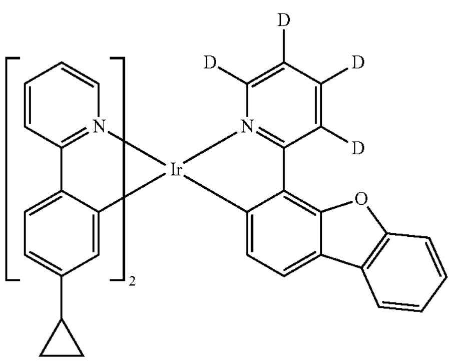
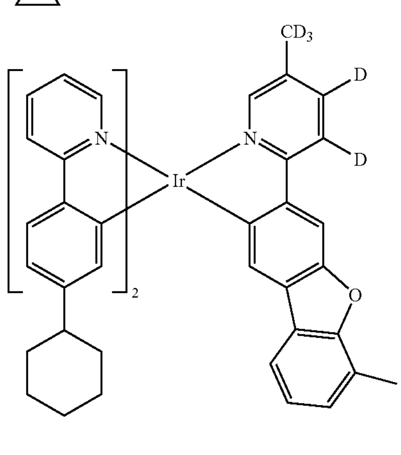
-continued
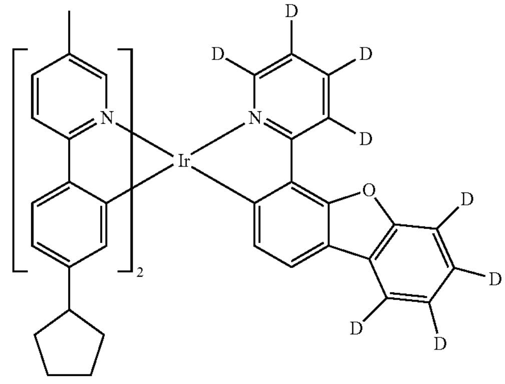
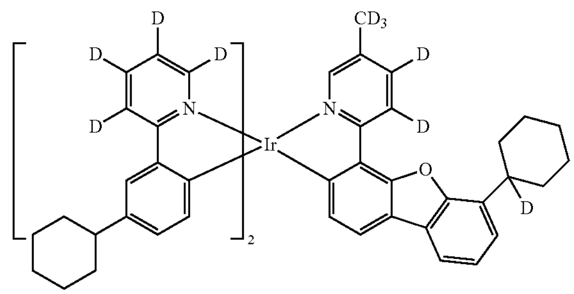
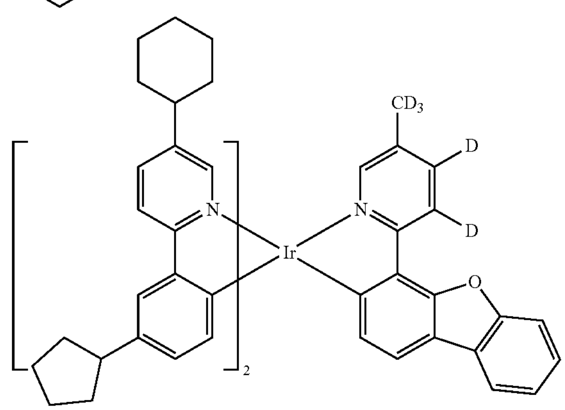
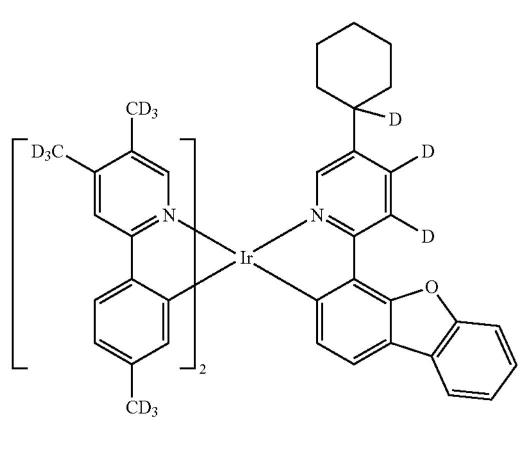

-continued
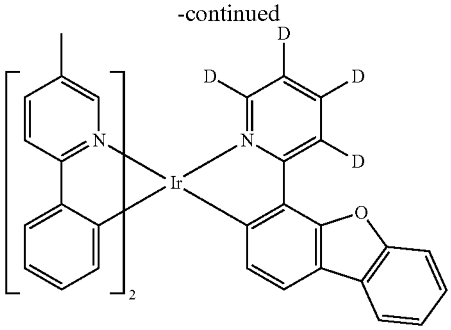
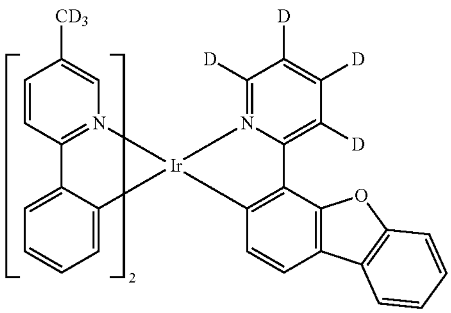
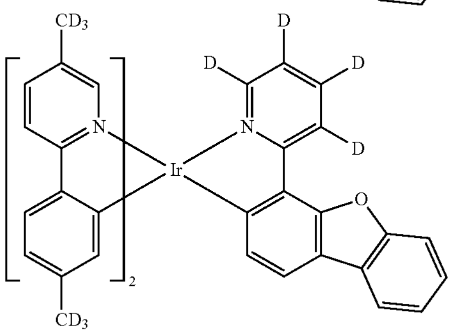
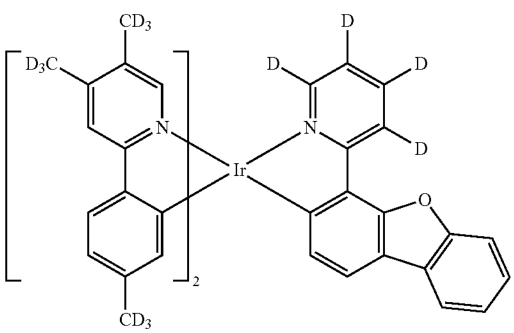
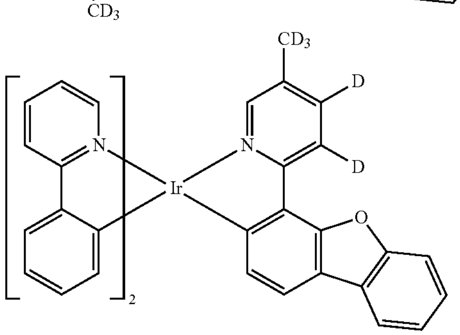
-continued
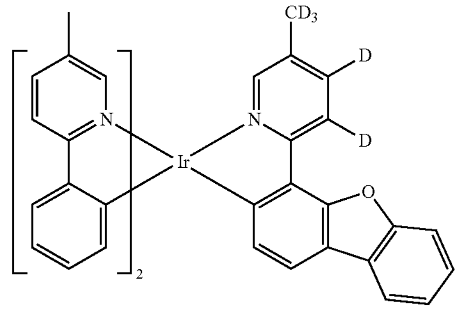
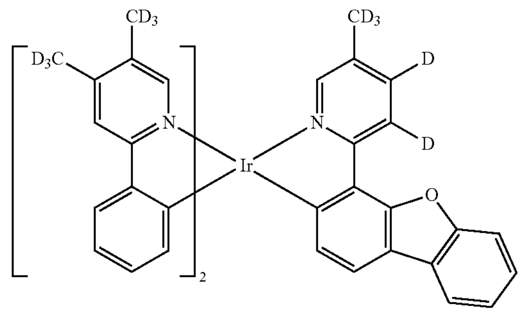
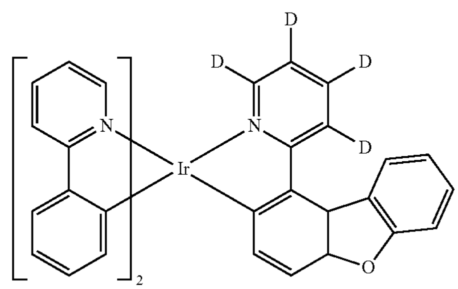
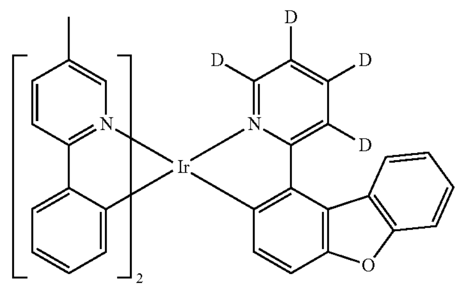
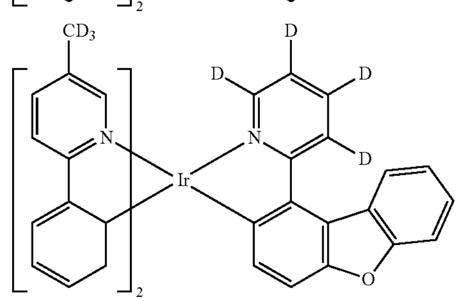

-continued
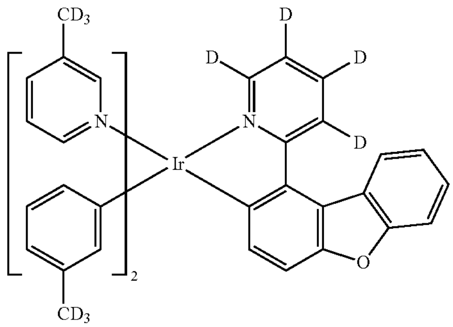
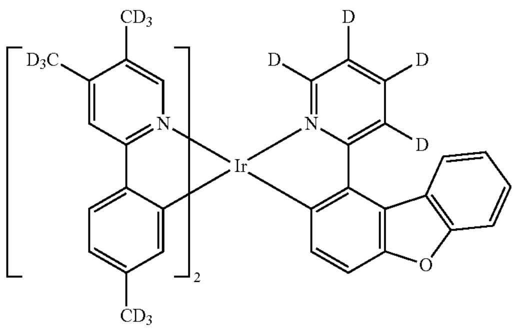
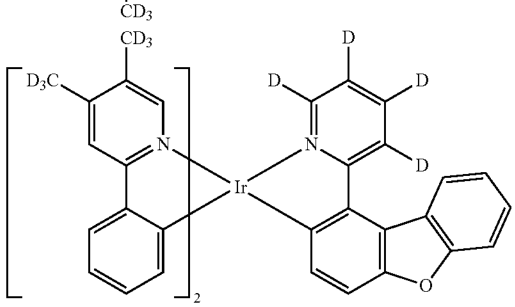
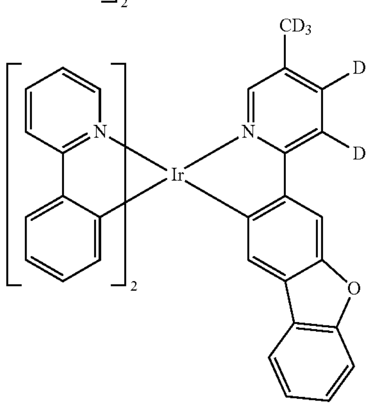
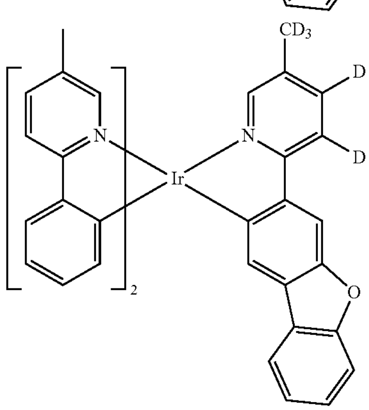
-continued
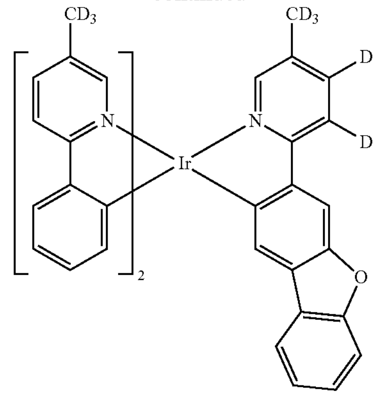
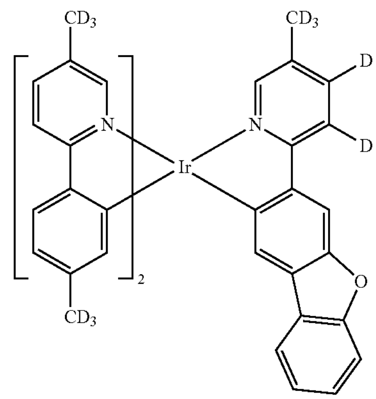
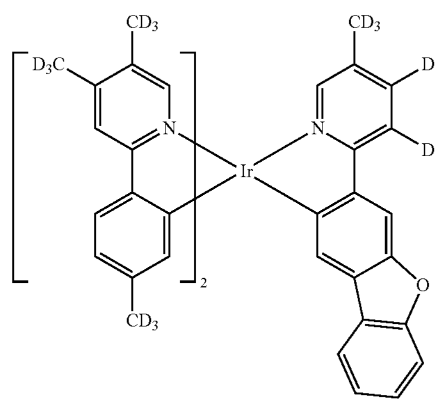
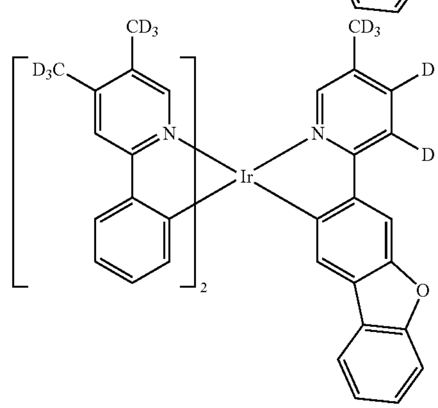

-continued
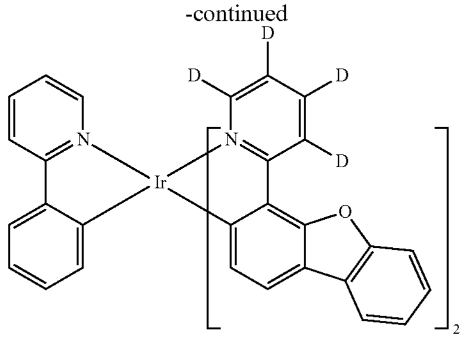
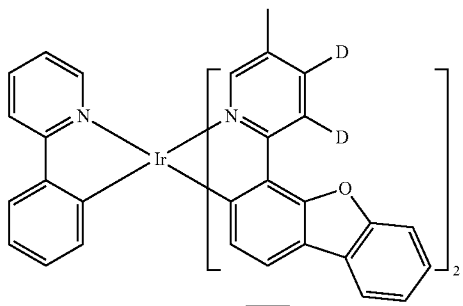
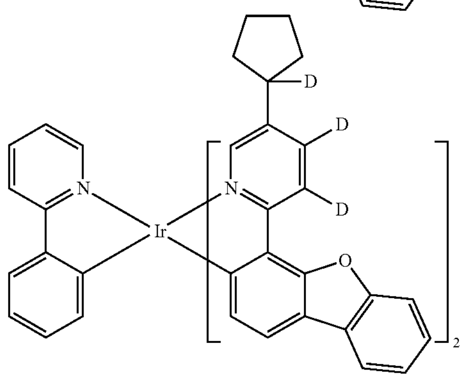
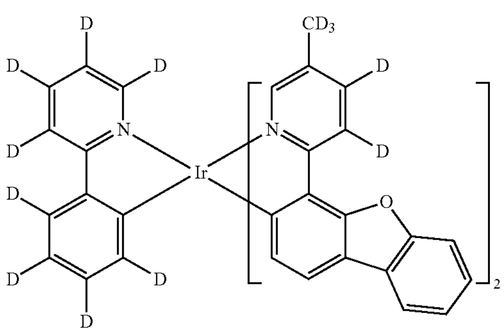
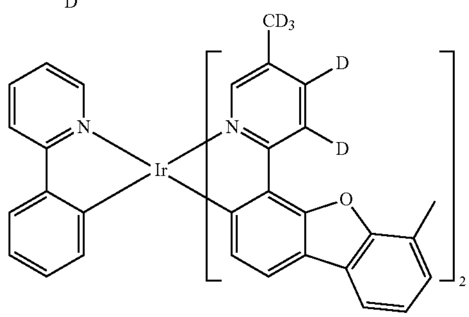
-continued
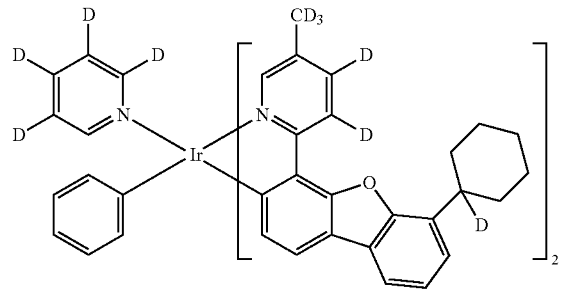
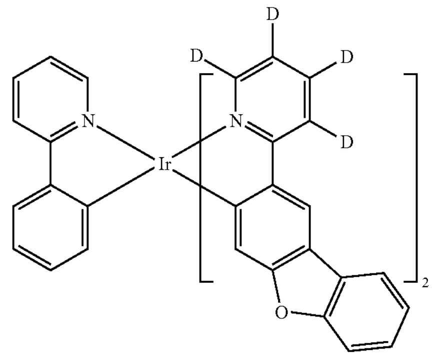
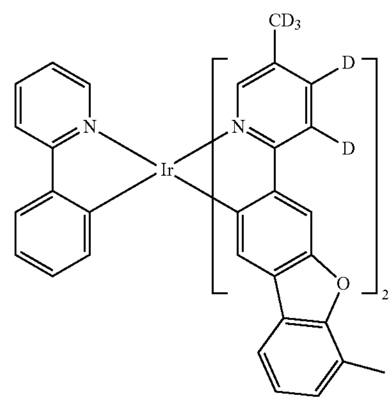
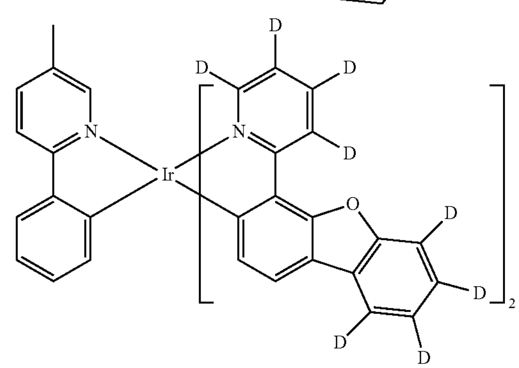
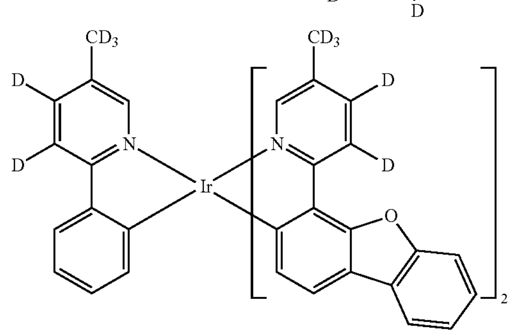

-continued
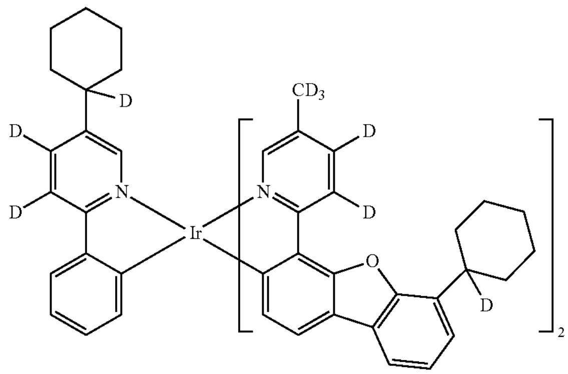
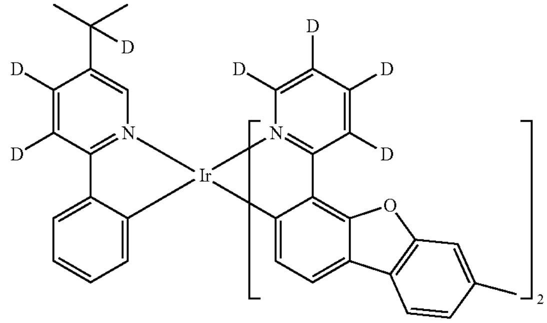
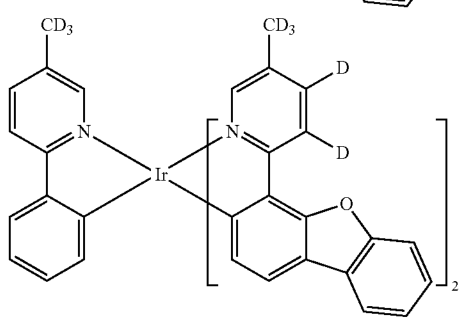
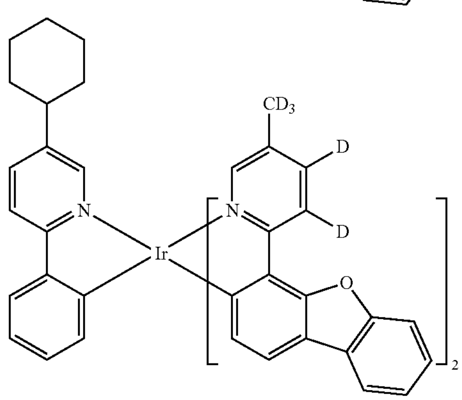
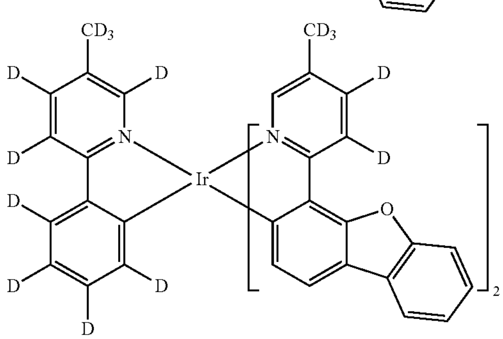
-continued
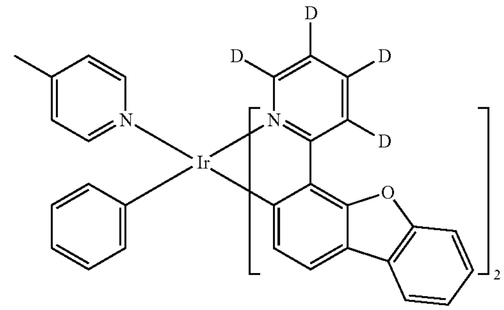
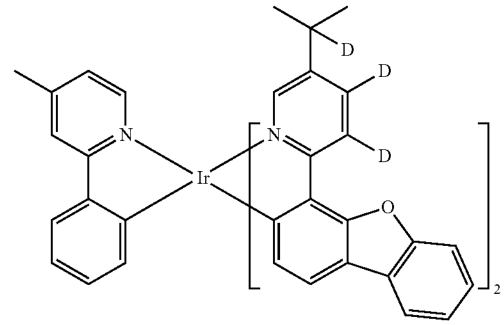
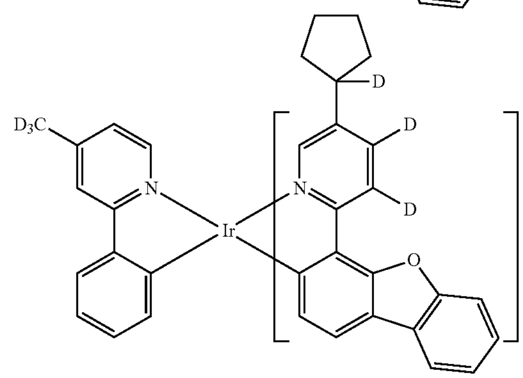
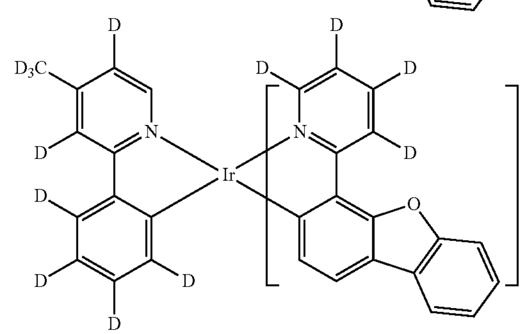
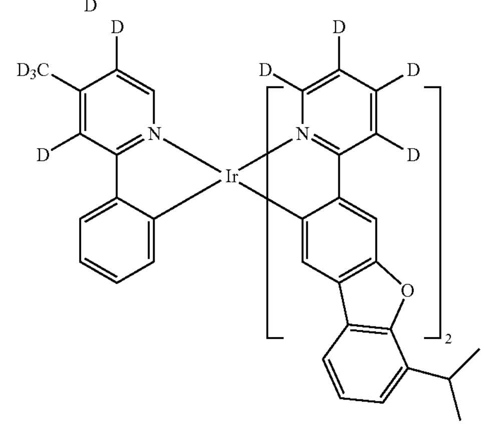

-continued
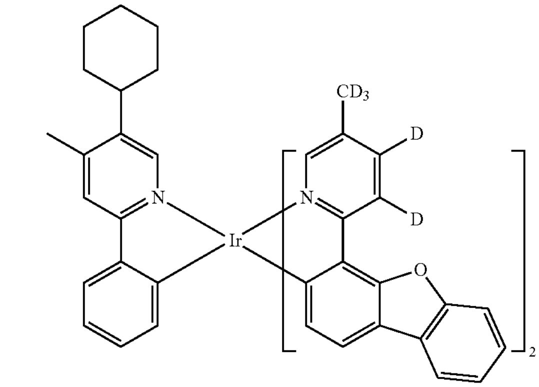
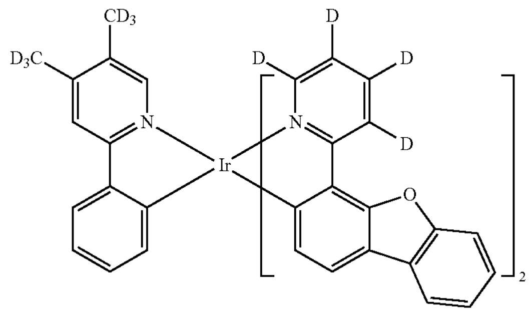
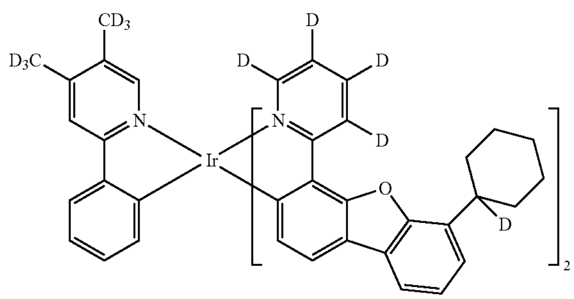
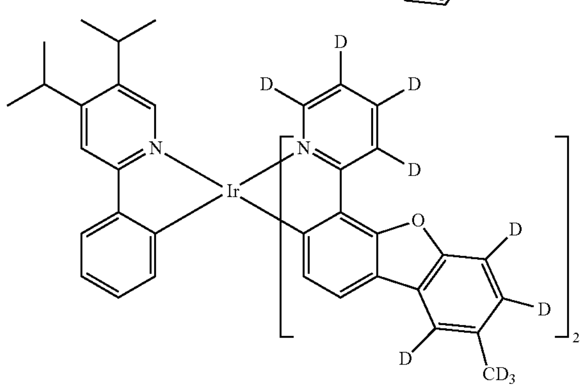
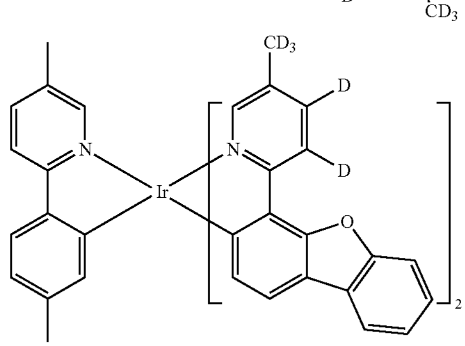
-continued
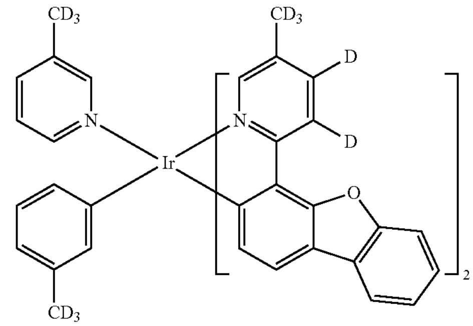
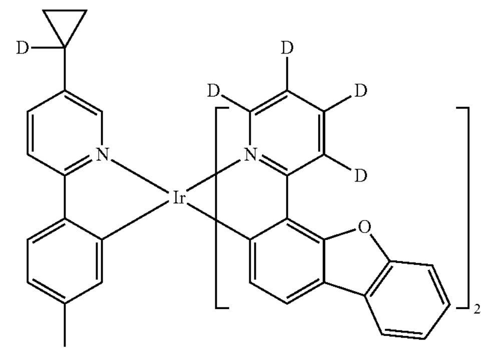
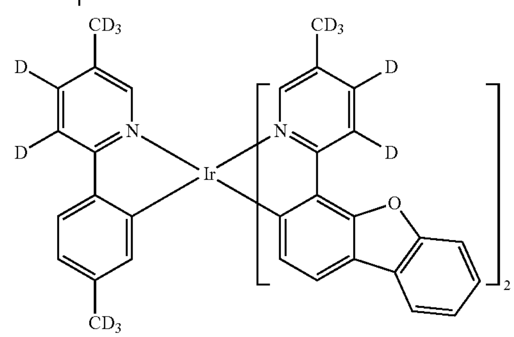
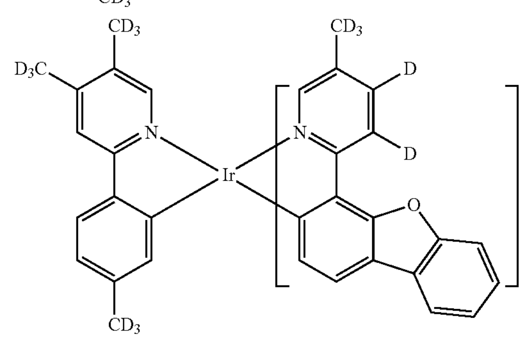
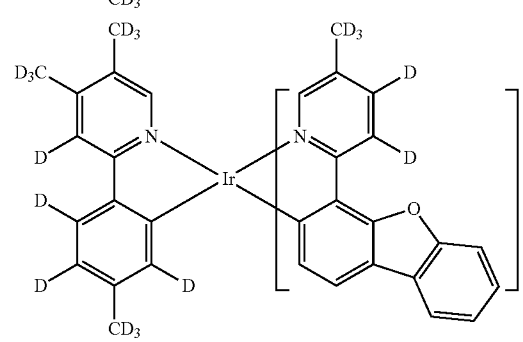

-continued
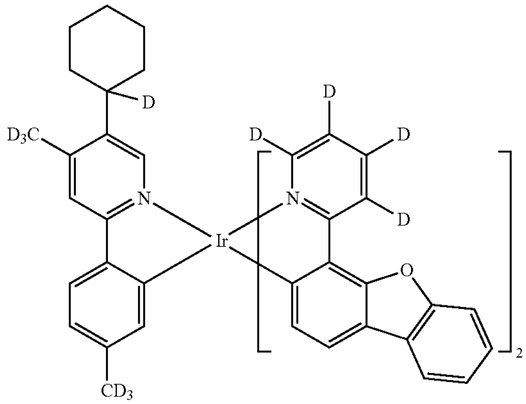
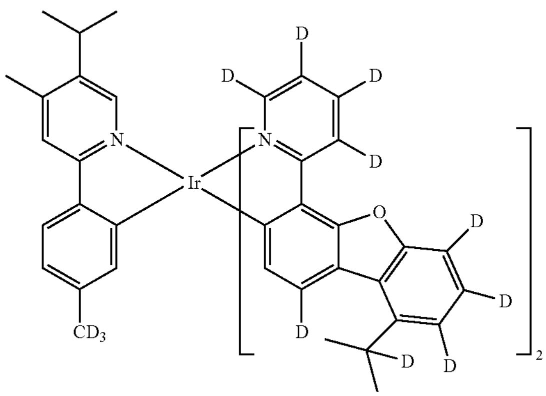
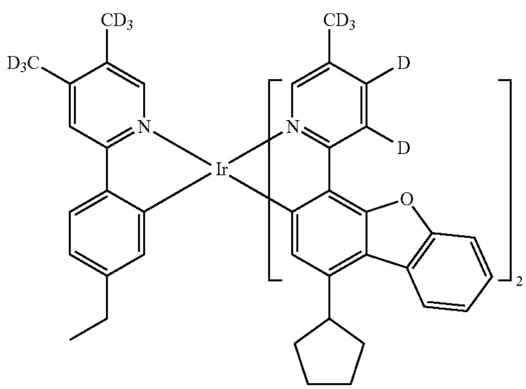
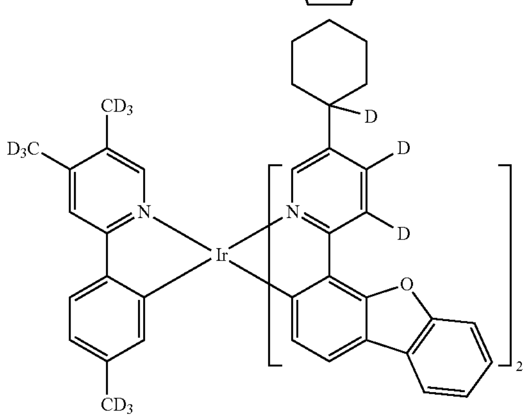
-continued
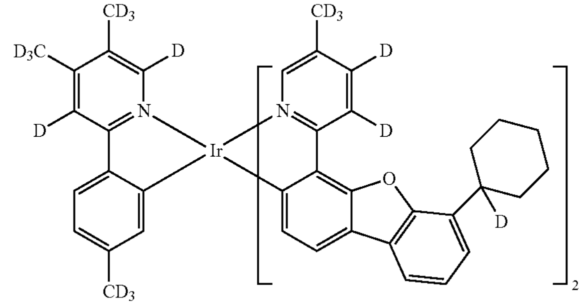
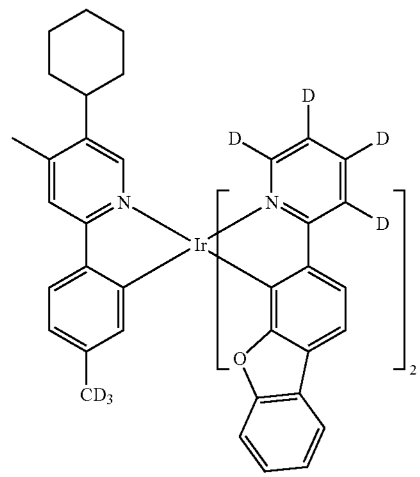
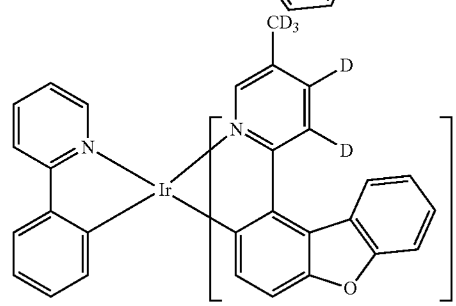
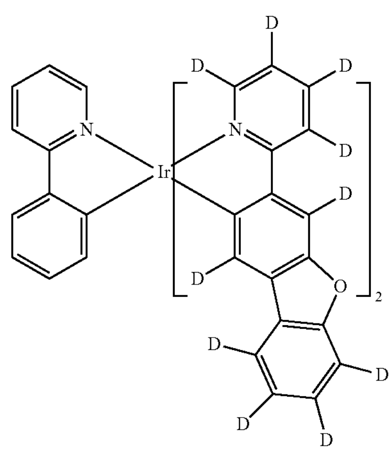

-continued
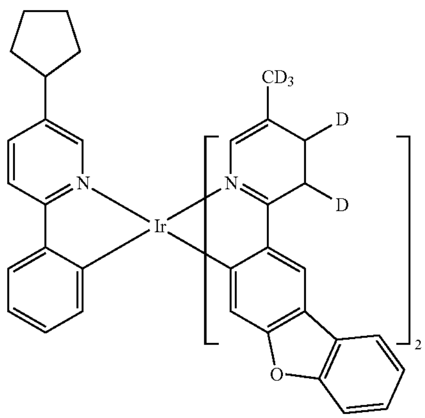
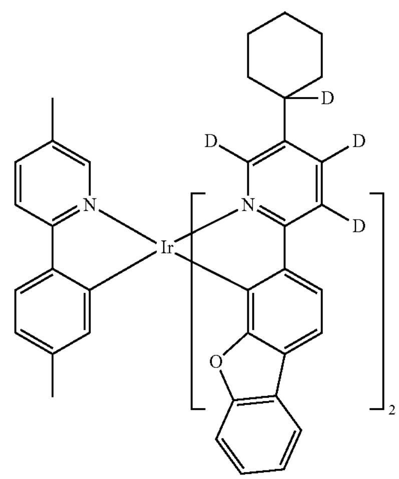
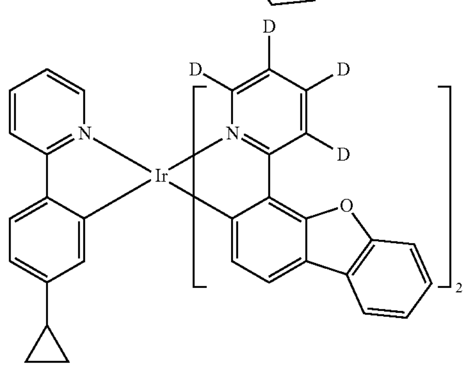
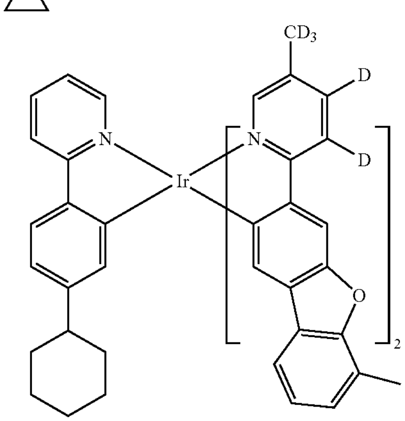
-continued
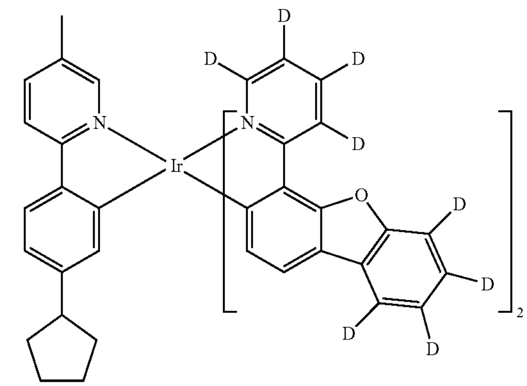
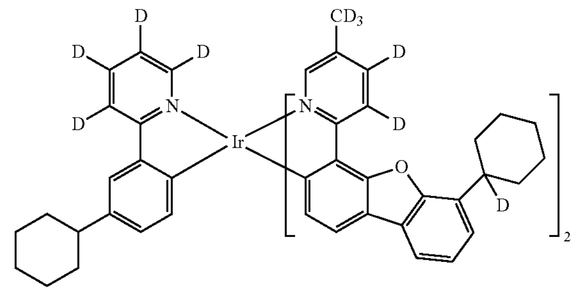
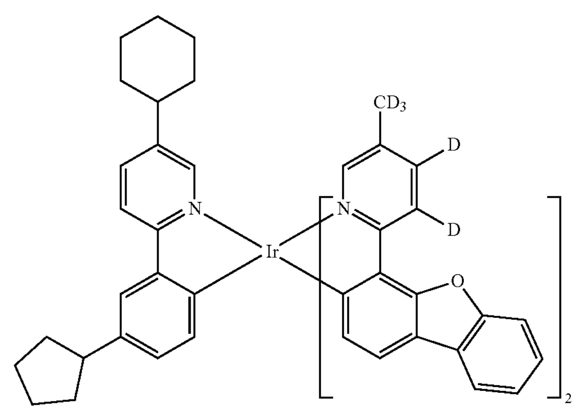
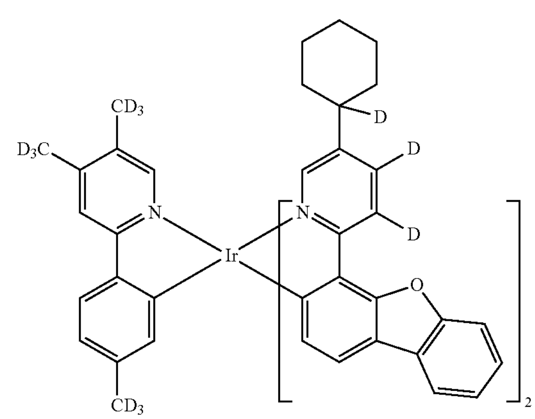

-continued
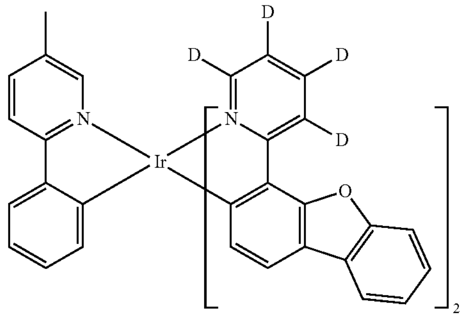
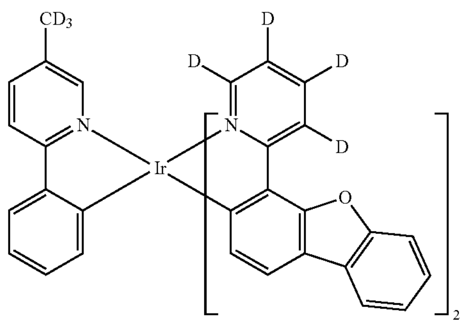
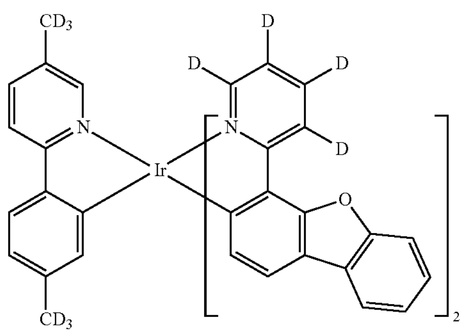
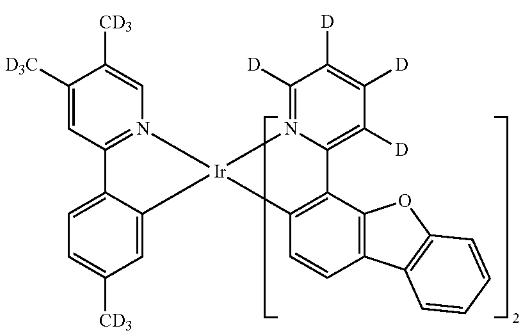
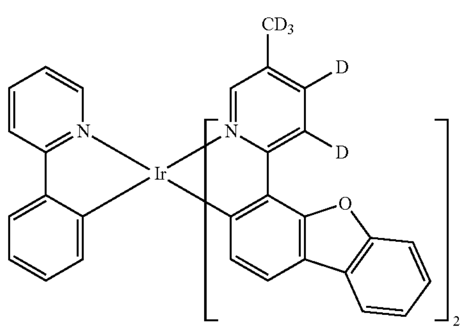
-continued
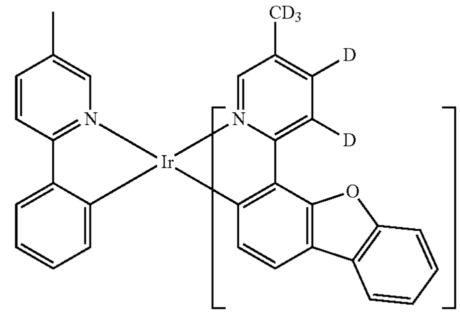
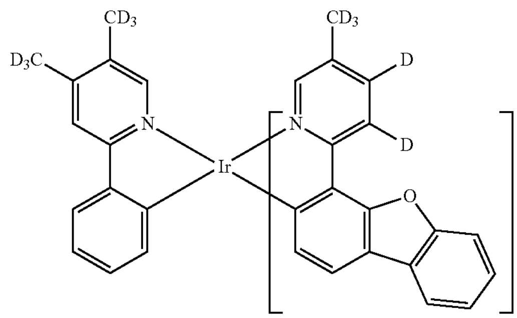
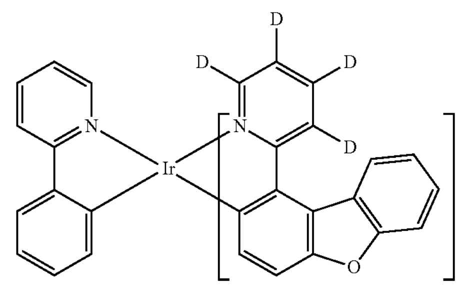
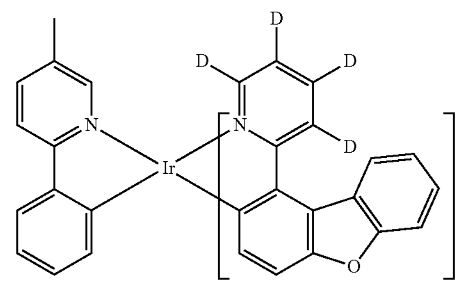
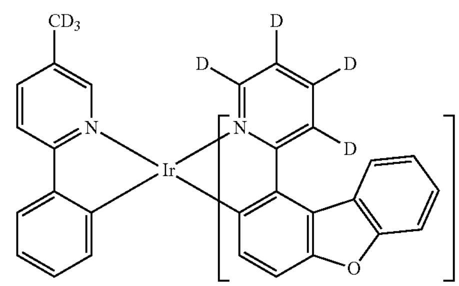

-continued
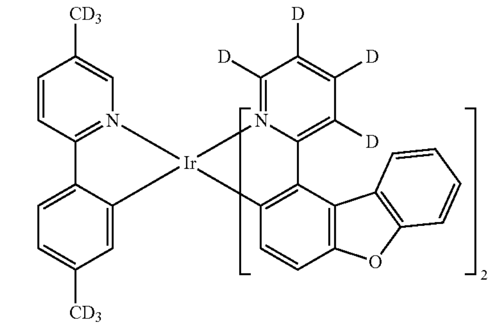
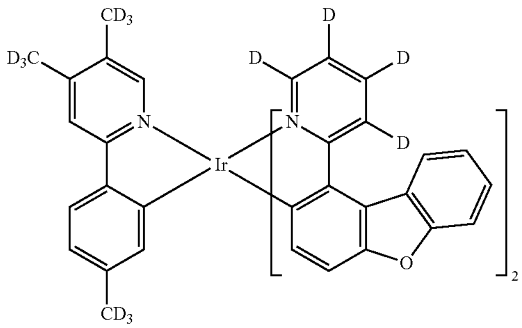
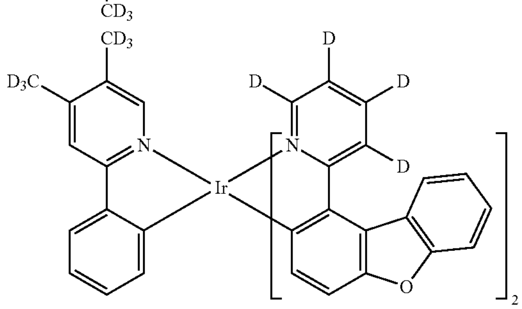
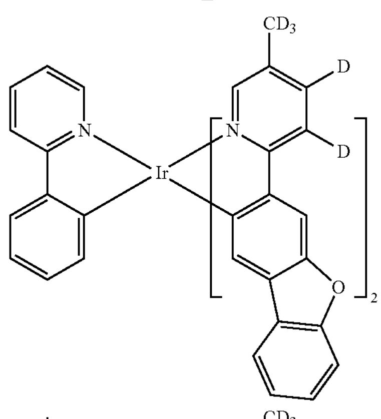
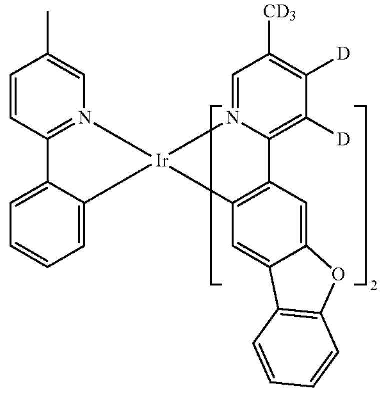
-continued
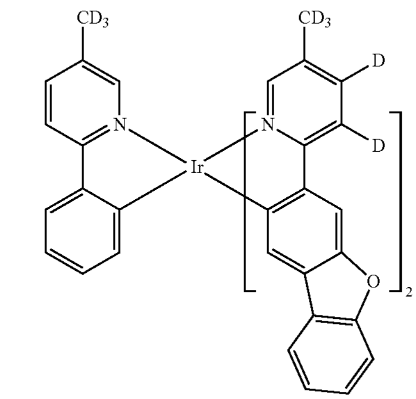
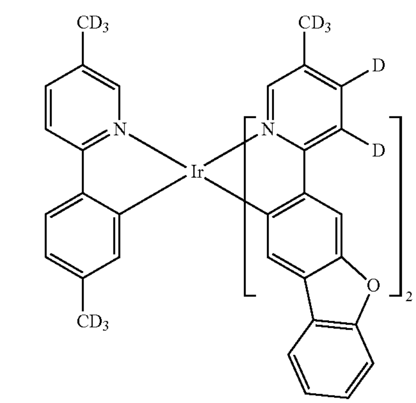
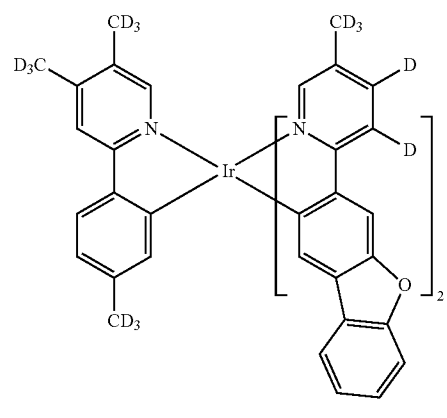
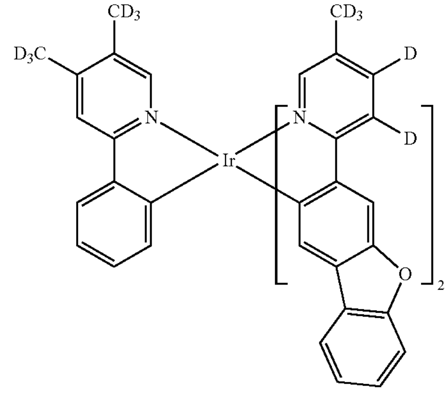

-continued
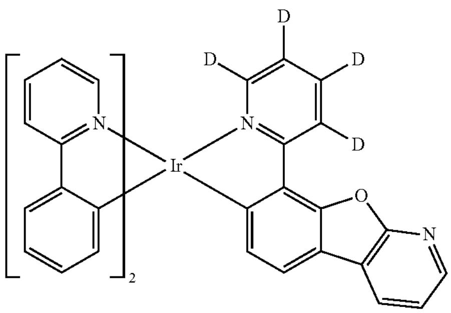
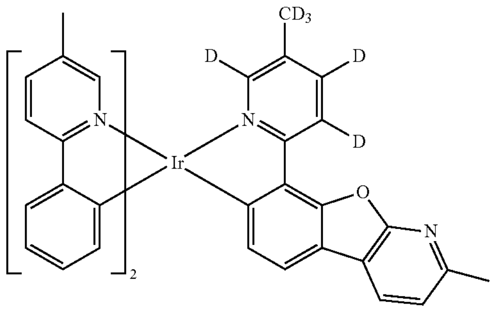
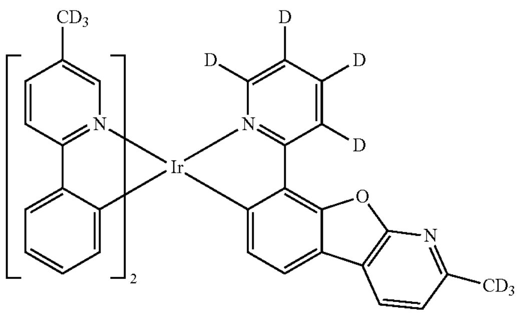
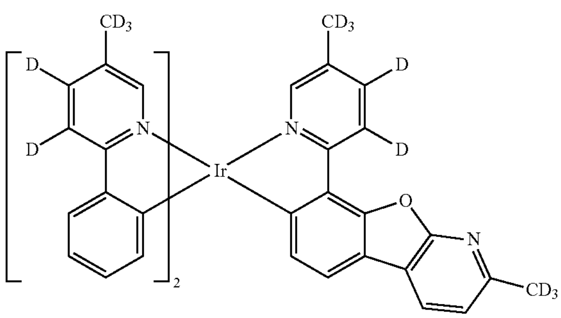
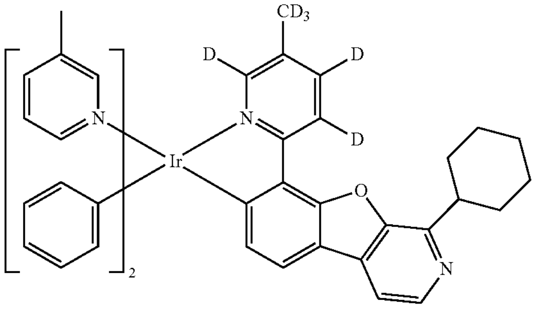
-continued
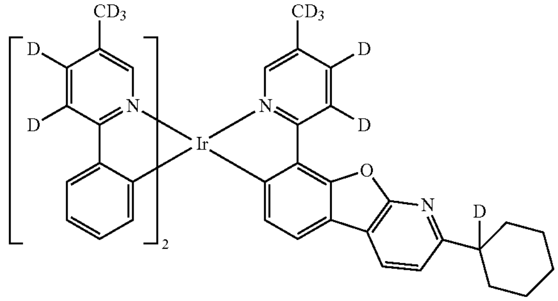
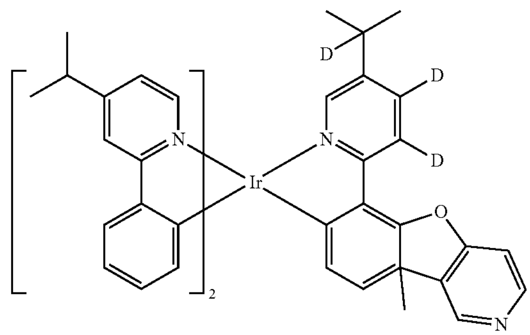
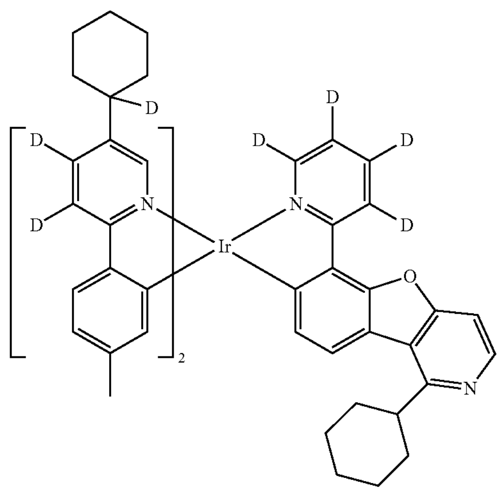
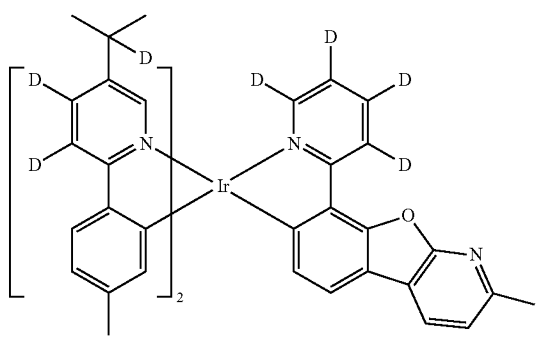

-continued
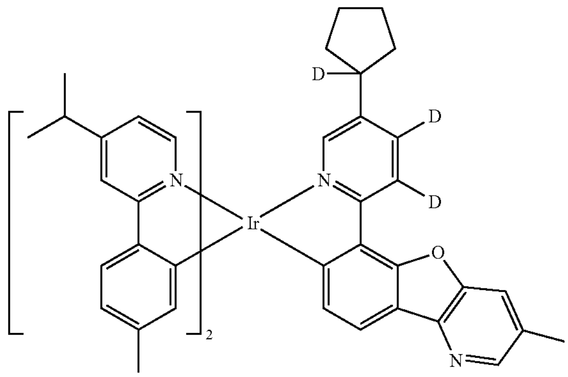
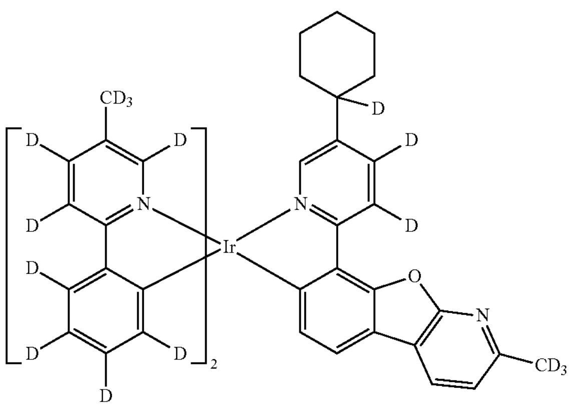
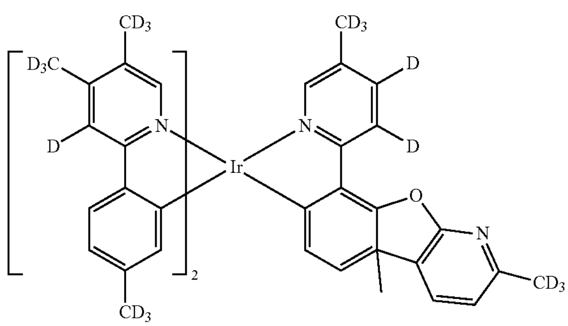
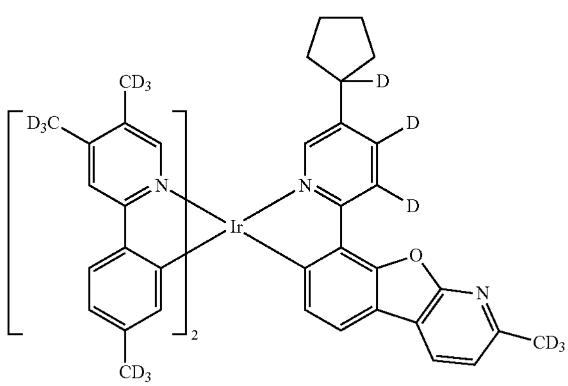
-continued
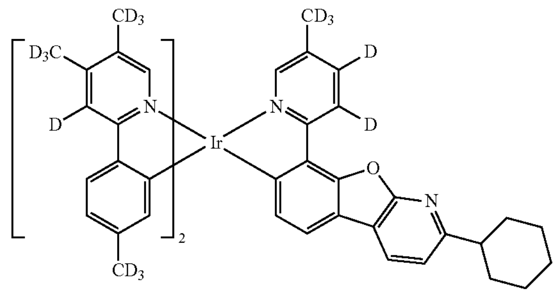
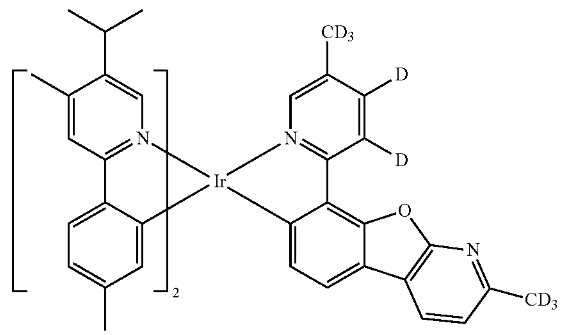
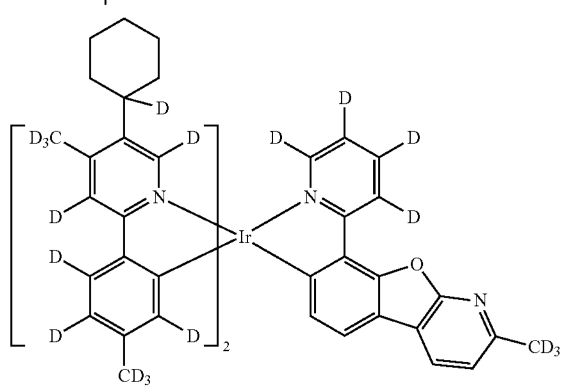
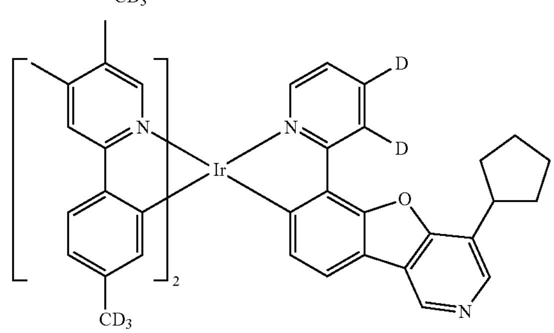
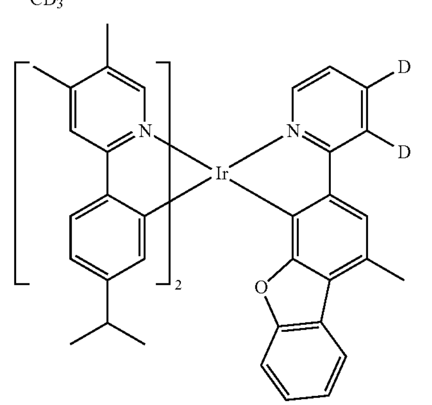

-continued
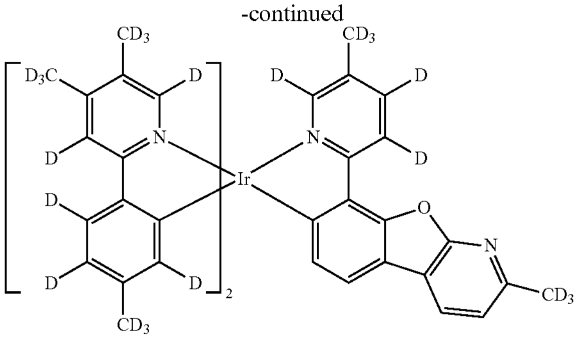
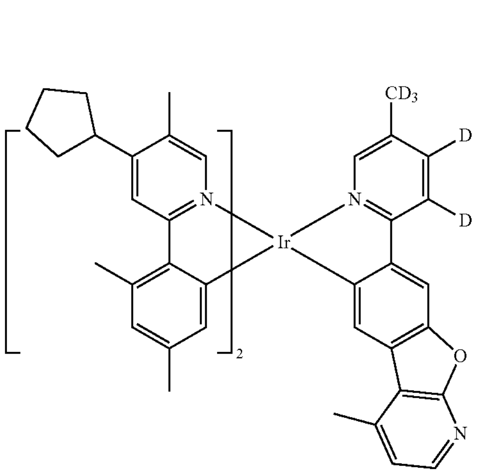
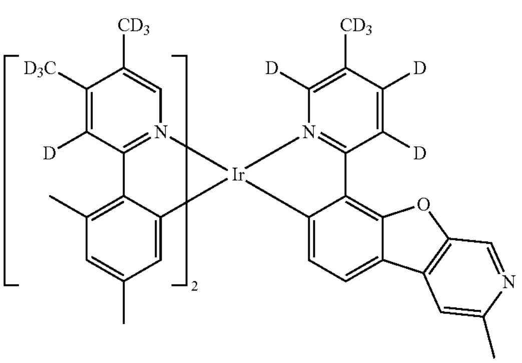
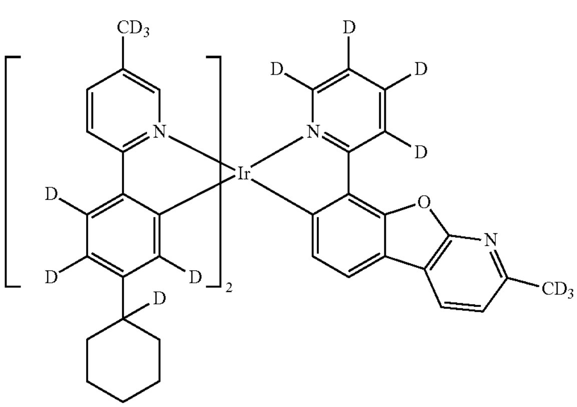
-continued
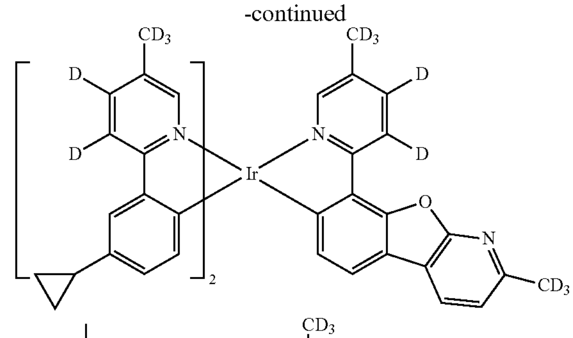
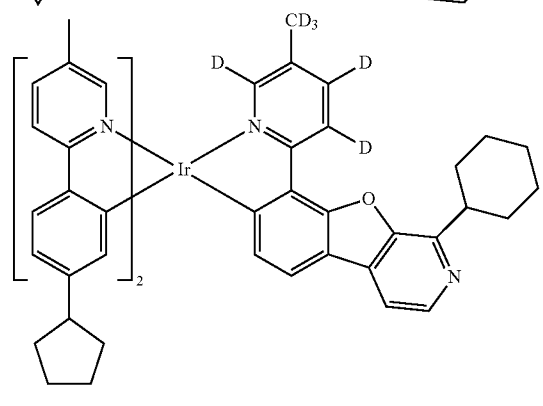
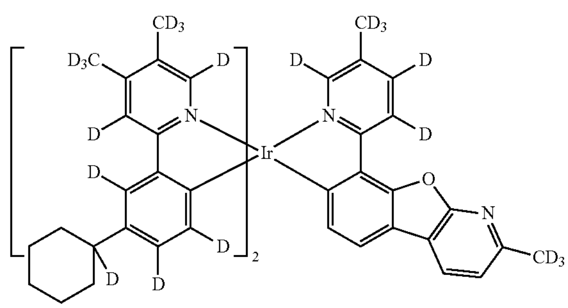
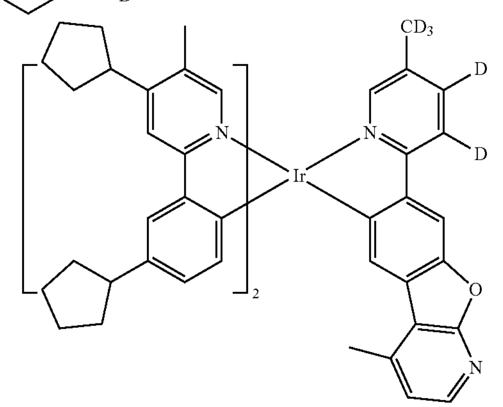
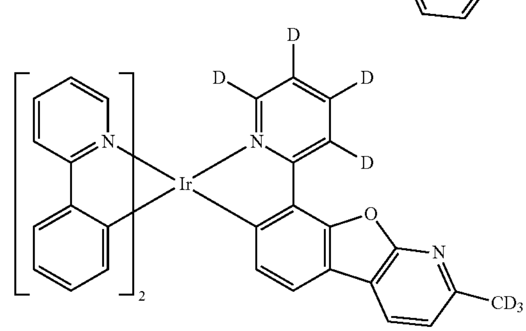

-continued
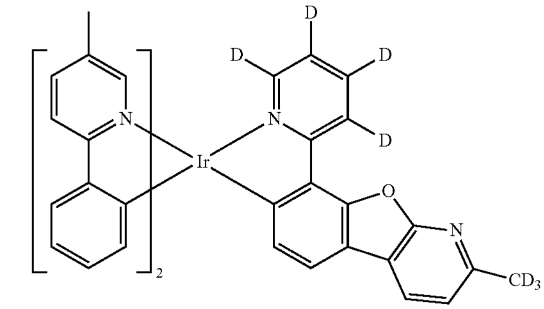
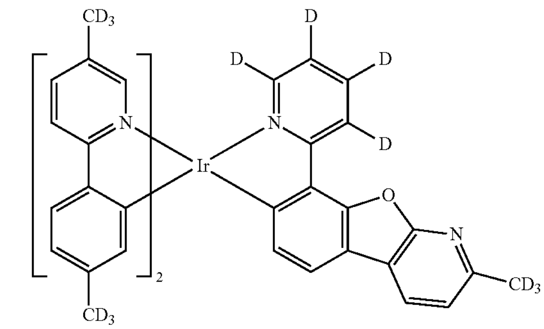
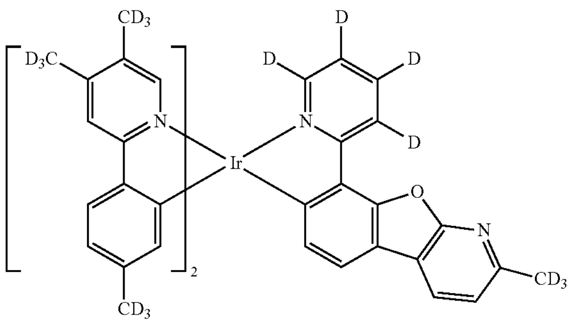
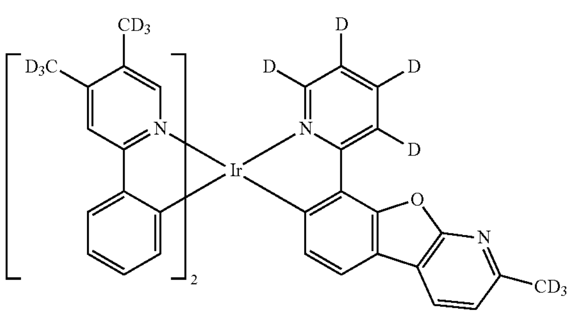
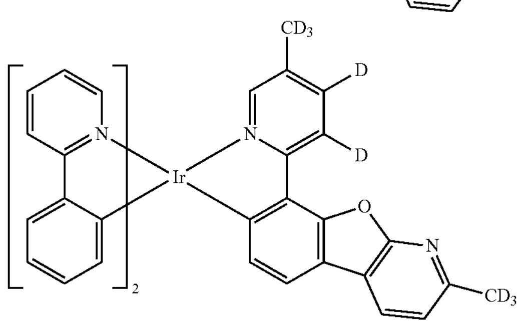
-continued
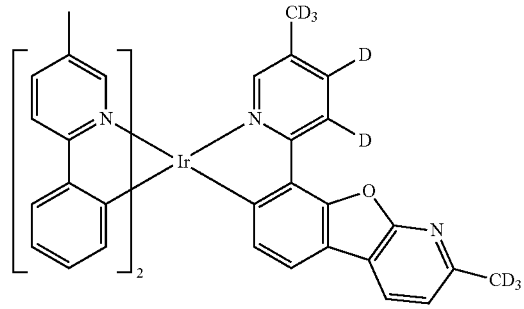
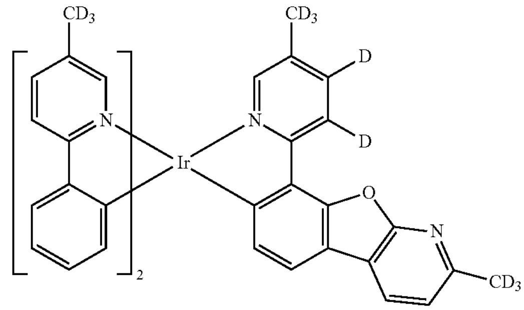
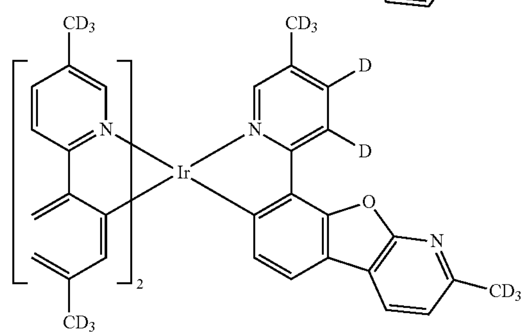
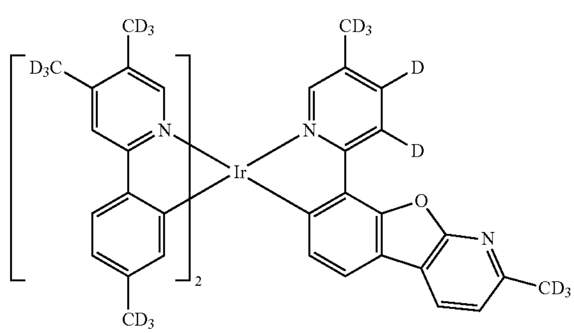
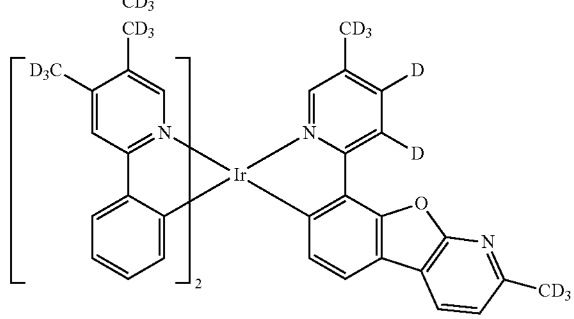

-continued
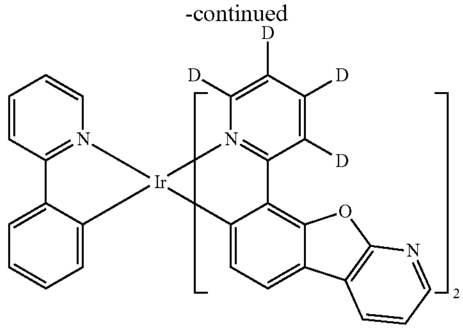
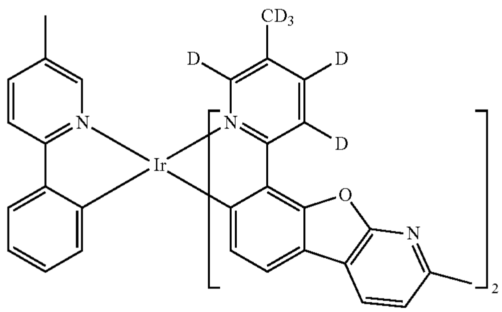
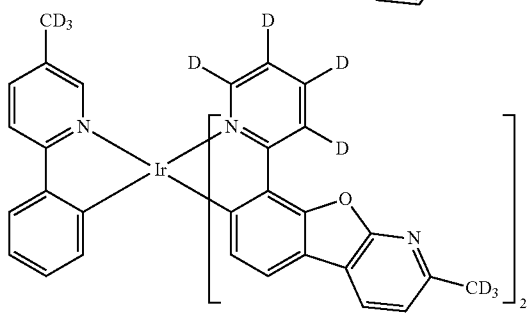
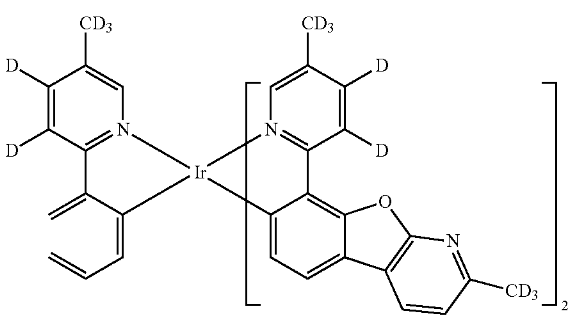
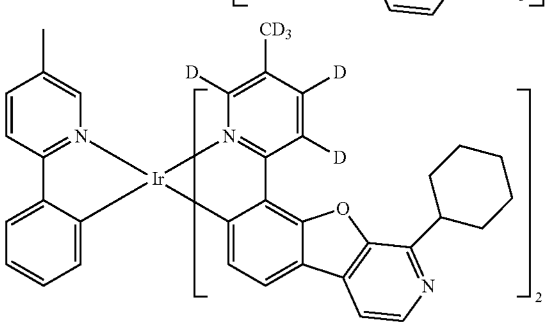
-continued
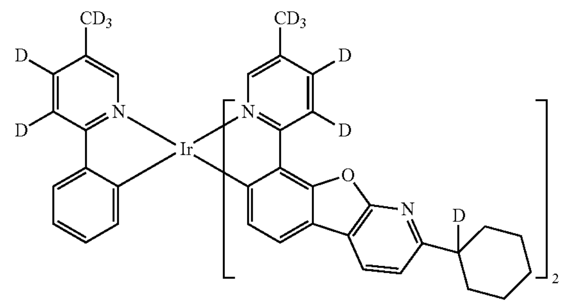
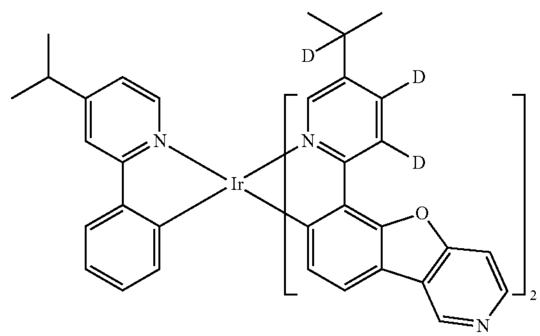
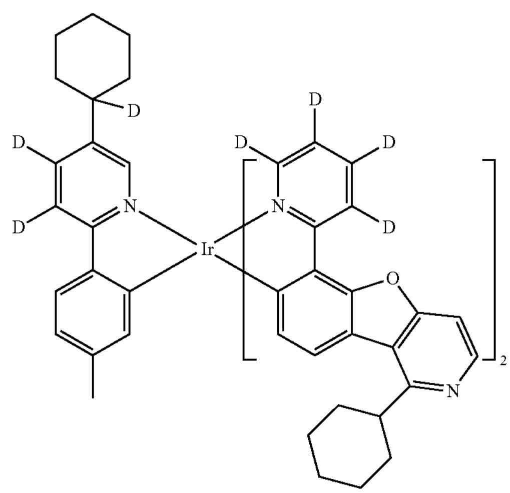
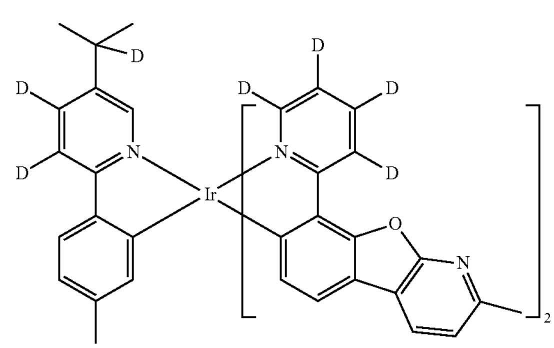

-continued
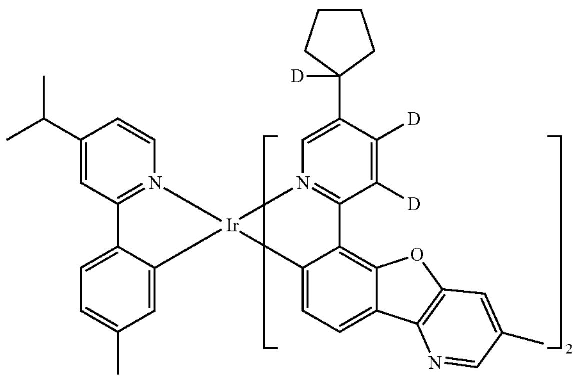
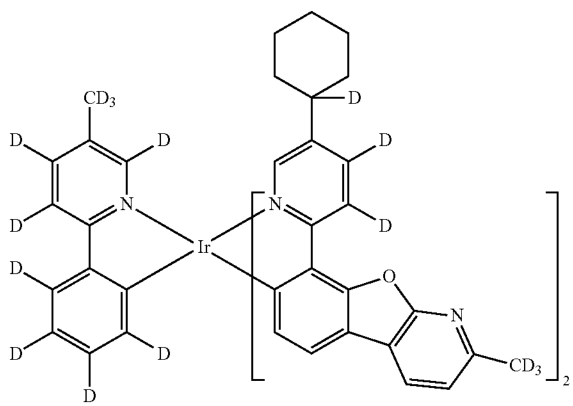
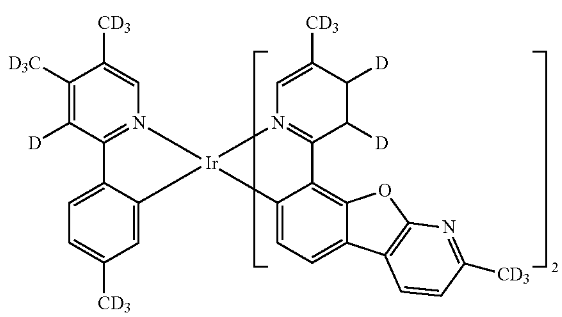
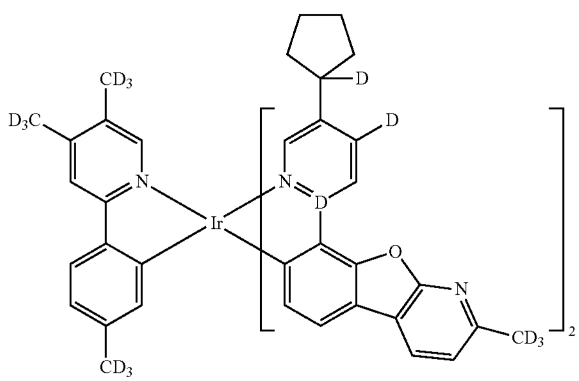
-continued
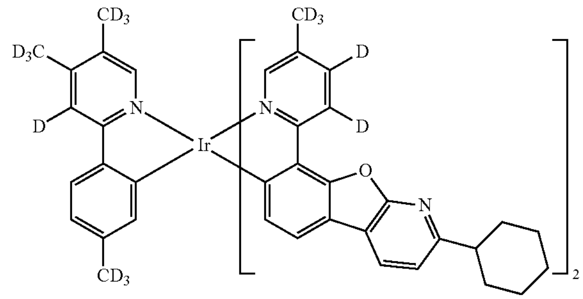
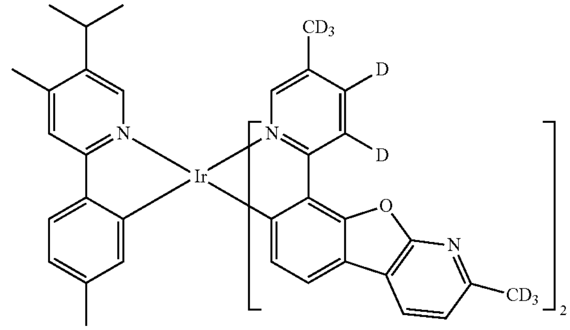
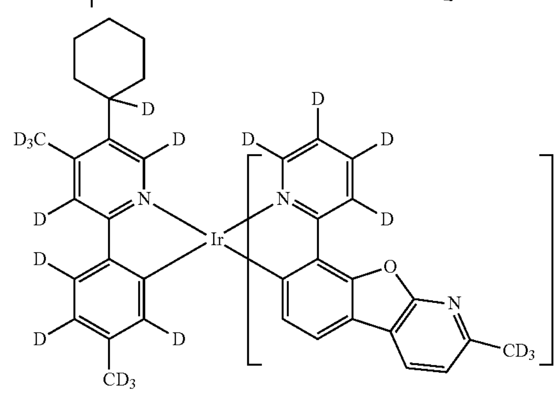
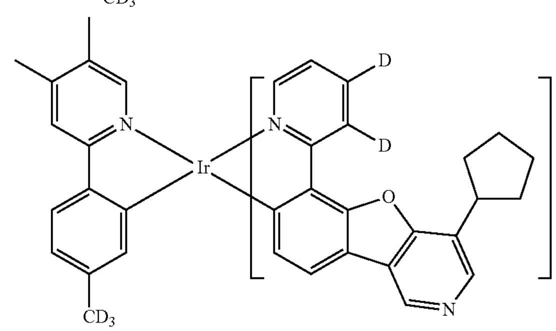
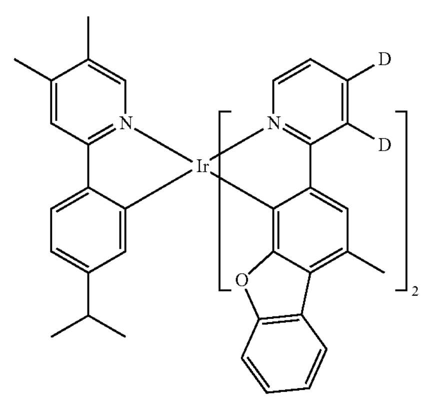

-continued
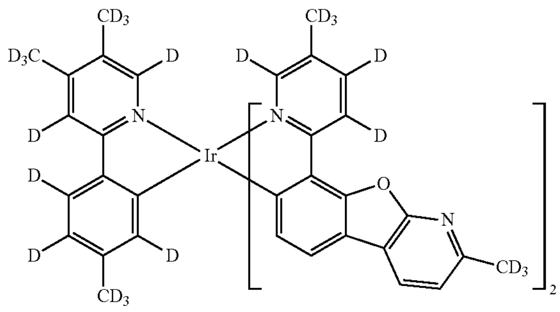
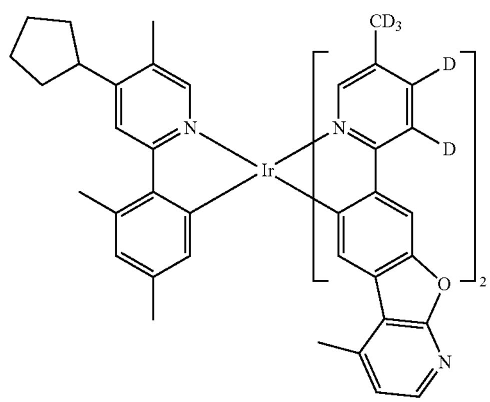
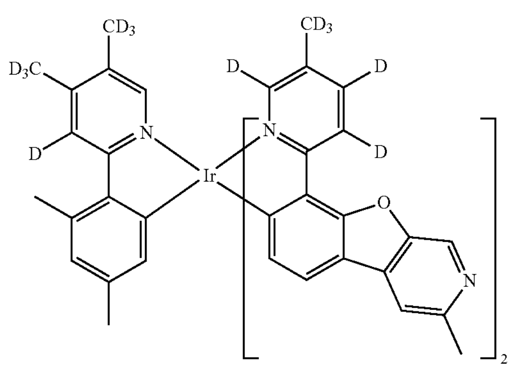
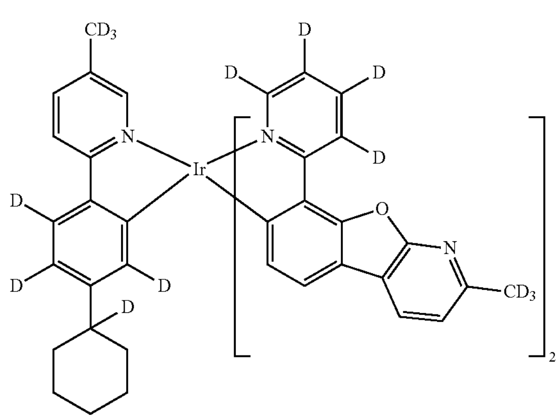
-continued
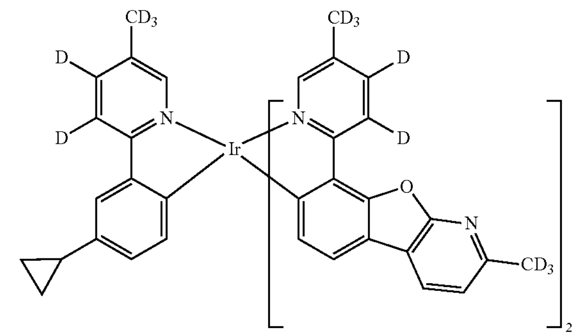
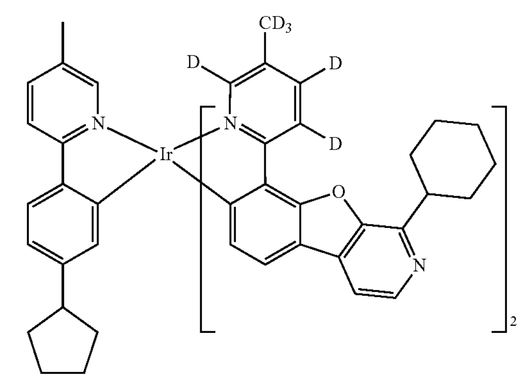
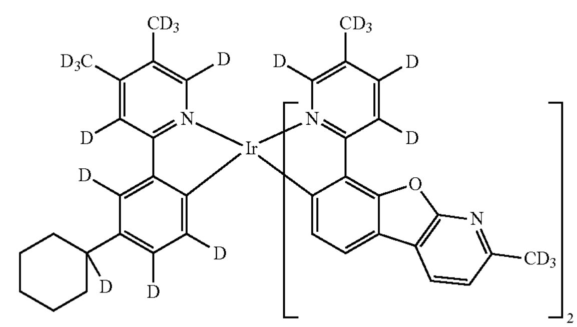
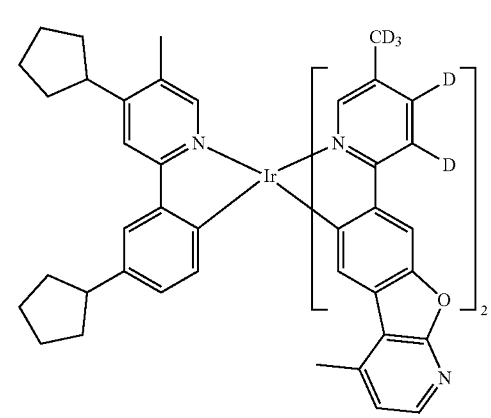

-continued
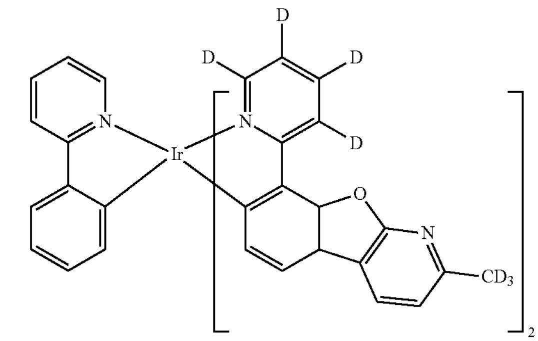
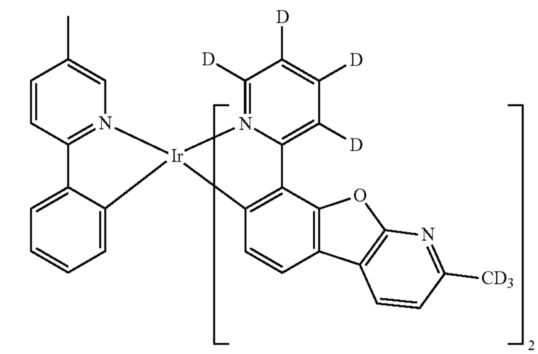
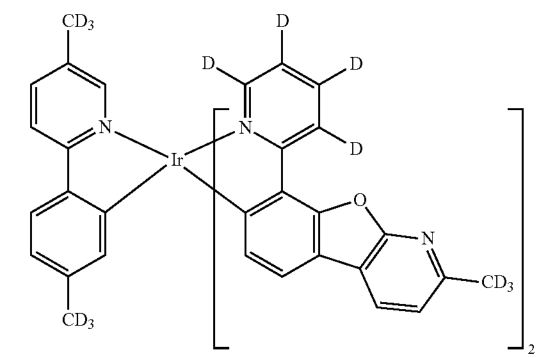
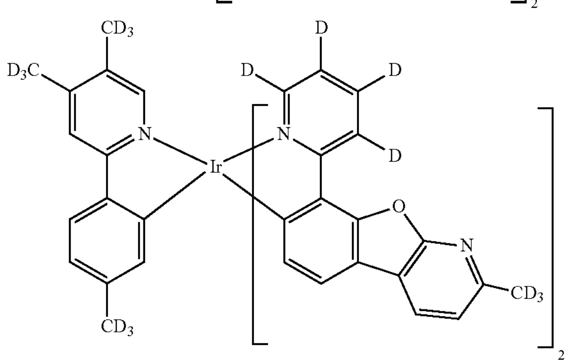
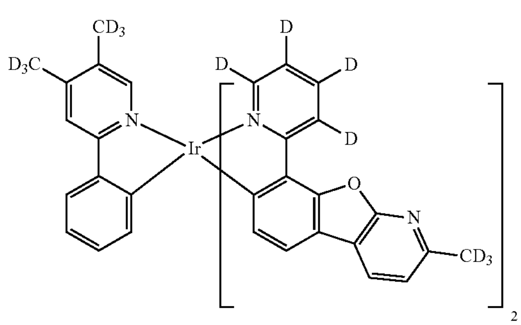
-continued
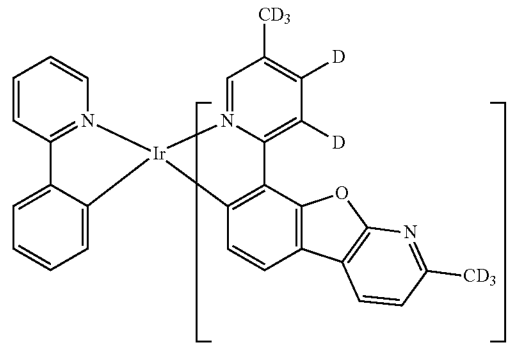
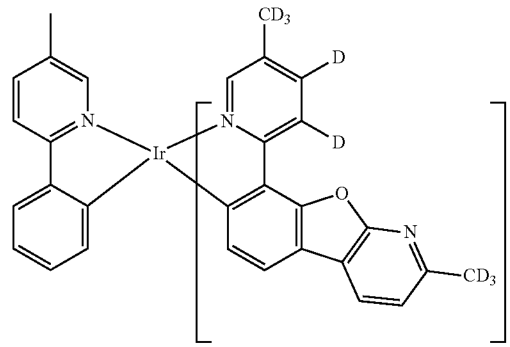
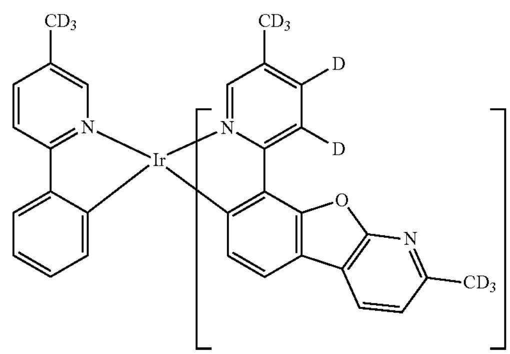
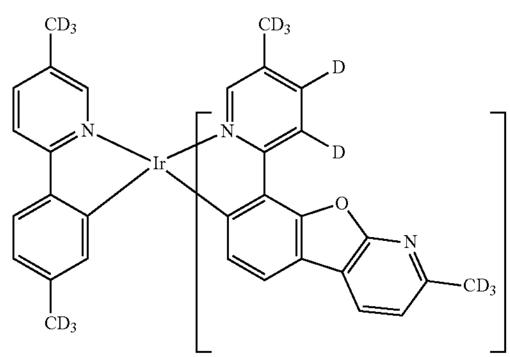

-continued
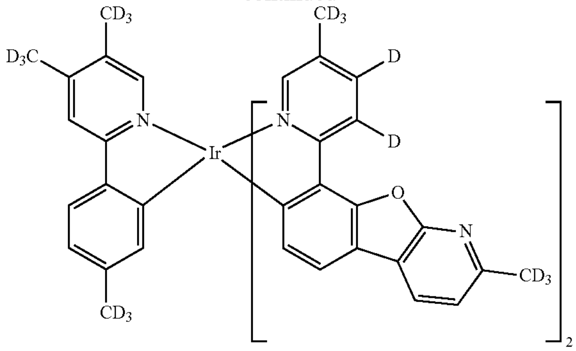
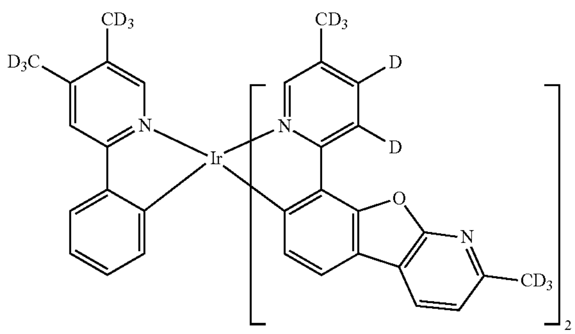
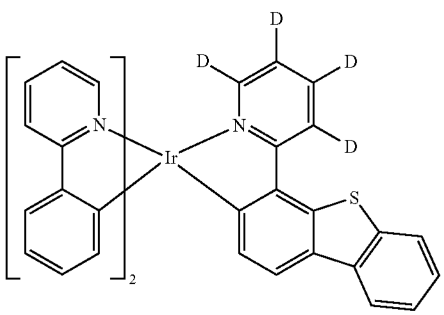
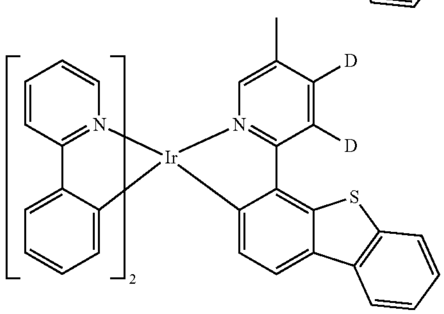
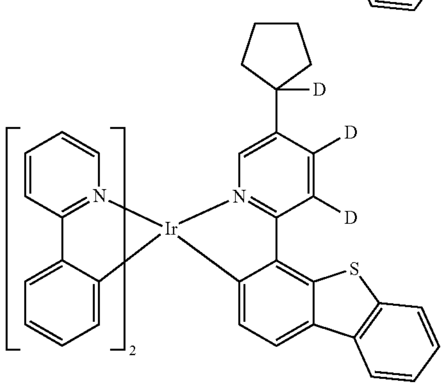
-continued
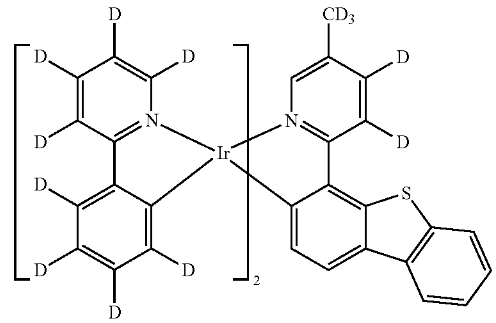
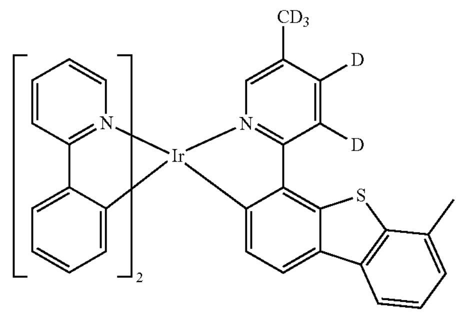
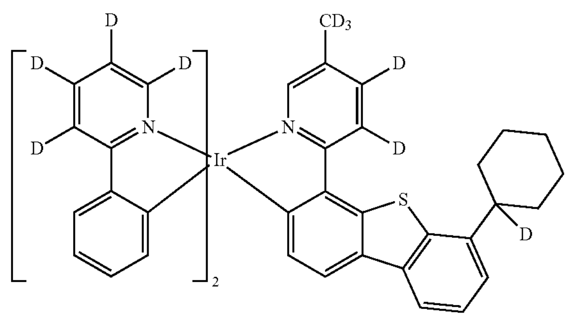
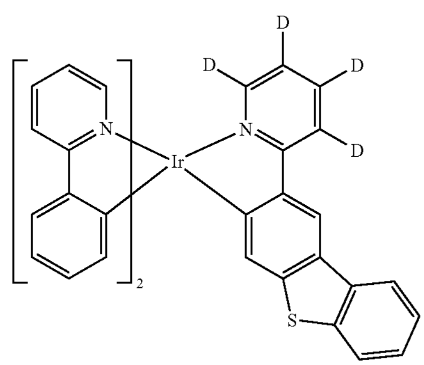
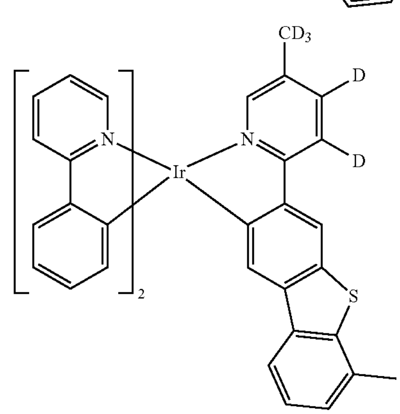

-continued
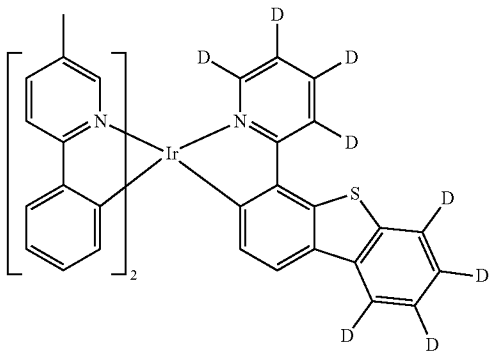
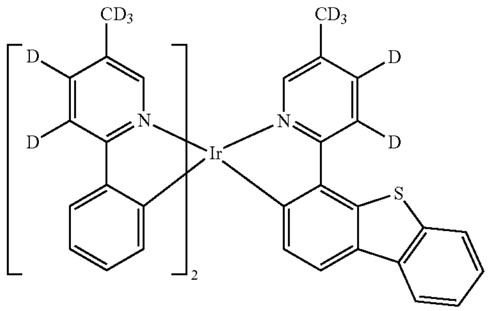
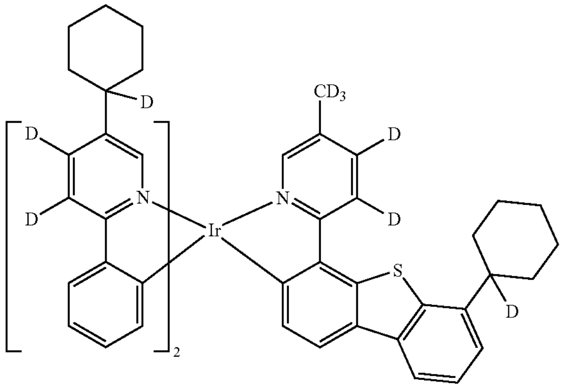
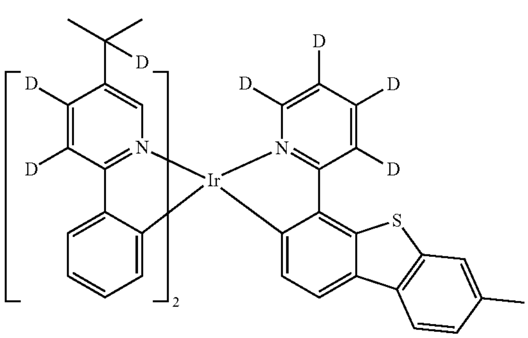
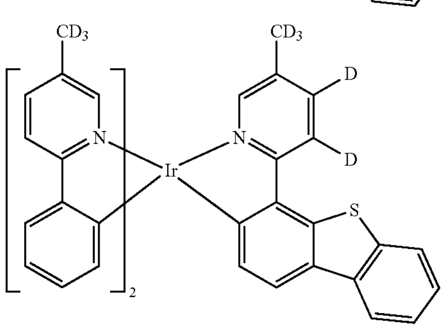
-continued
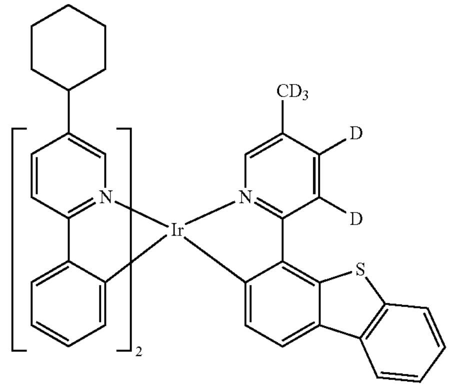
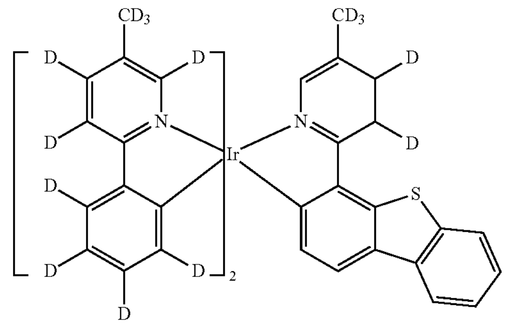
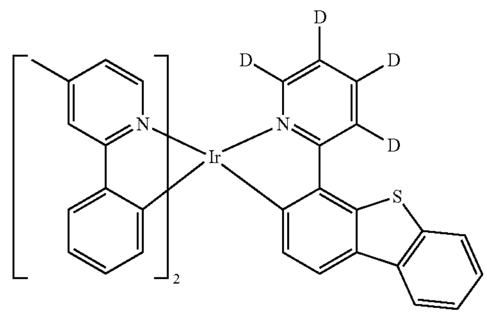
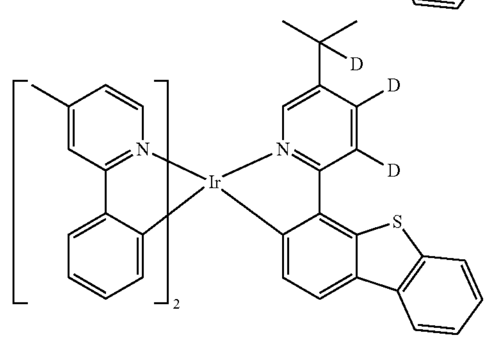
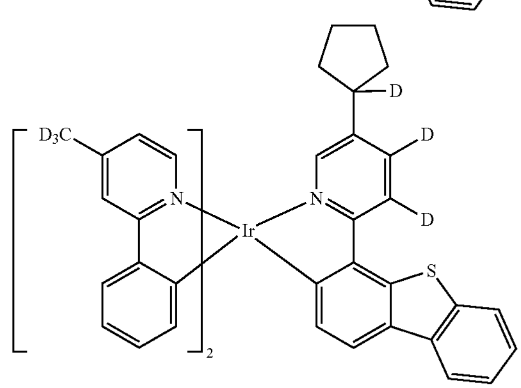

-continued
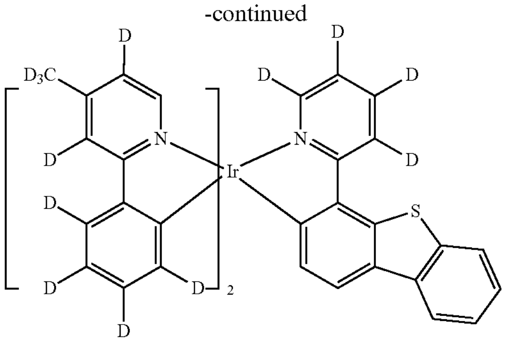
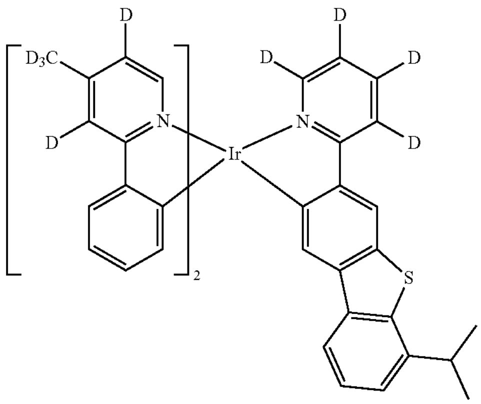
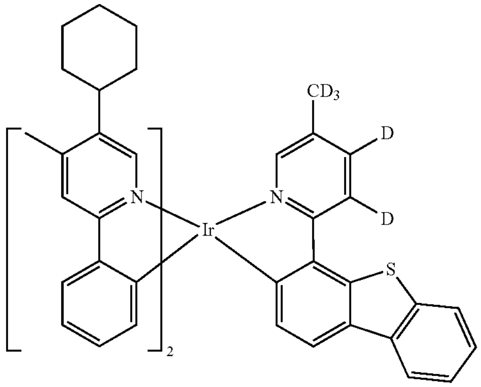
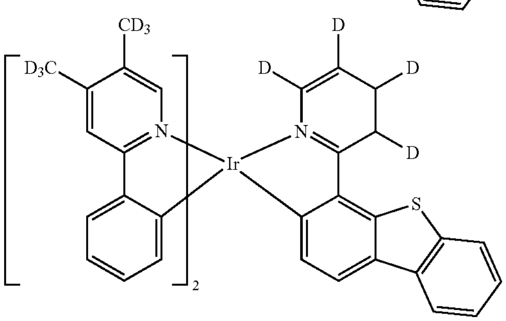
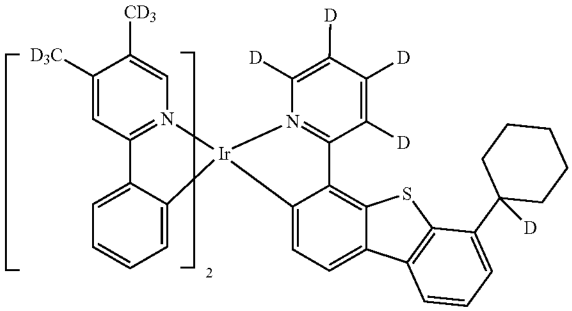
-continued
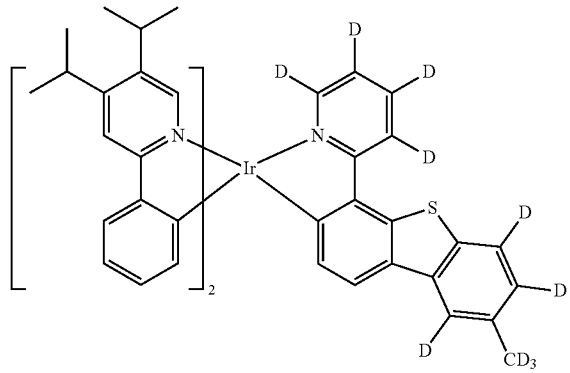
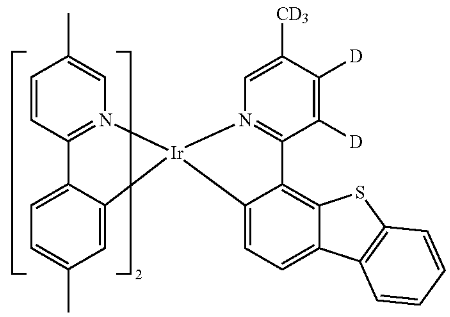
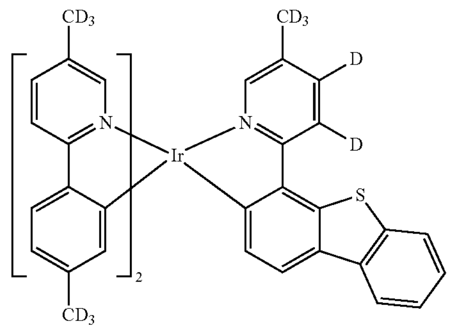
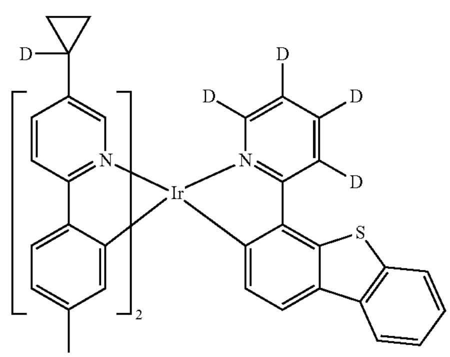
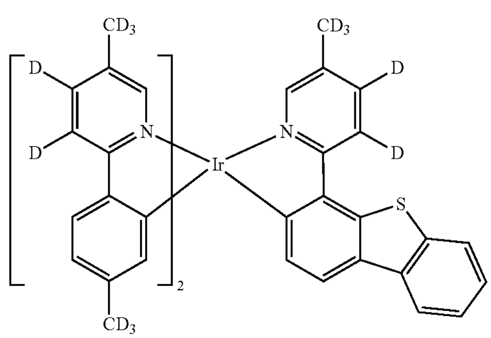

-continued
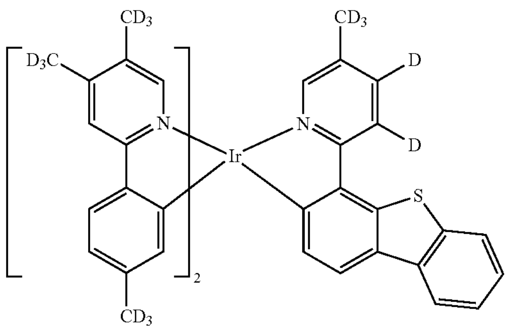
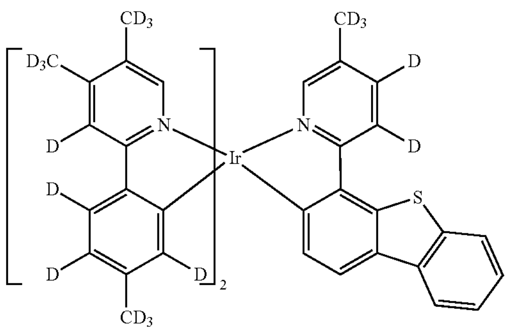
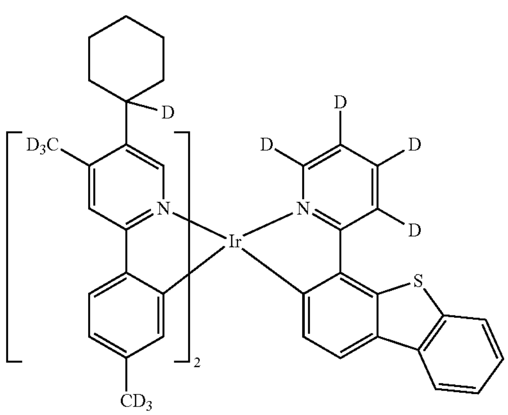
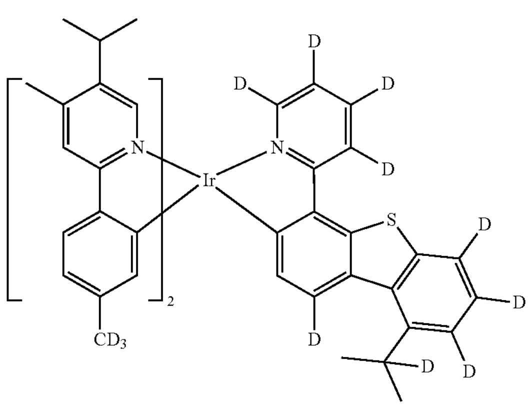
-continued
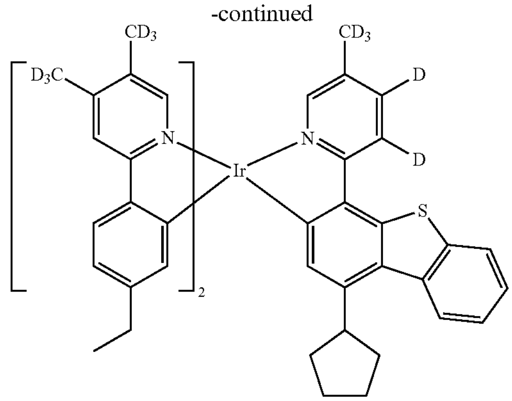
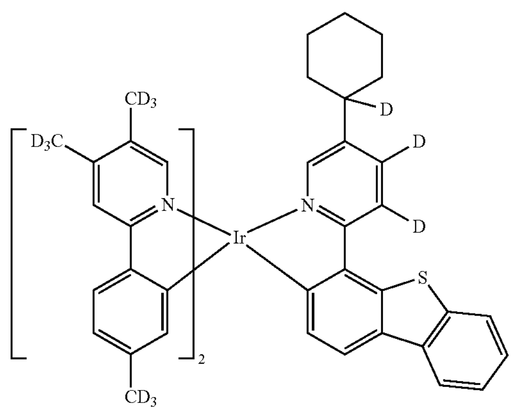
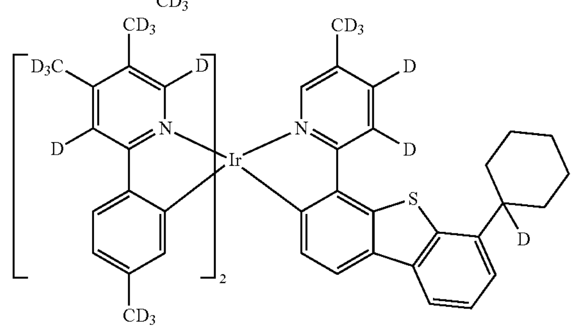
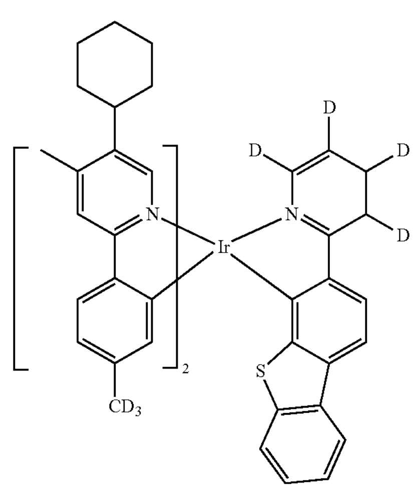

-continued
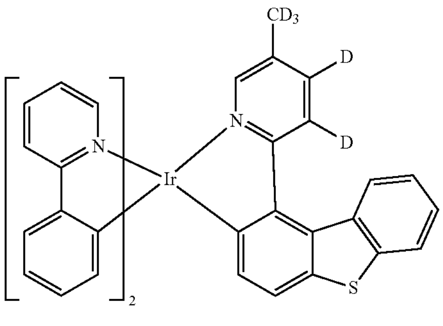
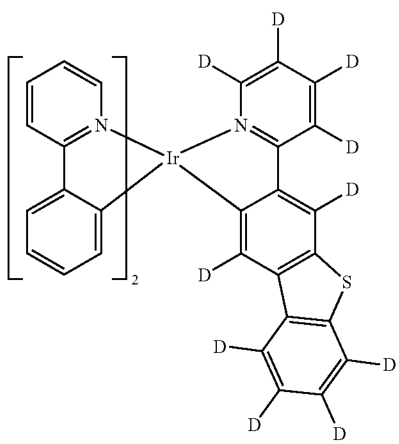
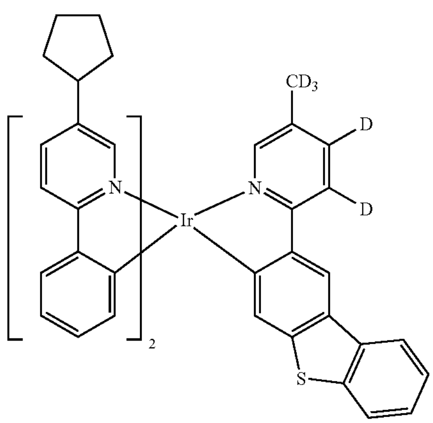
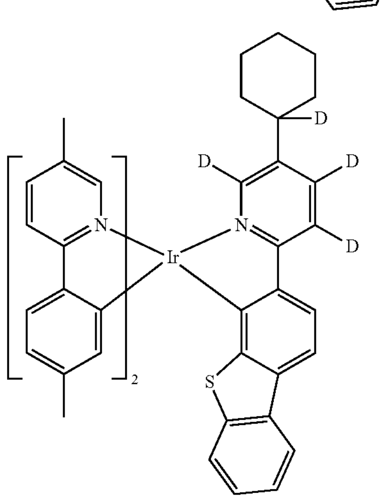
-continued
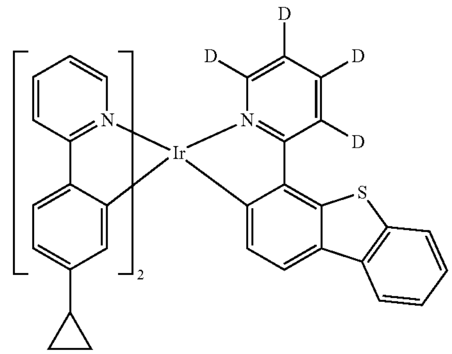
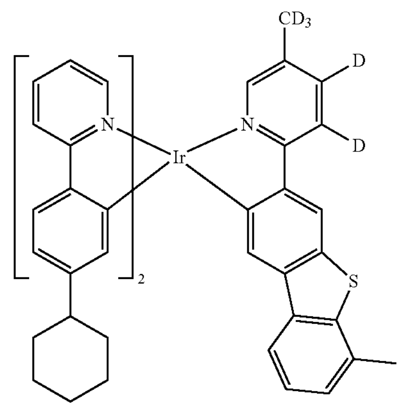
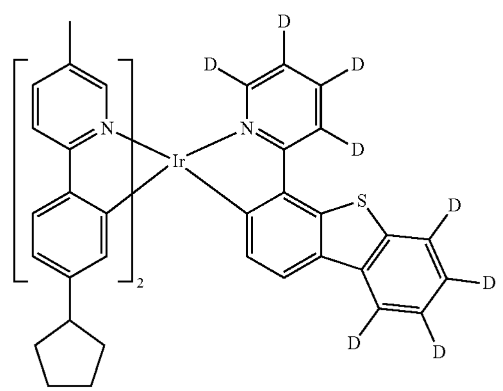
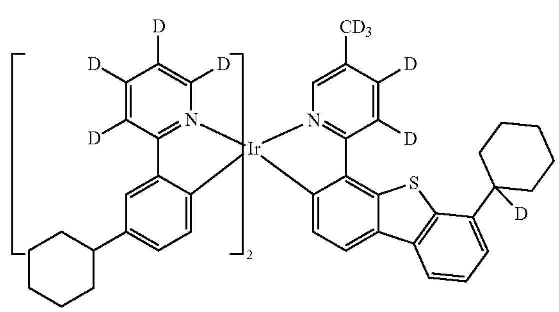

-continued
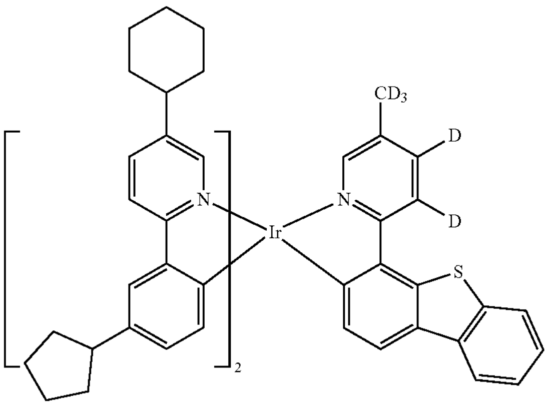
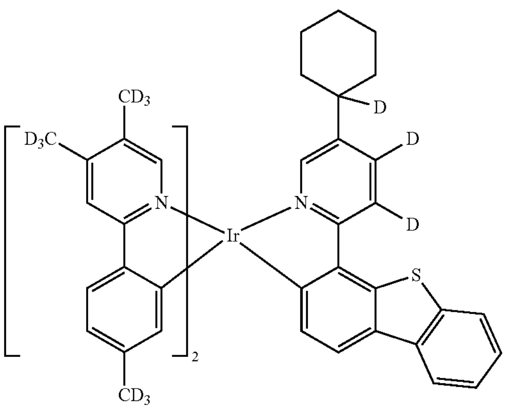
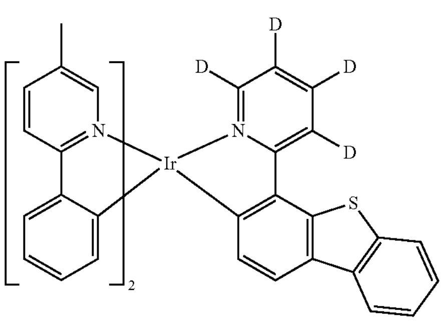
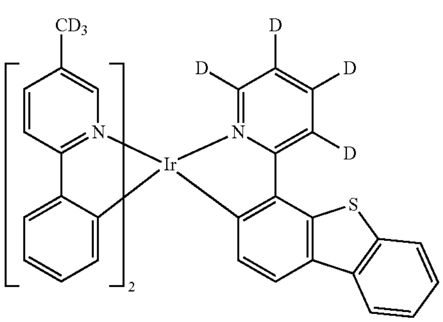
-continued
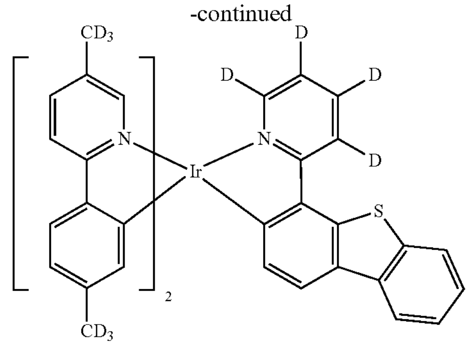
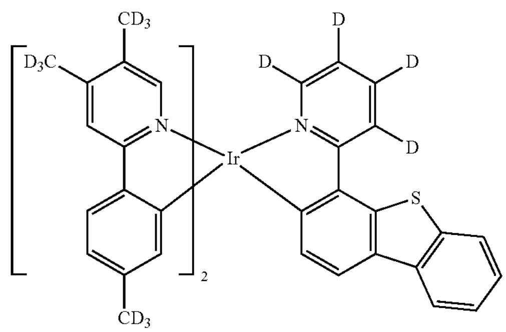
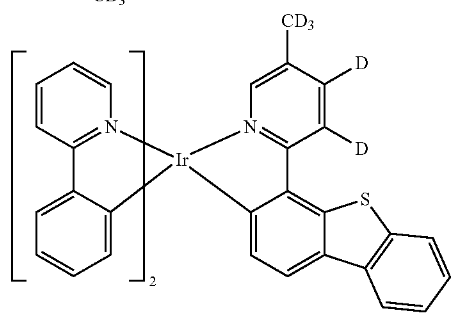
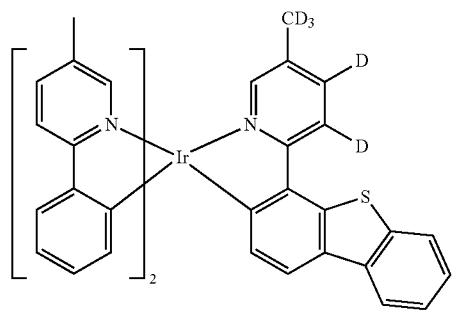
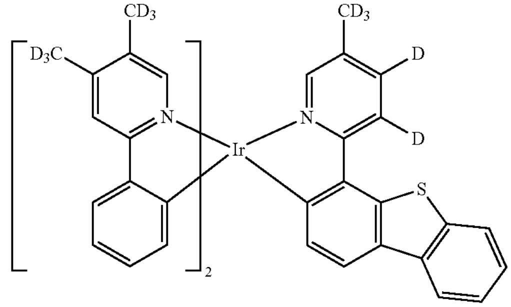

-continued
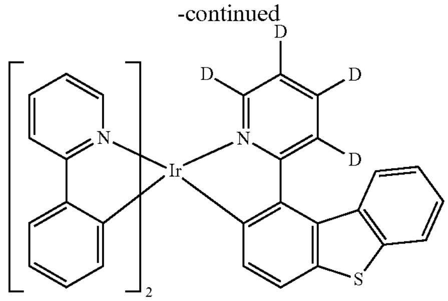
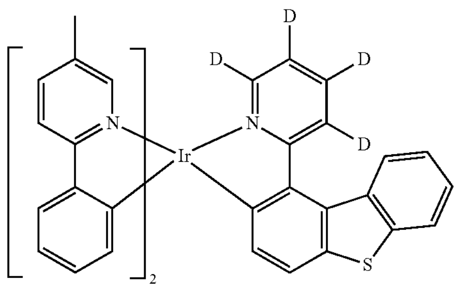
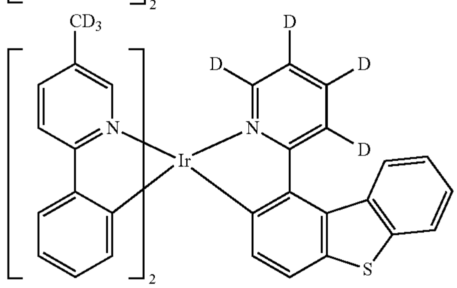
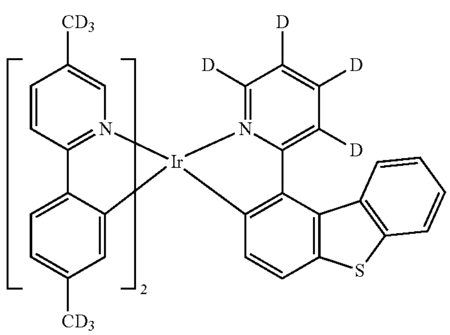
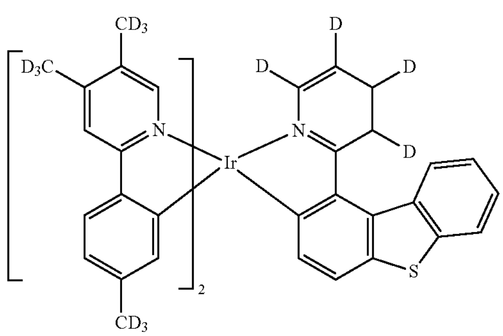
-continued
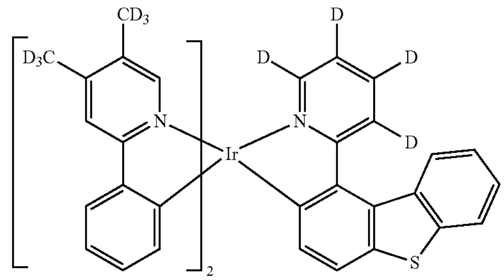
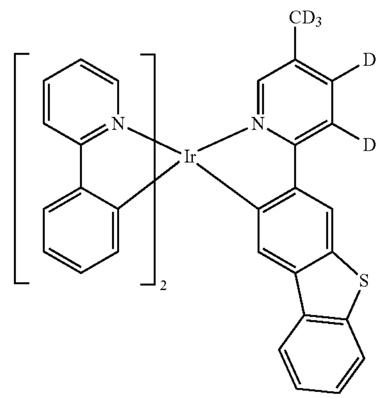
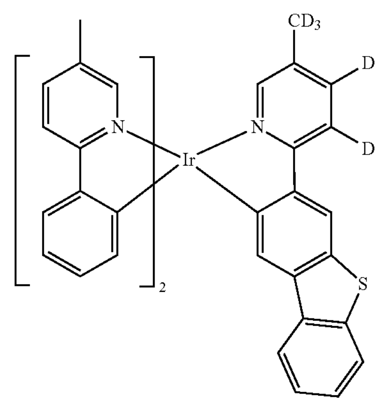
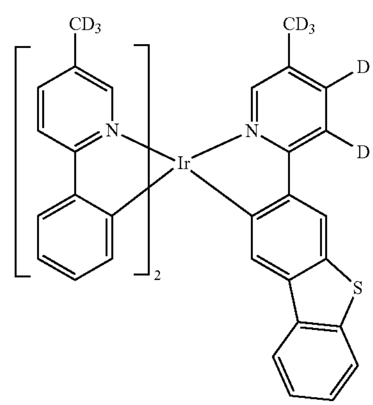

-continued
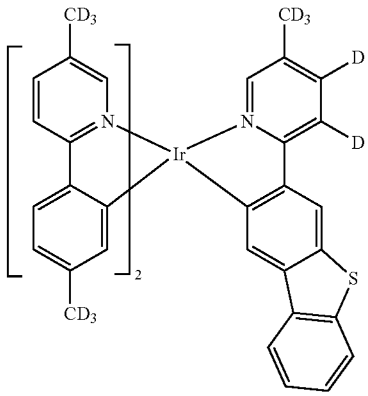
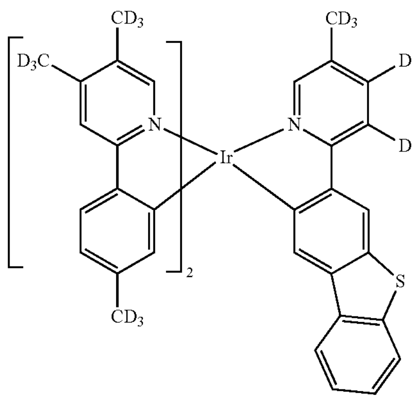
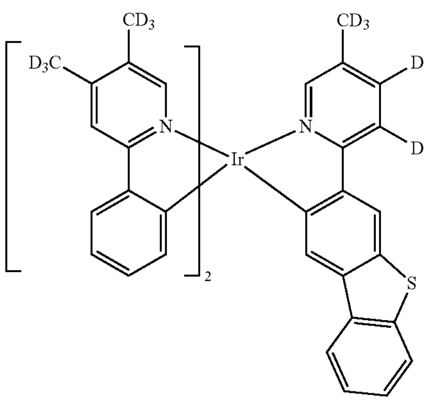
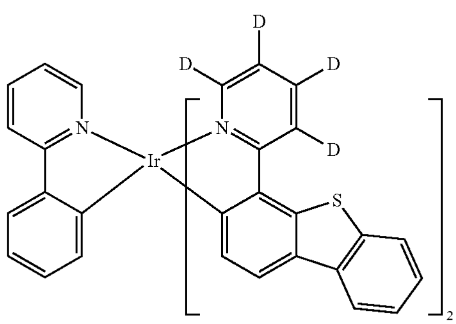
-continued
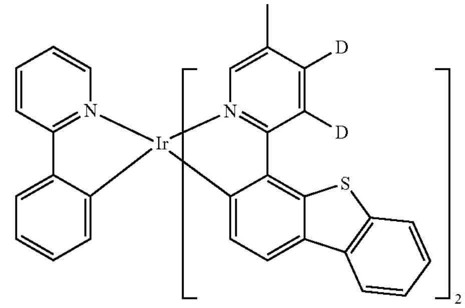
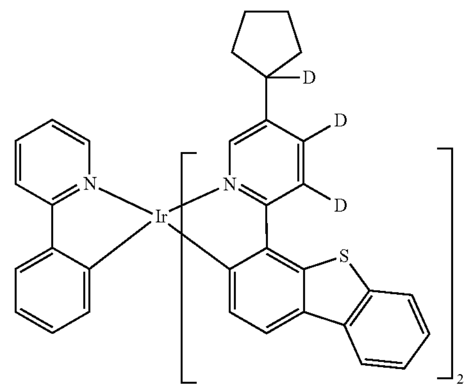
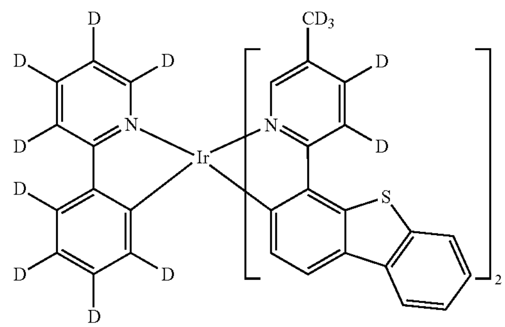
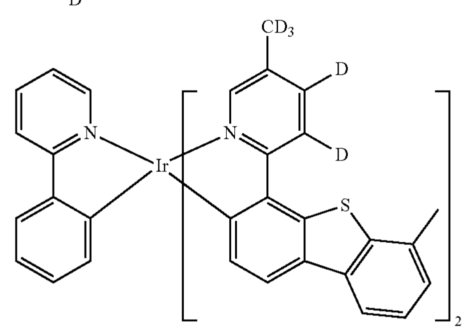
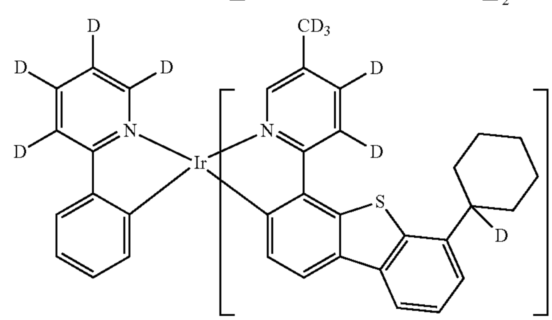

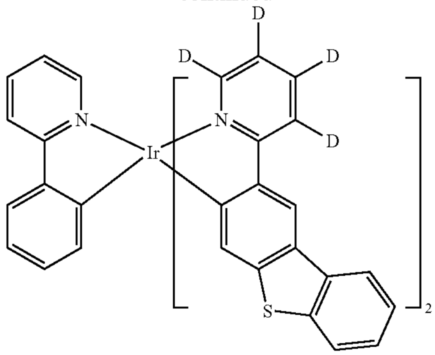
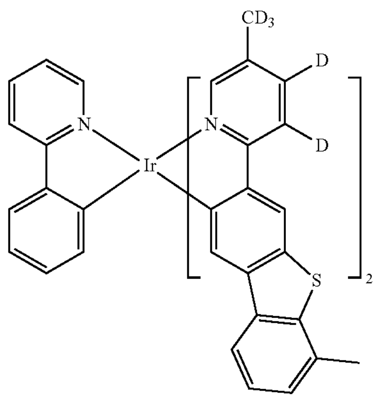
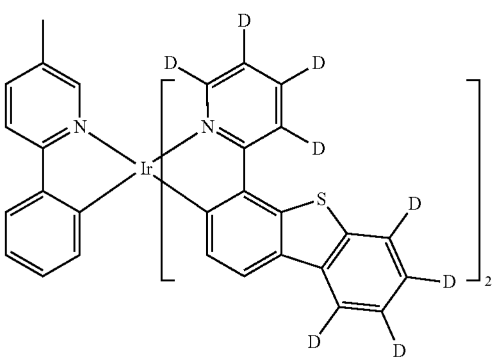
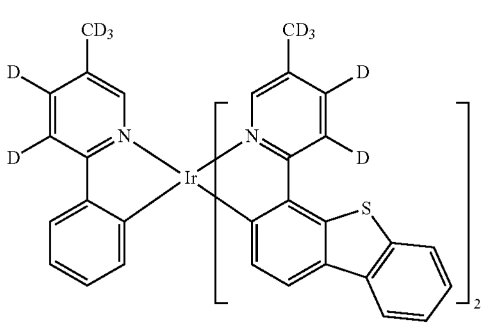
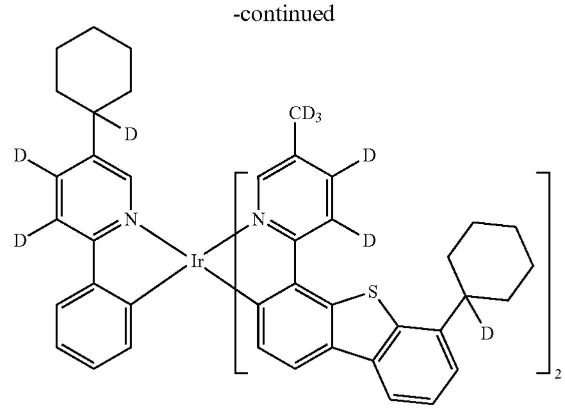
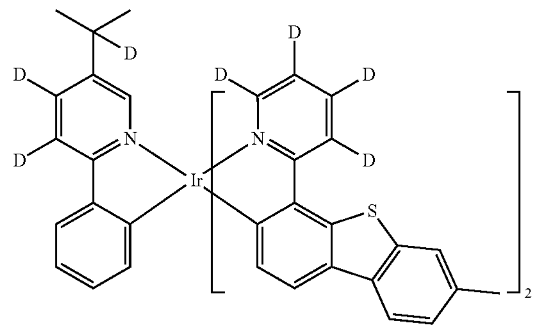
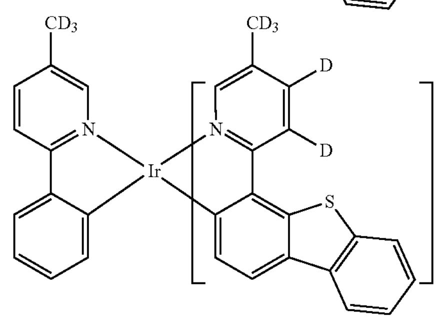
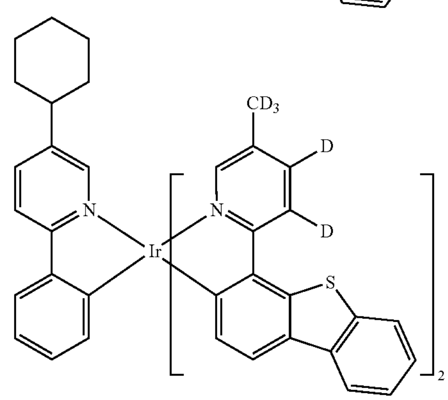
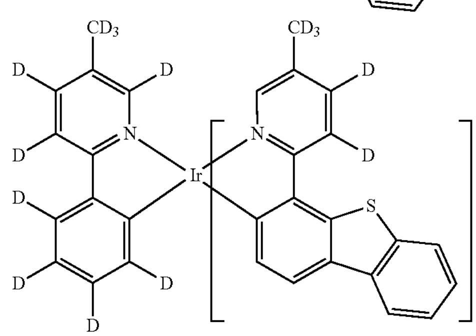

-continued
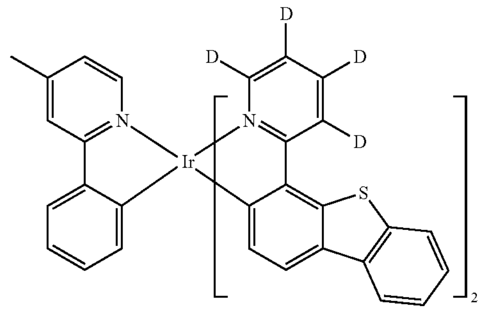
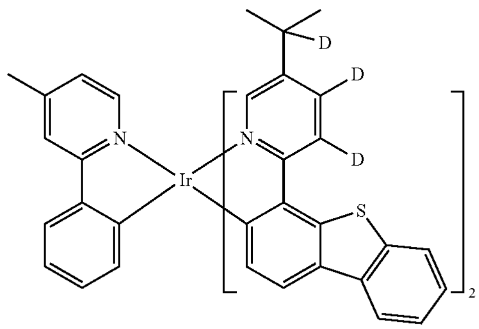
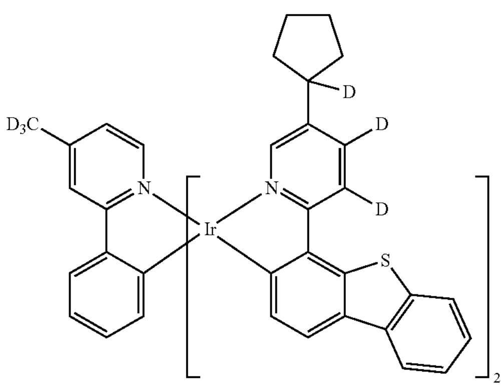
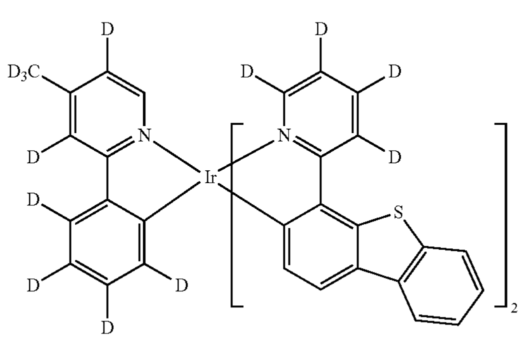
-continued
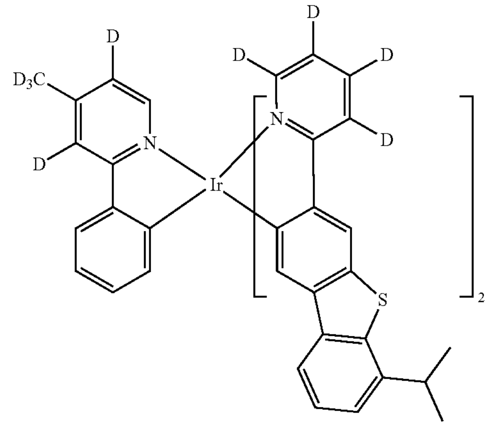
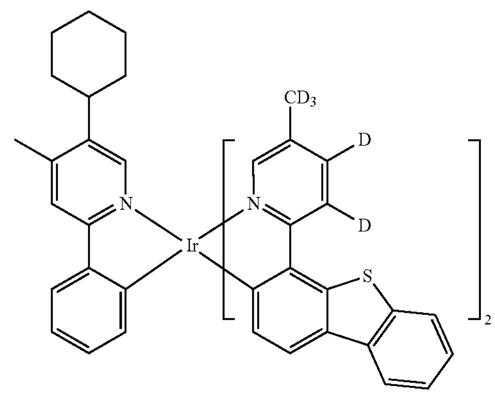
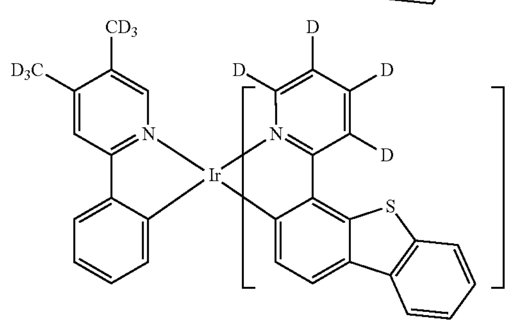
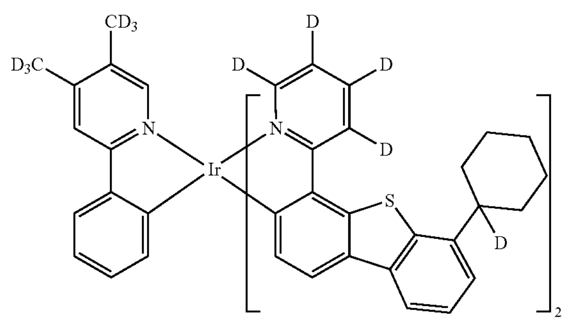

-continued
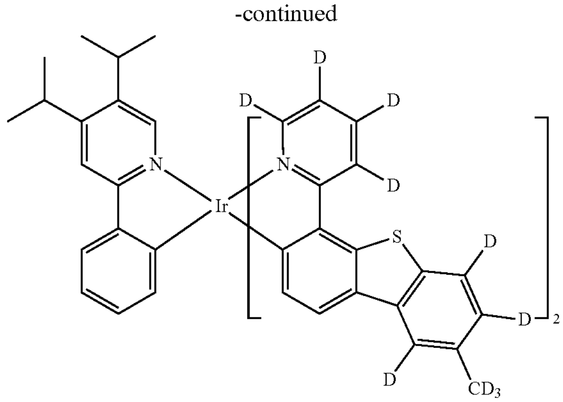
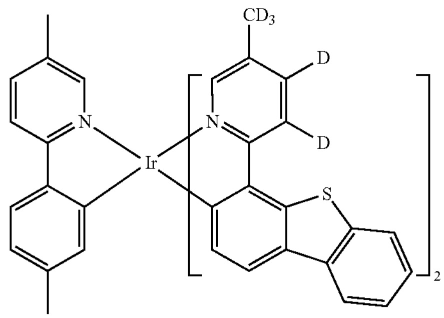
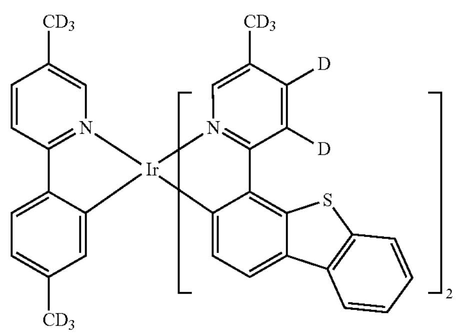
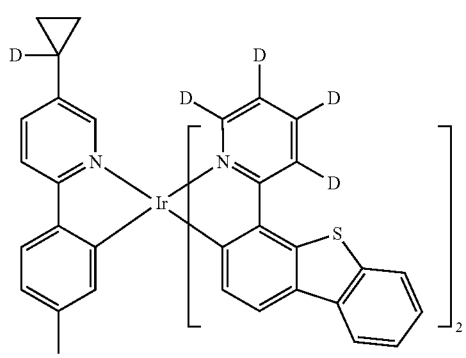
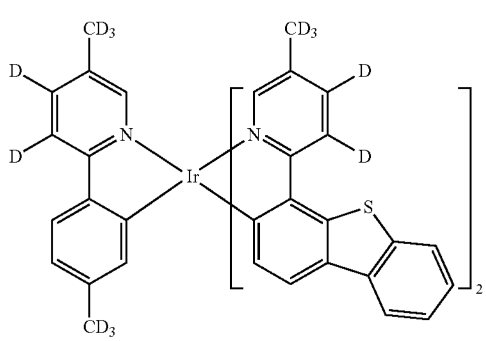
-continued
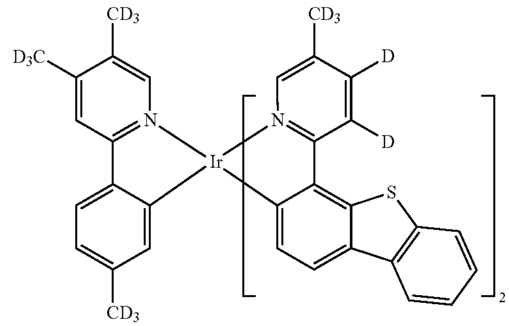
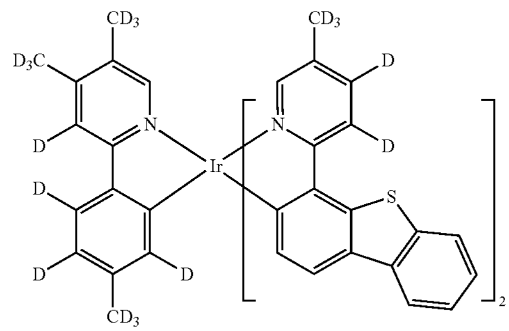
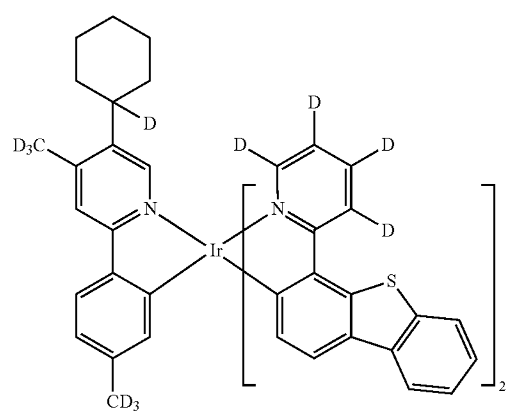
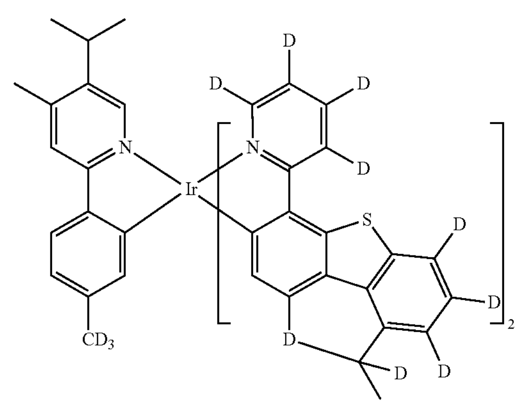

-continued
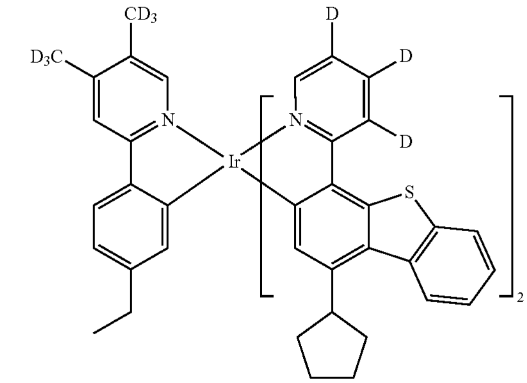
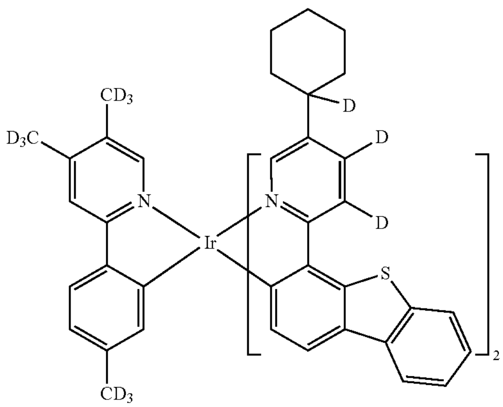
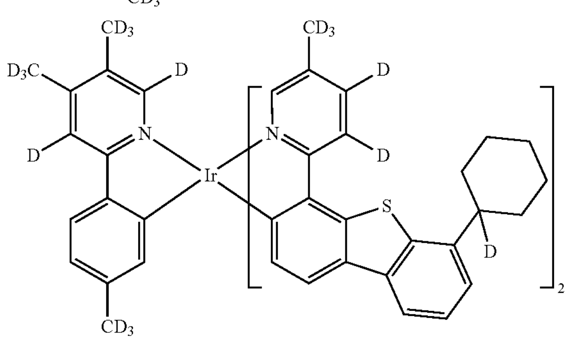
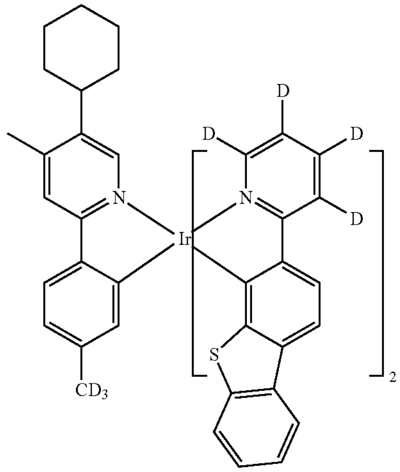
-continued
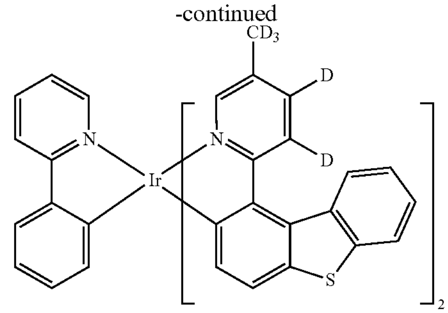
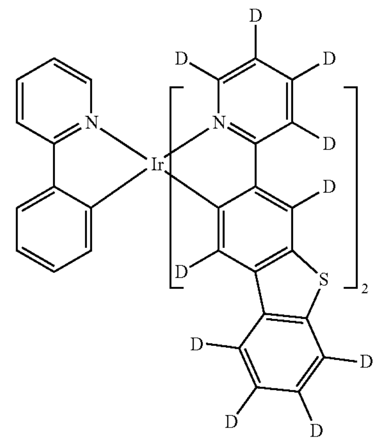
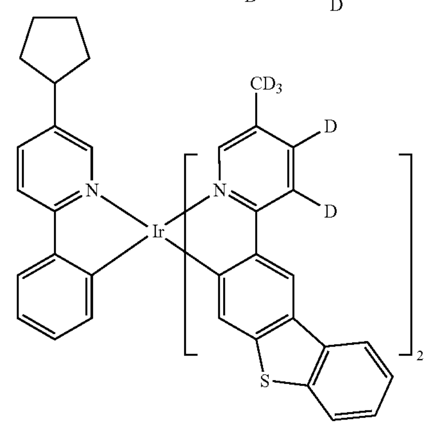
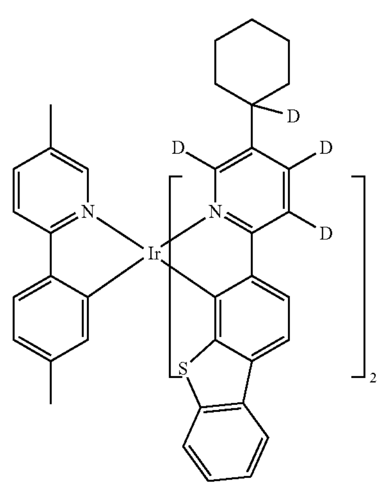

-continued
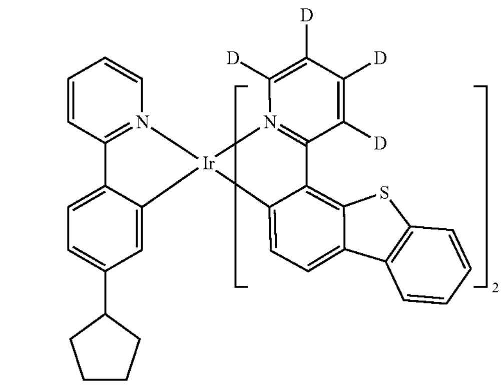
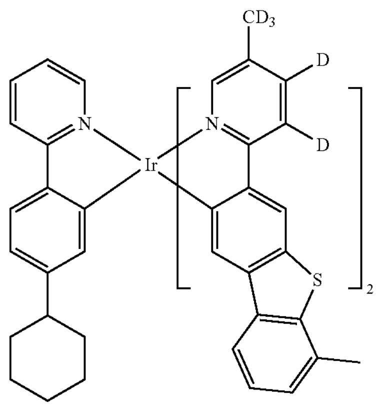
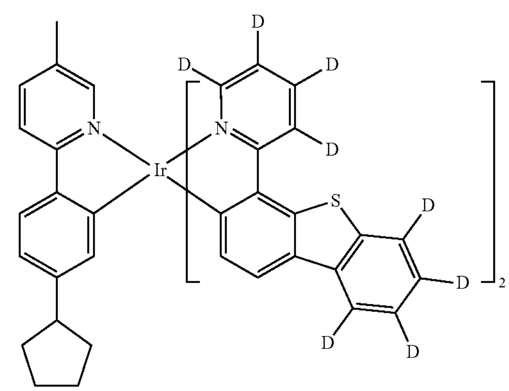
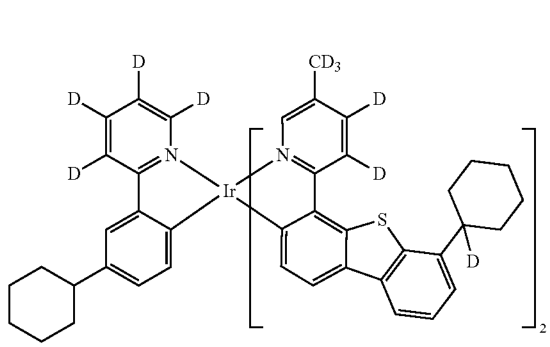
-continued
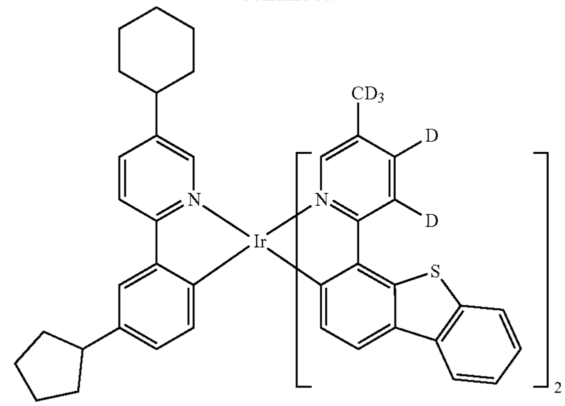
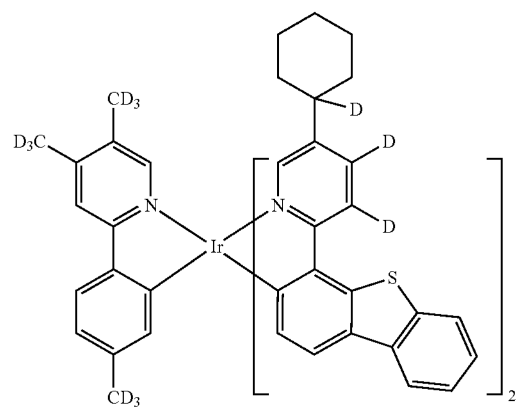
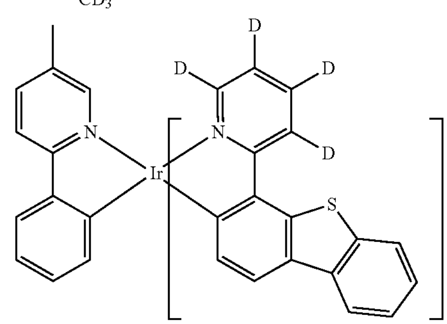
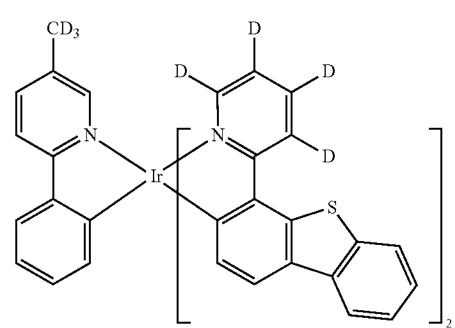

-continued
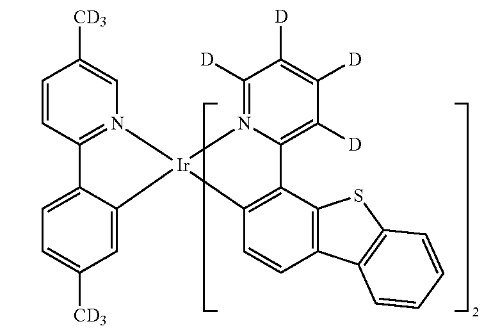
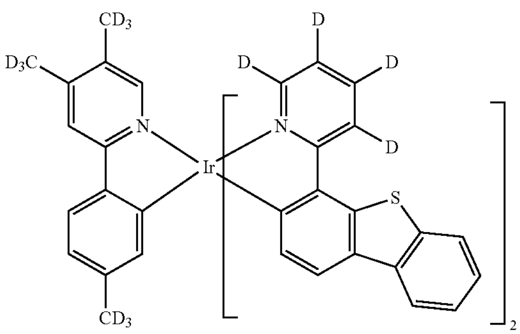
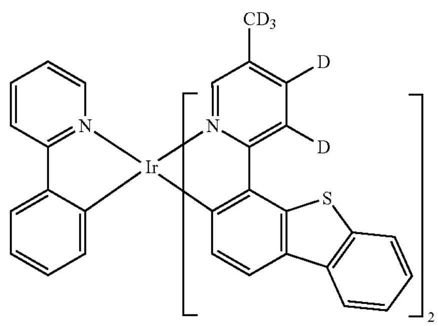
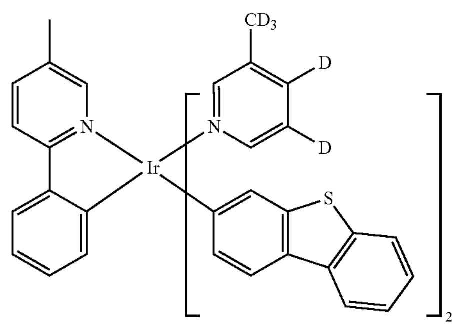
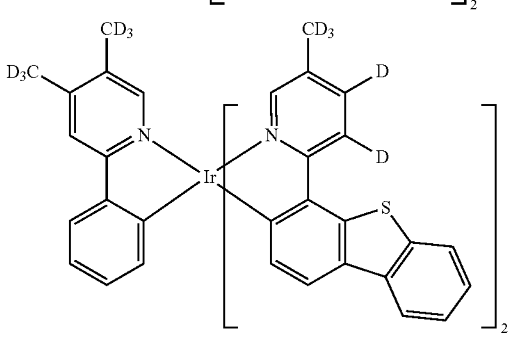
-continued
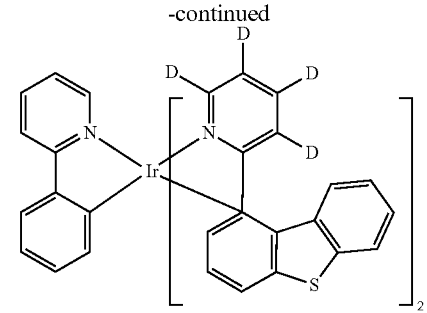
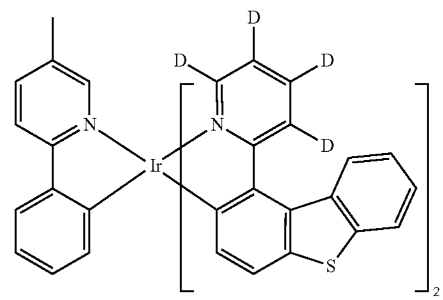
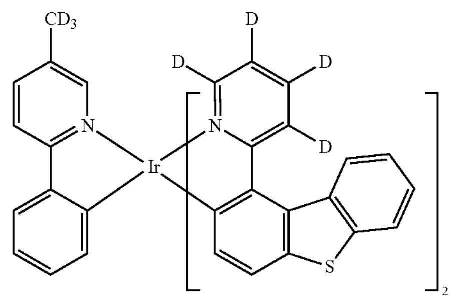
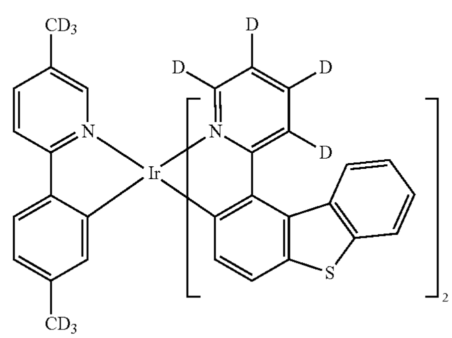
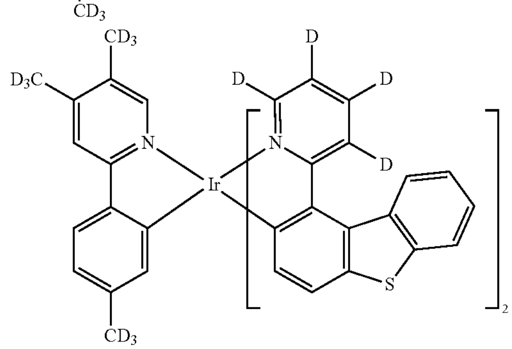

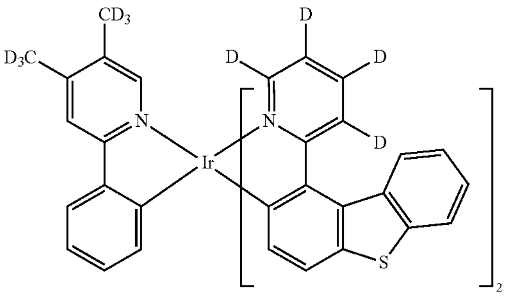
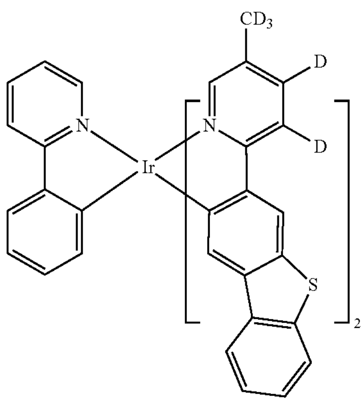
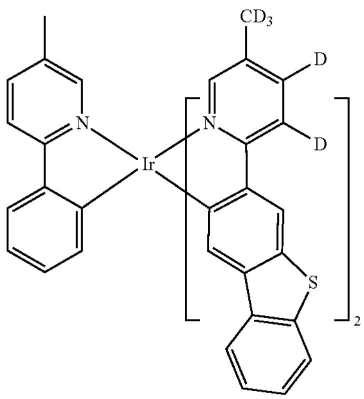
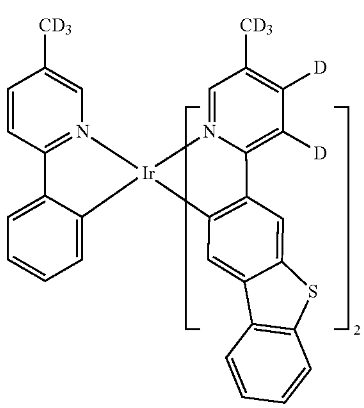
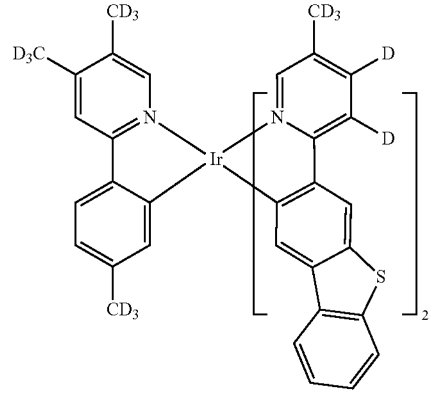
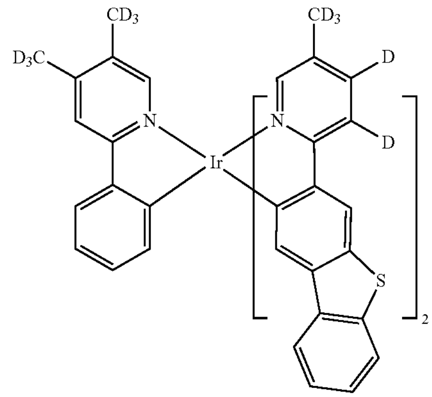
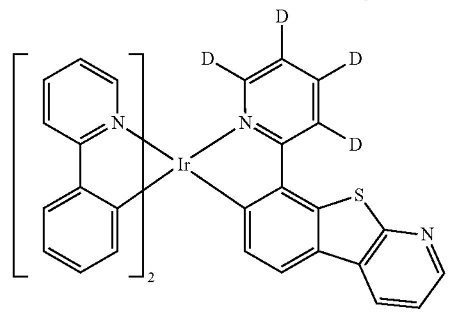
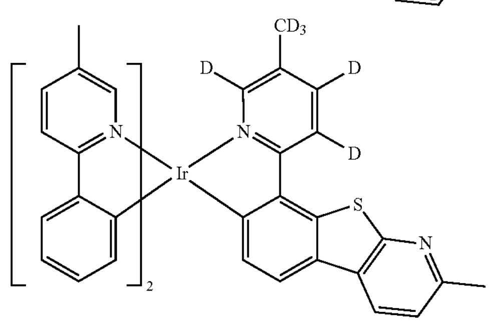
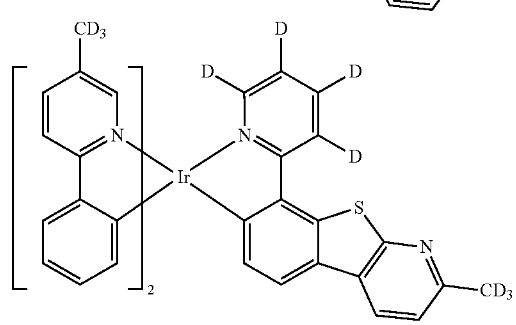

-continued
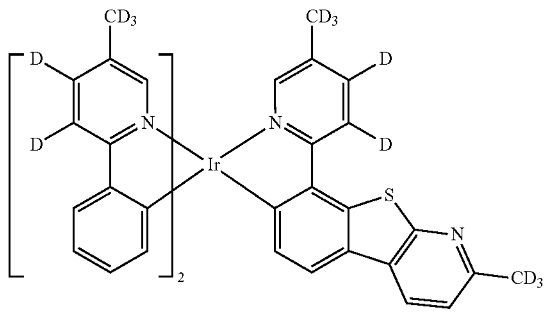
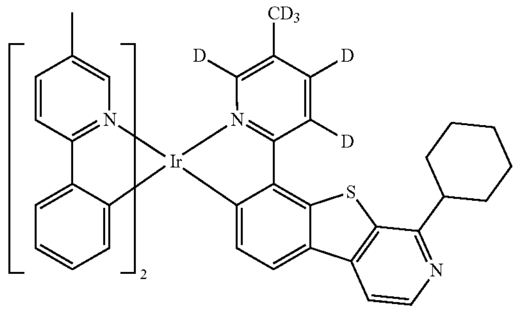
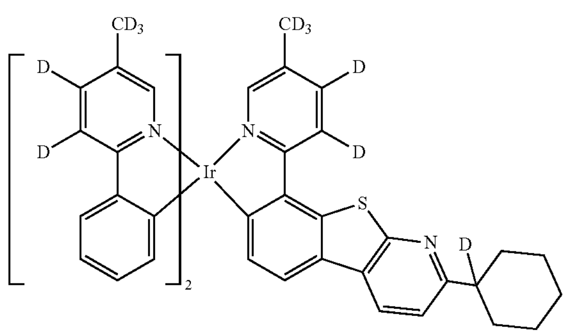
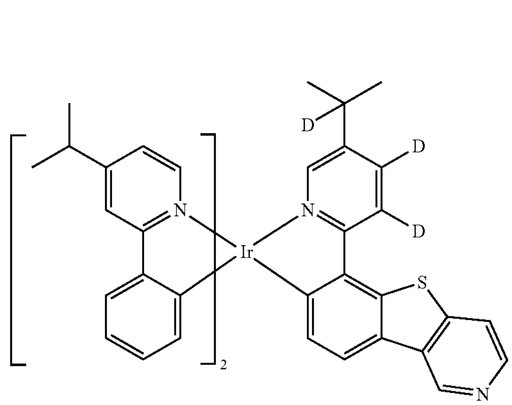
-continued
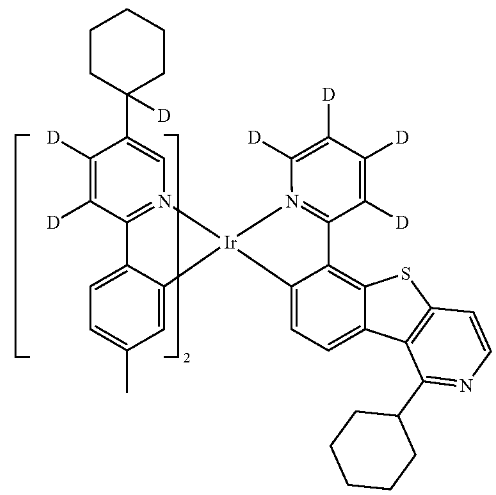
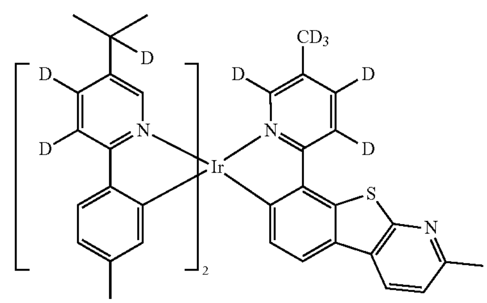
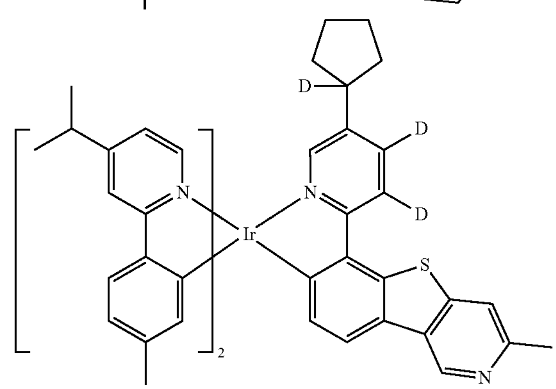
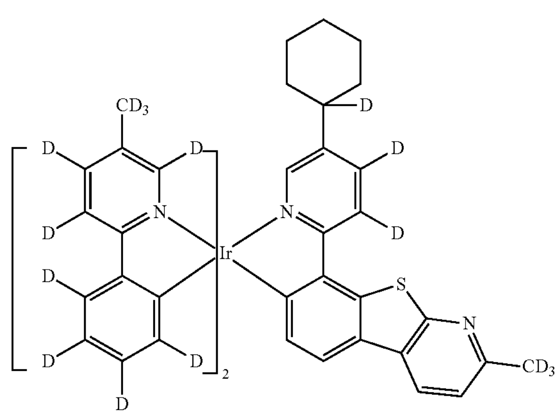

-continued
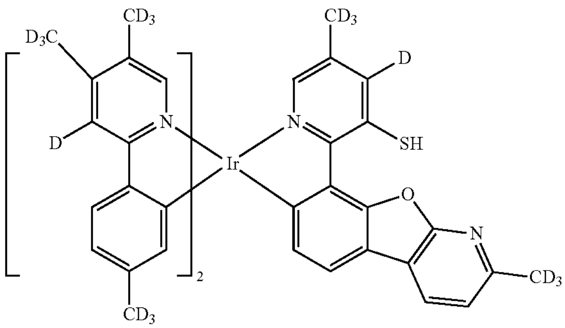
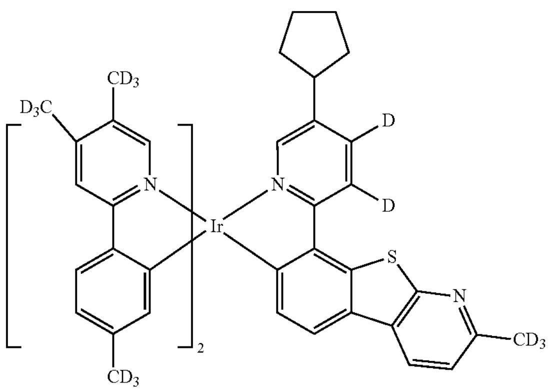
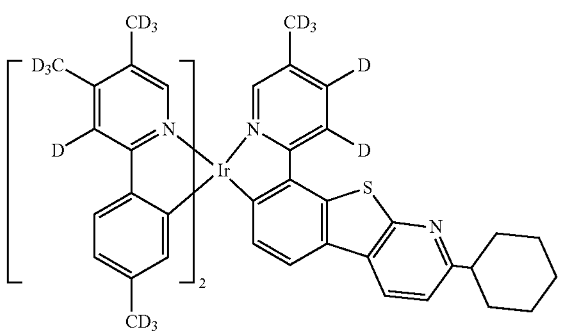
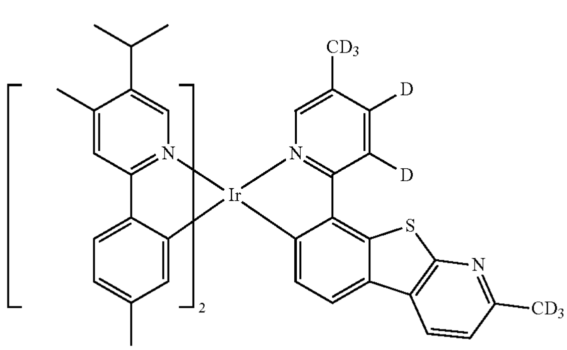
-continued
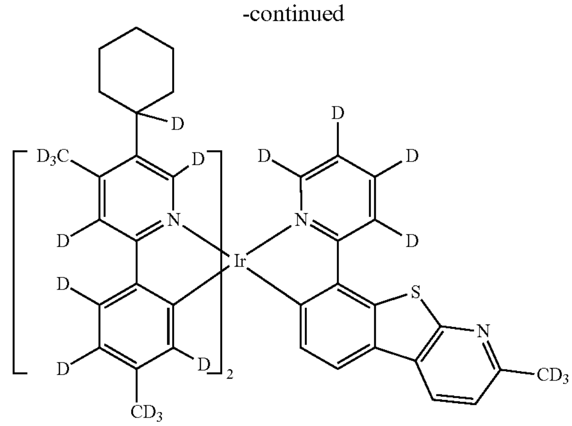
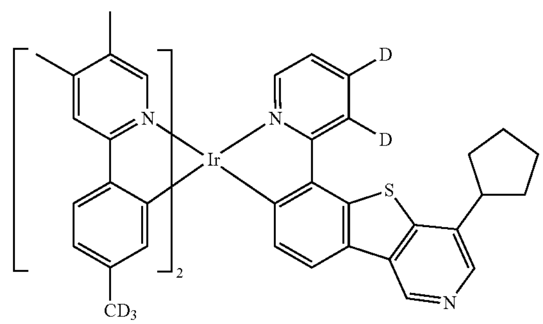
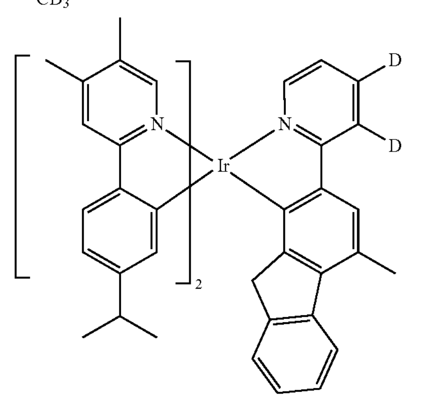
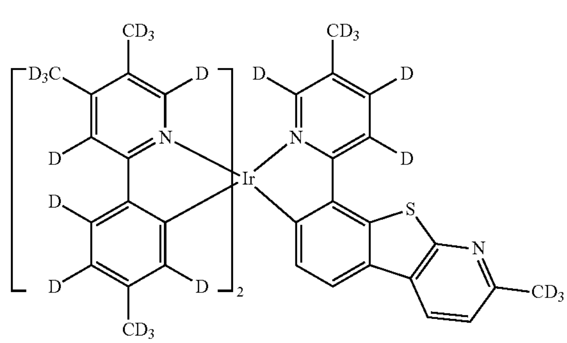

-continued
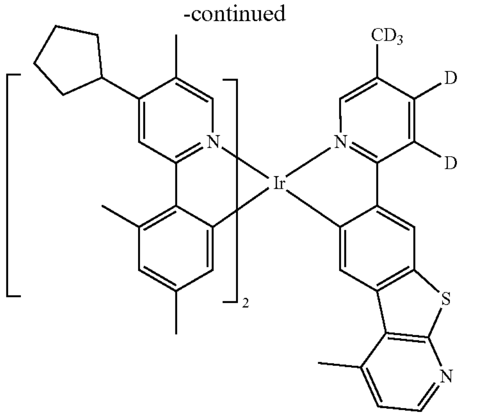
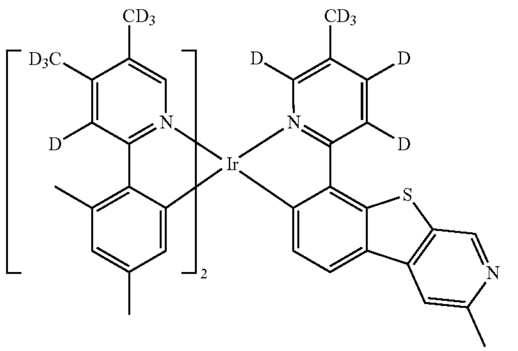
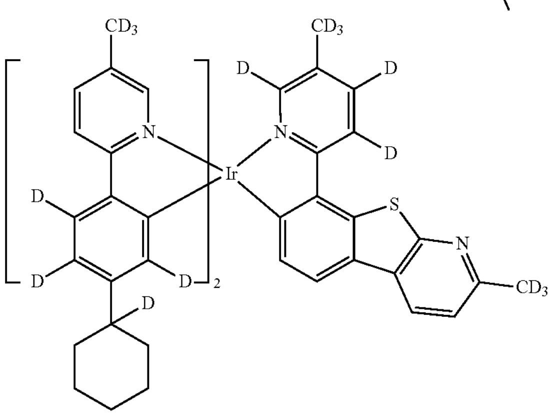
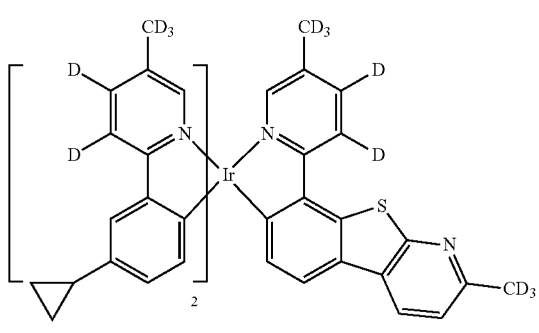
-continued
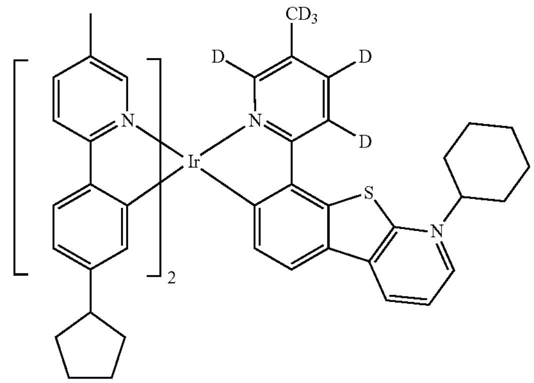
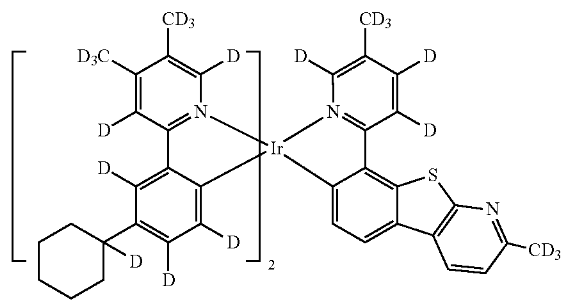
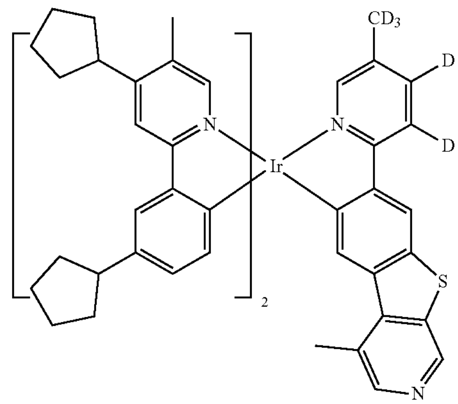
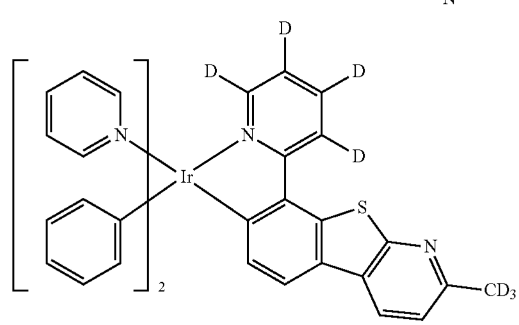
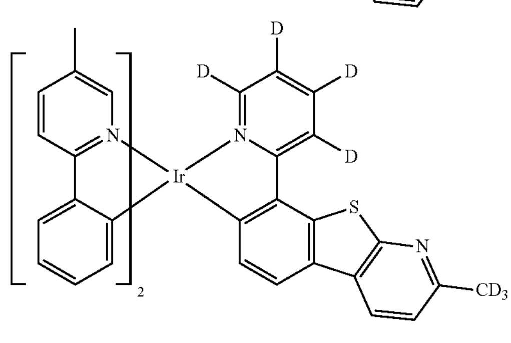

-continued
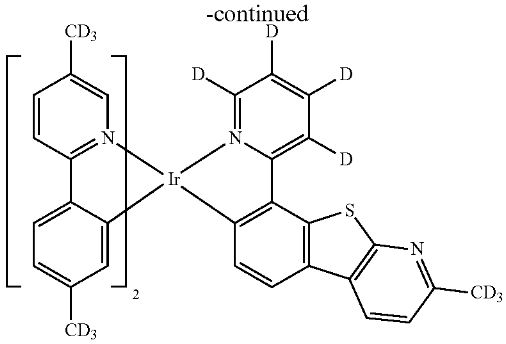
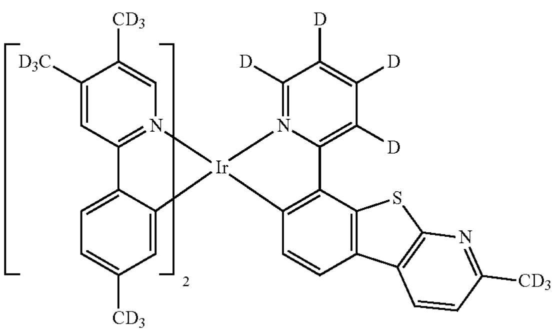
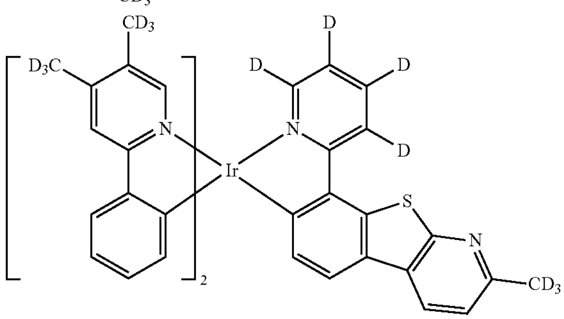
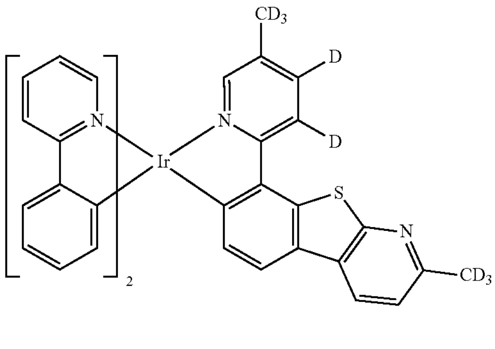
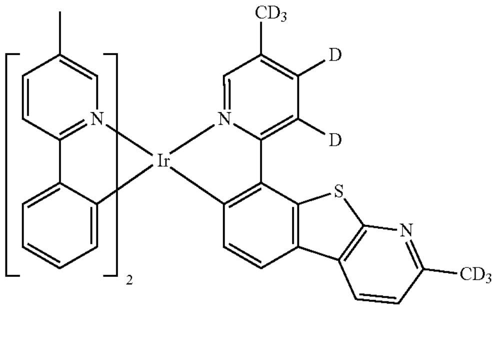
-continued
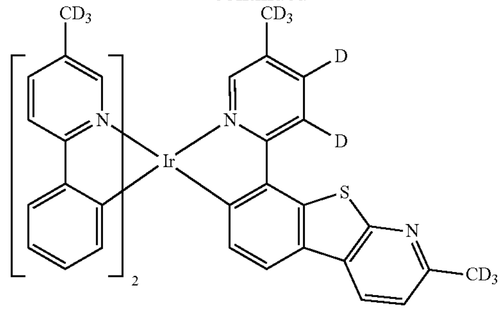
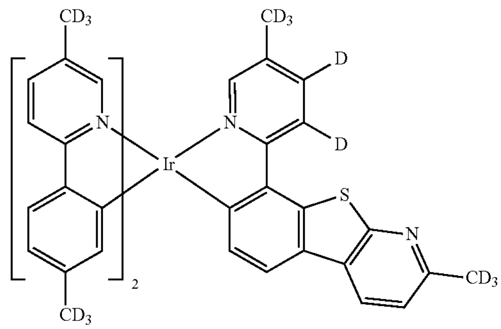
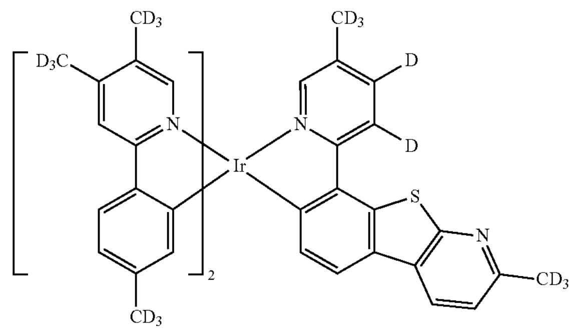
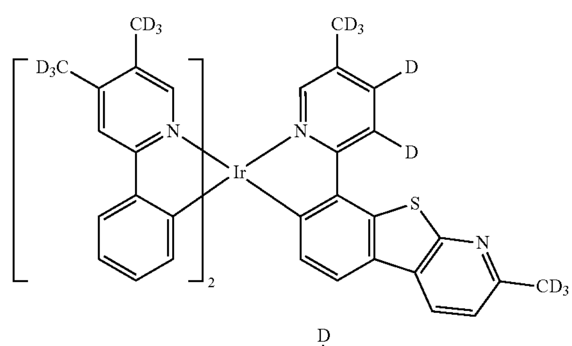
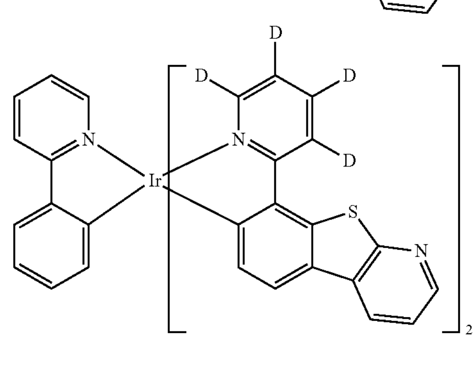

-continued
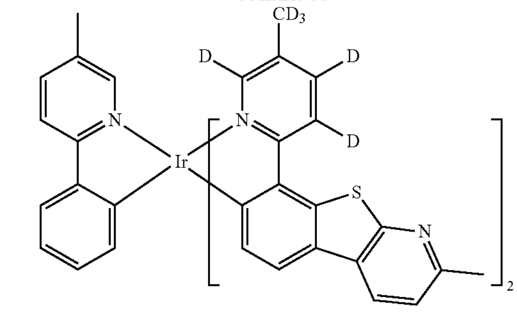
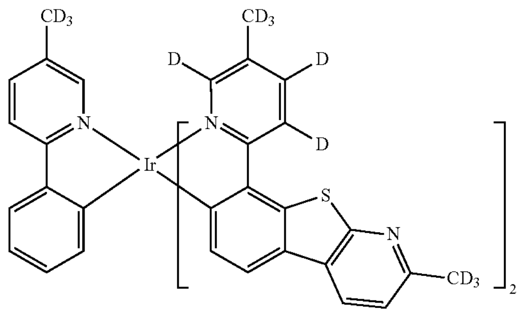
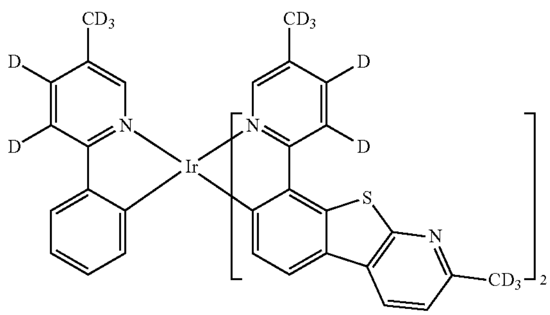
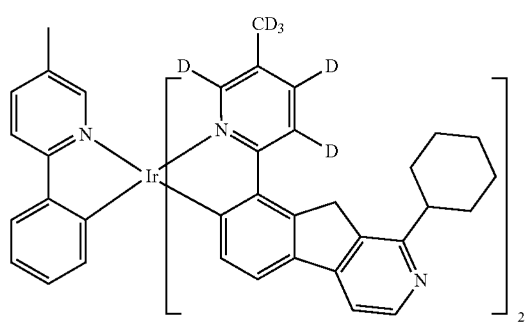
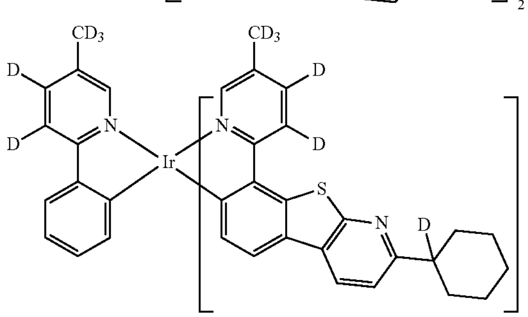
-continued
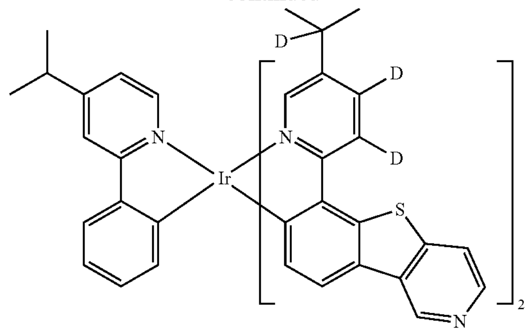
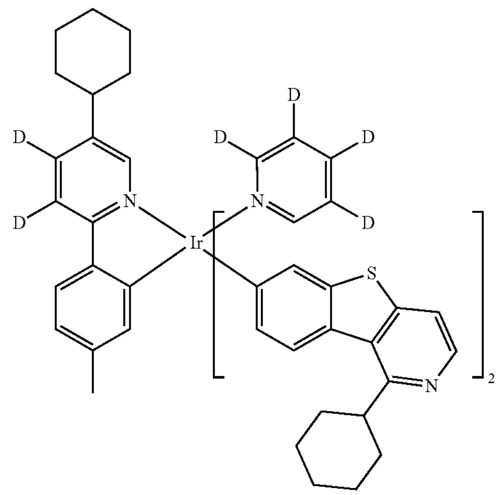
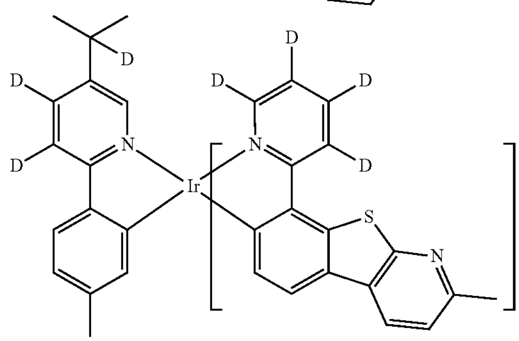
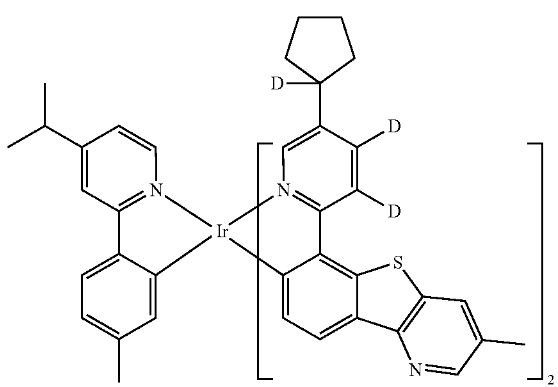

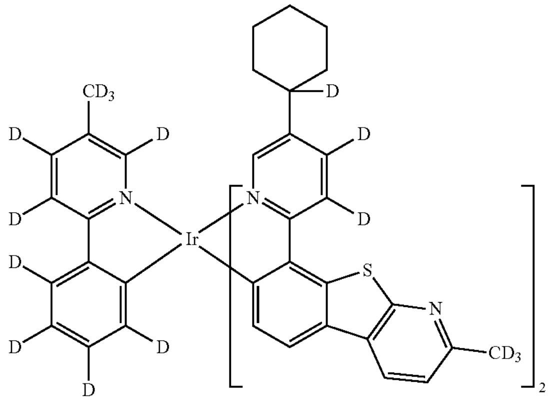
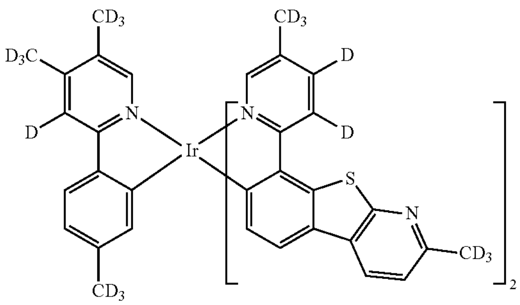
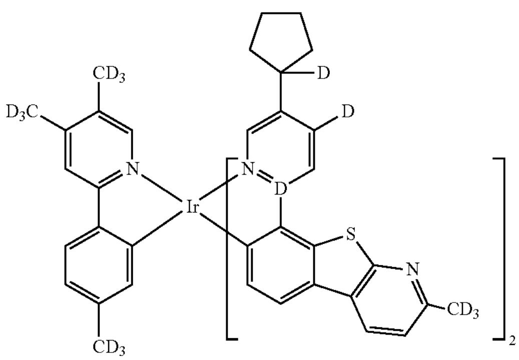
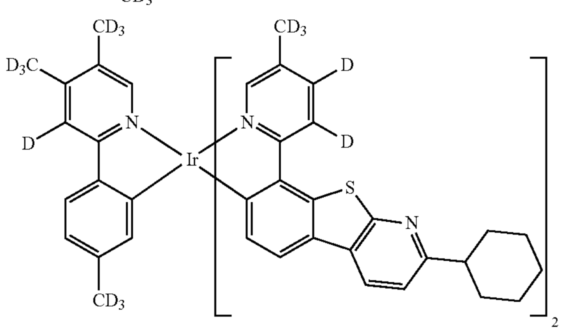
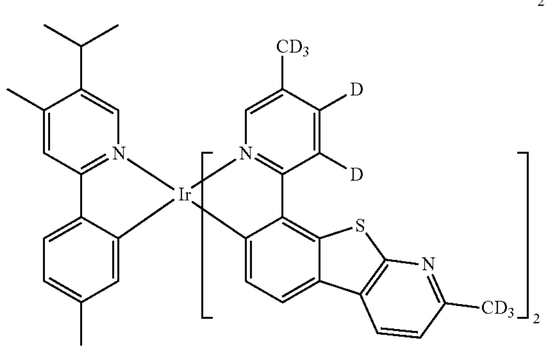
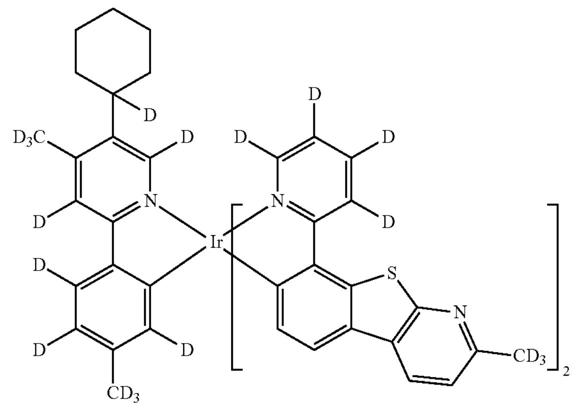
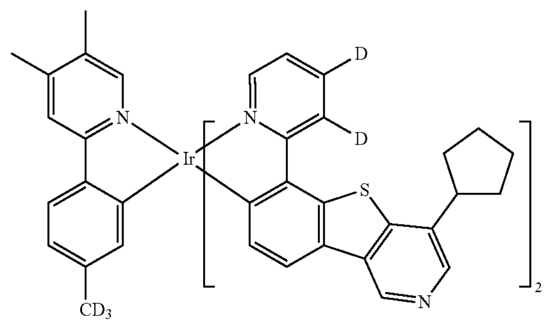
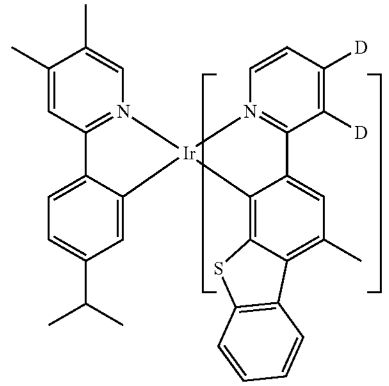
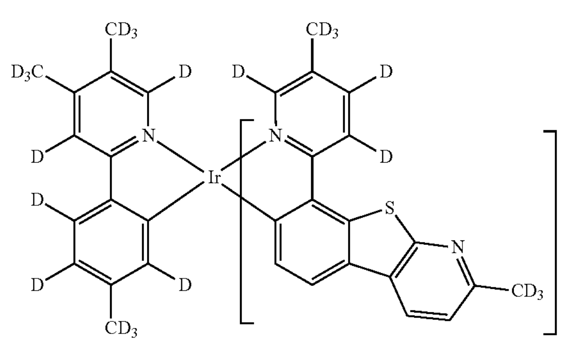

-continued
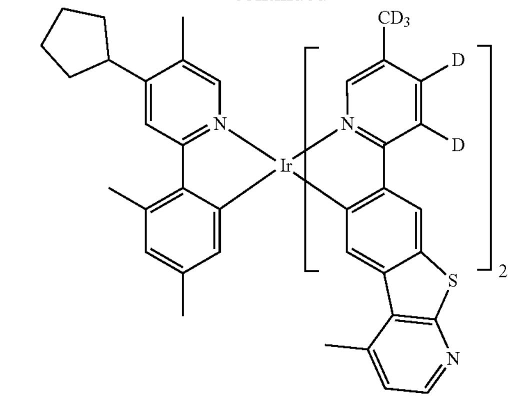
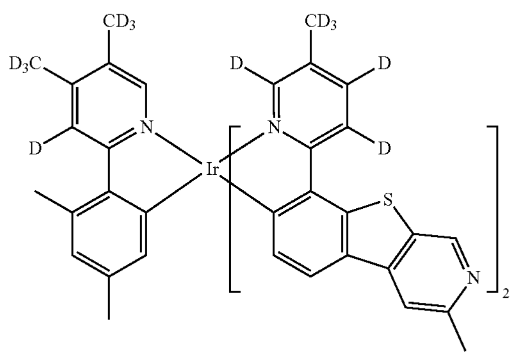
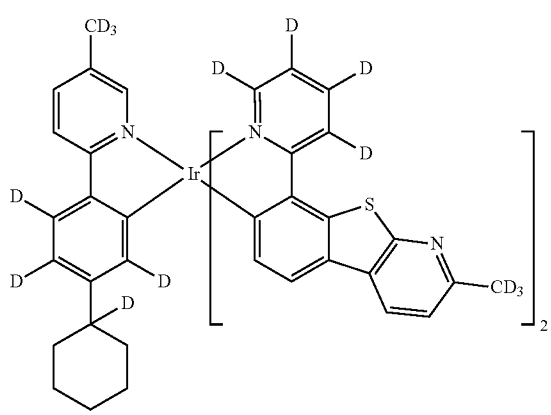
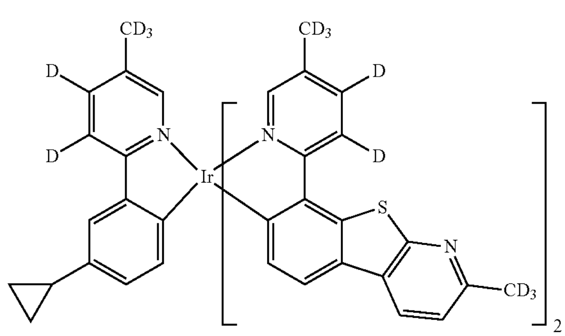
-continued
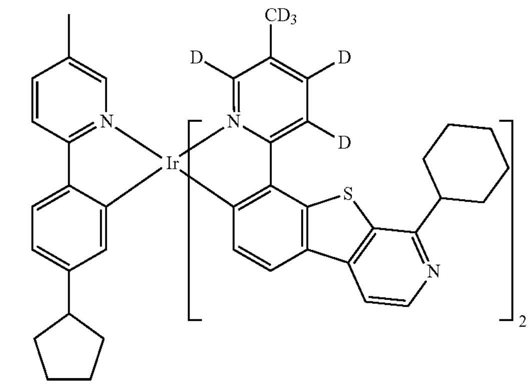
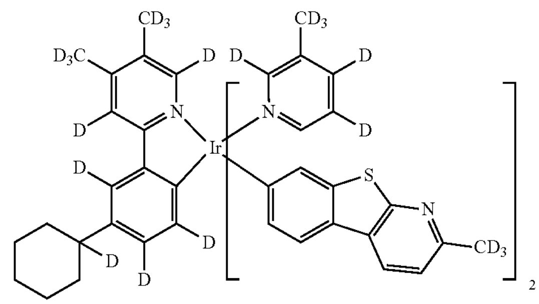
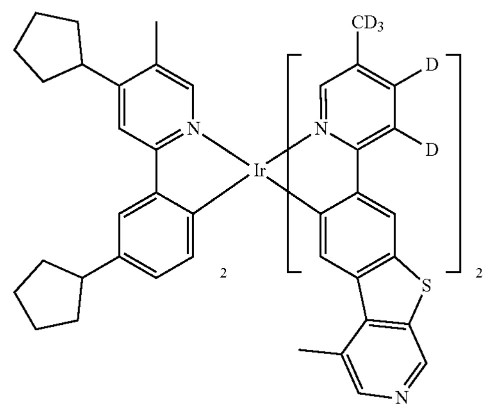
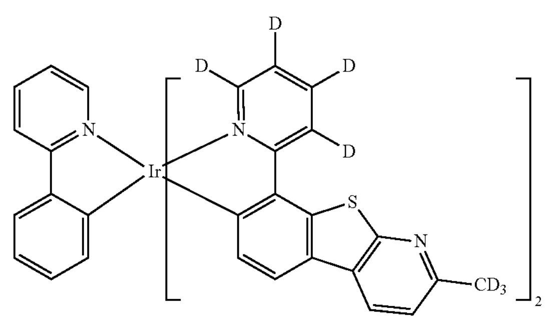
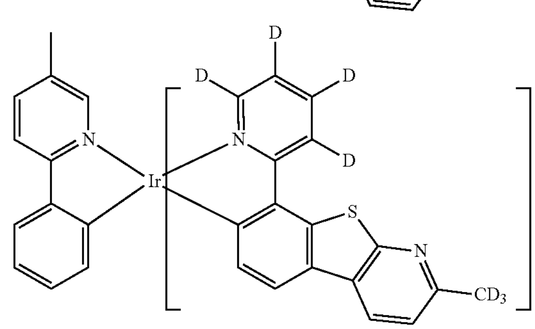

-continued
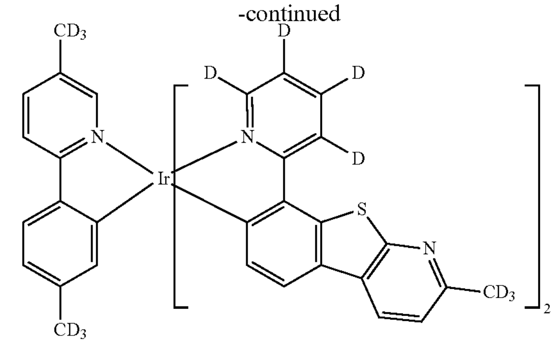
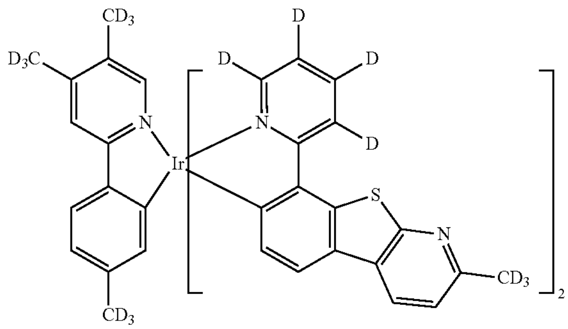
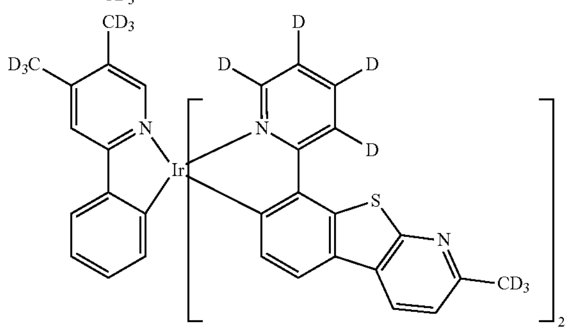
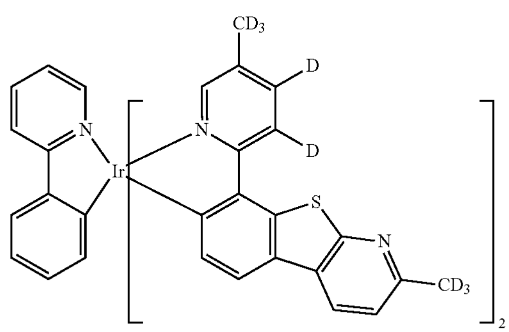
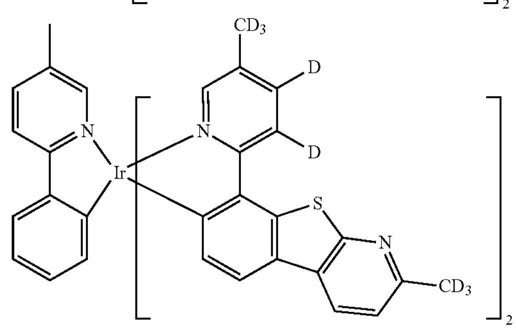
-continued
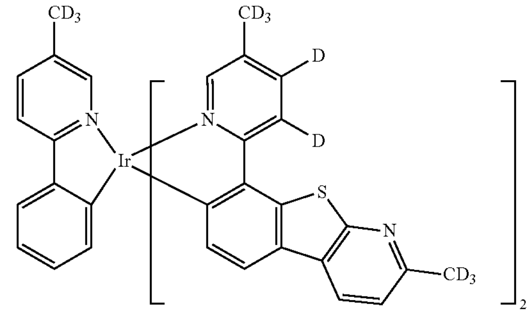
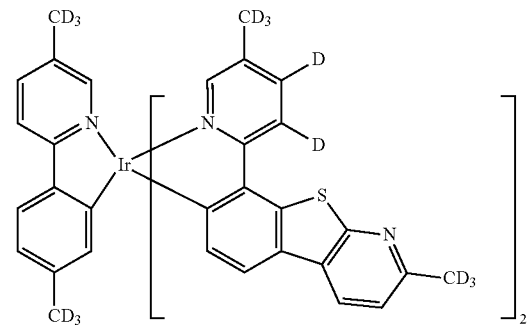
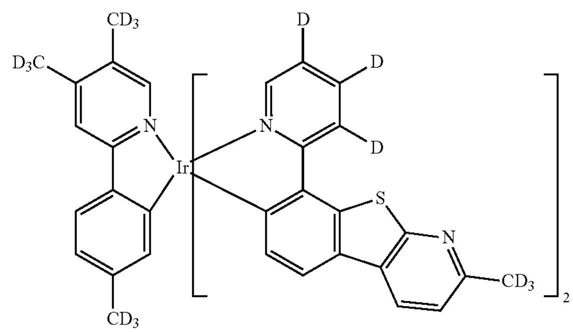
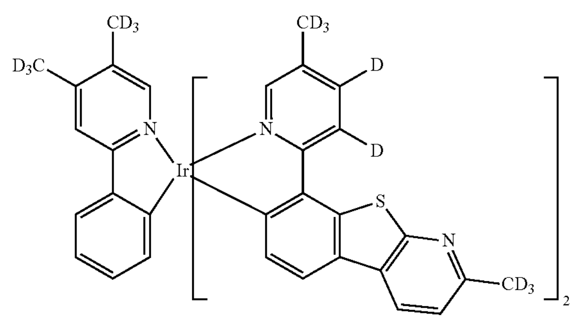
In another embodiment of the invention, provided is a method for preparing a compound of Chemical Formula 1 as shown in the following reaction scheme 1.

[Reaction Scheme 1]

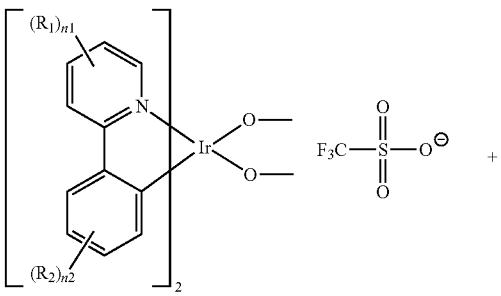

1-a

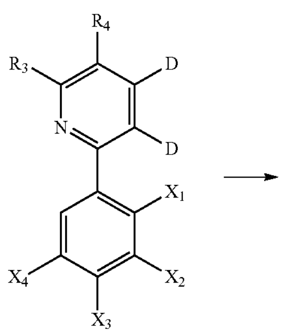

1-b

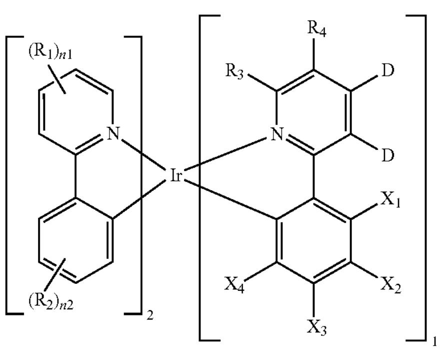

1 (n = 2)

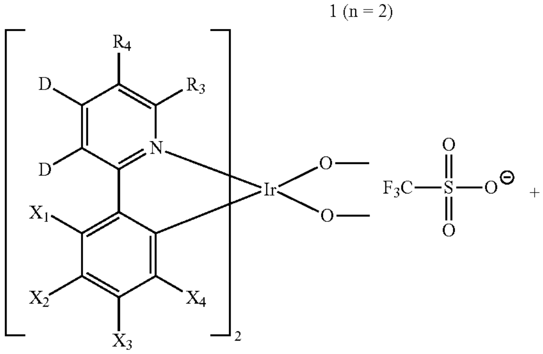

1-c

-continued

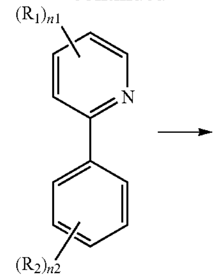

1-d

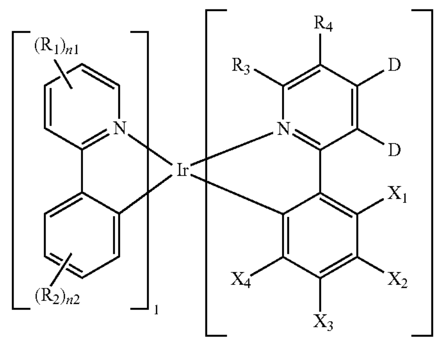

1 (n = 1)

The above preparation method can be further specified in Preparation Examples to be described later.

In still another embodiment of the invention, there is provided an organic light emitting device including a compound of Chemical Formula 1. As an example, there is provided an organic light emitting device including: a first electrode; a second electrode provided opposite to the first electrode; and one or more organic material layers provided between the first electrode and the second electrode, wherein one or more layers of the organic material layers includes the compound of Chemical Formula 1.

The organic material layer of the organic light emitting device of the present invention can have a single layer structure, or it can have a multilayered structure in which two or more organic material layers are stacked. For example, the organic light emitting device of the present disclosure can have a structure comprising a hole injection layer, a hole transport layer, a light emitting layer, an electron transport layer, an electron injection layer and the like as the organic material layer. However, the structure of the organic light emitting device is not limited thereto, and it can include a smaller number of organic layers.

Further, the organic material layer can include a light emitting layer, wherein the light emitting layer includes a compound of Chemical Formula 1. In particular, the compound according to the present invention can be used as a dopant in a light emitting layer.

Further, the organic material layer can include an electron transport layer, or an electron injection layer, wherein the electron transport layer, or the electron injection layer includes a compound of Chemical Formula 1.

Further, the electron transport layer, the electron injection layer, or a layer simultaneously performing electron transport and electron injection include a compound of Chemical Formula 1.

Further, the organic material layer includes a light emitting layer and an electron transport layer, wherein the electron transport layer can include a compound of Chemical Formula 1.

Further, the organic light emitting device according to the present invention can be a normal type organic light emitting device in which an anode, one or more organic material layers, and a cathode are sequentially stacked on a substrate. Further, the organic light emitting device according to the present disclosure can be an inverted type organic fight emitting device in which a cathode, one or more organic material layers and an anode are sequentially stacked on a substrate. For example, the structure of an organic light emitting device according to an embodiment of the present disclosure is illustrated in FIGS. 1 and 2.

FIG. 1 shows an example of an organic light emitting device comprising a substrate 1, an anode 2, a light emitting layer 3, and a cathode 4. In such a structure, the compound of Chemical Formula 1 can be included in the light emitting layer.

FIG. 2 shows an example of an organic light emitting device comprising a substrate 1, an anode 2, a hole injection layer 5, a hole transport layer 6, a light emitting layer 7, an electron transport layer 8 and a cathode 4. In such a structure, the compound of Chemical Formula 1 can be included in one or more layers of the hole injection layer, the hole transport layer, the light emitting layer and the electron transport layer.

The organic light emitting device according to the present invention can be manufactured by materials and methods known in the art, except that one or more layers of the organic material layers includes the compound of Chemical Formula 1. In addition, when the organic light emitting device includes a plurality of organic material layers, the organic material layers can be formed of the same material or different materials.

For example, the organic light emitting device according to the present invention can be manufactured by sequentially stacking a first electrode, an organic material layer and a second electrode on a substrate. In this case, the organic light emitting device can be manufactured by depositing a metal, metal oxides having conductivity, or an alloy thereof on the substrate using a PVD (physical vapor deposition) method such as a sputtering method or an e-beam evaporation method to form an anode, forming organic material layers including the hole injection layer, the hole transport layer, the light emitting layer, and the electron transport layer thereon, and then depositing a material that can be used as the cathode thereon. In addition to such a method, the organic light emitting device can be manufactured by sequentially depositing a cathode material, an organic material layer and an anode material on a substrate.

In addition, the compound of Chemical Formula 1 can be formed into an organic layer by a solution coating method as well as a vacuum deposition method at the time of manufacturing an organic light emitting device. Herein, the solution coating method means a spin coating, a dip coating, a doctor blading, an inkjet printing, a screen printing, a spray method, a roll coating, or the like, but is not limited thereto.

In addition to such a method, the organic light emitting device can be manufactured by sequentially depositing a cathode material, an organic material layer and an anode material on a substrate (International Publication WO2003/012890). However, the manufacturing method is not limited thereto.

As an example, the first electrode is an anode, and the second electrode is a cathode, or alternatively the first electrode is a cathode and the second electrode is an anode.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)-thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

The hole injection layer is a layer for injecting holes from the electrode, and the hole injection material is preferably a compound which has a capability of transporting the holes, thus has a hole injecting effect in the anode and an excellent hole injecting effect to the light emitting layer or the light emitting material, prevents excitons produced in the light emitting layer from moving to a hole injection layer or the electron injection material, and is excellent in the ability to form a thin film. It is preferable that a HOMO (highest occupied molecular orbital) of the hole injection material is between the work function of the anode material and a HOMO of a peripheral organic material layer. Specific examples of the hole injection material include metal porphyrin, oligothiophene, an arylamine-based organic material, a hexanitrile hexaazatriphenylene-based organic material, a quinacridone-based organic material, a perylene-based organic material, anthraquinone, polyaniline and polythiophene-based conductive polymer, and the like, but are not limited thereto.

The hole transport layer is a layer that receives holes from a hole injection layer and transports the holes to the light emitting layer. The hole transport material is suitably a material having large mobility to the holes, which can receive holes from the anode or the hole injection layer and transfer the holes to the light emitting layer. Specific examples thereof include an arylamine-based organic material, a conductive polymer, a block copolymer in which a conjugate portion and a non-conjugate portion are present together, and the like, but are not limited thereto.

The light emitting material is preferably a material which can receive holes and electrons transported from a hole transport layer and an electron transport layer, respectively, and combine the holes and the electrons to emit light in a visible ray region, and has good quantum efficiency to fluorescence or phosphorescence. Specific examples of the light emitting material include an 8-hydroxy-quinoline aluminum complex ($Alq_3$), a carbazole-based compound, a dimerized styryl compound, BAlq, a 10-hydroxybenzoquinoline-metal compound, a benzoxazole, benzothiazole and benzimidazole-based compound, a poly(p-phenylenevinylene)(PPV)-based polymer, a spiro compound, polyfluorene, lubrene, and the like, but are not limited thereto.

The light emitting layer can include a host material and a dopant material. The host material can be a fused aromatic ring derivative, a heterocycle-containing compound or the like. Specific examples of the fused aromatic ring derivatives include anthracene derivatives, pyrene derivatives, naphthalene derivatives, pentacene derivatives, phenanthrene compounds, fluoranthene compounds, and the like. Examples of the heterocyclic-containing compounds include carbazole derivatives, dibenzofuran derivatives, ladder-type furan compounds, pyrimidine derivatives, and the like, but are not limited thereto.

Examples of the dopant material include an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

The electron transport layer is a layer which receives electrons from an electron injection layer and transports the electrons to a light emitting layer, and an electron transport material is suitably a material which can receive electrons well from a cathode and transfer the electrons to a light emitting layer, and has a large mobility for electrons. Specific examples of the electron transport material include: an Al complex of 8-hydroxyquinoline, a complex including $Alq_3$, an organic radical compound, a hydroxyflavone-metal complex, and the like, but are not limited thereto. The electron transport layer can be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples of the electron injection layer include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)-gallium, bis(2-methyl-8-quinolinato)(1-naphtholato)aluminum, bis(2-methyl-8-quinolinato)(2-naphtholato)gallium, and the like, but are not limited thereto.

The organic light emitting device according to the present invention can be a front side emission type, a back side emission type, or a double side emission type according to the used material.

In addition, the compound of Chemical Formula 1 can be included in an organic solar cell or an organic transistor in addition to an organic light emitting device.

The preparation of the compound of Chemical Formula 1 and the organic light emitting device comprising the same will be described in detail in the following examples. However, these examples are presented for illustrative purposes only, and are not intended to limit the scope of the present invention.

PREPARATION EXAMPLE

Preparation Example 1-1: Preparation of Intermediates A1 and B1

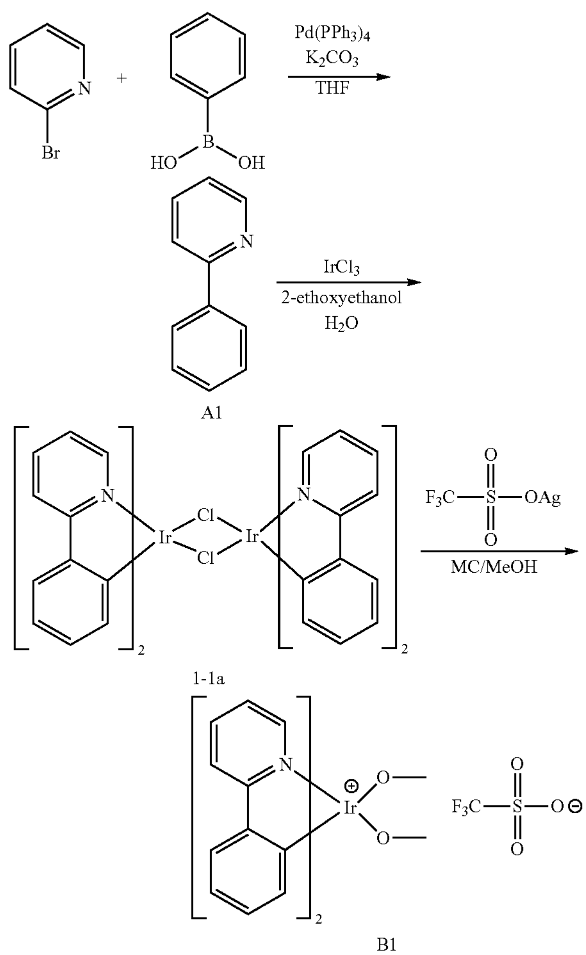

(1) Preparation of Intermediate A1

2-Bromopyridine (30 g, 0.20 mol), and phenylboronic acid (43 g, 035 mol) were dissolved in THF (300 ml) in a round bottom flask under a nitrogen atmosphere, to which a 2 M aqueous potassium carbonate solution (150 ml) was added and tetrakis-(triphenylphosphine)palladium (7.0 g, 6.0 mmol) was added, and then the resulting mixture was heated and stirred at 70° C. for 3 hours. After completion of the reaction, the temperature was lowered, the aqueous layer was separated and then the solvent in the organic layer was removed. After dissolving using chloroform, the resulting solution was washed with water. Magnesium sulfate and acidic white clay were added thereto, stirred, filtered, and concentrated under reduced pressure, which was then isolated by column chromatography under the conditions of ethyl acetate:hexane (1:50 (v:v)) to give Compound A1 (25 g, yield: 80%).

(2) Preparation of Intermediate 1-1a

Iridium chloride (10 g, 33 mmol) and Compound A1 (11.4 g, 0.073 mol) were added to 2-ethoxyethanol (1000 ml) and distilled water (330 ml) in a round bottom flask under a nitrogen atmosphere, and the mixture was heated and stirred for 24 hours. The temperature was lowered to room temperature, and the reaction product was filtered and washed with ethanol (2 L) to give Compound 1-1b (10.2 g, yield: 59%).

(3) Preparation of Intermediate B1

Intermediate 1-1 b (10.2 g, 10 mmol) and AgOTf (14.6 g, 18.9 mmol) containing methylene chloride (500 ml) were dissolved in methanol (250 ml), and then stirred at room temperature in a state where light was blocked. After 24 hours, the resulting solution was filtered, and the solvent was evaporated from the filtrate and precipitated in toluene to give Compound B1 (yield: 91%) without further purification.

Preparation Example 1-2: Preparation of Intermediates A2 and B2

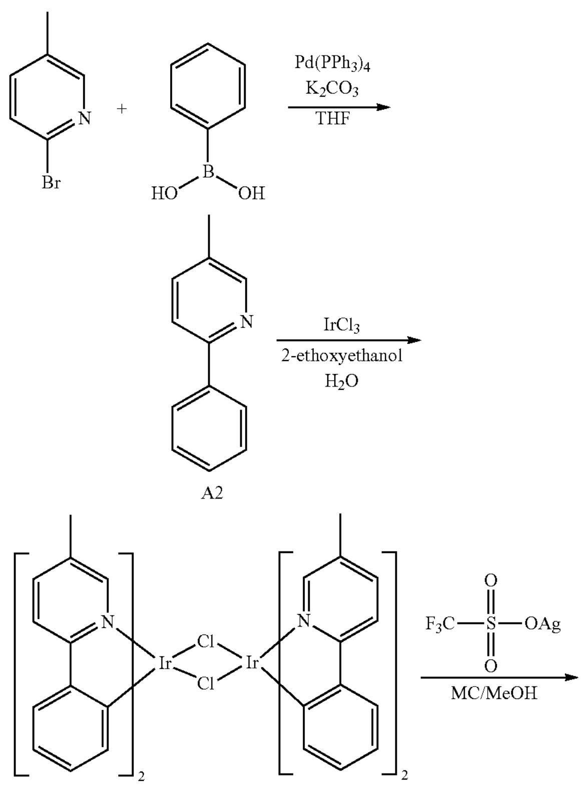

A2

1-1b

-continued

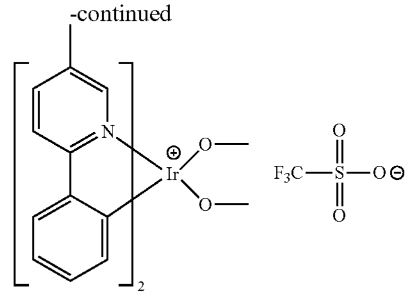

B2

(1) Preparation of Intermediate A2

Compound A2 (26 g, yield: 65%) was prepared in the same manner as in Preparation of Intermediate AI, except that 2-bromo-5-methylpyridine (50.0 g, 0.28 mol) was used instead of 2-bromopyridine.

(2) Preparation of Intermediate 1-1b

Intermediate 1-1b (20 g, yield: 54%) was prepared in the same manner as in Preparation of Intermediate 1-1a, except that Intermediate A2 was used instead of Intermediate A1.

(3) Preparation of Intermediate B2

Intermediate B2 (yield: 94%) was prepared in the same manner as in Preparation of Intermediate B1, except that Intermediate 1-1b was used instead of Intermediate 1-1a.

Preparation Example 1-3: Preparation of Intermediates A3 and B3

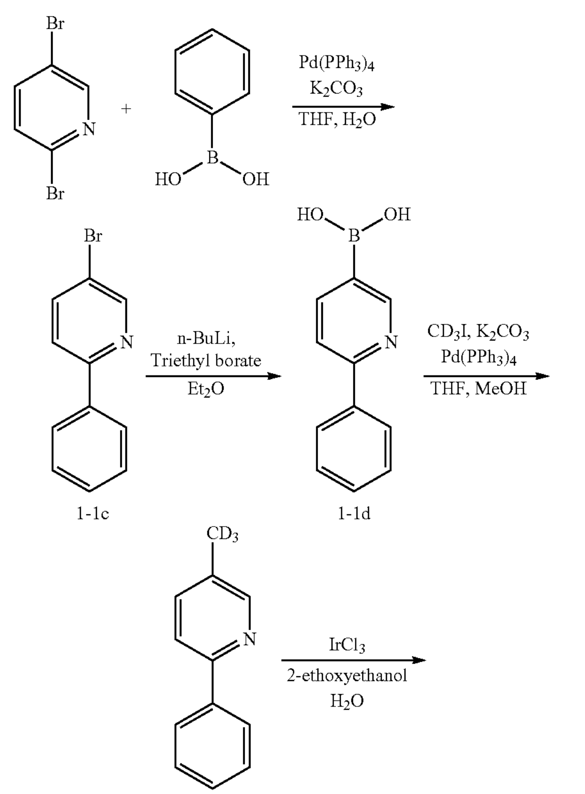

1-1c 1-1d

A3

-continued

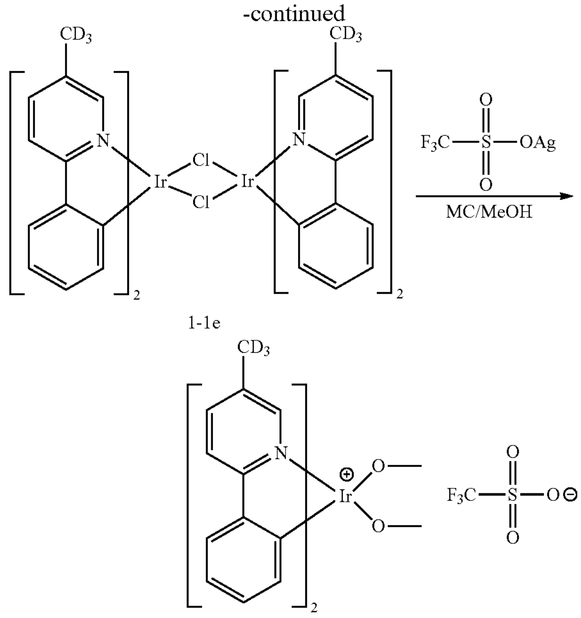

1-1e

B3

(1) Preparation of Intermediate 1-1c

Compound (1-1c) (26 g, yield: 65%) was prepared in the same manner as in Preparation of Intermediate A1, except that 2,5-bromopyridine (55 g, 0.23 mol) was used instead of 2-bromopyridine.

(2) Preparation of Intermediate 1-1d

5-Bromo-2-phenylpyridine (35 g, 0.15 mol) was dissolved in diethyl ether in a round bottom flask under a nitrogen atmosphere, and then 2.5 M n-BuLi (65 ml, 0.16 mol) was added thereto at −78° C. and stirred for 1 hour. Triethylborate (33 g, 0.23 mol) was added at −78° C., and the mixture was stirred at room temperature for 1 hour. 2M hydrochloride aqueous solution (100 ml) was added and stirred for 30 minutes and then neutralized with 20% aqueous sodium hydroxide solution (100 ml). The aqueous layer was separated and the solvent in the organic layer was removed. It was separated by column chromatography under the conditions of hexane:ethyl acetate (100:1 (v:v)) to give Compound 1-1d (21 g, yield: 73%).

(3) Preparation of Intermediate A3

(6-Phenylpyridin-3-yl) boronic acid (21 g, 0.11 mol) and iodomethane-d3 (23 g, 0.16 mol) were dissolved in tetrahydrofuran (200 ml) and methanol (100 ml) in a round bottom flask under a nitrogen atmosphere, to which a 2 M aqueous potassium carbonate solution (100 ml) was added and tetrakis-(triphenylphosphine)palladium (3.8 g, 3.3 mmol) was added, and then the resulting mixture was heated and stirred at 70° C. for 12 hours. Magnesium sulfate and acidic white clay were added thereto, stirred, filtered, and concentrated under reduced pressure. It was then separated by column chromatography under the conditions of hexane: ethyl acetate (50:1 (v:v)) to give Compound A3 (11 g, yield: 67%).

(4) Preparation of Intermediate 1-1e

Intermediate 1-1e (10.2 g, yield: 62%) was prepared in the same manner as in Preparation of Intermediate 1-1a, except that Intermediate A3 was used instead of Intermediate A1.

(5) Preparation of Intermediate B3

Intermediate B3 (yield: 90%) was prepared in the same manner as in Preparation of Intermediate B1, except that Intermediate 1-1e was used instead of Intermediate 1-1a.

Preparation Example 1-4: Preparation of Intermediates A4 and B4

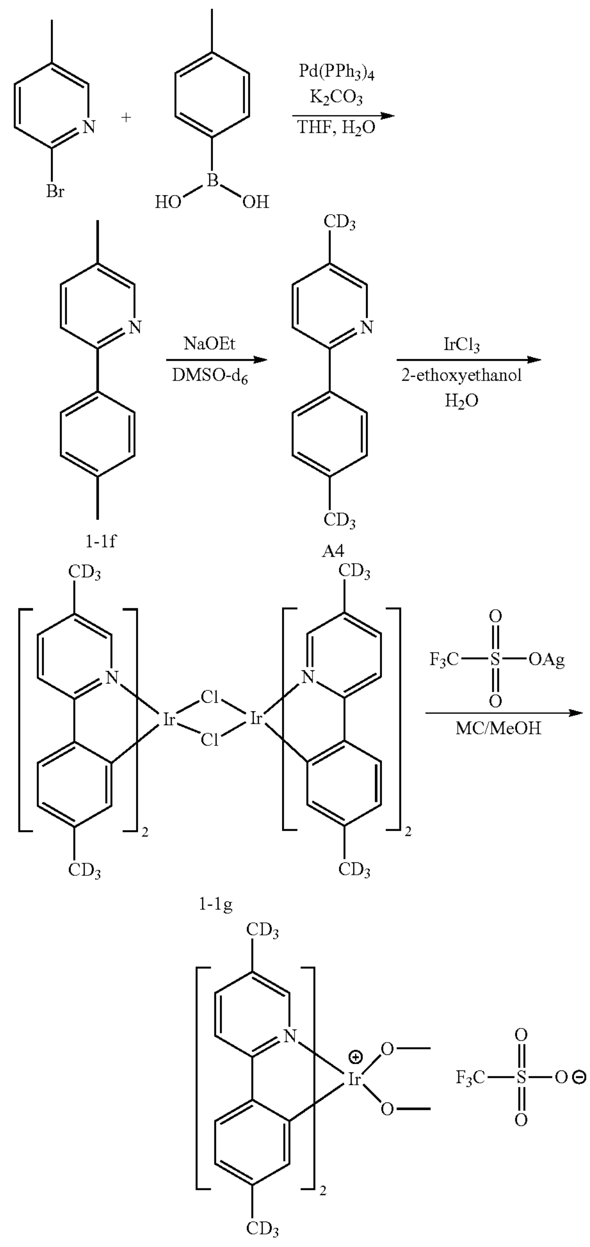

1-1f

A4

1-1g

B4

(1) Preparation of Intermediate 1-1f

Compound A4 (22 g, yield: 70%) was prepared in the same manner as in Preparation of Intermediate A1 except that bromo-5-methylpyridine (30 g, 0.17 mol) was used instead of 2-bromopyridine, and para-tolylboronic acid (26 g, 0.19 mol) was used instead of phenylboronic acid.

(2) Preparation of Intermediate A4

Intermediate 1-1f (22 g, 0.12 mol) and sodium ethoxide (5.8 g, 0.085 mol) were dissolved in dimethylsulfoxide-d6 (300 ml) in a round bottom flask under a nitrogen atmosphere, and then heated and stirred at 80° C. for 32 hours. The temperature was lowered to room temperature, and the mixture was quenched with $D_2O$ (100 ml; 10 eq) and sufficiently stirred for 1 hour. An excess of $H_2O$ was added thereto, extracted with ethyl acetate, and concentrated under reduced pressure. Then, column chromatography was performed under the conditions of hexane:ethyl acetate (50:1 (v:v)) to give Compound A4 (10 g, yield: 46%).

(3) Preparation of Intermediate 1-1g

Intermediate 1-1g (10.4 g, yield: 65%) was prepared in the same manner as in Preparation of Intermediate 1-1a, except that Intermediate A4 was used instead of Intermediate A1.

(4) Preparation of Intermediate B4

Intermediate B4 (yield: 87%) was prepared in the same manner as in Preparation of Intermediate B1, except that Intermediate 1-1g was used instead of Intermediate 1-1a.

Preparation Example 1-5: Preparation of Intermediates A5 and B5

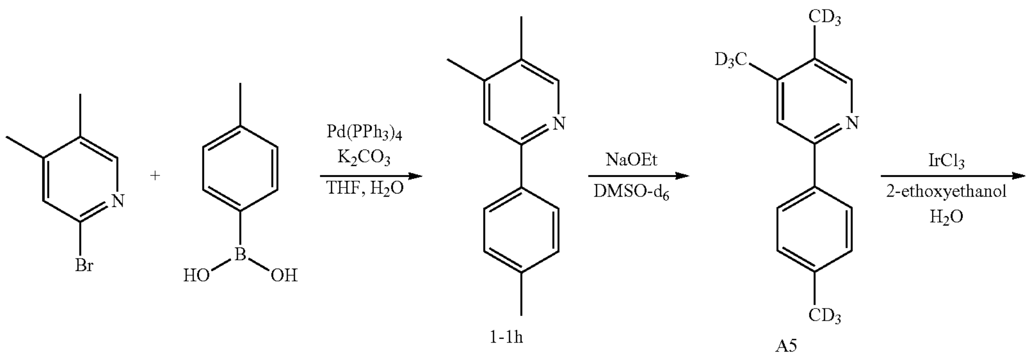

1-1h

A5

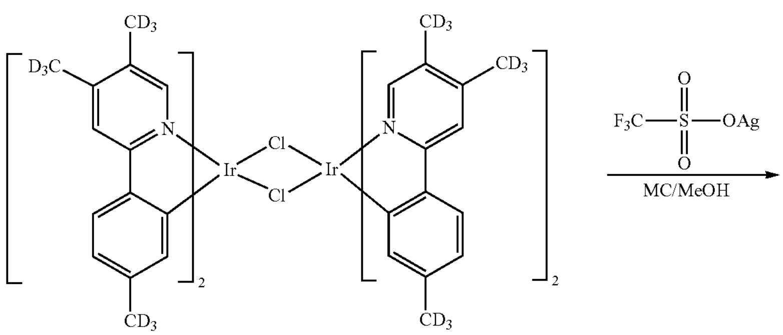

1-1i

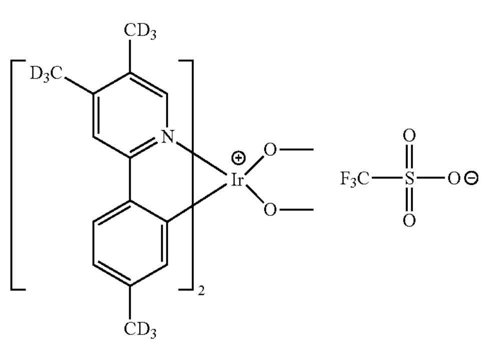

B5

(1) Preparation of Intermediate 1-1h

Compound A5 (35 g, yield: 66%) was prepared in the same manner as in Preparation of Intermediate AI, except that 2-bromo-4,5-dimethylpyridine (50 g, 0.27 mol) was used instead of 2-bromopyridine, and para-tolylboronic acid (40 g, 0.30 mol) was used instead of phenylboronic acid.

(2) Preparation of Intermediate A5

Intermediate A5 (19 g, yield: 58%) was prepared in the same manner as in Preparation of Intermediate A4, except that Intermediate 1-1h was used instead of Intermediate 1-1f.

(3) Preparation of Intermediate 1-1i

Intermediate 1-1h (20 g, yield: 55%) was prepared in the same manner as in Preparation of Intermediate 1-1a, except that Intermediate A5 was used instead of Intermediate A1.

(4) Preparation of Intermediate B5

Intermediate B5 (yield: 90%) was prepared in the same manner as in Preparation of Intermediate B1, except that Intermediate 1-1i was used instead of Intermediate 1-1a.

Preparation Example 1-6: Preparation of Intermediates A6 and B6

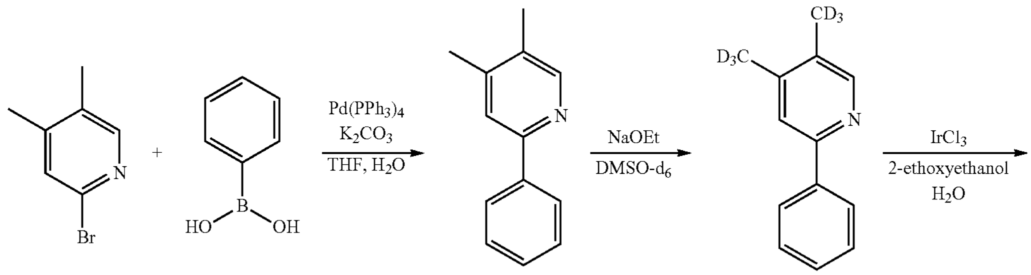

1-1j A6

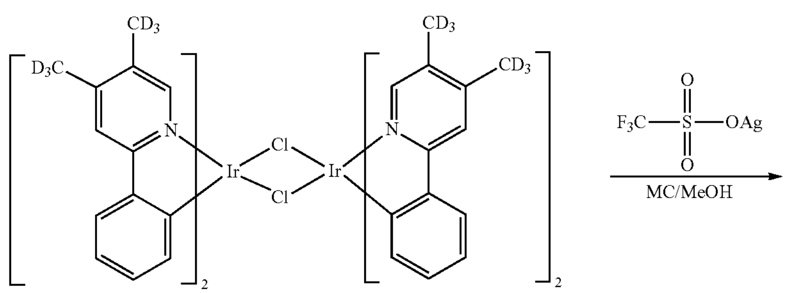

1-1k

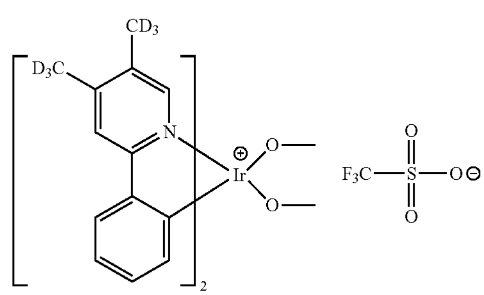

B6

(1) Preparation of Intermediate 1-1j

Compound A6 (37 g, yield: 70%) was prepared in the same manner as in Preparation of Intermediate AI, except that 2-bromo-4,5-dimethylpyridine (50 g, 0.27 mol) was used instead of 2-bromopyridine.

(2) Preparation of Intermediate A6

Intermediate A6 (21 g, yield: 60%) was prepared in the same manner as in Preparation of Intermediate A4, except that Intermediate 1-1j was used instead of Intermediate 1-1f.

(3) Preparation of Intermediate 1-1k

Intermediate 1-1k (25 g, yield: 62%) was prepared in the same manner as in Preparation of Intermediate 1-1a, except that Intermediate A6 was used instead of Intermediate A1.

(4) Preparation of Intermediate B6

Intermediate B6 (yield: 92%) was prepared in the same manner as in Preparation of Intermediate B1, except that Intermediate 1-1k was used instead of Intermediate 1-1a.

Preparation Example 2-1: Preparation of Intermediates C1 and D1

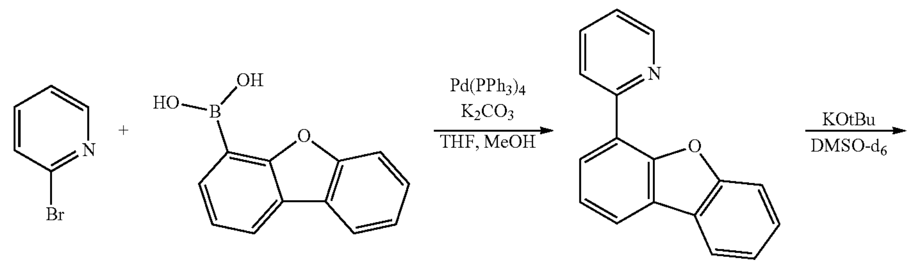

2-1a

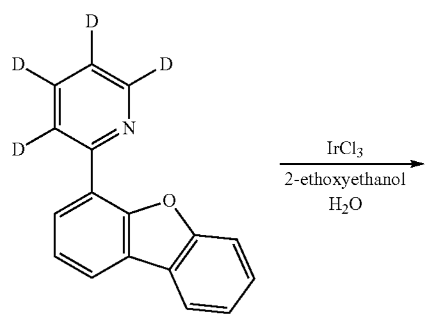

C1

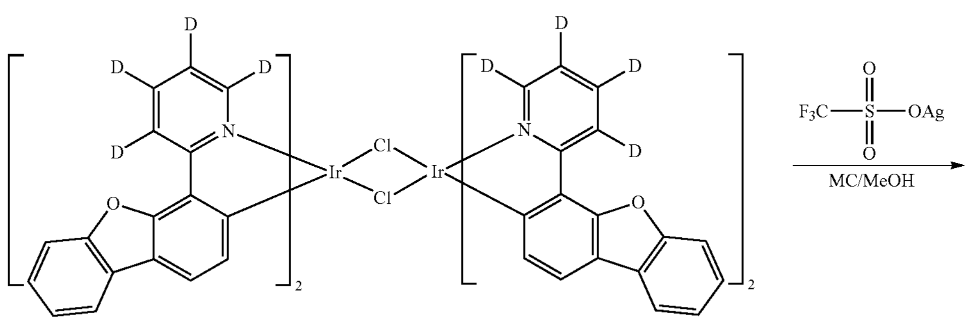

2-1b

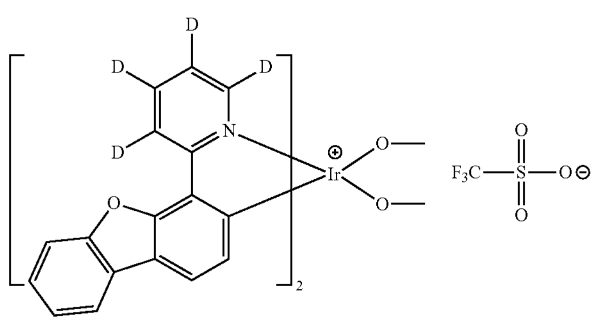

D1

(1) Preparation of Intermediate 2-1a

2-Bromopyridine (50 g, 0.32 mol), and 4-(dibenzofuranyl)boronic acid (71 g, 0.34 mol) were dissolved in tetrahydrofuran (400 ml) and methanol (200 ml) in a round bottom flask under a nitrogen atmosphere, to which a 2 M aqueous potassium carbonate solution (250 ml) was added and tetrakis-(triphenylphosphine)palladium (7.4 g, 6.4 mmol) was added, and then the resulting mixture was heated and stirred at 80° C. for 12 hours. After completion of the reaction, the temperature was lowered, the aqueous layer was separated and then the solvent in the organic layer was removed. After dissolving using chloroform, the resulting solution was washed with water. Magnesium sulfate and acidic white clay were added thereto, stirred, filtered, and concentrated under reduced pressure, which was then isolated by column chromatography under the conditions of ethyl acetate:hexane (1:50 (v:v)) to give Compound 2-1a (59 g, yield: 74%).

(2) Preparation of Intermediate C1

Intermediate 2-1a (50 g, 1 eq) and potassium tert-butoxide (6.5 g, 0.3 eq) were dissolved in dimethylsulfoxide-d6 (300 ml) in a round bottom flask under a nitrogen atmosphere, and then heated and stirred at 110° C. for 24 hours. After confirming the completion of the reaction by NMR, the temperature was lowered to room temperature. The reaction was filtered to remove salts, and then the solvent was concentrated under reduced pressure. After dissolving in chloroform (500 ml), the resulting solution was mixed with aqueous sodium chloride solution and extracted. The organic solvent layer was separated, and magnesium sulfate and acidic white clay were added thereto, stirred and filtered. Then, it was separated by column chromatography under the condition of hexane:ethyl acetate (100:1 (v:v)) to give Intermediate C1 (45 g, yield: 90%).

(3) Preparation of Intermediate 2-1b

Intermediate 2-1 b (30 g, yield: 48%) was prepared in the same manner as in Preparation of Intermediate 1-1a, except that Intermediate C1 was used instead of Intermediate A1.

(4) Preparation of Intermediate D1

Intermediate D1 (yield: 91%) was prepared in the same manner as in Preparation of Intermediate B1, except that Intermediate 2-1 b was used instead of Intermediate 1-1a.

Preparation Example 2-2: Preparation of Intermediates C2 and D2

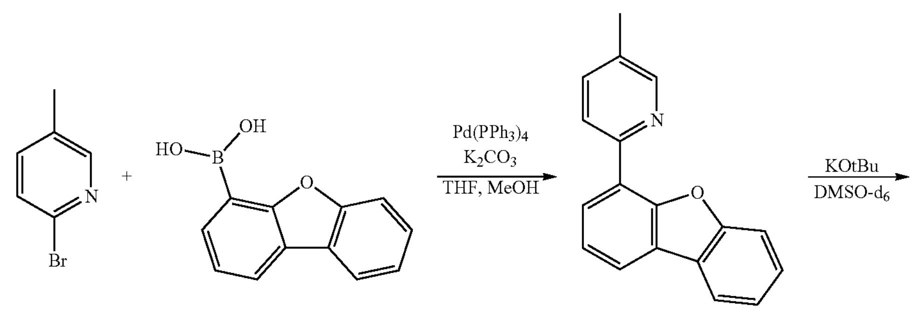

2-1c

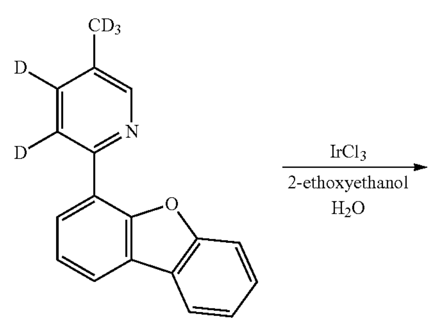

C2

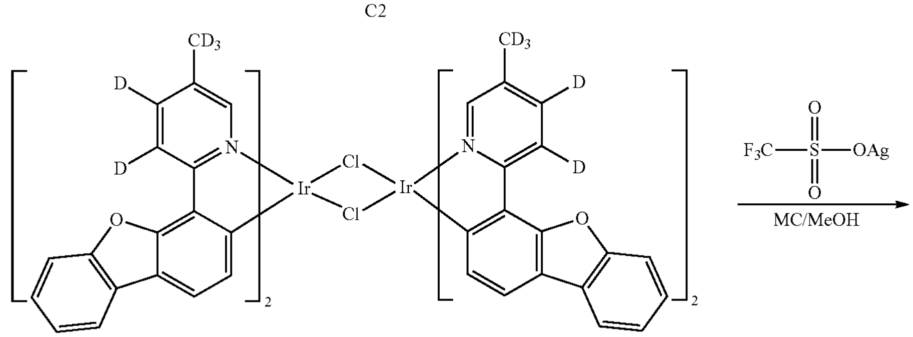

2-1d

-continued

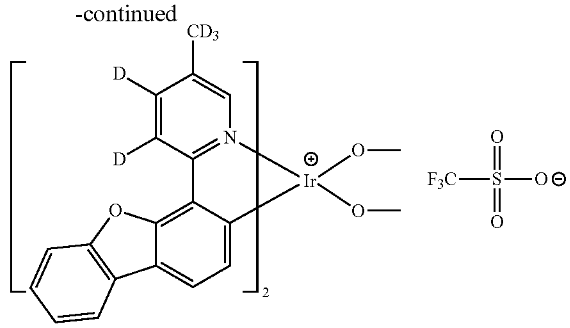

D2

(1) Preparation of Intermediate 2-1c

Intermediate 2-1c (32 g, yield: 85%) was prepared in the same manner as in Preparation of Intermediate 2-1a, except that bromo-5-methylpyridine was used instead of 2-bromopyridine.

(2) Preparation of Intermediate C2

Intermediate C2 (27 g, yield: 84%) was prepared in the same manner as in Preparation of Intermediate C1, except that Intermediate 2-1c was used instead of Intermediate 2-1a, (3) Preparation of Intermediate 2-1d Intermediate 2-1d (25 g, yield: 50%) was prepared in the same manner as in Preparation of Intermediate 1-1a, except that Intermediate C2 was used instead of Intermediate A1.

(4) Preparation of Intermediate D2

Intermediate D2 (22 g, yield: 92%) was prepared in the same manner as in Preparation of Intermediate 1-1a, except that Intermediate 2-1d was used instead of Intermediate 1-1a.

Preparation Example 2-3: Preparation of Intermediates C3 and D3

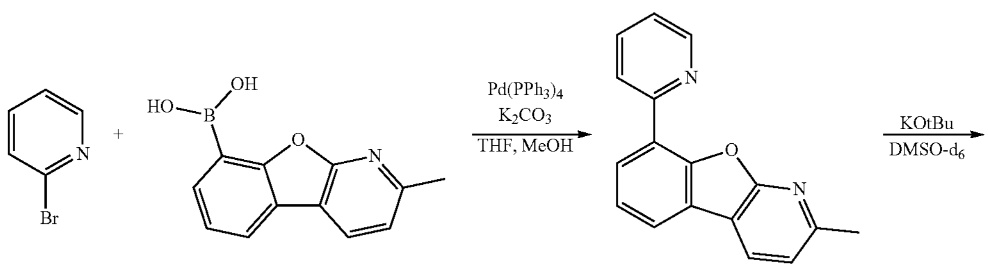

2-1e

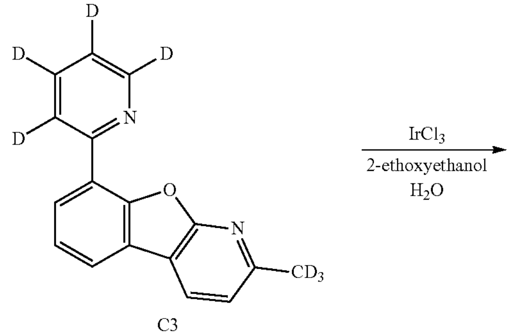

C3

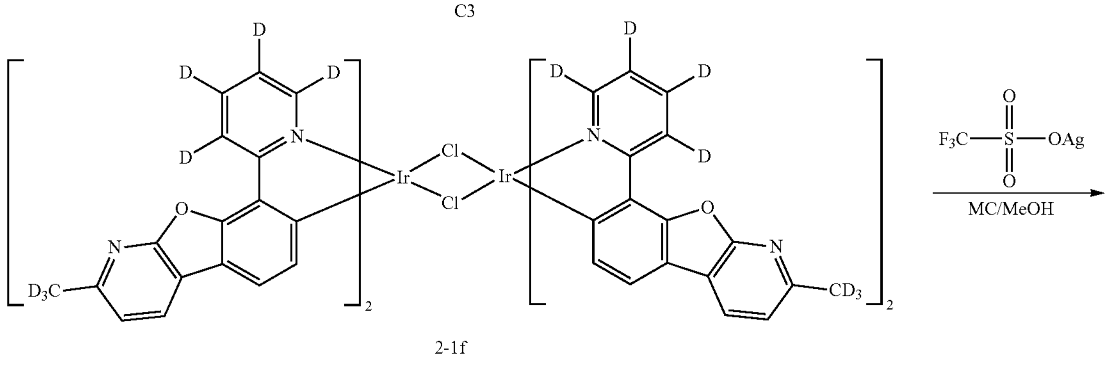

2-1f

-continued

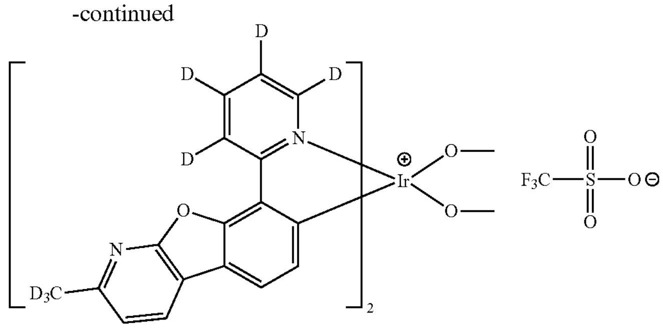

D3

(1) Preparation of Intermediate 2-1e

Intermediate 2-1e (42 g, yield: 82%) was prepared in the same manner as in Preparation of Intermediate 2-1a, except that (2-methylbenzofuro[2,3-b]pyridin-8-yl)boronic acid was used instead of dibenzo[b.d]furan-4-ylboronic acid.

(2) Preparation of Intermediate C3

Intermediate C3 (36 g, yield: 86%) was prepared in the same manner as in Preparation of Intermediate C1, except that Intermediate 2-1e was used instead of Intermediate 2-1a.

(3) Preparation of Intermediate 2-1f

Intermediate 2-1f (35 g, yield: 57%) was prepared in the same manner as in Preparation of Intermediate 1-1a, except that Intermediate C3 was used instead of Intermediate A1

(4) Preparation of Intermediate D3

Intermediate D3 (30 g, yield: 90%) was prepared in the same manner as in Preparation of Intermediate 1-1a, except that Intermediate 2-1f was used instead of Intermediate 1-1a.

Preparation Example 2-4: Preparation of Intermediates C4 and D4

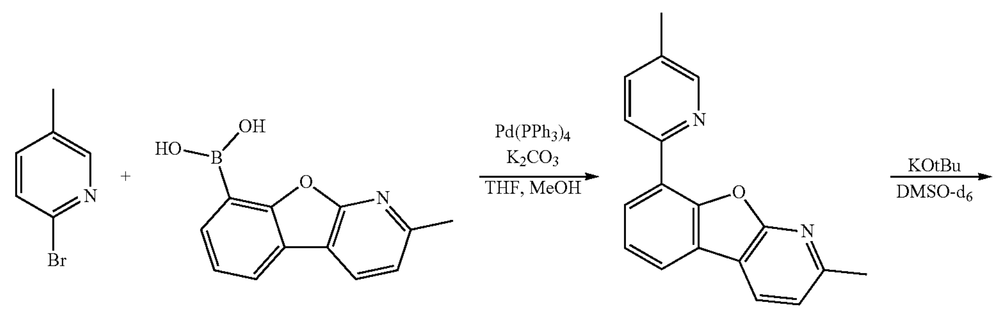

2-1g

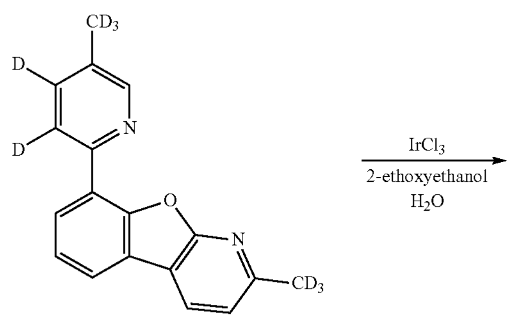

C4

-continued

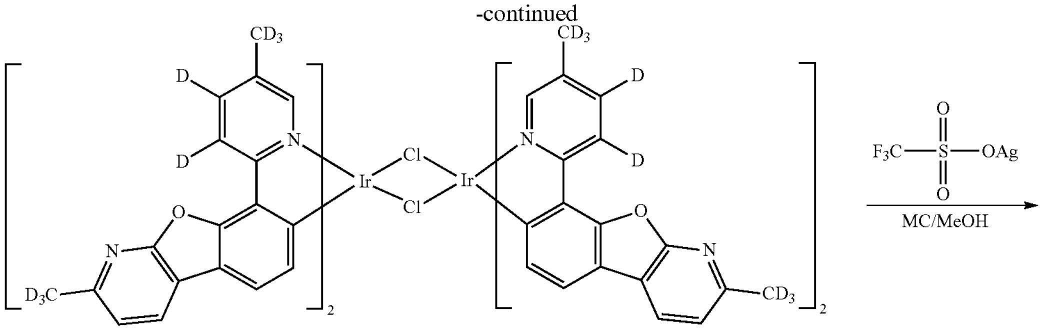

2-1h

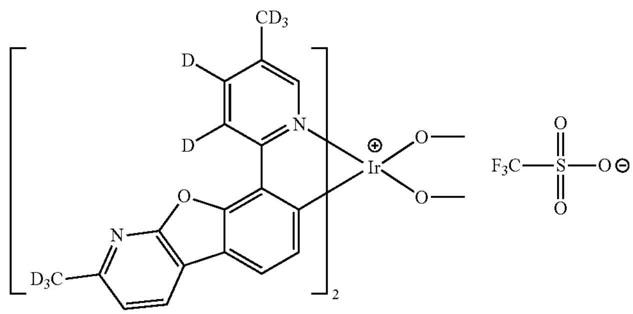

D4

(1) Preparation of Intermediate 2-1e

Intermediate 2-1e (29 g, yield: 86%) was prepared in the same manner as in Preparation of Intermediate 2-1c, except that (2-methylbenzofuro[2,3-b]pyridin-8-yl)boronic add was used instead of dibenzo[b.d]furan-4-ylboronic acid.

(2) Preparation of Intermediate C4

Intermediate C4 (25 g, yield: 86%) was prepared in the same manner as in Preparation of Intermediate C1, except that Intermediate 2-1g was used instead of Intermediate 2-1a (3) Preparation of Intermediate 2-1h Intermediate 2-1h (23 g, yield: 53%) was prepared in the same manner as in Preparation of Intermediate 1-1a, except that Intermediate C4 was used instead of Intermediate A1

(4) Preparation of Intermediate D4

Intermediate D4 (19 g, yield: 87%) was prepared in the same manner as in Preparation of Intermediate 1-1a, except that Intermediate 2-1h was used instead of Intermediate 1-1a.

Preparation Example 2-5: Preparation of Intermediates C5 and D5

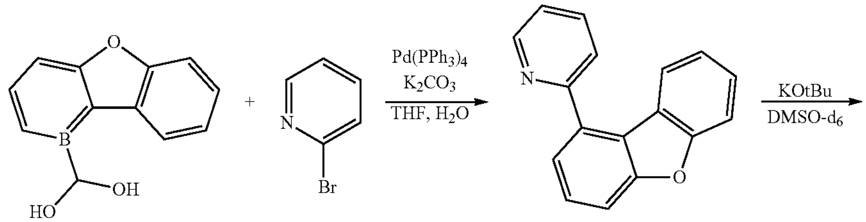

2-1i

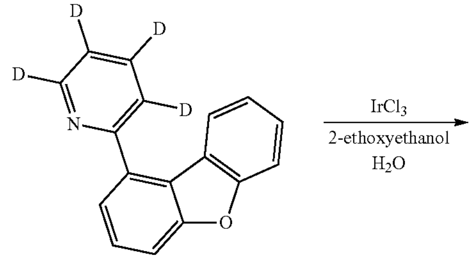

C5

-continued

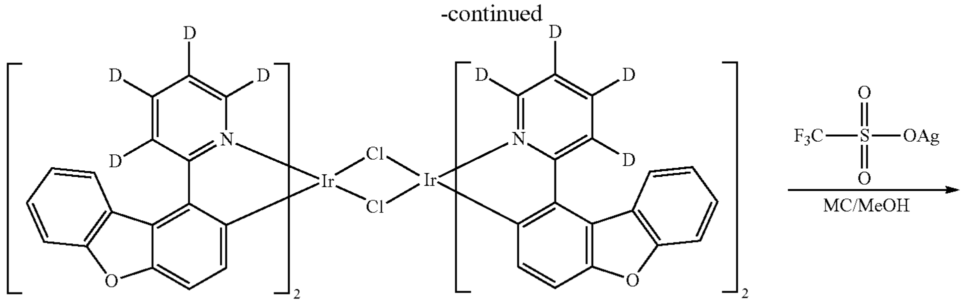

2-1j

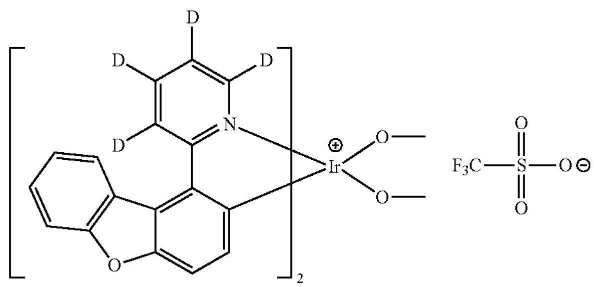

D5

(1) Preparation of Intermediate 2-1i

Intermediate 2-11 (30 g, yield: 81%) was prepared in the same manner as in Preparation of Intermediate 2-1a, except that dibenzo[b,d]furan-1-ylboronic acid was used instead of 4-(dibenzofuranyl)boronic acid.

(2) Preparation of Intermediate C5

Intermediate C5 (27 g, yield: 90%) was prepared in the same manner as in Preparation of Intermediate C1, except that Intermediate 2-1i was used instead of Intermediate 2-1a.

(3) Preparation of Intermediate 2-1j

Intermediate 2-1j (24 g, yield: 54%) was prepared in the same manner as in Preparation of Intermediate 1-1a, except that Intermediate C5 was used instead of Intermediate A1.

(4) Preparation of Intermediate D5

Intermediate D5 (22 g, yield: 91%) was prepared in the same manner as in Preparation of Intermediate 1-1a, except that Intermediate 2-1j was used instead of Intermediate 1-1a.

Preparation Example 2-6: Preparation of Intermediates C6 and D6

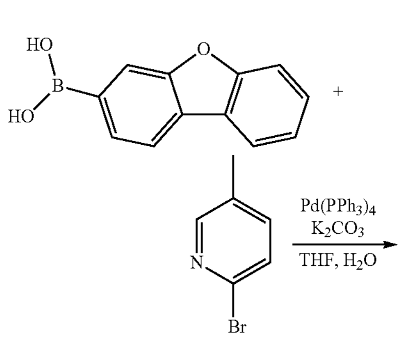

-continued

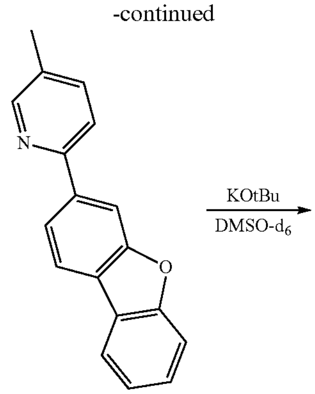

2-1m

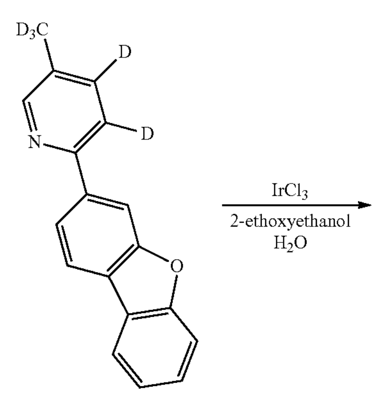

C6

-continued

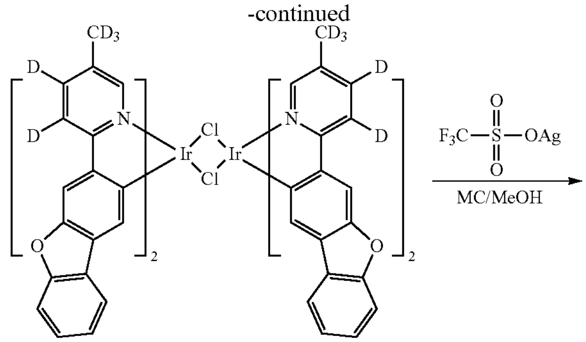

2-1n

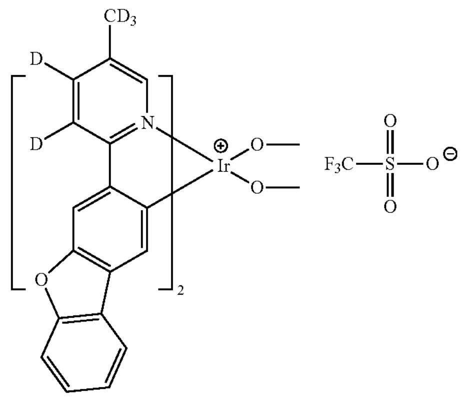

D6

(1) Preparation of Intermediate 2-1e

Intermediate 2-1m (40 g, yield: 88%) was prepared in the same manner as in Preparation of Intermediate 2-1c, except that dibenzo[b,d]furan-1-ylboronic acid was used instead of dibenzo[b.d]furan-4-ylboronic acid.

(2) Preparation of Intermediate C6

Intermediate C6 (33 g, yield: 82%) was prepared in the same manner as in Preparation of Intermediate C1, except that Intermediate 2-1m was used instead of Intermediate 2-1a (3) Preparation of Intermediate 2-1n Intermediate 2-1n (30 g, yield: 49%) was prepared in the same manner as in Preparation of Intermediate 1-1a, except that Intermediate C4 was used instead of Intermediate A1.

(4) Preparation of Intermediate D6

Intermediate D6 (26 g, yield: 82%) was prepared in the same manner as in Preparation of Intermediate 1-1a, except that Intermediate 2-1n was used instead of Intermediate 1-1a.

Preparation Example 2-7: Preparation of Intermediates C7 and D7

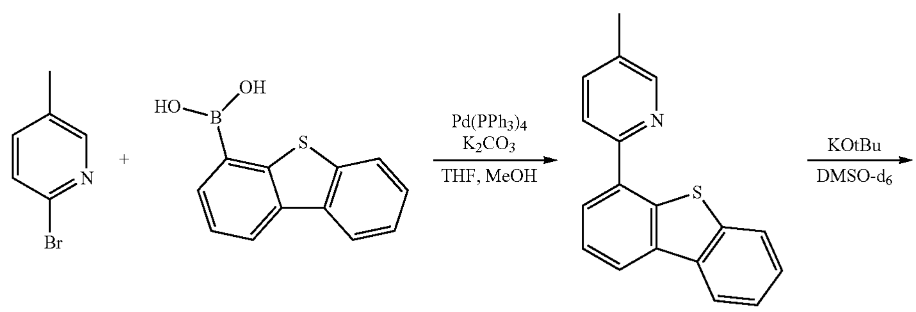

2-1o

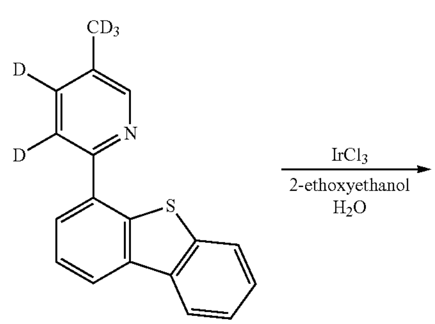

C7

-continued

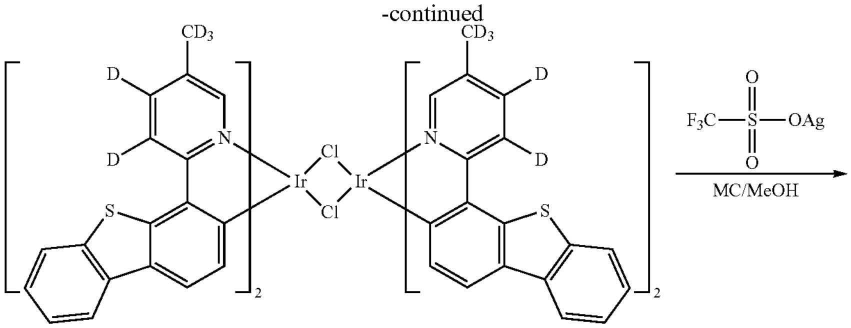

2-1p

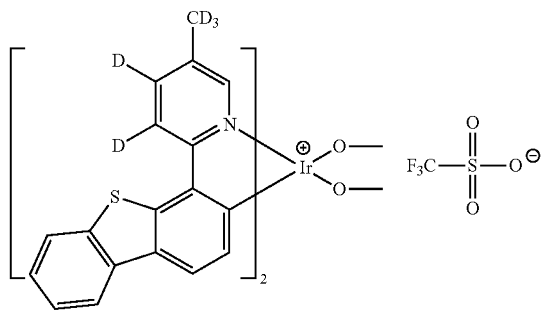

D7

(1) Preparation of Intermediate 2-1a

Intermediate 2-10 (38 g, yield: 91%) was prepared in the same manner as in Preparation of Intermediate 2-1c, except that dibenzo[b,d]thiophen-4-ylboronic acid was used instead of dibenzo[b,d]furan-4-ylboronic acid.

(2) Preparation of Intermediate C7

Intermediate C7 (33 g, yield: 87%) was prepared in the same manner as in Preparation of Intermediate C1, except that Intermediate 2-1o was used instead of Intermediate 2-1a.

(3) Preparation of Intermediate 2-1p

Intermediate 2-1p (32 g, yield: 59%) was prepared in the same manner as in Preparation of Intermediate 1-1a, except that Intermediate C7 was used instead of Intermediate A1.

(4) Preparation of Intermediate D7

Intermediate D7 (28 g, yield: 89%) was prepared in the same manner as in Preparation of Intermediate 1-1a, except that Intermediate 2-1p was used instead of Intermediate 1-1a.

Preparation Example 2-8: Preparation of Intermediates C8 and D8

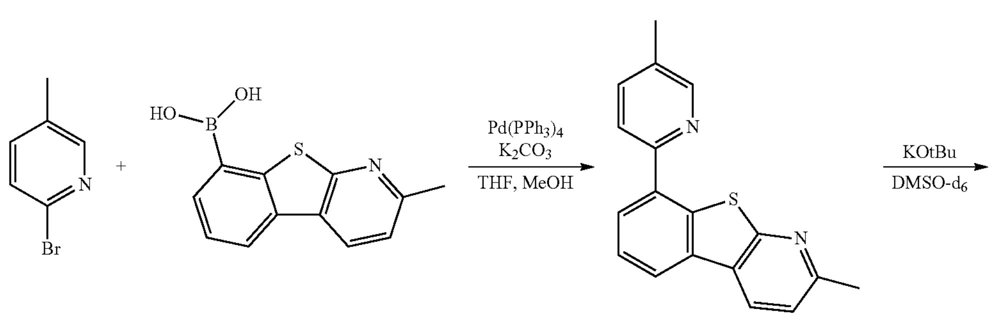

2-1q

-continued

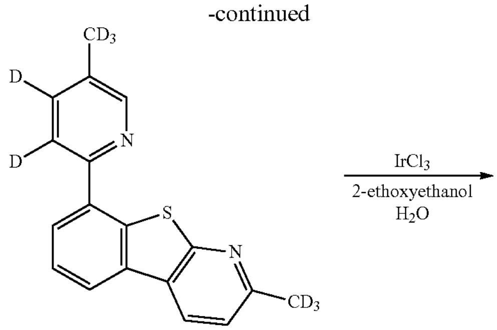

C8

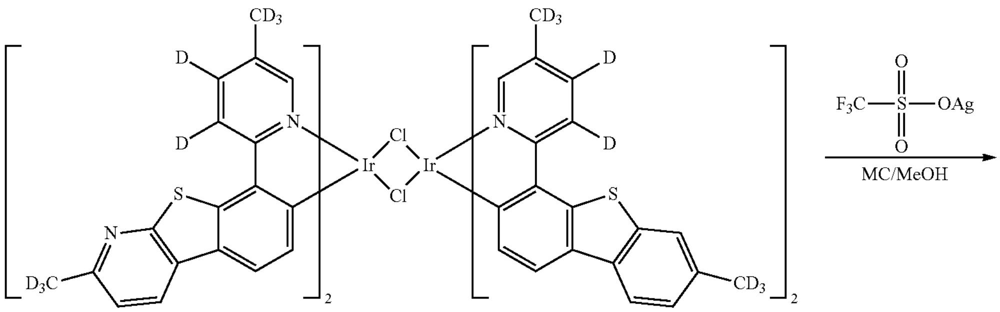

2-1r

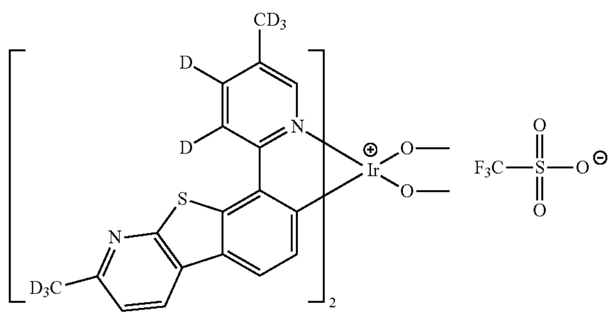

D8

(1) Preparation of Intermediate 2-1e

Intermediate 2-1q (24 g, yield: 80%) was prepared in the same manner as in Preparation of Intermediate 2-1c, except that (2-methylbenzo[4,5]thieno[2,3-b]pyridin-8-ylboronic acid was used instead of dibenzo[b.d]furan-4-ylboronic acid.

(2) Preparation of Intermediate C8

Intermediate C8 (20 g, yield: 76%) was prepared in the same manner as in Preparation of Intermediate C1, except that Intermediate 2-1q was used instead of Intermediate 2-1a.

(3) Preparation of Intermediate 2-1r

Intermediate 2-1r (17 g, yield: 50%) was prepared in the same manner as in Preparation of Intermediate 1-1a, except that Intermediate C8 was used instead of Intermediate A1.

(4) Preparation of Intermediate D8

Intermediate D8 (15 g, yield: 82%) was prepared in the same manner as in Preparation of Intermediate 1-1a, except that Intermediate 2-1r was used instead of Intermediate 1-1a.

EXAMPLE

Example 1: Preparation of Compound 1

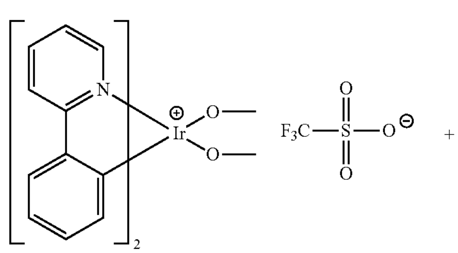

B1

-continued

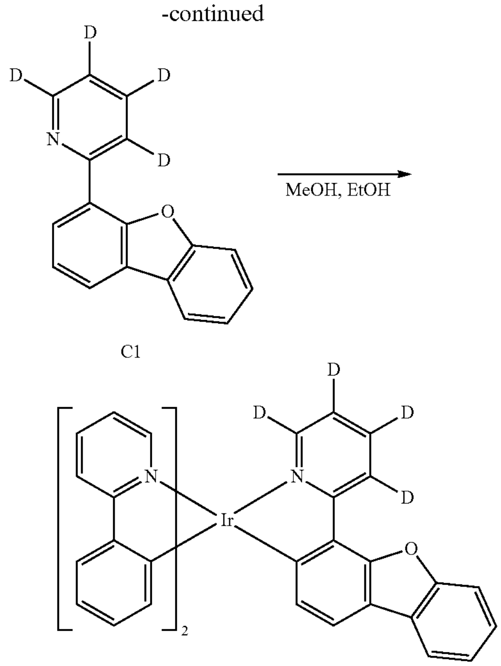

C1

1

Compound B1 (20 g, 28 mmol) and Compound C1 (17.5 g, 2.5 eq, 70 mmol), methanol (200 ml) and ethanol (200 ml) were added under a nitrogen atmosphere, and the mixture was heated and stirred at 70° C. for 48 hours. After completion of the reaction, the reaction mixture was filtered, washed with ethanol, and then separated by column chromatography under the conditions of hexane:methanol (50:1 (v:v)) to give Compound 1 (yield: 40%).

MS: $[M+H]^+$=750.20

Example 2: Preparation of Compound 2

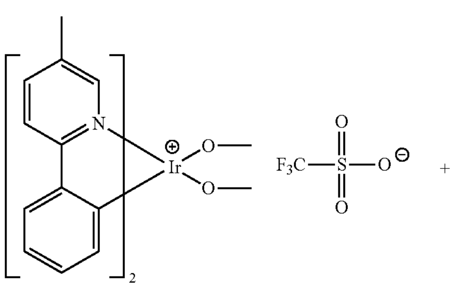

B2

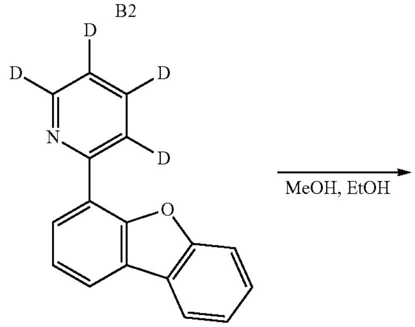

C1

-continued

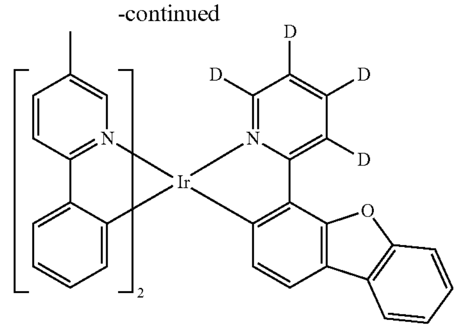

2

Compound 2 (yield: 49%) was prepared in the same manner as in Preparation of Compound 1, except that Intermediate B2 was used instead of Intermediate B1.

MS: $[M+H]^+$=778.23

Example 3: Preparation of Compound 3

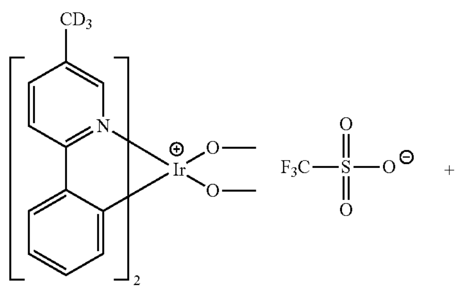

B3

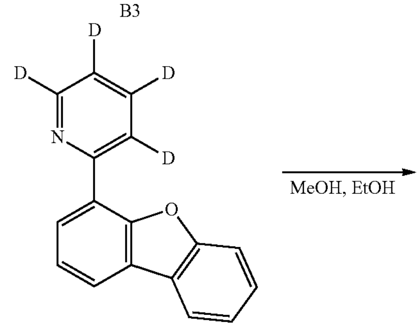

C1

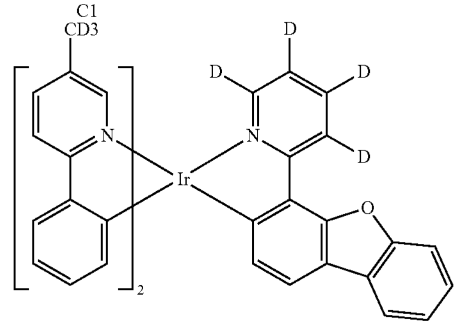

3

Compound 3 (yield: 45%) was prepared in the same manner as in Preparation of Compound 1, except that Intermediate B3 was used instead of Intermediate B1.

MS: $[M+H]^+$=784.26

Example 4: Preparation of Compound 4

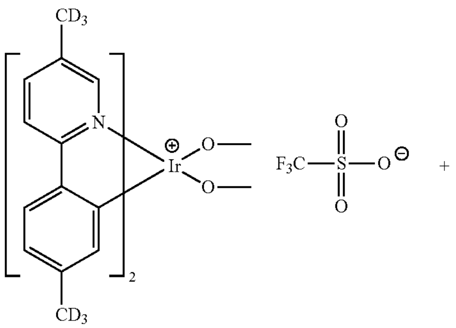

B4

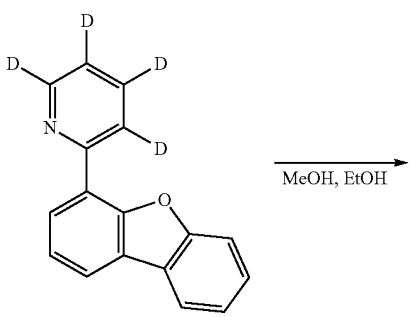

C1

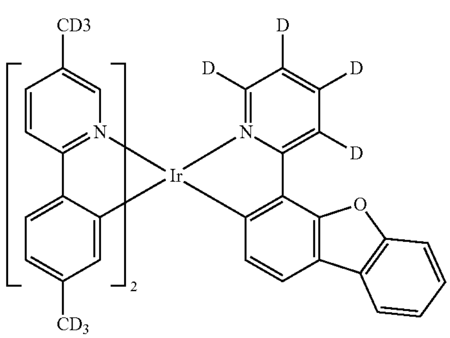

4

Compound 4 (yield: 52%) was prepared in the same manner as in Preparation of Compound 1, except that Intermediate B4 was used instead of Intermediate B1.

MS: $[M+H]^+$=818.33

Example 5: Preparation of Compound 5

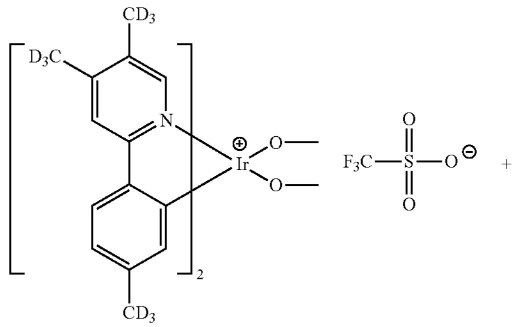

B5

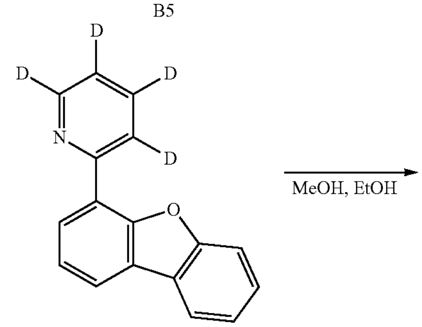

C1

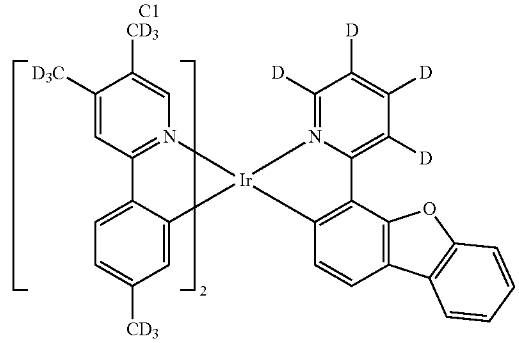

5

Compound 5 (yield: 50%) was prepared in the same manner as in Preparation of Compound 1, except that Intermediate B5 was used instead of Intermediate B1.

MS: $[M+H]^+$=852.40

Example 6: Preparation of Compound 6

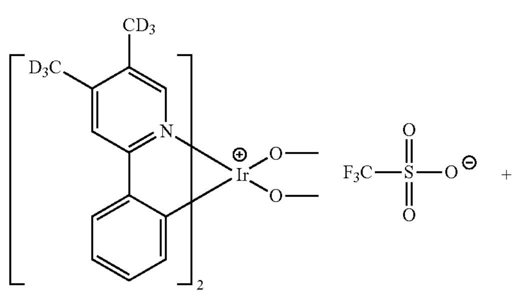

B6

-continued

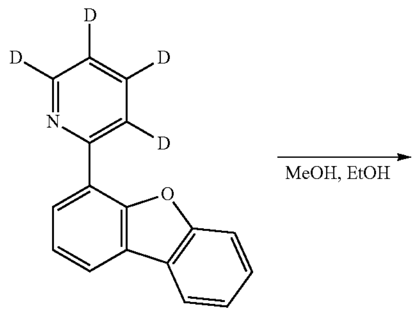

C1

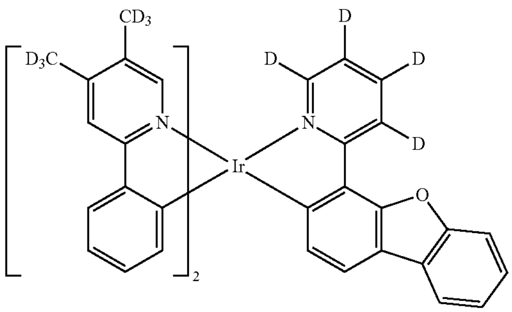

6

Compound 6 (yield: 47%) was prepared in the same manner as in Preparation of Compound 1, except that Intermediate B6 was used instead of Intermediate B1.

MS: $[M+H]^{+}$=818.33

Example 7: Preparation of Compound 7

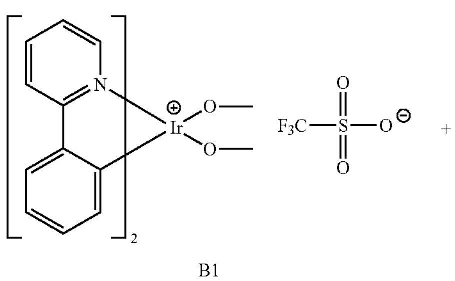

B1

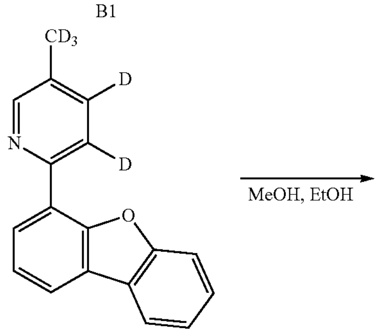

C2

-continued

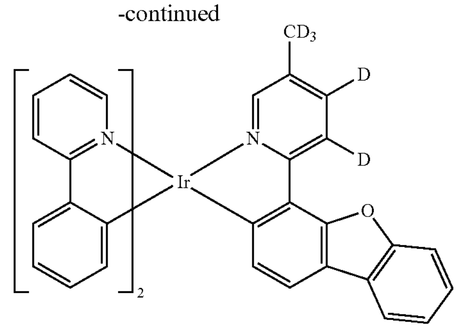

7

Compound 7 (yield: 60%) was prepared in the same manner as in Preparation of Compound 1, except that Intermediate C2 was used instead of Intermediate C1

MS: $[M+H]^{+}$=765.22

Example 8: Preparation of Compound 8

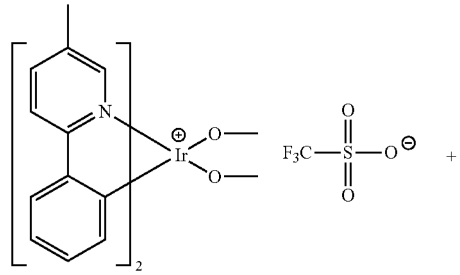

B2

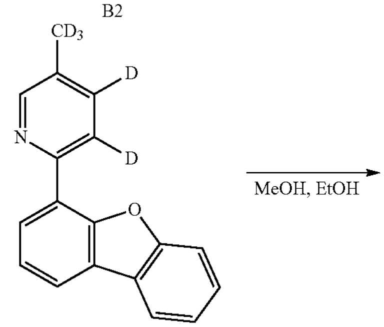

C2

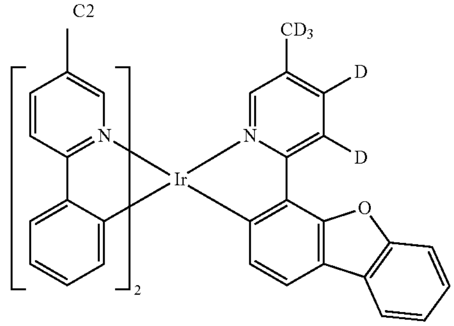

8

Compound 8 (yield: 58%) was prepared in the same manner as in Preparation of Compound 1, except that Intermediate B2 was used instead of Intermediate B1, and Intermediate C2 was used instead of Intermediate C1.

MS: $[M+H]^{+}$=793.25

Example 9: Preparation of Compound 9

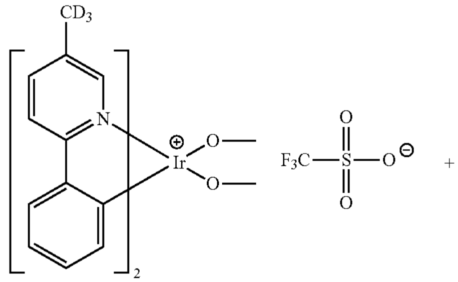

B3

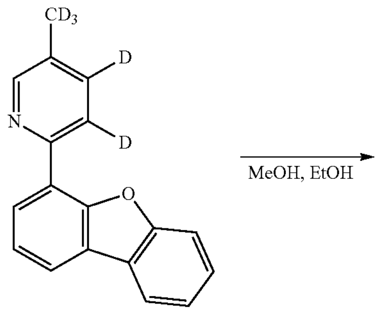

C2

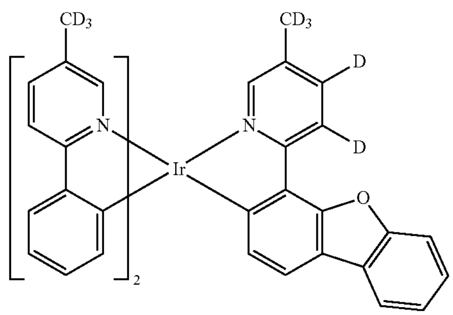

9

Compound 9 (yield: 58%) was prepared in the same manner as in Preparation of Compound 1, except that Intermediate E33 was used instead of Intermediate B1, and Intermediate C2 was used instead of Intermediate C1.

MS: $[M+H]^+$=799.29

Example 10: Preparation of Compound 10

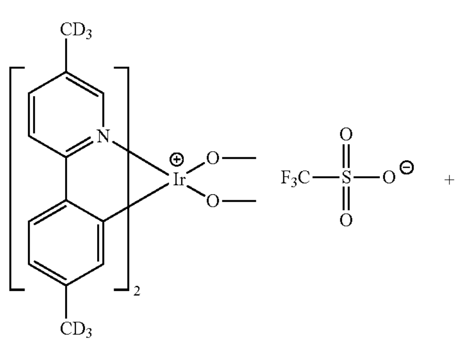

B4

-continued

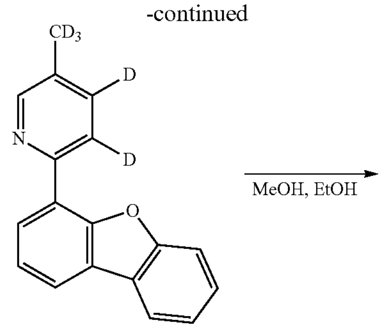

C2

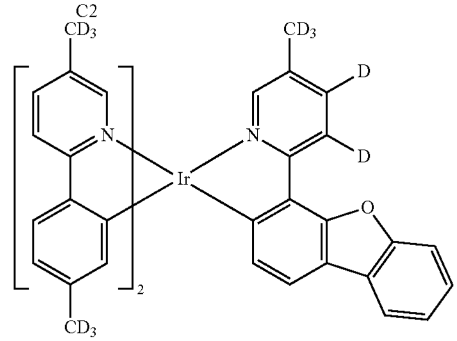

10

Compound 10 (yield: 50%) was prepared in the same manner as in Preparation of Compound 1, except that Intermediate B4 was used instead of Intermediate B1, and Intermediate C2 was used instead of Intermediate C1.

MS: $[M+H]^+$=833.36

Example 11: Preparation of Compound 11

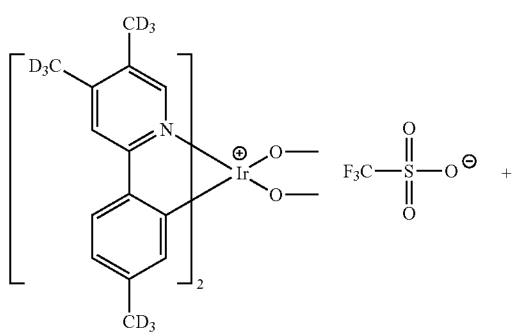

B5

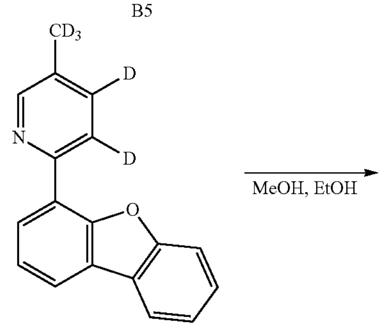

C2

-continued

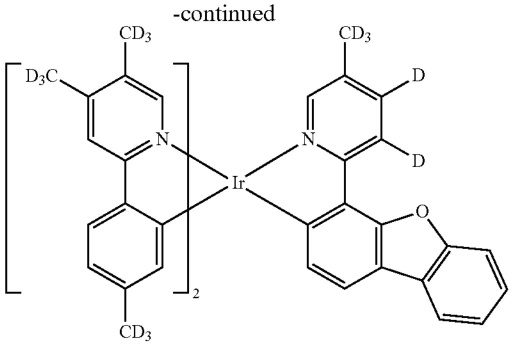

11

Compound 11 (yield: 51%) was prepared in the same manner as in Preparation of Compound 1, except that Intermediate B5 was used instead of Intermediate B1, and Intermediate C2 was used instead of Intermediate C1

MS: $[M+H]^+$=867.42

Example 12: Preparation of Compound 12

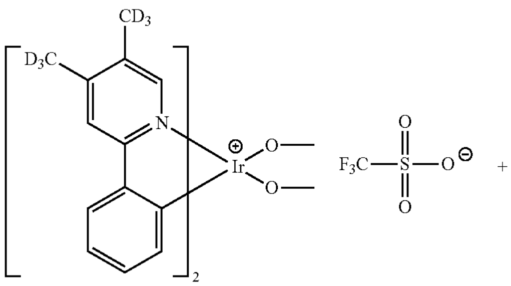

B6

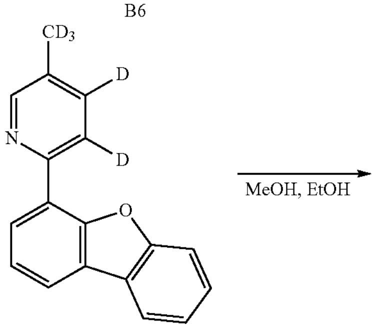

C2

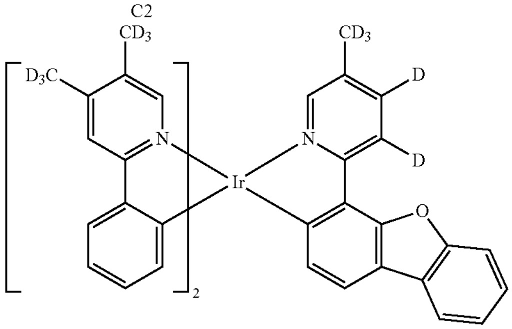

12

Compound 12 (yield: 42%) was prepared in the same manner as in Preparation of Compound 1, except that Intermediate B6 was used instead of Intermediate B1, and Intermediate C2 was used instead of Intermediate C1.

MS: $[M+H]^+$=833.36

Example 13: Preparation of Compound 13

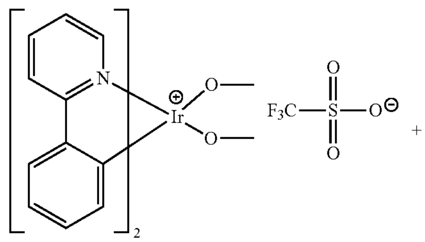

B1

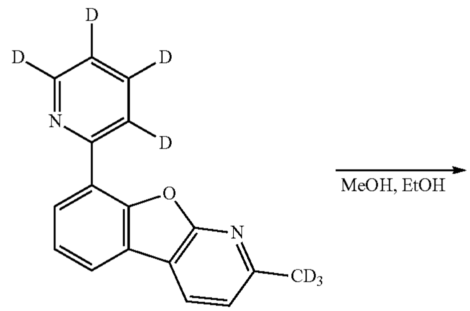

C3

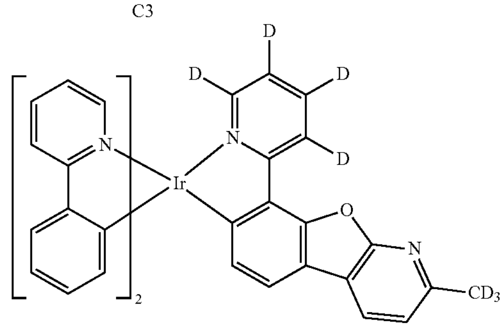

13

Compound 13 (yield: 49%) was prepared in the same manner as in Preparation of Compound 1, except that Intermediate C3 was used instead of Intermediate C1

MS: $[M+H]^+$=768.23

Example 14: Preparation of Compound 14

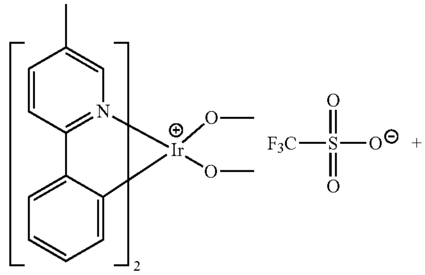

B2

-continued

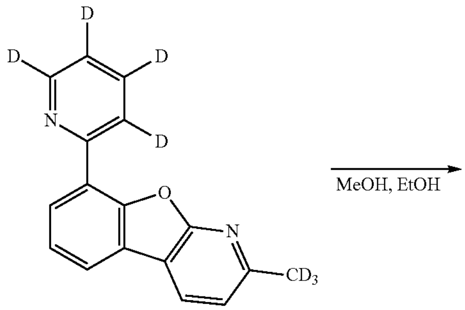

C3

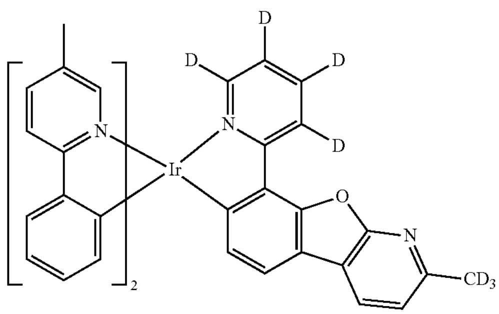

14

Compound 14 (yield: 42%) was prepared in the same manner as in Preparation of Compound 1, except that Intermediate B2 was used instead of Intermediate B1, and Intermediate C3 was used instead of Intermediate C1.

MS: $[M+H]^+$=796.26

Example 15: Preparation of Compound 15

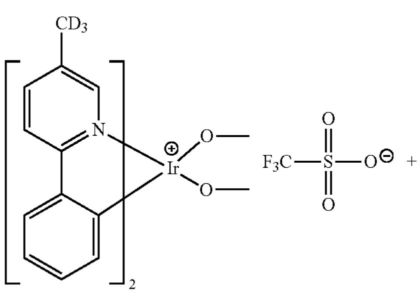

B3

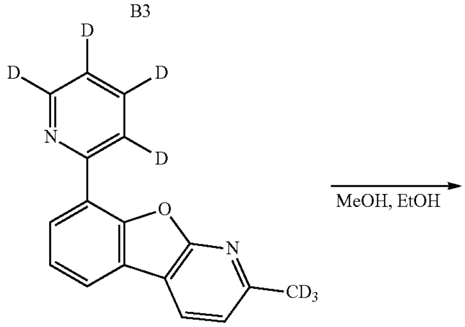

C3

-continued

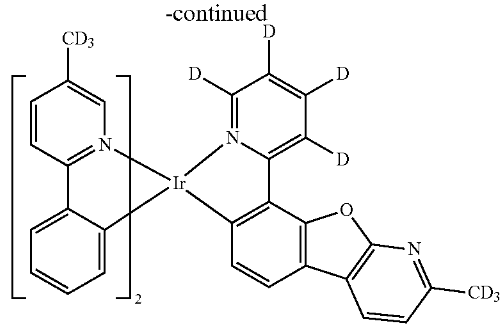

15

Compound 15 (yield: 47%) was prepared in the same manner as in Preparation of Compound 1, except that Intermediate B3 was used instead of Intermediate B1, and Intermediate C3 was used instead of Intermediate C1.

MS: $[M+H]^+$=802.29

Example 16: Preparation of Compound 16

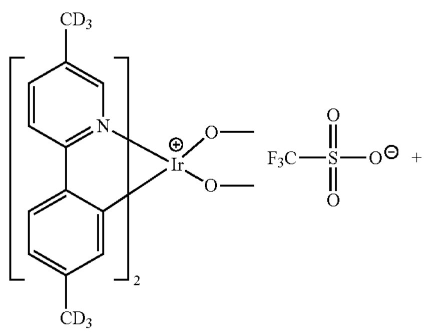

B4

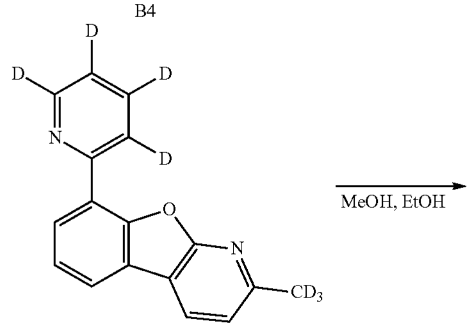

C3

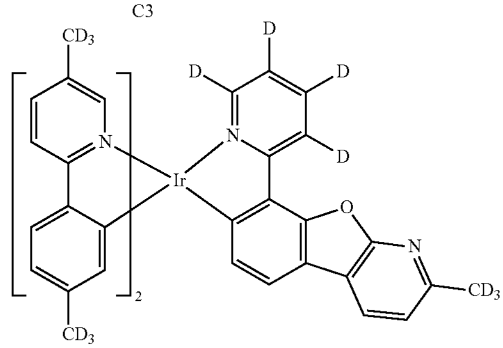

16

Compound 16 (yield: 51%) was prepared in the same manner as in Preparation of Compound 1, except that Intermediate B4 was used instead of Intermediate B1, and Intermediate C3 was used instead of Intermediate C1.

MS: $[M+H]^+$=836.36

Example 17: Preparation of Compound 17

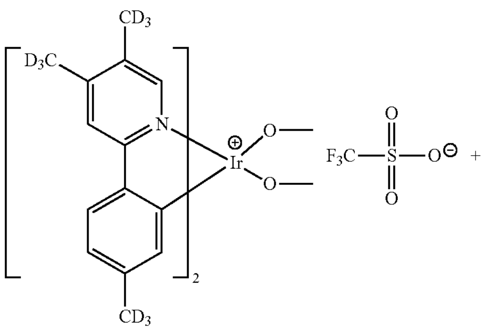

B5

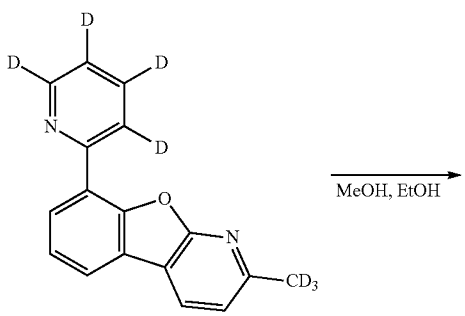

C3

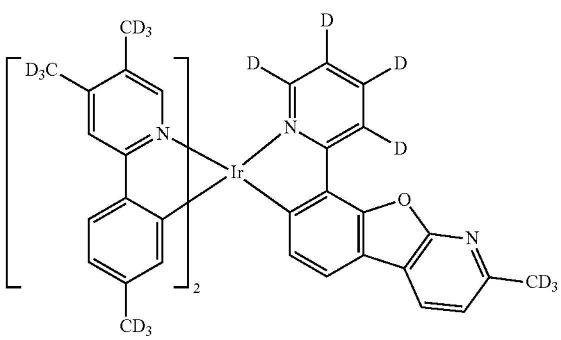

17

Compound 17 (yield: 41%) was prepared in the same manner as in Preparation of Compound 1, except that Intermediate B5 was used instead of Intermediate B1, and Intermediate C3 was used instead of Intermediate C1.

MS: $[M+H]^+$=870.43

Example 18: Preparation of Compound 18

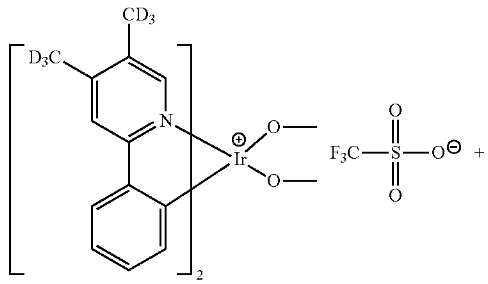

B6

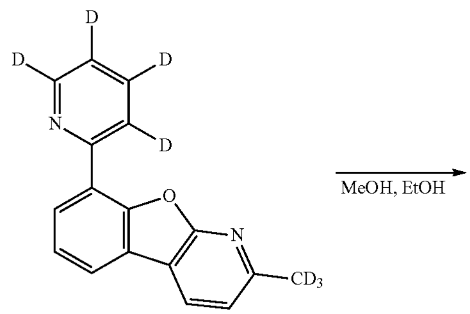

C3

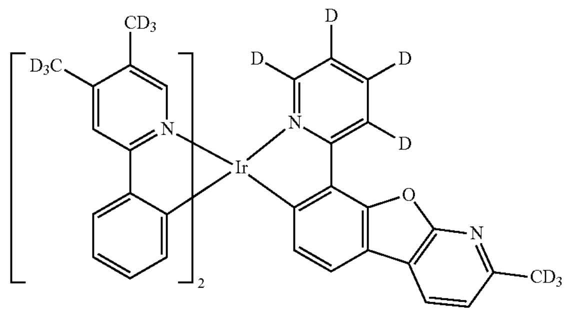

18

Compound 18 (yield: 45%) was prepared in the same manner as in Preparation of Compound 1, except that Intermediate E36 was used instead of Intermediate B1, and Intermediate C3 was used instead of Intermediate C1.

MS: $[M+H]^+$=836.36

Example 19: Preparation of Compound 19

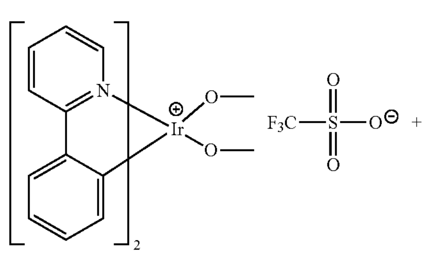

B1

-continued

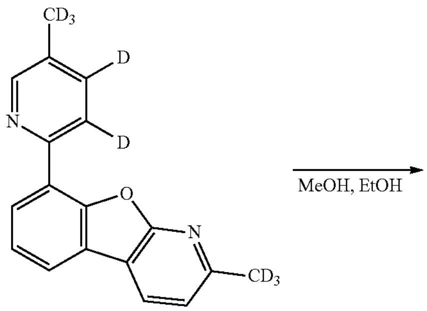

C4

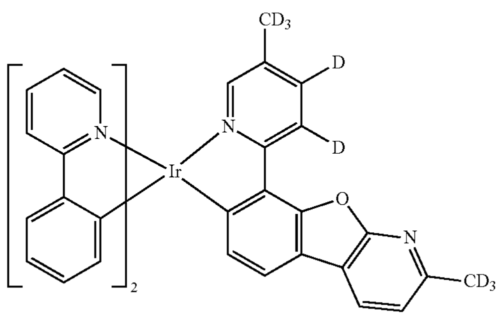

19

Compound 19 (yield: 53%) was prepared in the same manner as in Preparation of Compound 1, except that Intermediate C4 was used instead of Intermediate C1.

MS: $[M+H]^+$=783.25

Example 20: Preparation of Compound 20

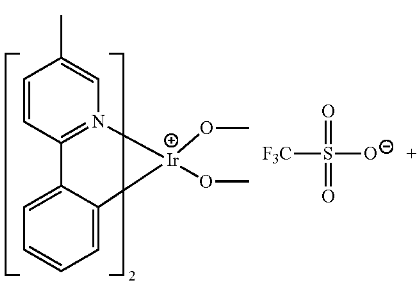

B2

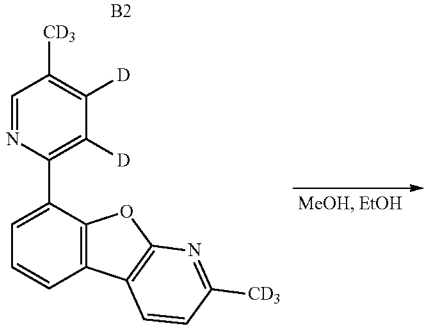

C4

-continued

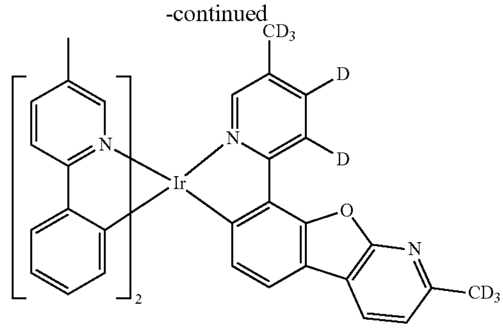

20

Compound 20 (yield: 53%) was prepared in the same manner as in Preparation of Compound 1, except that Intermediate B2 was used instead of Intermediate B1, and Intermediate C4 was used instead of Intermediate C1

MS: $[M+H]^+$=811.28

Example 21: Preparation of Compound 21

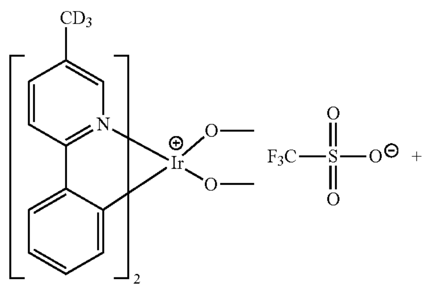

B3

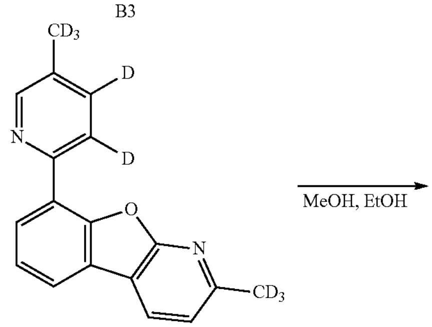

C4

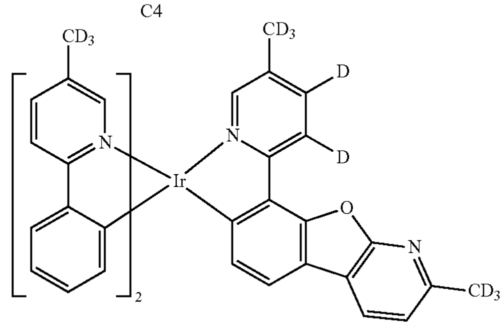

21

Compound 21 (yield: 46%) was prepared in the same manner as in Preparation of Compound 1, except that Intermediate B3 was used instead of Intermediate B1, and Intermediate C4 was used instead of Intermediate C1

MS: $[M+H]^+$=817.32

Example 22: Preparation of Compound 22

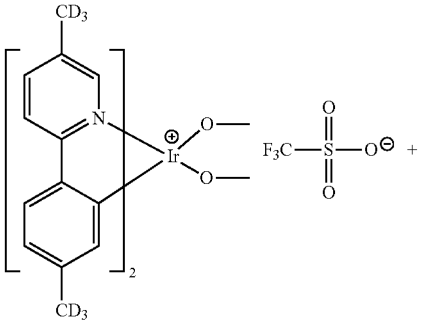

B4

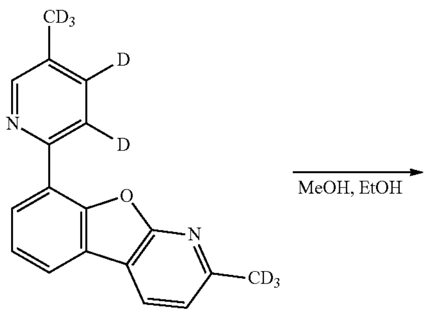

C4

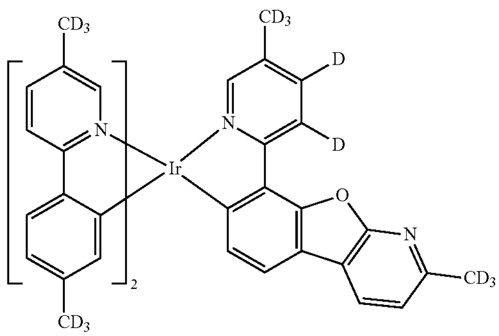

22

Compound 22 (yield: 49%) was prepared in the same manner as in Preparation of Compound 1, except that Intermediate B4 was used instead of Intermediate B1, and Intermediate C4 was used instead of Intermediate C1

MS: $[M+H]^+$=851.39

Example 23: Preparation of Compound 23

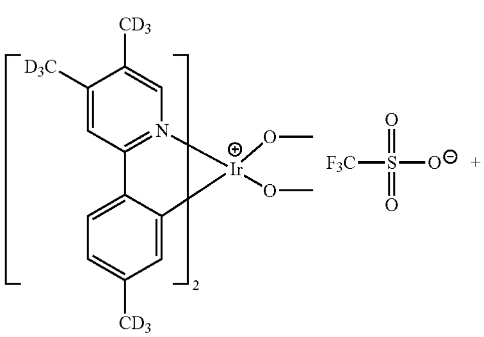

B5

-continued

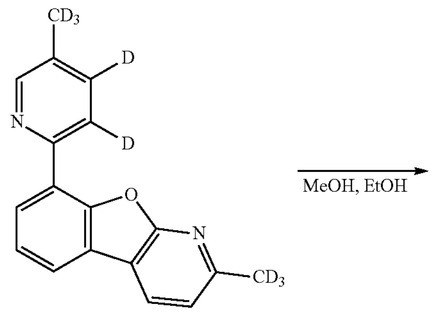

C4

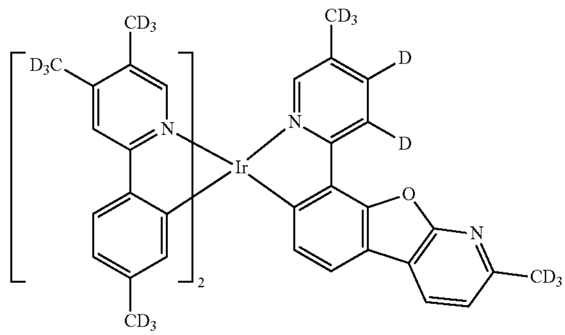

23

Compound 23 (yield: 52%) was prepared in the same manner as in Preparation of Compound 1, except that Intermediate B5 was used instead of Intermediate B1, and Intermediate C4 was used instead of Intermediate C1.

MS: $[M+H]^+$=885.45

Example 24: Preparation of Compound 24

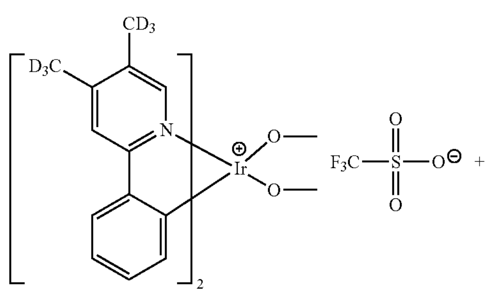

B6

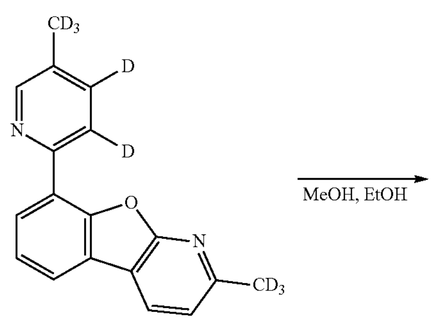

C4

-continued

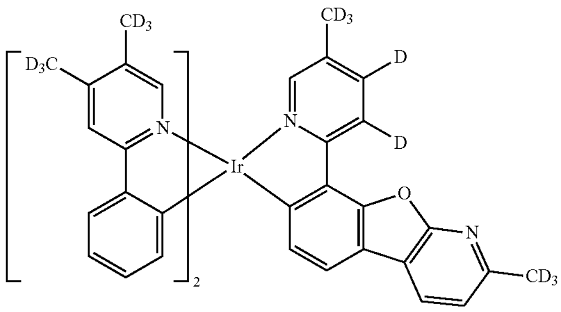

24

Compound 24 (yield: 40%) was prepared in the same manner as in Preparation of Compound 1, except that Intermediate B6 was used instead of Intermediate B1, and Intermediate C4 was used instead of Intermediate C1

MS: $[M+H]^{+}$=851.39

Example 25: Preparation of Compound 25

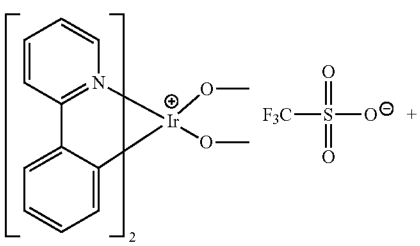

B1

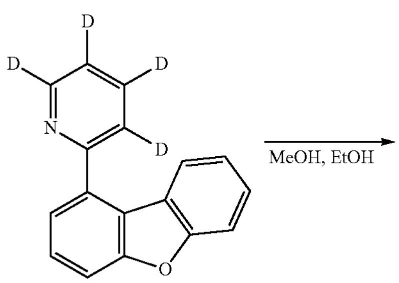

C5

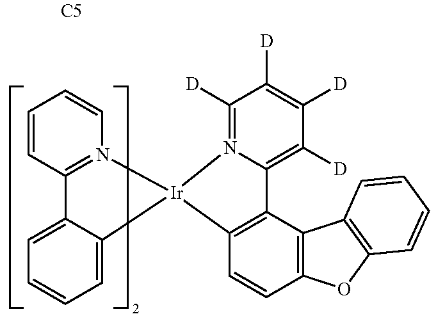

25

Compound 25 (yield: 53%) was prepared in the same manner as in Preparation of Compound 1, except that Intermediate C5 was used instead of Intermediate

MS: $[M+H]^{+}$=750.20

Example 26: Preparation of Compound 26

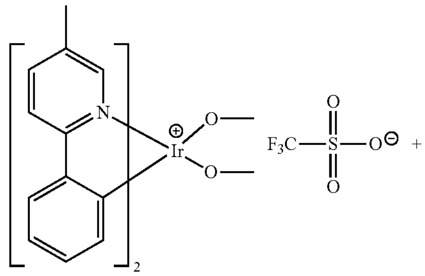

B2

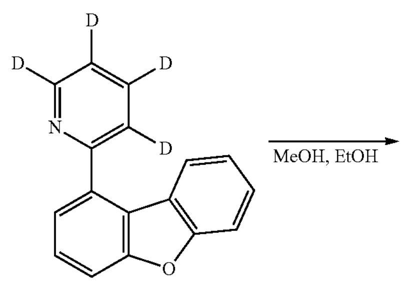

C5

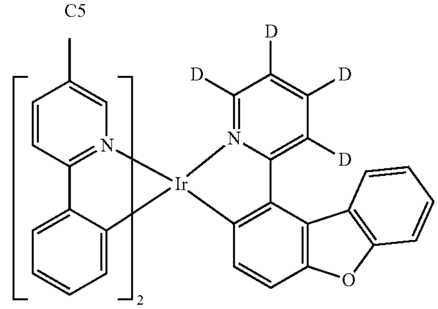

26

Compound 26 (yield: 50%) was prepared in the same manner as in Preparation of Compound 1, except that Intermediate B2 was used instead of Intermediate B1, and Intermediate C5 was used instead of Intermediate C1.

MS: $[M+H]^{+}$=778.23

Example 27: Preparation of Compound 27

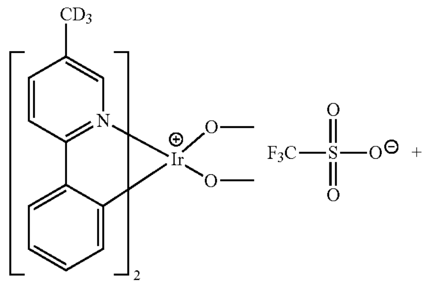

B3

-continued

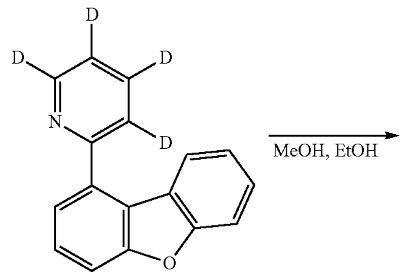

C5

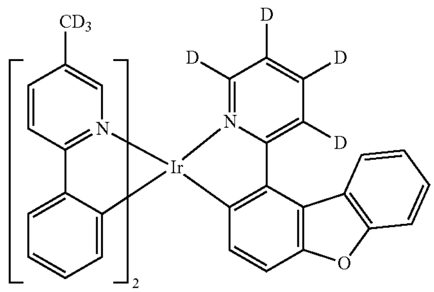

27

Compound 27 (yield: 47%) was prepared in the same manner as in Preparation of Compound 1, except that Intermediate B3 was used instead of Intermediate B1, and Intermediate C5 was used instead of Intermediate C1.

MS: $[M+H]^+$=784.26

Example 28: Preparation of Compound 28

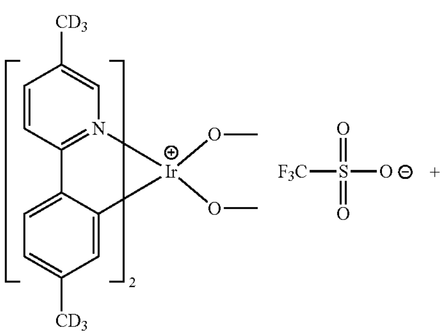

B4

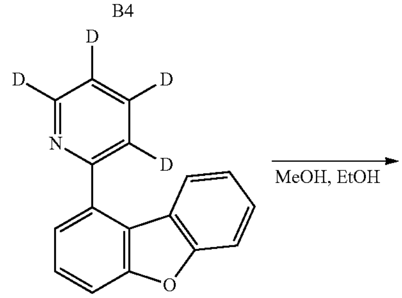

C5

-continued

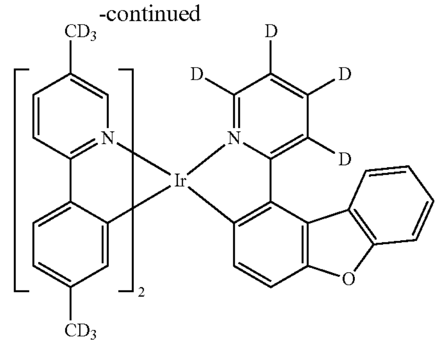

28

Compound 28 (yield: 43%) was prepared in the same manner as in Preparation of Compound 1, except that Intermediate B4 was used instead of Intermediate B1, and Intermediate C5 was used instead of Intermediate C1.

MS: $[M+H]^+$=818.33

Example 29: Preparation of Compound 29

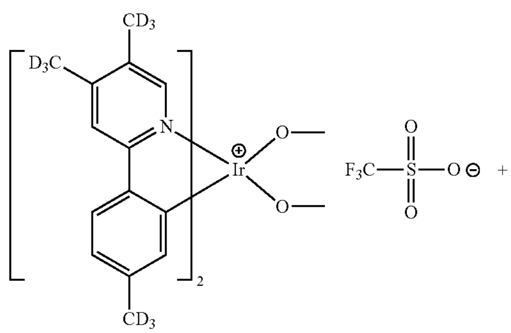

B5

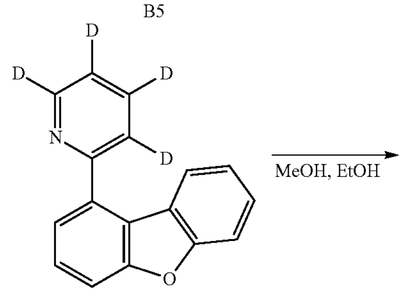

C5

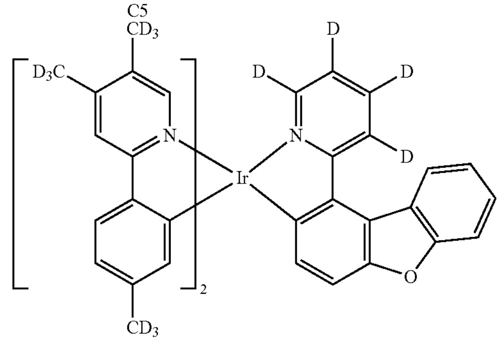

29

Compound 29 (yield: 44%) was prepared in the same manner as in Preparation of Compound 1, except that Intermediate B5 was used instead of Intermediate B1, and Intermediate C5 was used instead of Intermediate C1

MS: $[M+H]^+$=852.40

Example 30: Preparation of Compound 30

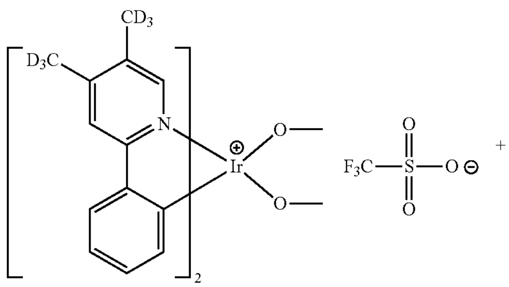

B6

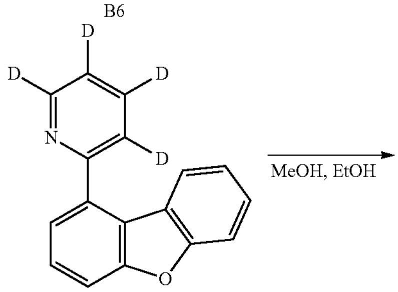

C5

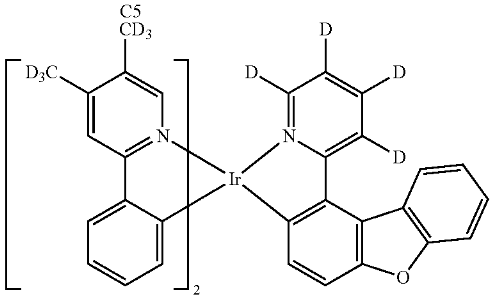

30

Compound 30 (yield: 49%) was prepared in the same manner as in Preparation of Compound 1, except that Intermediate B6 was used instead of Intermediate B1, and Intermediate C5 was used instead of Intermediate C1.

MS: $[M+H]^+$=818.33

Example 31: Preparation of Compound 31

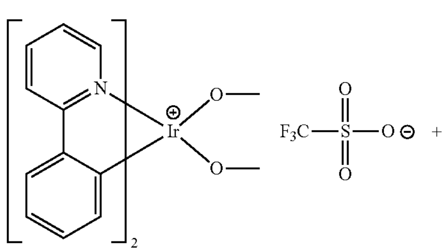

B1

-continued

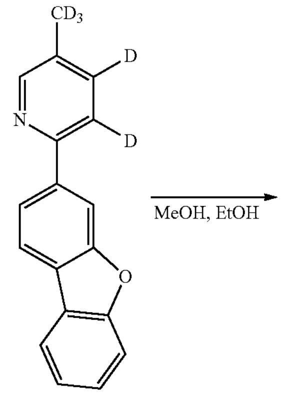

C6

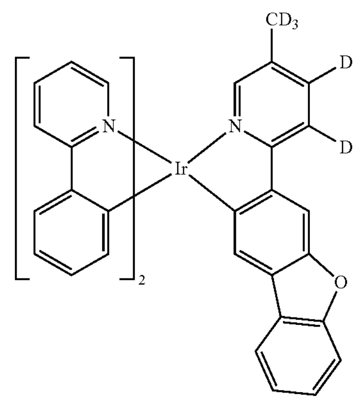

31

Compound 31 (yield: 42%) was prepared in the same manner as in Preparation of Compound 1, except that Intermediate C6 was used instead of Intermediate C1.

MS: $[M+H]^+$=765.22

Example 32: Preparation of Compound 32

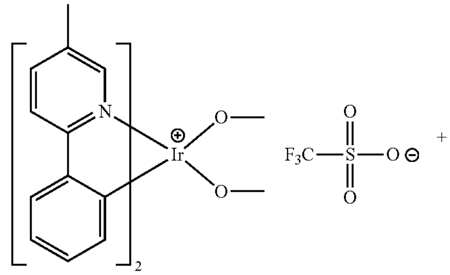

B2

-continued

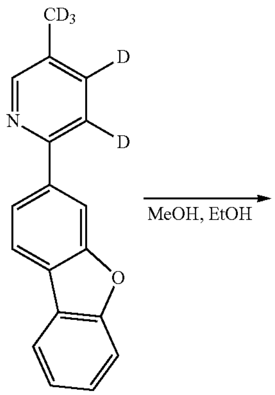

C6

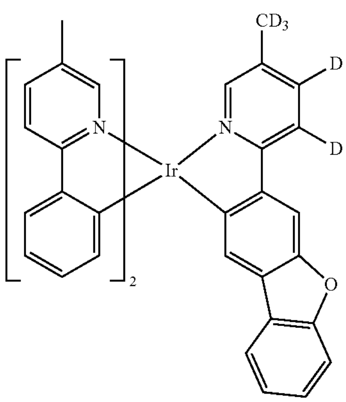

32

Compound 32 (yield: 42%) was prepared in the same manner as in Preparation of Compound 1, except that Intermediate B2 was used instead of Intermediate B1, and Intermediate C6 was used instead of Intermediate C1.

MS: $[M+H]^+$=793.25

Example 33: Preparation of Compound 33

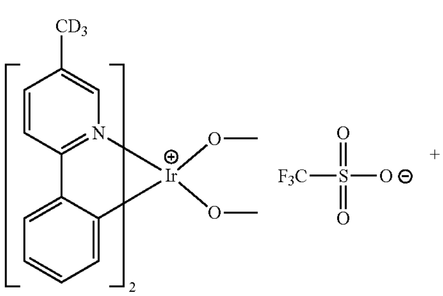

B3

-continued

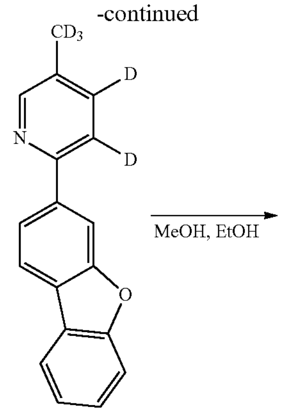

C6

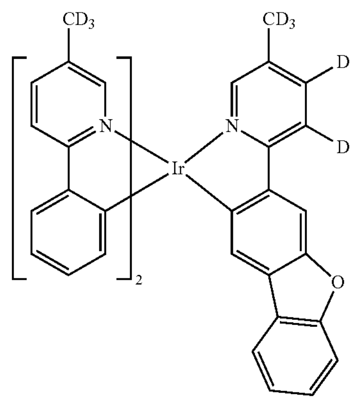

33

Compound 33 (yield: 40%) was prepared in the same manner as in Preparation of Compound 1, except that Intermediate B3 was used instead of Intermediate B1, and Intermediate C6 was used instead of Intermediate C1.

MS: $[M+H]^+$=799.29

Example 34: Preparation of Compound 34

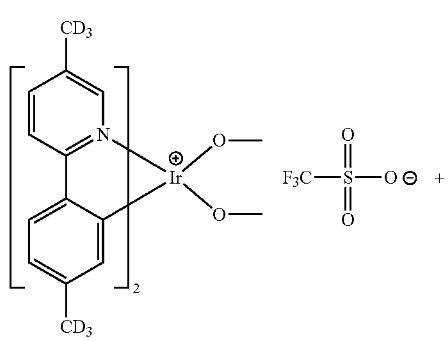

B4

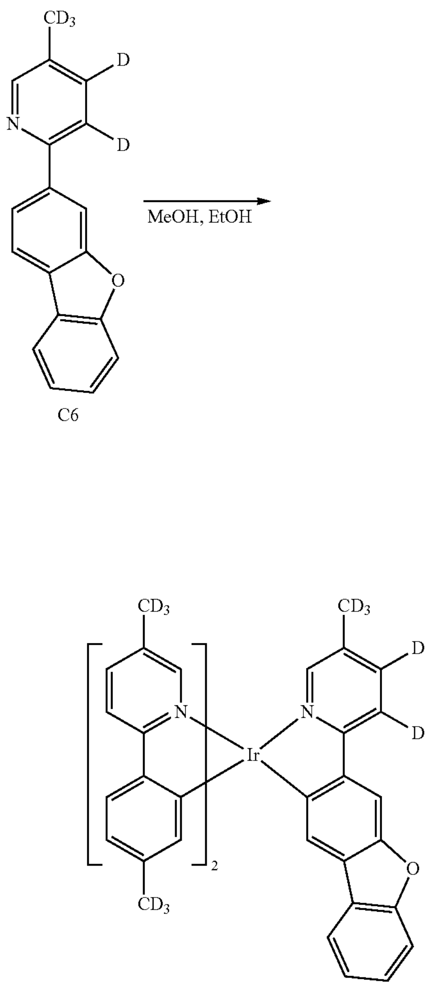

C6

34

Compound 34 (yield: 37%) was prepared in the same manner as in Preparation of Compound 1, except that Intermediate E34 was used instead of Intermediate B1, and Intermediate C6 was used instead of Intermediate C1.

MS: $[M+H]^+$=833.36

Example 35: Preparation of Compound 35

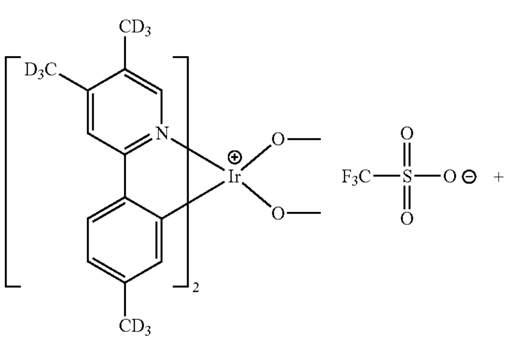

B5

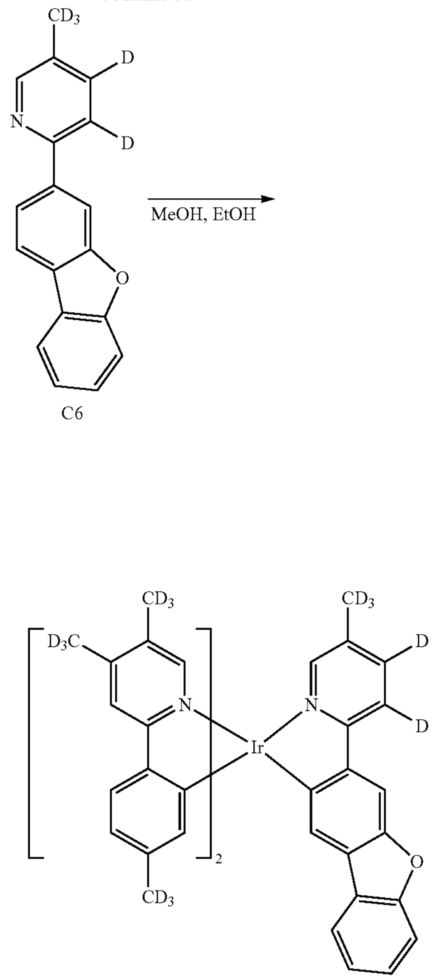

C6

35

Compound 35 (yield: 38%) was prepared in the same manner as in Preparation of Compound 1, except that Intermediate B5 was used instead of Intermediate B1, and Intermediate C6 was used instead of Intermediate C1

MS: $[M+H]^+$=867.42

Example 36: Preparation of Compound 36

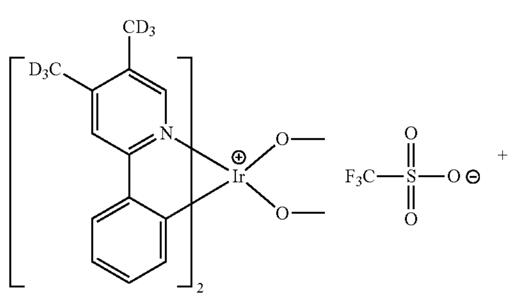

B6

-continued

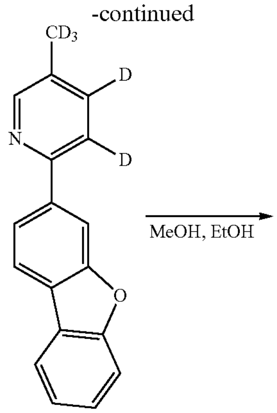

C6

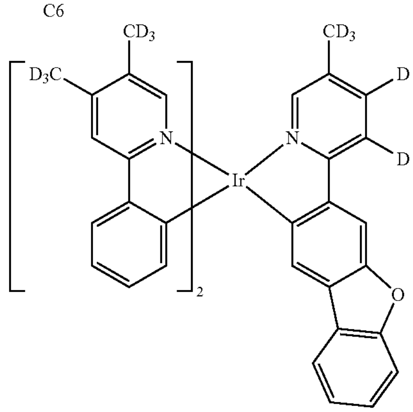

36

Compound 36 (yield: 45%) was prepared in the same manner as in Preparation of Compound 1, except that Intermediate B6 was used instead of Intermediate B1, and Intermediate C6 was used instead of Intermediate C1.

MS: $[M+H]^+$=833.36

Example 37: Preparation of Compound 37

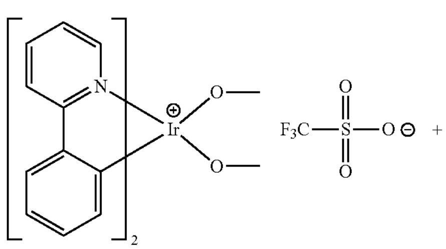

B1

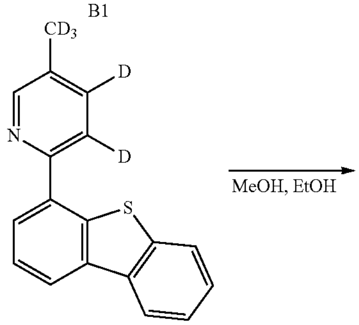

C7

-continued

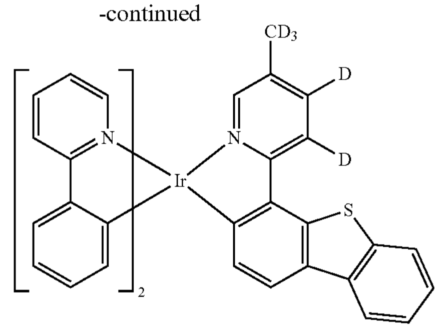

37

Compound 37 (yield: 57%) was prepared in the same manner as in Preparation of Compound 1 except that Intermediate C7 was used instead of Intermediate C1.

MS: $[M+H]^+$=780.99

Example 38: Preparation of Compound 38

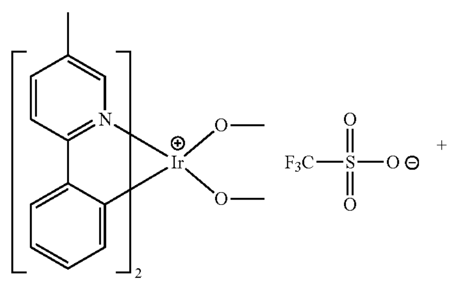

B2

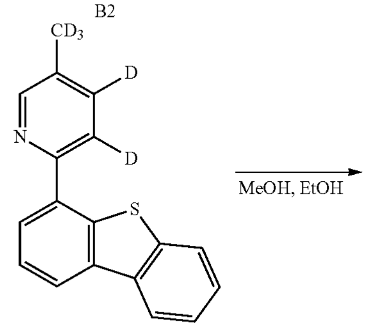

C7

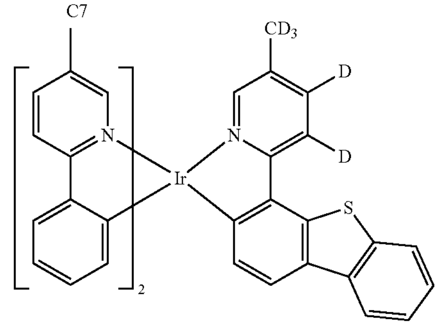

38

Compound 38 (yield: 57%) was prepared in the same manner as in Preparation of Compound 1, except that Intermediate E32 was used instead of Intermediate B1, and Intermediate C7 was used instead of Intermediate C1.

MS: $[M+H]^+$=809.05

Example 39: Preparation of Compound 39

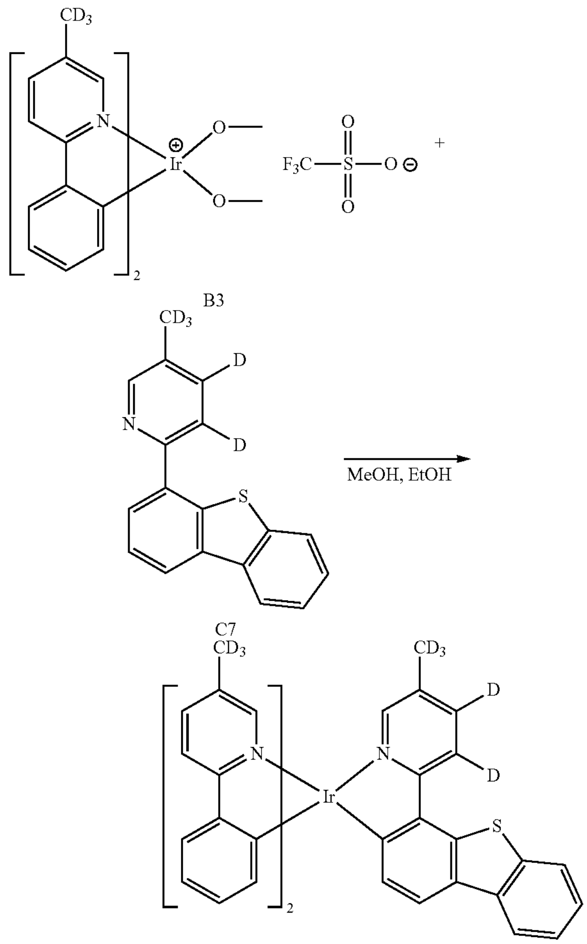

B3

C7

39

Compound 39 (yield: 57%) was prepared in the same manner as in Preparation of Compound 1, except that Intermediate B3 was used instead of Intermediate B1, and Intermediate C7 was used instead of Intermediate C1.

MS: $[M+H]^+$=815.08

Example 40: Preparation of Compound 40

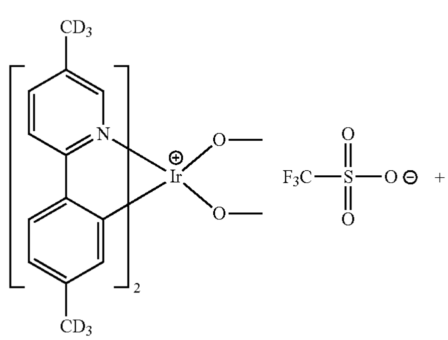

B4

-continued

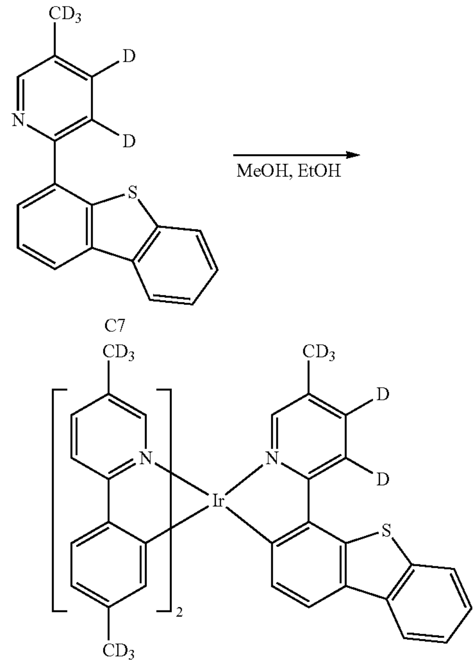

C7

40

Compound 40 (yield: 51%) was prepared in the same manner as in Preparation of Compound 1, except that Intermediate B4 was used instead of Intermediate B1, and Intermediate C7 was used instead of Intermediate C1.

MS: $[M+H]^+$=849.17

Example 41: Preparation of Compound 41

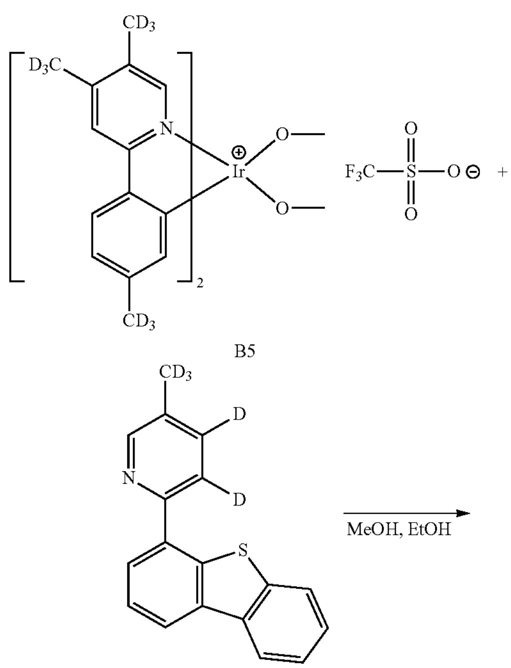

B5

C7

-continued

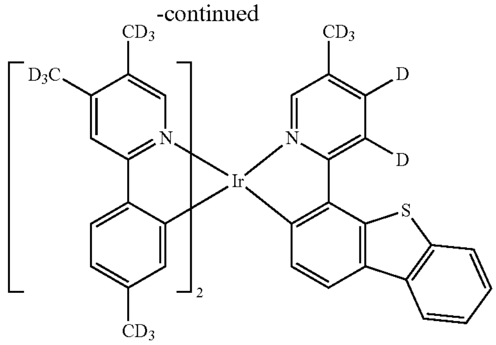

41

Compound 41 (yield: 50%) was prepared in the same manner as in Preparation of Compound 1, except that Intermediate B5 was used instead of Intermediate B1, and Intermediate C7 was used instead of Intermediate C1.

MS: $[M+H]^+$=833.26

Example 42: Preparation of Compound 42

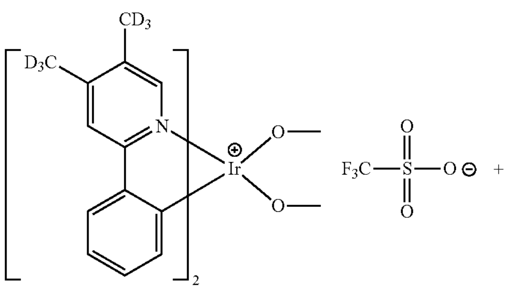

B6

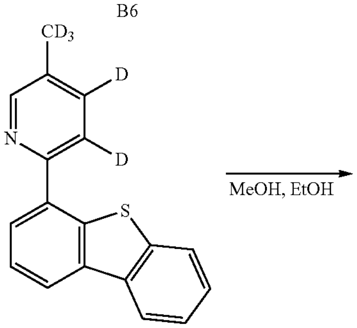

C7

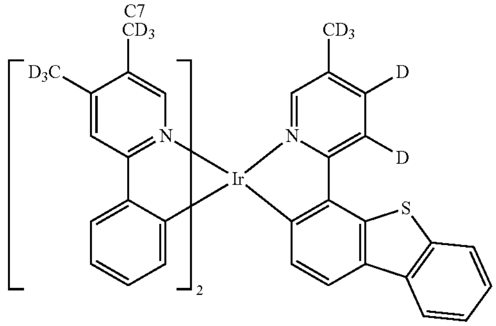

42

Compound 42 (yield: 41%) was prepared in the same manner as in Preparation of Compound 1, except that Intermediate E36 was used instead of Intermediate B1, and Intermediate C7 was used instead of Intermediate C1.

MS: $[M+H]^+$=849.17

Example 43: Preparation of Compound 43

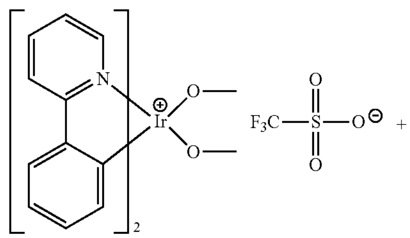

B1

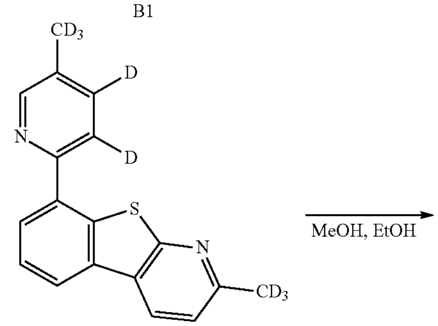

C8

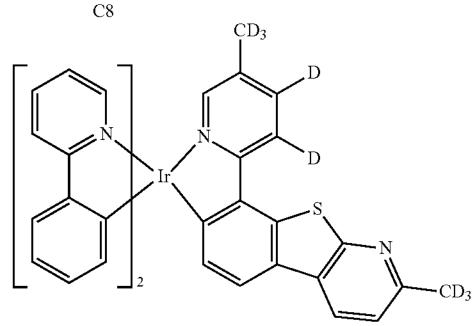

43

Compound 43 (yield: 44%) was prepared in the same manner as in Preparation of Compound 1, except that Intermediate C8 was used instead of Intermediate C1

MS: $[M+H]^+$=799.03

Example 44: Preparation of Compound 44

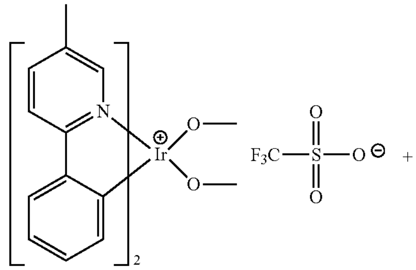

B2

-continued

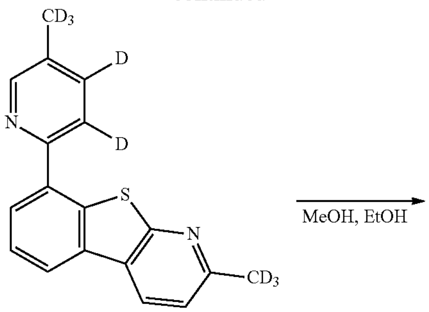

C8

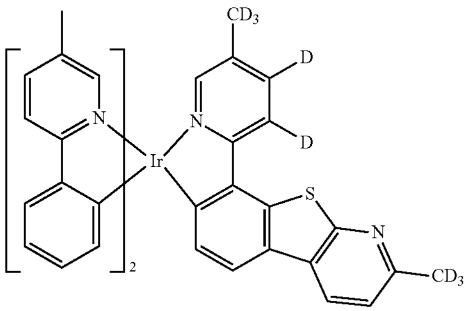

44

Compound 44 (yield: 49%) was prepared in the same manner as in Preparation of Compound 1, except that Intermediate B2 was used instead of Intermediate B1, and Intermediate C8 was used instead of Intermediate C1.

MS: $[M+H]^+$=827.03

Example 45: Preparation of Compound 45

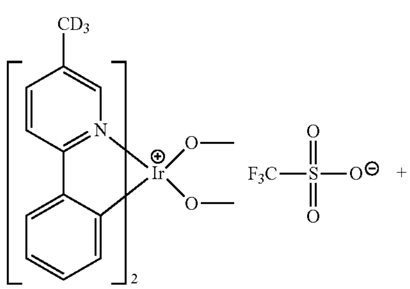

B3

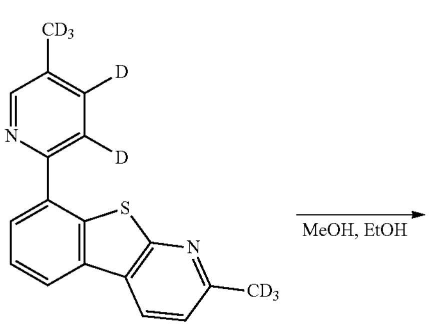

C8

-continued

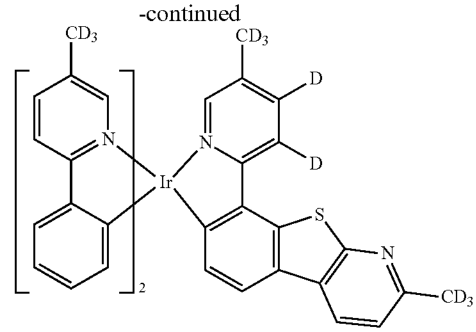

45

Compound 45 (yield: 57%) was prepared in the same manner as in Preparation of Compound 1, except that Intermediate B3 was used instead of Intermediate B1, and Intermediate C8 was used instead of Intermediate C1.

MS: $[M+H]^+$=833.12

Example 46: Preparation of Compound 46

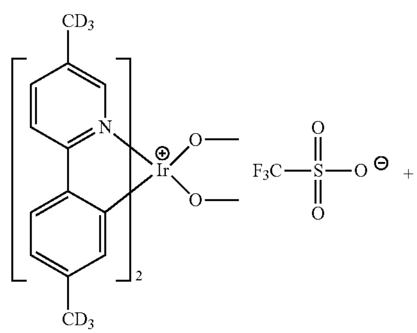

B4

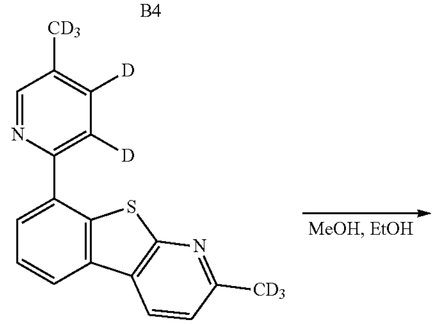

C8

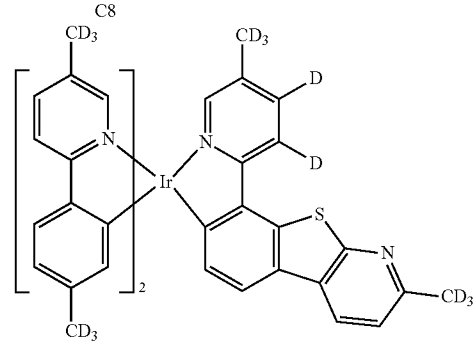

46

Compound 46 (yield: 50%) was prepared in the same manner as in Preparation of Compound 1, except that Intermediate E34 was used instead of Intermediate B1, and Intermediate C8 was used instead of Intermediate C1.

MS: $[M+H]^+$=867.12

Example 47: Preparation of Compound 47

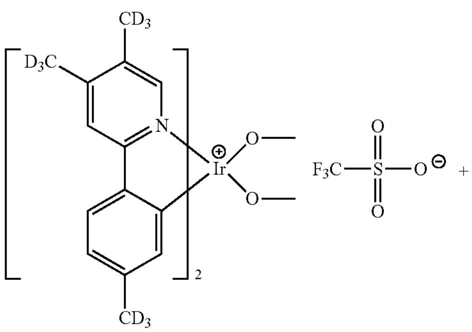

B5

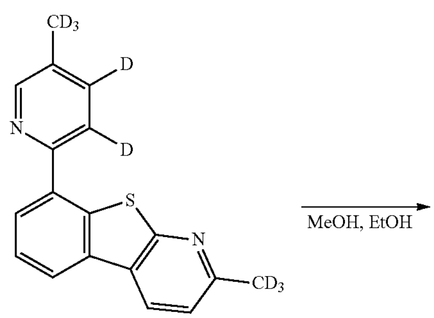

C8

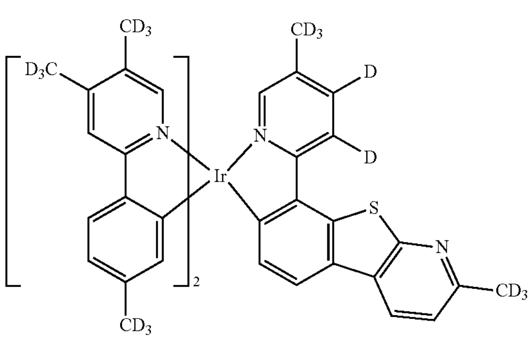

47

Compound 47 (yield: 41%) was prepared in the same manner as in Preparation of Compound 1, except that Intermediate B5 was used instead of Intermediate B1, and Intermediate C8 was used instead of Intermediate C1.

MS: $[M+H]^+$=901.30

Example 48: Preparation of Compound 48

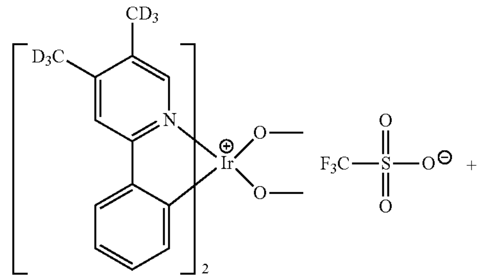

B6

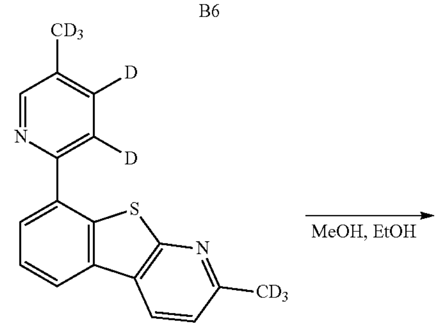

C8

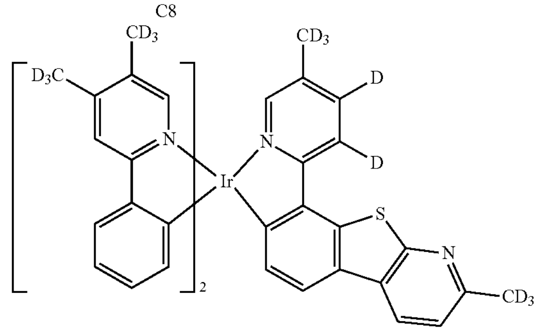

48

Compound 48 (yield: 41%) was prepared in the same manner as in Preparation of Compound 1, except that Intermediate B6 was used instead of Intermediate B1, and Intermediate C8 was used instead of Intermediate C1.

MS: $[M+H]^+$=867.12

Example 49: Preparation of Compound 49

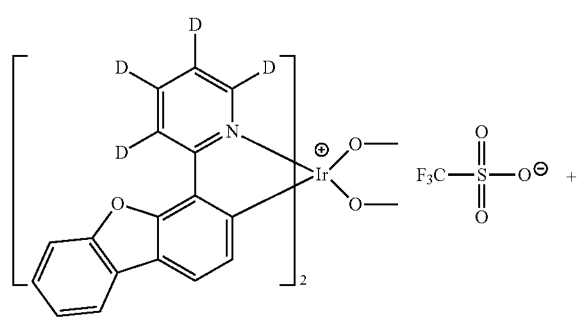

D1

-continued

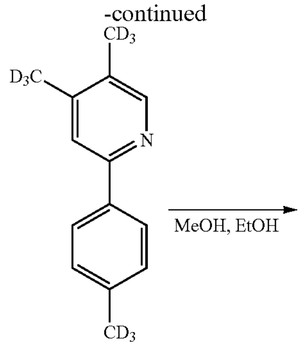

A5

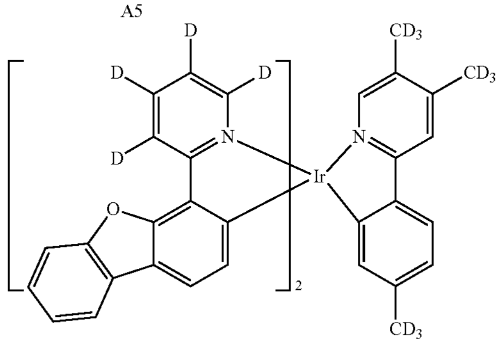

49

Compound 49 (yield: 40%) was prepared in the same manner as in Preparation of Compound 1, except that Intermediate D1 was used instead of Intermediate B1, and Intermediate A5 was used instead of Intermediate C1.

MS: $[M+H]^{+}$=895.14

Example 50: Preparation of Compound 50

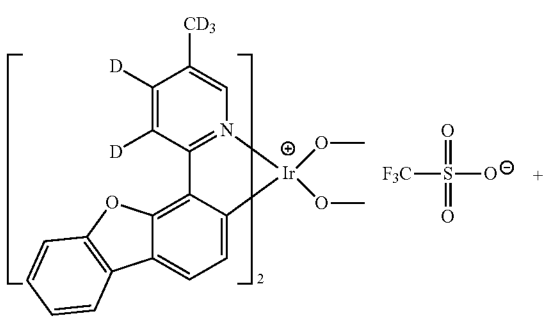

D2

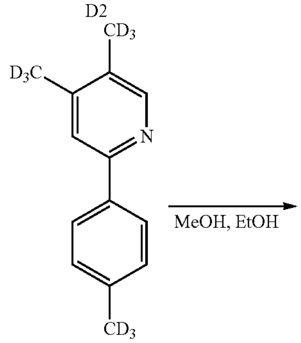

A5

-continued

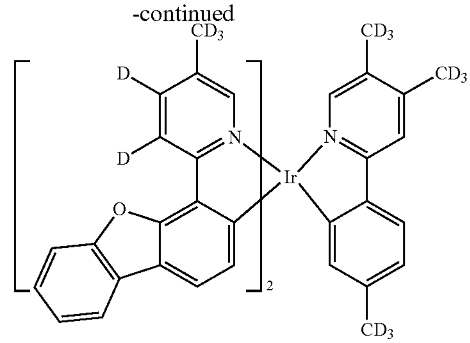

50

Compound 50 (yield: 38%) was prepared in the same manner as in Preparation of Compound 1, except that Intermediate 02 was used instead of Intermediate B1, and Intermediate A5 was used instead of Intermediate C1.

MS: $[M+H]^{+}$=925.21

Example 51: Preparation of Compound 51

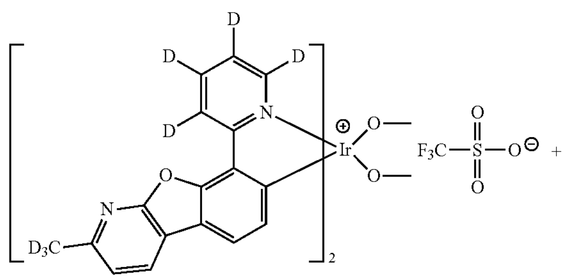

D3

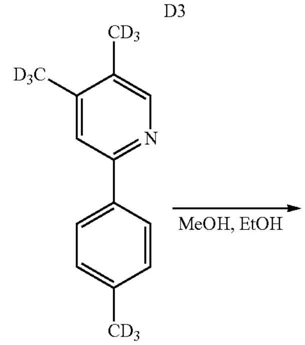

A5

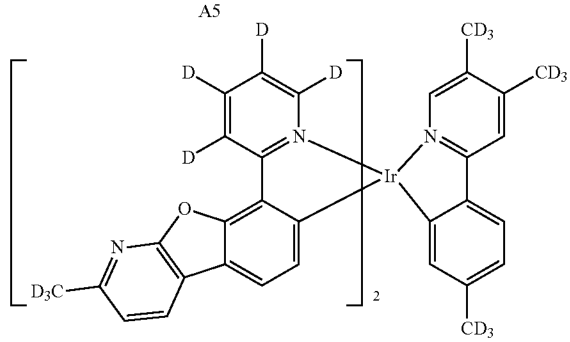

51

Compound 51 (yield: 46%) was prepared in the same manner as in Preparation of Compound 1, except that Intermediate D3 was used instead of Intermediate B1, and Intermediate A5 was used instead of Intermediate C1.

MS: $[M+H]^+$=931.21

Example 52: Preparation of Compound 52

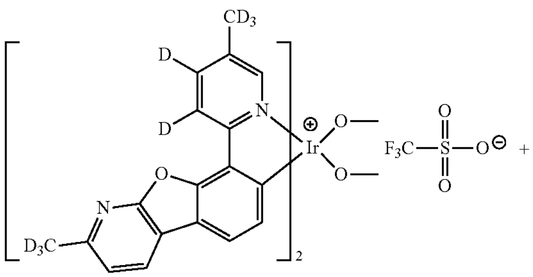

D4

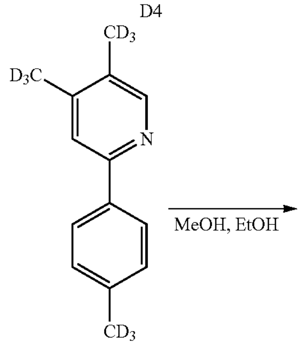

A5

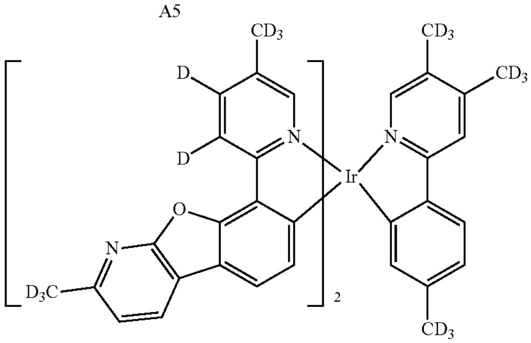

52

Compound 52 (yield: 44%) was prepared in the same manner as in Preparation of Compound 1, except that Intermediate D4 was used instead of Intermediate B1, and Intermediate A5 was used instead of Intermediate C1

MS: $[M+H]^+$=961.27

Example 53: Preparation of Compound 53

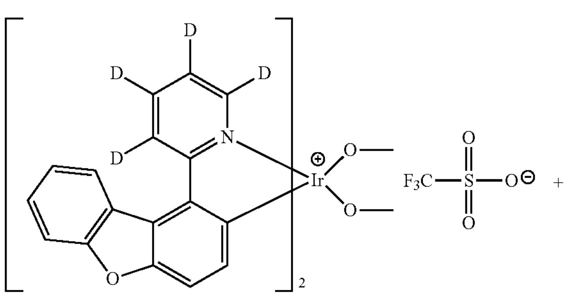

D5

-continued

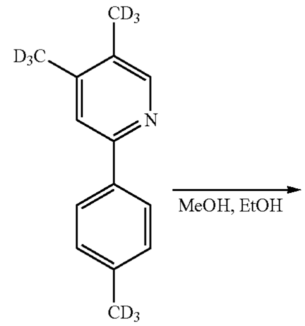

A5

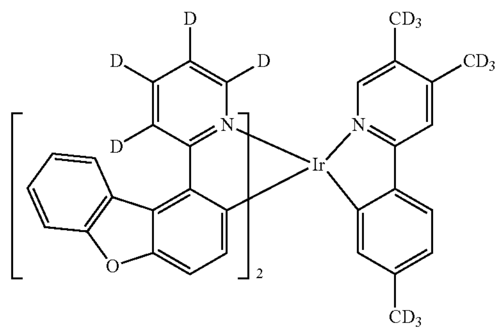

53

Compound 53 (yield: 50%) was prepared in the same manner as in Preparation of Compound 1, except that Intermediate 05 was used instead of Intermediate B1, and Intermediate A5 was used instead of Intermediate C1,

MS: $[M+H]^+$=895.14

Example 54: Preparation of Compound 54

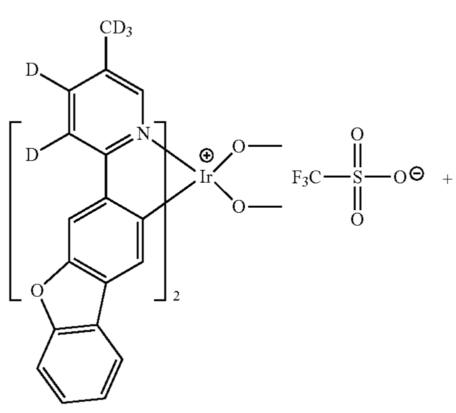

D6

-continued

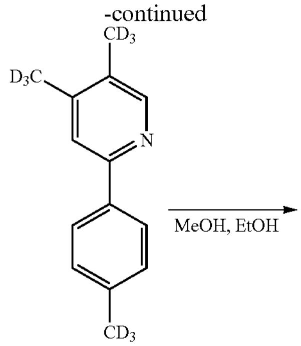

A5

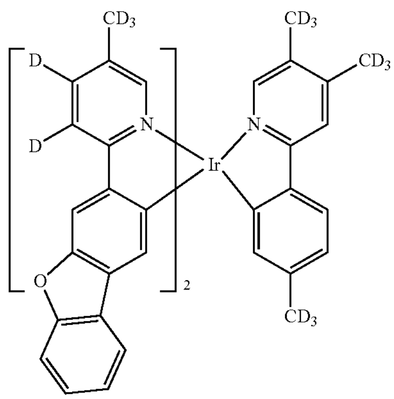

54

Compound 54 (yield: 46%) was prepared in the same manner as in Preparation of Compound 1, except that Intermediate D6 was used instead of Intermediate B1, and Intermediate A5 was used instead of Intermediate C1.

MS: $[M+H]^+$=895.14

Example 55: Preparation of Compound 55

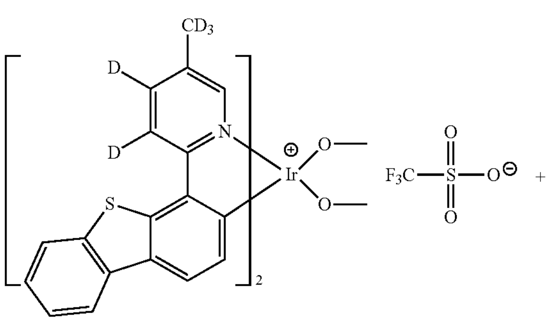

D7

-continued

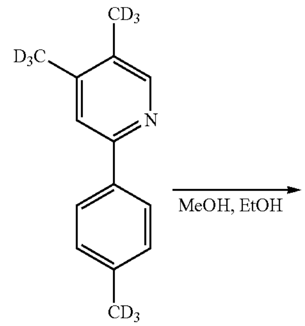

A5

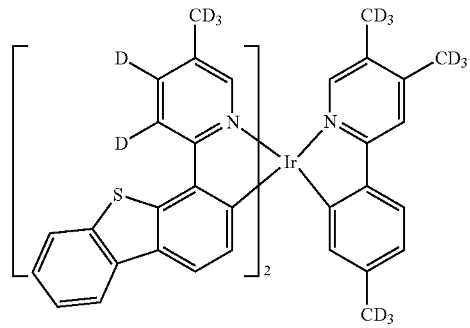

55

Compound 55 (yield: 46%) was prepared in the same manner as in Preparation of Compound 1, except that Intermediate D7 was used instead of Intermediate B1, and Intermediate A5 was used instead of Intermediate C1,

MS: $[M+H]^+$=963.33

Example 56: Preparation of Compound 56

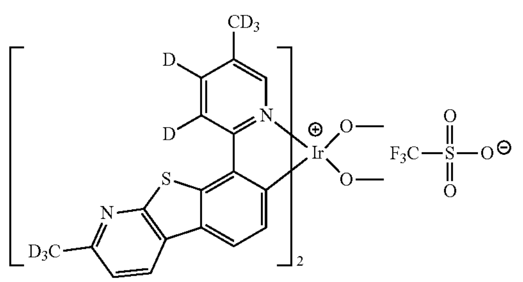

D8

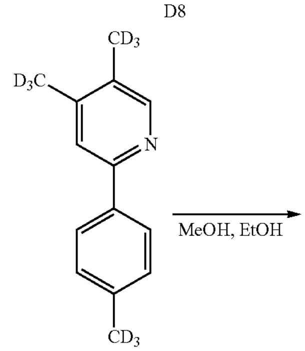

A5

-continued

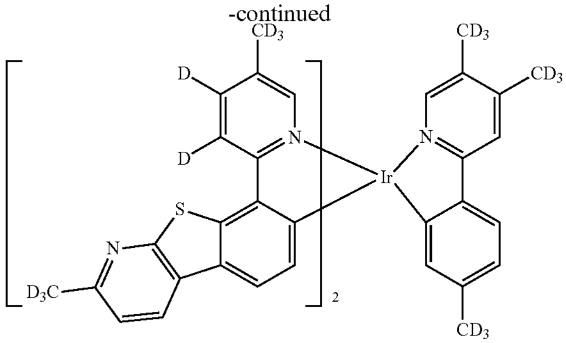

56

Compound 56 (yield: 46%) was prepared in the same manner as in Preparation of Compound 1, except that Intermediate D8 was used instead of Intermediate B1, and Intermediate A5 was used instead of Intermediate C1,

MS: $[M+H]^+$=993.39

EXPERIMENTAL EXAMPLE

Experimental Example 1

A glass substrate on which ITO (indium tin oxide) was coated as a thin film to a thickness of 1,400 Å was put into distilled water in which a detergent was dissolved, and ultrasonically cleaned. In this case, a Decon™ CON705 product available at Fischer Co., was used as the detergent, and as the distilled water, distilled water twice filtered using a 0.22 μm sterilizing filter manufactured by Millipore Co., was used. After the ITO was washed for 30 minutes, ultrasonic washing was conducted twice repeatedly using distilled water for 10 minutes. After the washing using distilled water was completed, ultrasonic washing was conducted using solvents of isopropyl alcohol, acetone, and methanol for 10 minutes, respectively, and then dried, after which it was transferred to a plasma cleaner. In addition, the substrate was cleaned for 5 minutes using oxygen plasma, and then transferred to a vacuum depositor.

On the ITO transparent electrode thus prepared, a mixture of 95 wt % of a compound HT-A below and 5 wt % of a compound P-DOPANT compound below was thermally vacuum-deposited to a thickness of 100 Å, and then only a compound HT-A below was deposited to a thickness of 1150 Å to form a hole transport layer. Then, a compound HT-B below was thermally vacuum-deposited in a thickness of 450 Å on the hole transport layer to form an electron blocking layer. A mixture of a compound GH1 below as a first host, a compound GH2 below as a second host, and the Compound 3 previously prepared as a dopant in a weight ratio of 47:47:6, respectively, were vacuum-deposited to a thickness of 400 Å on the electron blocking layer to form a light emitting layer. A compound ET-A below was vacuum-deposited to a thickness of 50 Å on the light emitting layer to form a hole blocking layer. A compound ET-B below and a compound Liq below were mixed at a weight ratio of 2:1 and thermally vacuum-deposited to a thickness of 250 Å on the hole blocking layer to form an electron transport layer, and then, LiF and magnesium were mixed at a weight ratio of 1:1 and thermally vacuum-deposited to a thickness of 30 Å to form an electron injection layer. Then, magnesium and silver were mixed at a weight ratio of 1:4 and deposited to a thickness of 160 Å on the electron injection layer to form a cathode, thereby completing the manufacture of an organic light emitting device.

HT-A

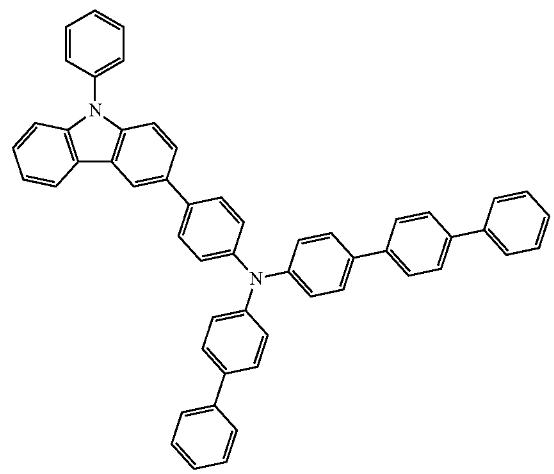

P-DOPANT

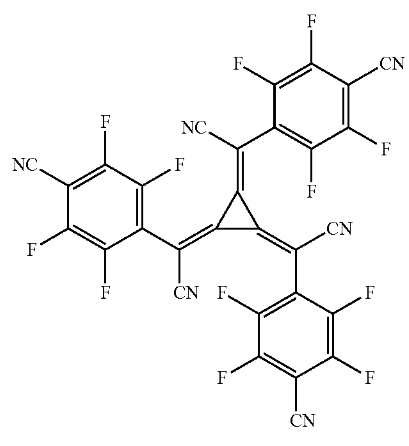

HT-B

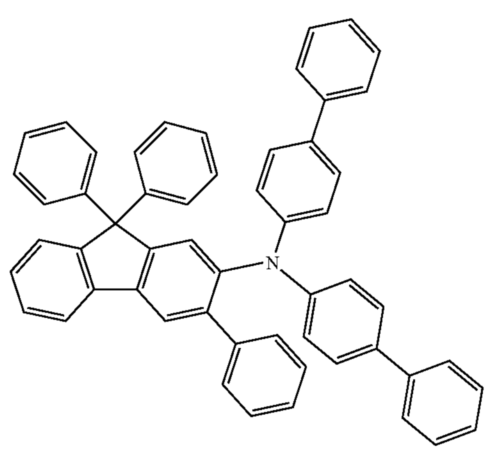

-continued

GH1

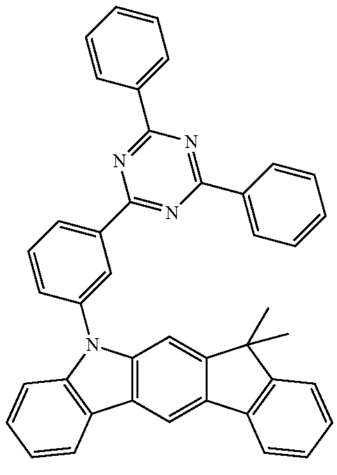

GH2

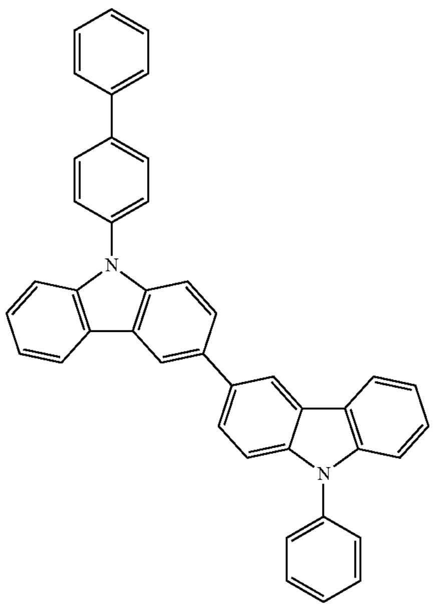

ET-B

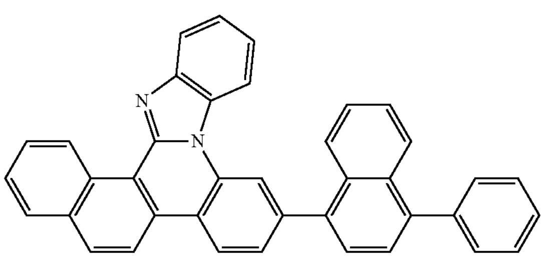

Liq

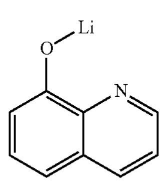

Experimental Examples 2 to 16

The organic light emitting devices of Experimental Examples 2 to 16 were respectively manufactured in the same manner as in Experimental Example 1, except that the compounds and the weight ratio shown in Table 1 below were used instead of Compound 1 as a phosphorescent dopant during formation of the light emitting layer. When the weight ratio is 10 in Table 1 below, it means that a mixture of the first host, the second host, and the dopant in a weight ratio of 45:45:10, respectively, was used.

Comparative Experimental Examples 1 to 6

The organic light emitting devices of Comparative Experimental Examples 1 to 6 were respectively manufactured in the same manner as in Experimental Example 1, except that the compounds and the weight ratio shown in Table 1 below were used instead of Compound 1 as a phosphorescent dopant during formation of the light emitting layer. When the weight ratio is 10 in Table 1 below, it means that a mixture of the first host, the second host, and the dopant in a weight ratio of 45:45:10, respectively, was used.

E1

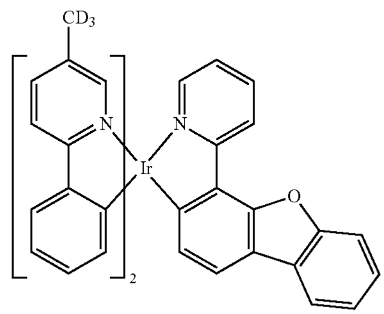

E2

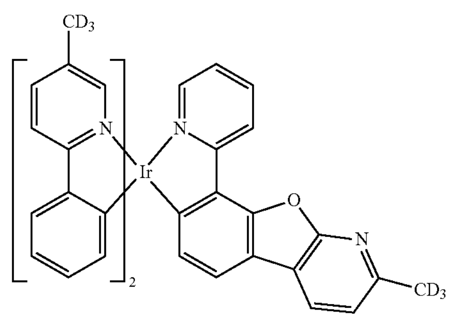

E3

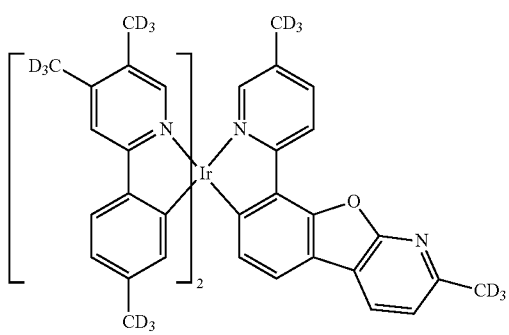

The wavelength of maximum emission (max), voltage, efficiency, color coordinate, and lifetime were measured by applying a current to the organic light emitting devices manufactured in the Experimental Examples and Comparative Experimental Examples, and the results are shown in Table 1 below. T95 means the time required for the luminance to be reduced to 95% of the initial value.

TABLE 1

| | Dopant material | Weight ratio | max (nm) | Voltage (V) (@10 mA/cm$^2$) | Efficiency (cd/A) (@10 mA/cm$^2$) | Lifetime (T95, hr) (@50 mA/cm$^2$) |
|---|---|---|---|---|---|---|
| Experimental Example 1 | Compound 3 | 6 | 530 | 4.20 | 58.52 | 140 |
| Experimental Example 2 | Compound 3 | 10 | 531 | 4.27 | 58.13 | 157 |
| Experimental Example 3 | Compound 15 | 6 | 528 | 4.32 | 67.40 | 156 |
| Experimental Example 4 | Compound 15 | 10 | 530 | 4.34 | 66.87 | 171 |
| Experimental Example 5 | Compound 21 | 6 | 528 | 4.30 | 68.91 | 173 |
| Experimental Example 6 | Compound 21 | 10 | 531 | 4.31 | 68.45 | 180 |
| Experimental Example 7 | Compound 23 | 6 | 528 | 4.25 | 72.33 | 230 |
| Experimental Example 8 | Compound 23 | 10 | 530 | 4.27 | 72.09 | 254 |
| Experimental Example 9 | Compound 42 | 6 | 533 | 4.44 | 70.38 | 200 |
| Experimental Example 10 | Compound 42 | 10 | 535 | 4.46 | 70.01 | 212 |
| Experimental Example 11 | Compound 47 | 6 | 532 | 4.40 | 71.18 | 217 |
| Experimental Example 12 | Compound 47 | 10 | 534 | 4.41 | 70.98 | 220 |
| Experimental Example 13 | Compound 51 | 6 | 531 | 4.35 | 69.24 | 180 |
| Experimental Example 14 | Compound 51 | 10 | 532 | 4.37 | 68.86 | 201 |
| Experimental Example 15 | Compound 52 | 6 | 530 | 4.33 | 70.31 | 194 |
| Experimental Example 16 | Compound 52 | 10 | 531 | 4.36 | 70.10 | 215 |
| Comparative Experimental Example 1 | Compound E1 | 6 | 530 | 4.21 | 49.87 | 72 |
| Comparative Experimental Example 2 | Compound E1 | 10 | 532 | 4.30 | 49.34 | 78 |
| Comparative Experimental Example 3 | Compound E2 | 6 | 528 | 4.32 | 53.21 | 97 |
| Comparative Experimental Example 4 | Compound E2 | 10 | 530 | 4.35 | 52.90 | 105 |
| Comparative Experimental Example 5 | Compound E3 | 6 | 528 | 4.26 | 54.48 | 104 |
| Comparative Experimental Example 6 | Compound E3 | 10 | 530 | 4.27 | 54.01 | 125 |

The structure of Chemical Formula 1 according to the present invention shows that in the ligand of 2-((dibenzo[b,d]furanyl)pyridine) skeleton of the three ligands connected to iridium, a C—H bond at para and meta positions of N connected to iridium is substituted with a C-D bond. Such a structure is one in which hydrogen of the weakest bond among the C—H bonds in pyridine is substituted with deuterium, which brings stability to the molecule itself. Therefore, such a structure can induce high luminous efficiency and long lifetime without substantially changing the color coordinate as compared with a structure not substituted with deuterium. Especially when the concentration of the dopant is increased, the effect appears more prominent. Therefore, as shown in Table 1, when the compound of Chemical Formula 1 according to the present invention is used as a dopant material in the light emitting layer of an organic light emitting device, a device with high efficiency and long lifetime can be obtained.

EXPLANATION OF SIGN

1: Substrate
2: Anode
3: Light emitting layer
4: Cathode
5: Hole injection layer
6: Hole transport layer
7: Light emitting layer
8: Electron transport layer

The invention claimed is:

1. A compound of the following Chemical Formula 1:

[Chemical Formula 1]

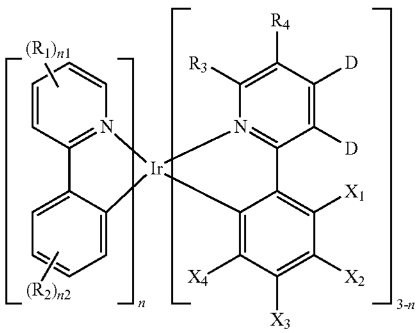

wherein in Chemical Formula 1:

for $X_1$ to $X_4$, $X_1$ and $X_2$, $X_2$ and $X_3$, or $X_3$ and $X_4$ are linked with * in the following Chemical Formula 2, and the rest are $R_5$:

[Chemical Formula 2]

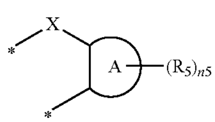

X is O, or S;

A is a benzene ring or a pyridine ring;

n is 1 or 2;

n1 is an integer of 1 to 4;

n2 is an integer of 1 to 4;

n5 is an integer of 1 to 4 when A is a benzene ring, and n5 is an integer of 1 to 3 when A is a pyridine ring;

$R_1$ to $R_4$ are each independently hydrogen, deuterium, cyano, amino, a substituted or unsubstituted $C_{1-60}$ alkyl, a substituted or unsubstituted $C_{1-60}$ haloalkyl, a substituted or unsubstituted $C_{3-60}$ cycloalkyl, a substituted or unsubstituted $C_{2-60}$ alkenyl, or a substituted or unsubstituted $C_{6-60}$ aryl;

one of $R_5$ is hydrogen, deuterium, cyano, amino, a substituted or unsubstituted $C_{1-60}$ alkyl, a substituted or unsubstituted $C_{1-60}$ haloalkyl, a substituted or unsubstituted $C_{3-60}$ cycloalkyl, a substituted or unsubstituted $C_{2-60}$ alkenyl, or a substituted or unsubstituted $C_{6-60}$ aryl, and the rest of $R_5$ is hydrogen, or deuterium.

2. The compound according to claim 1, wherein the Chemical Formula 1 is any one of the following Chemical Formula 1-1 to 1-10:

1-1

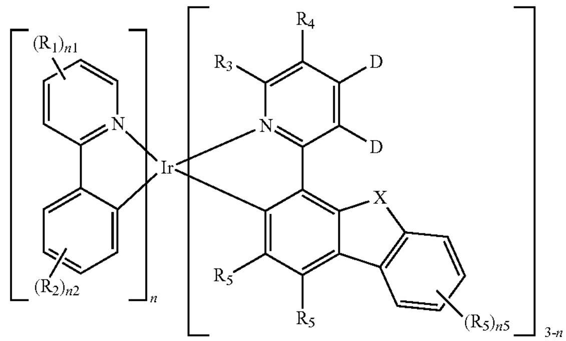

1-2

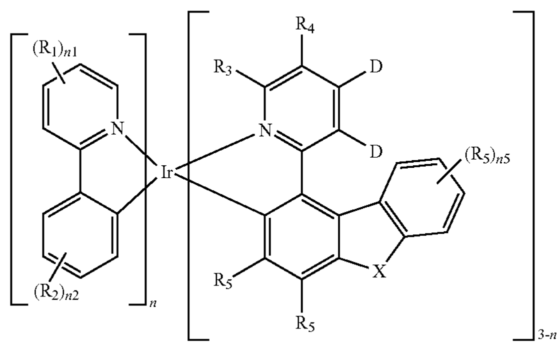

1-3

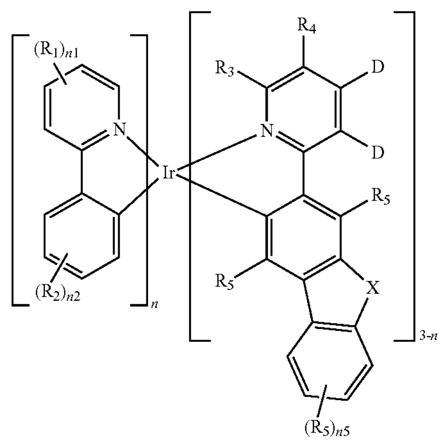

1-4

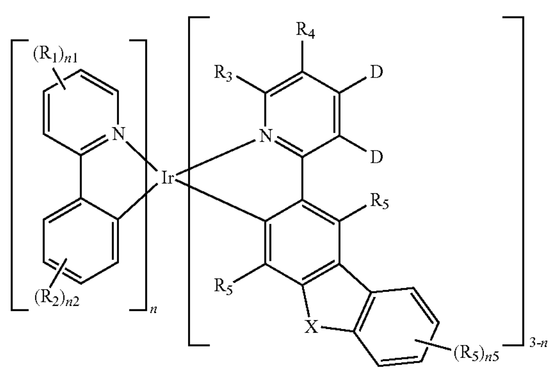

-continued 1-5

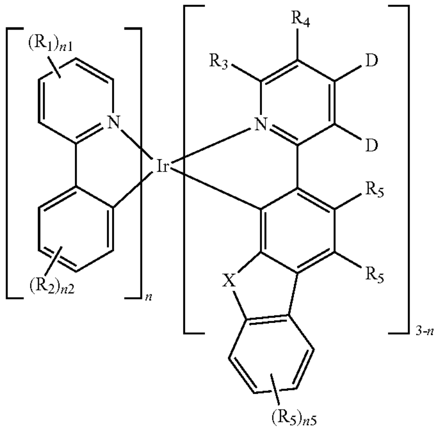

1-6

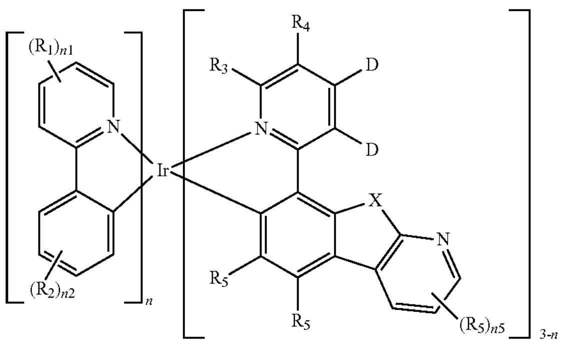

1-7

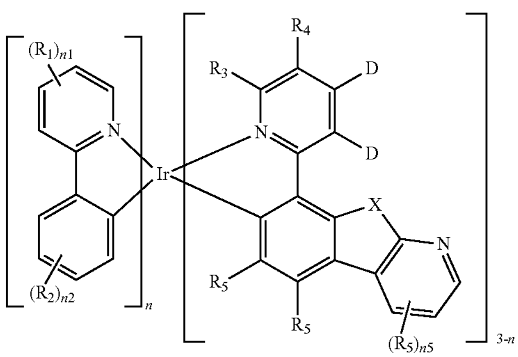

1-8

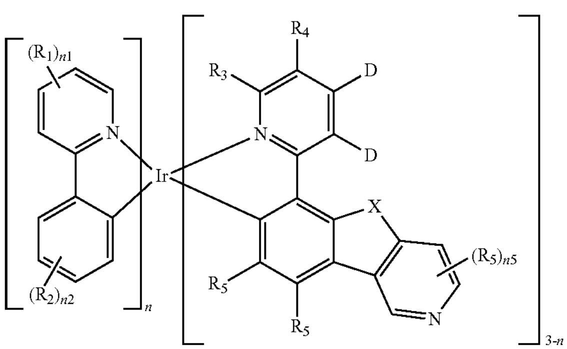

-continued 1-9

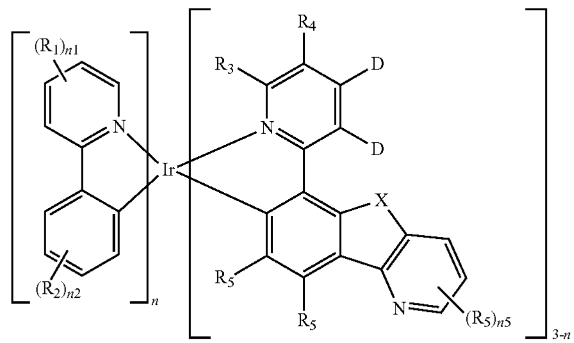

1-10

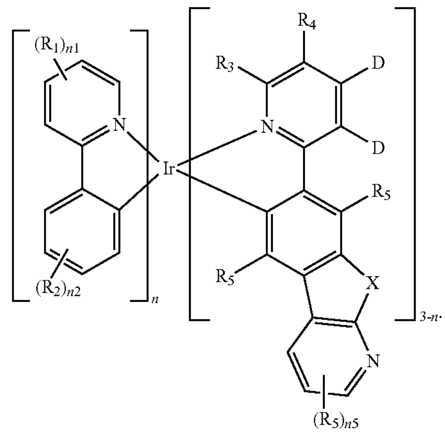

3. The compound according to claim 1, wherein each $R_1$ is independently hydrogen, deuterium, methyl, ethyl, propyl, or isopropyl which is unsubstituted or substituted by one or more deuterium, or cyclopropyl, cyclobutyl, cyclopentyl, or cyclohexyl which is unsubstituted or substituted by one or more deuterium.

4. The compound according to claim 1, wherein each $R_2$ is independently hydrogen, deuterium, methyl, ethyl, propyl, or isopropyl which is unsubstituted or substituted by one or more deuterium, or cyclopropyl, cyclobutyl, cyclopentyl, or cyclohexyl which is unsubstituted or substituted by one or more deuterium.

5. The compound according to claim 1, wherein $R_3$ is hydrogen or deuterium.

6. The compound according to claim 1, wherein $R_4$ is:

hydrogen, deuterium, methyl, ethyl, propyl, or isopropyl which is substituted or substituted by one or more deuterium, or cyclopropyl, cyclobutyl, cyclopentyl, or cyclohexyl which is unsubstituted or substituted by one or more deuterium.

7. The compound according to claim 1, wherein one of $R_5$ is hydrogen, deuterium, methyl, ethyl, propyl, or isopropyl which is unsubstituted or substituted by one or more deuterium, or cyclopropyl, cyclobutyl, cyclopentyl, or cyclohexyl which is unsubstituted or substituted by one or more deuterium, and
the rest of $R_5$ are each independently hydrogen or deuterium.
8. The compound according to claim 1, wherein the compound of Chemical Formula 1 is selected from the group consisting of the following:
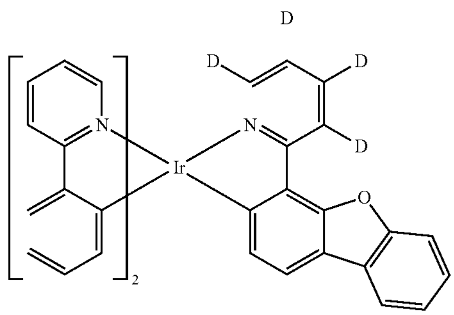
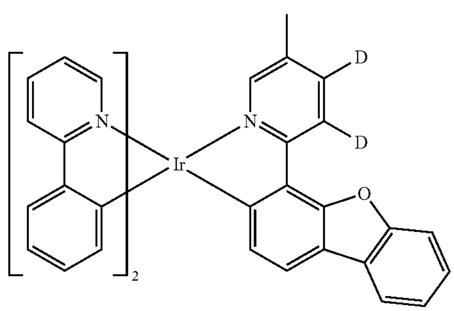
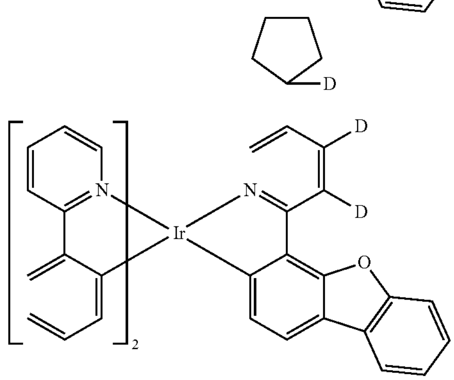
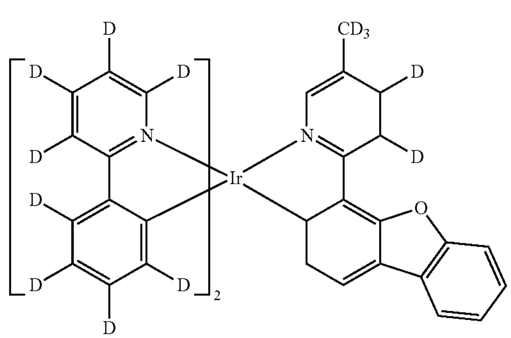
-continued
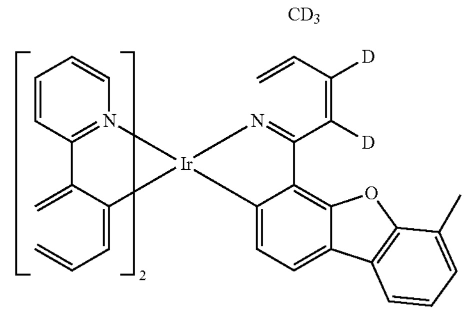
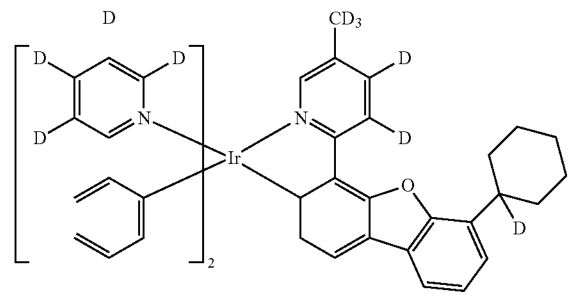
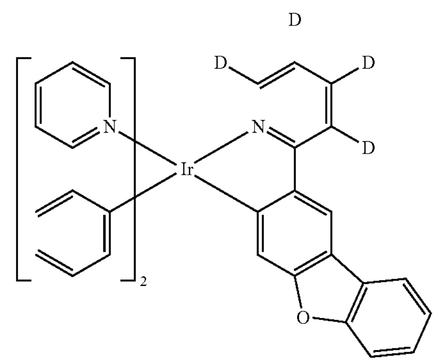
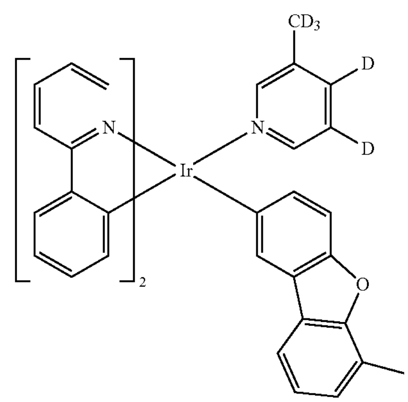
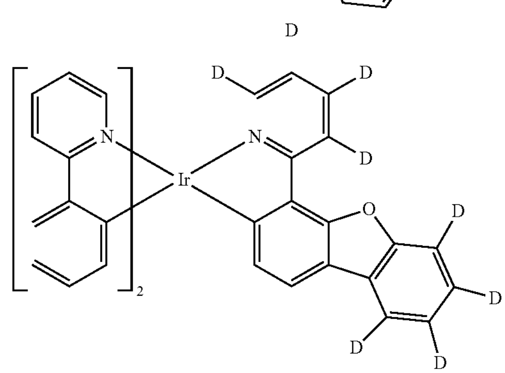

-continued
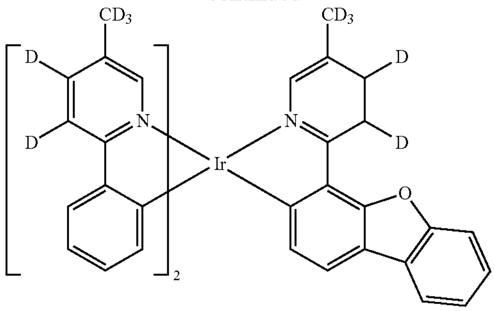
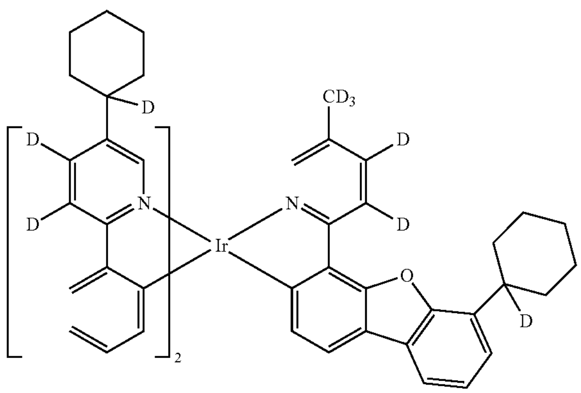
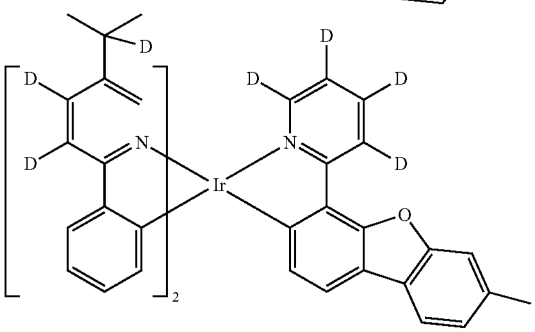
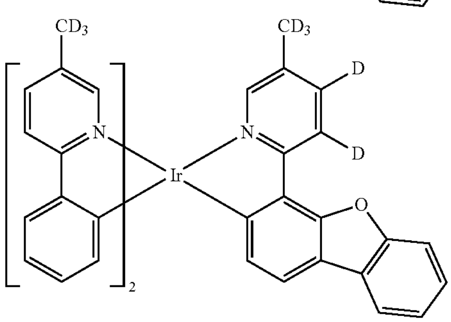
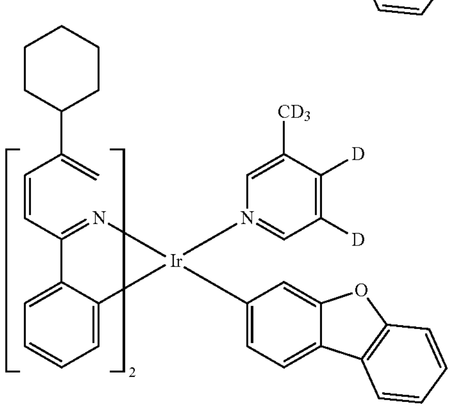
-continued
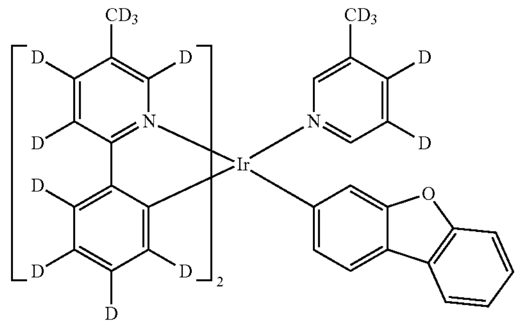
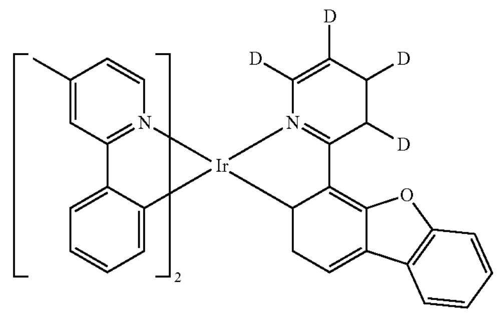
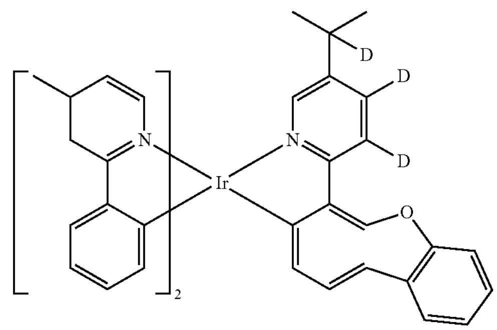
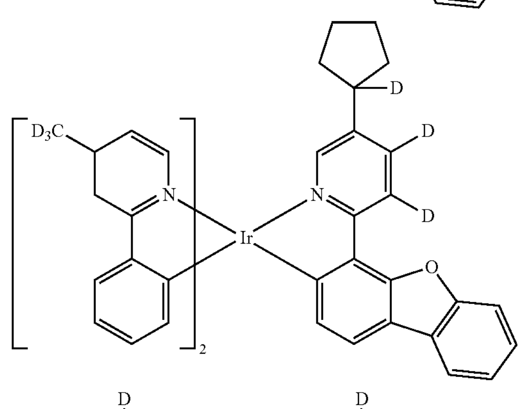
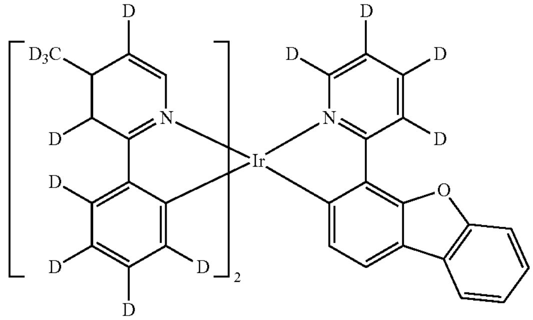

-continued
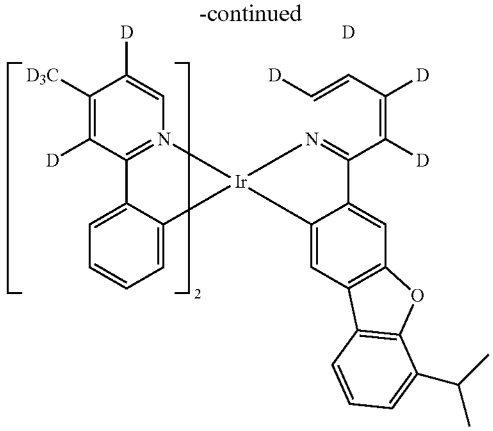
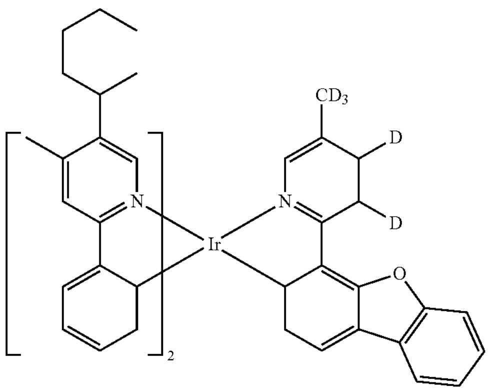
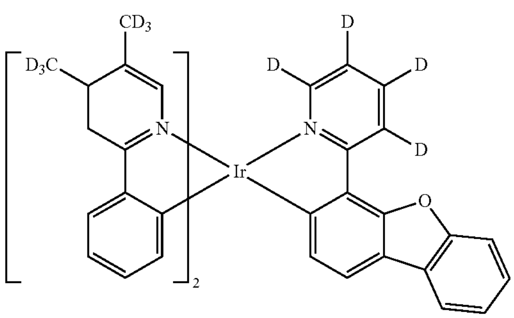
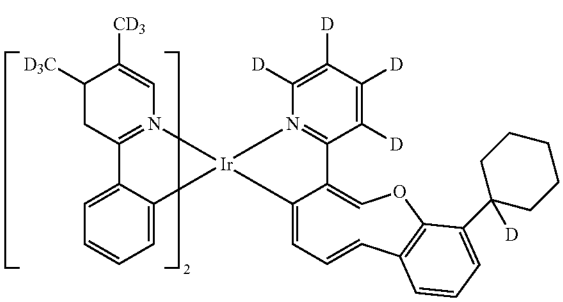
-continued
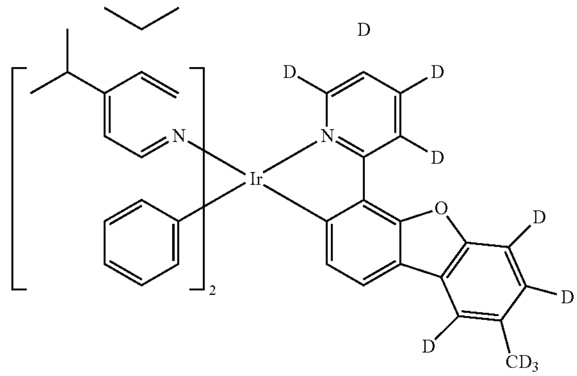
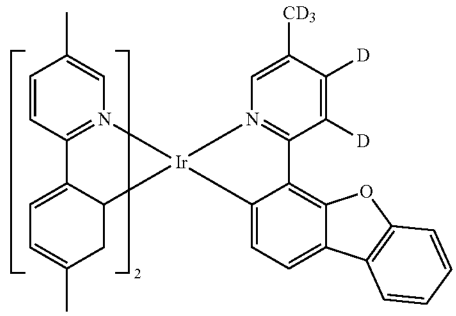
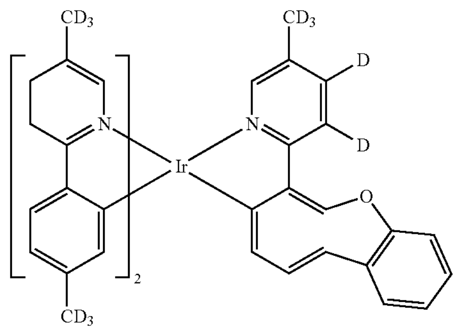
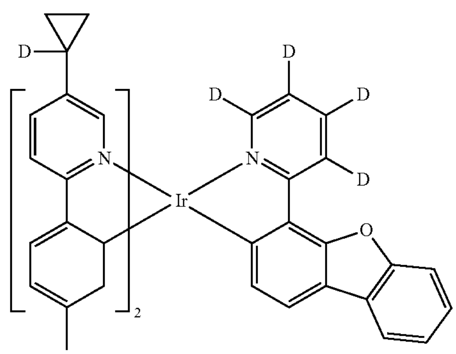
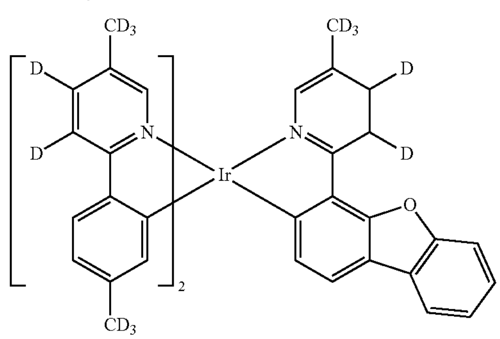

-continued
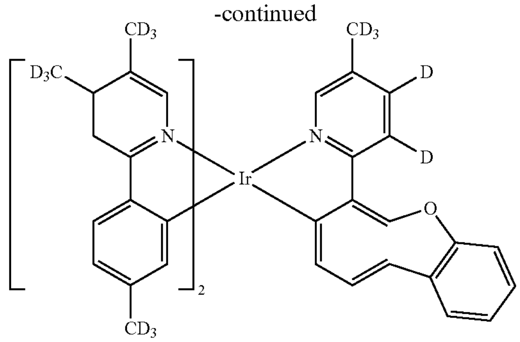
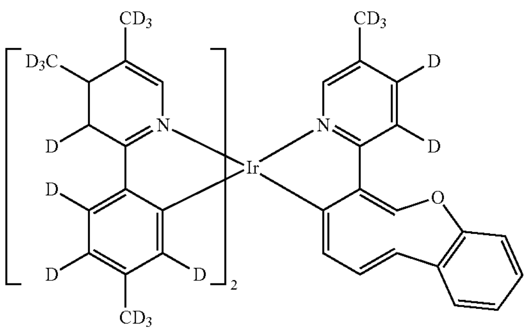
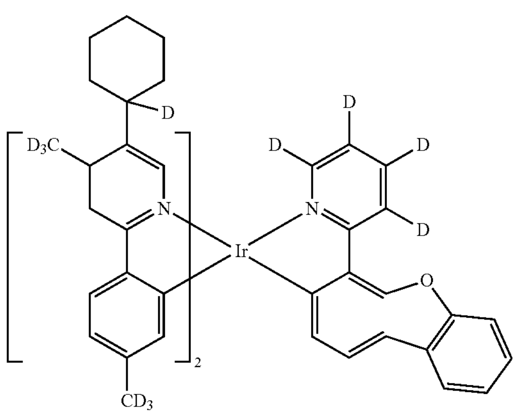
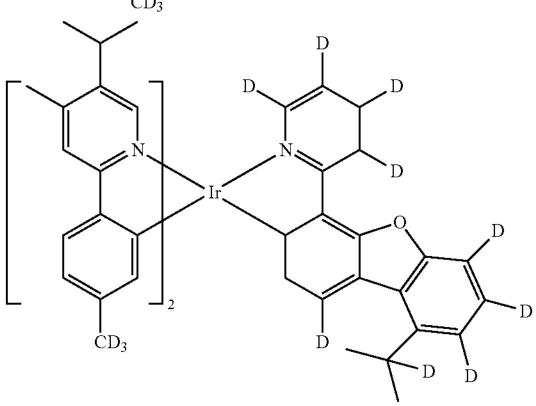
-continued
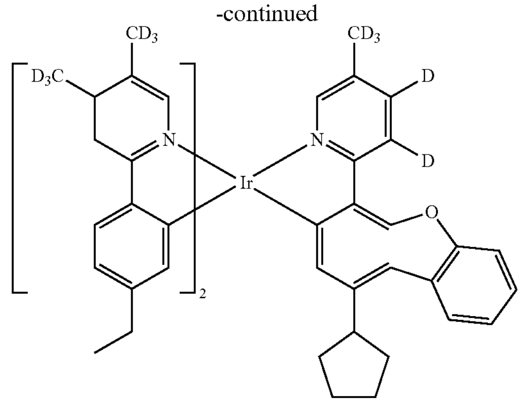
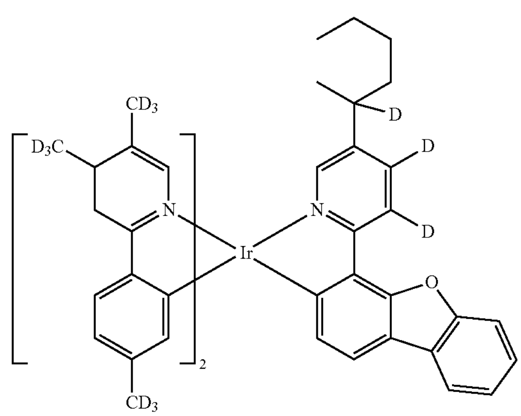
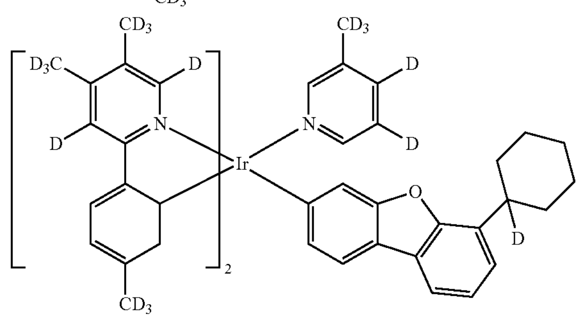
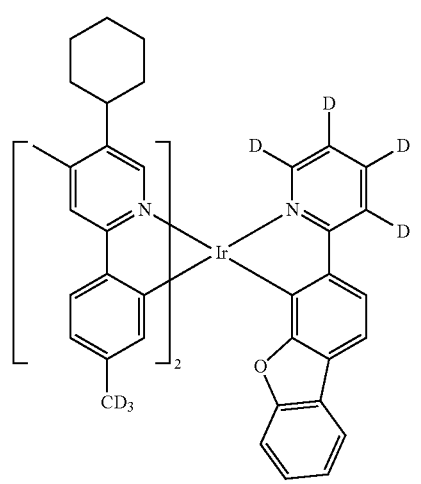

-continued
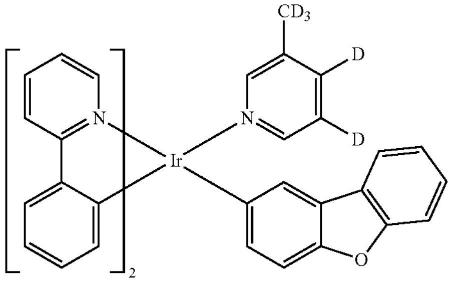
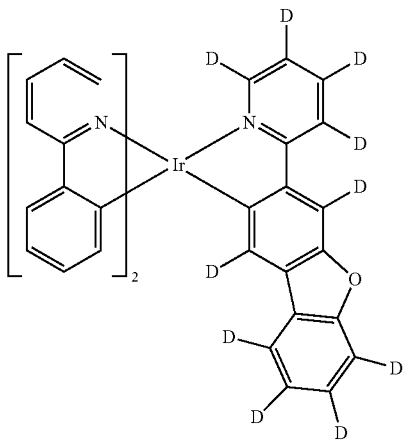
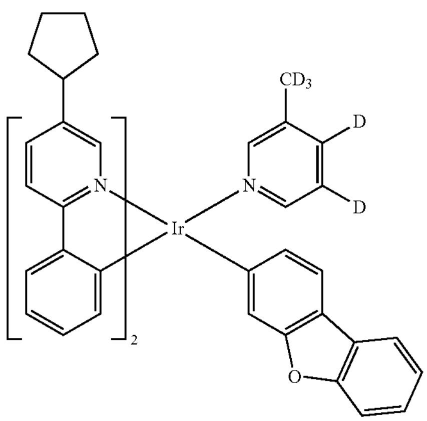
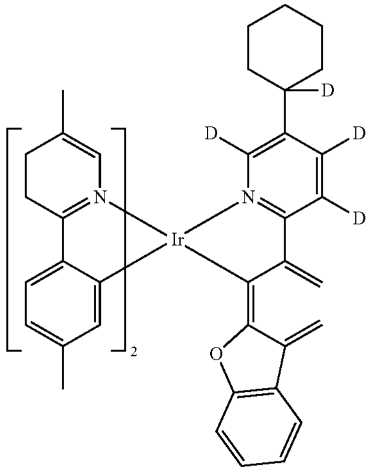
-continued
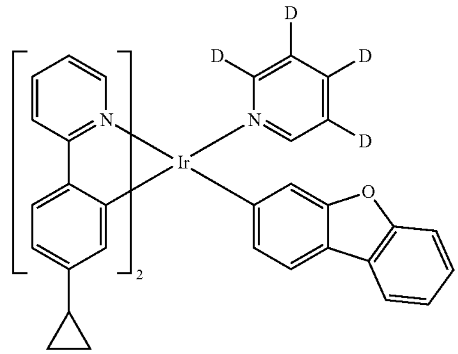
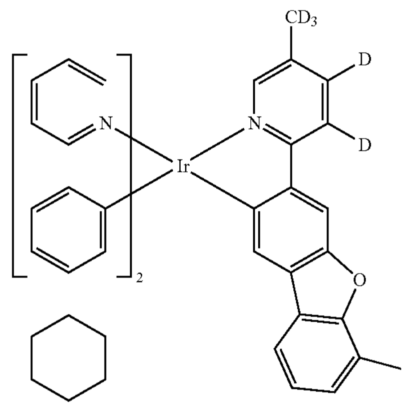
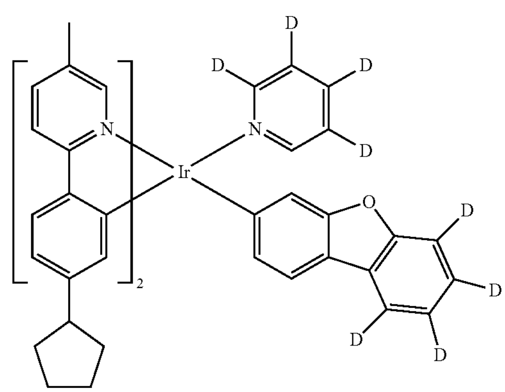
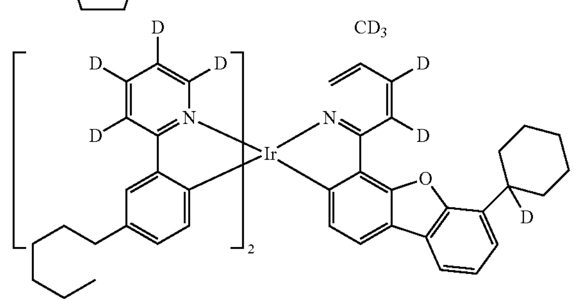

-continued
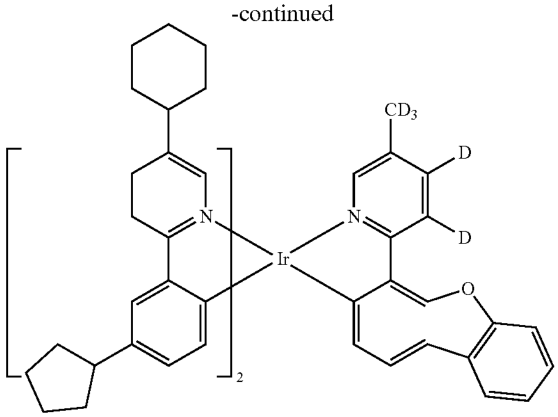
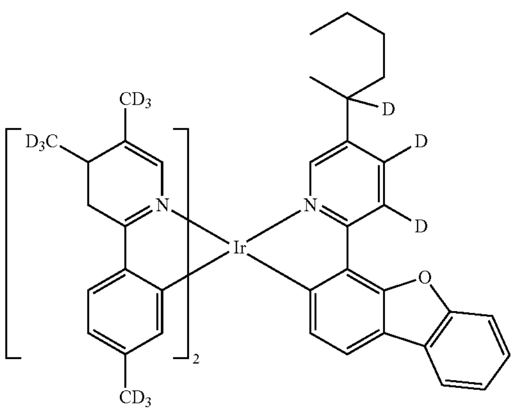
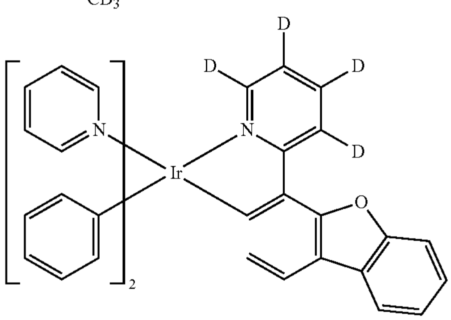
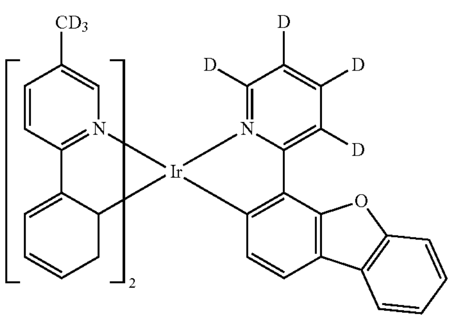
-continued
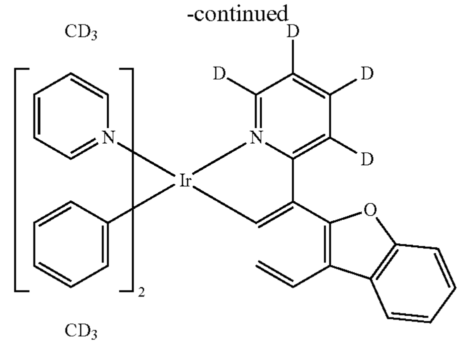
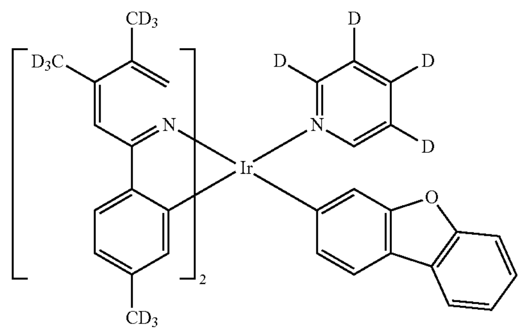
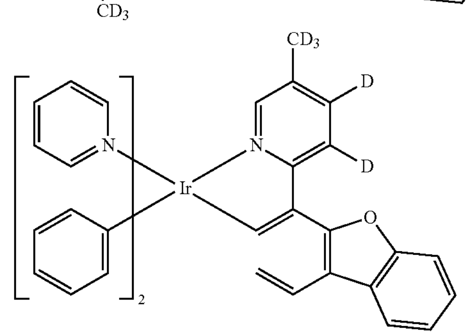
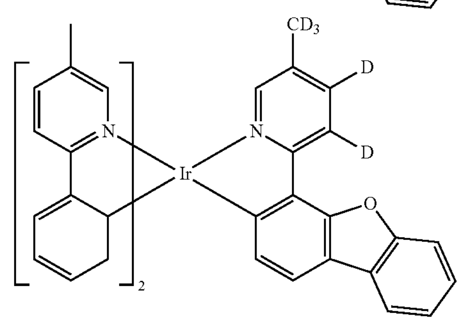
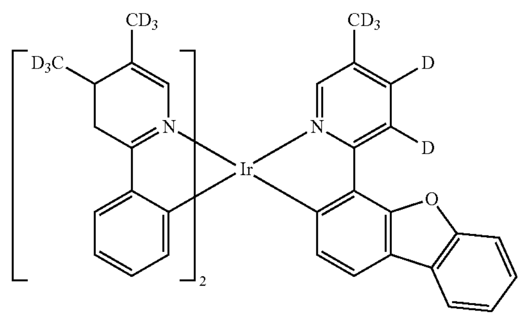

-continued
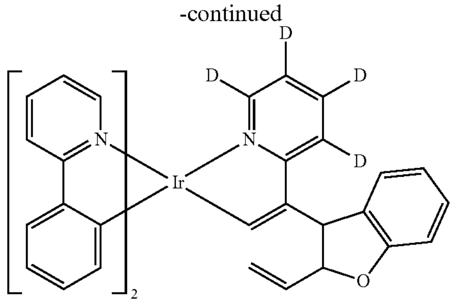
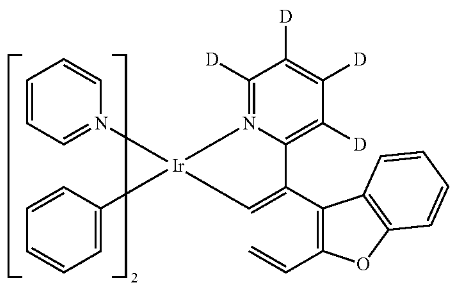
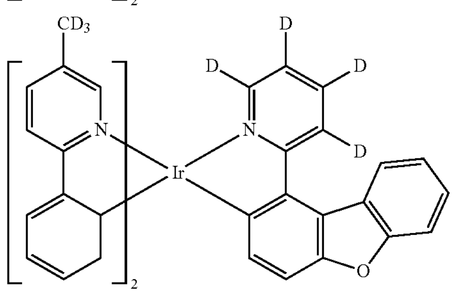
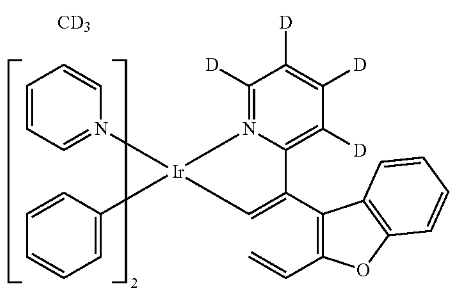
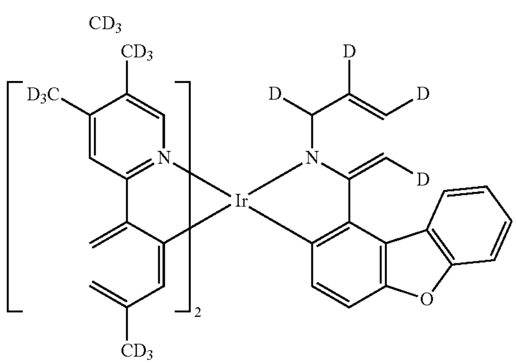
-continued
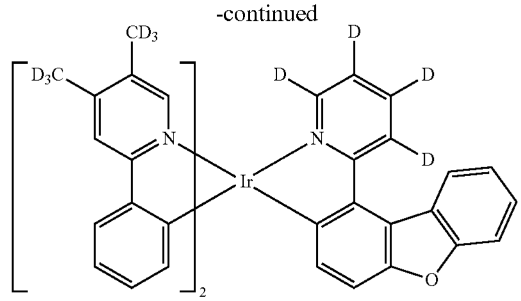
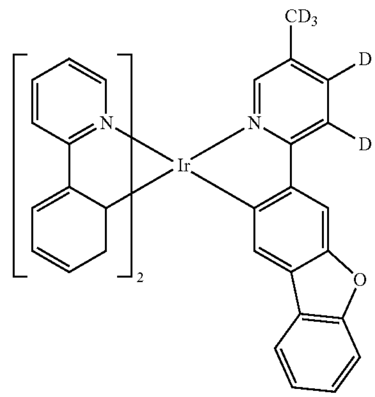
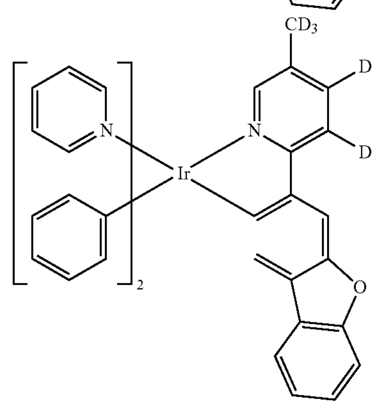
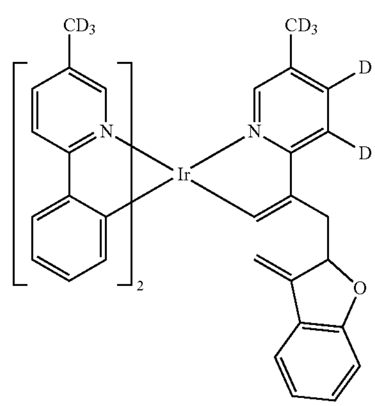

-continued
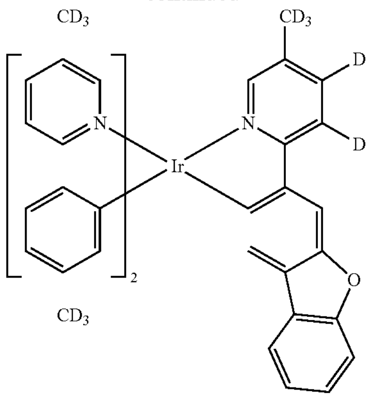
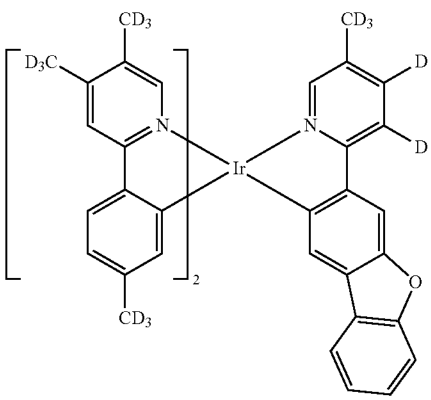
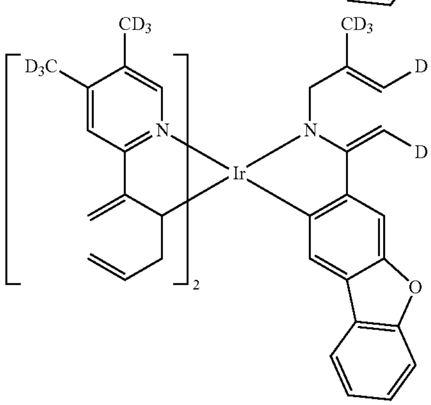
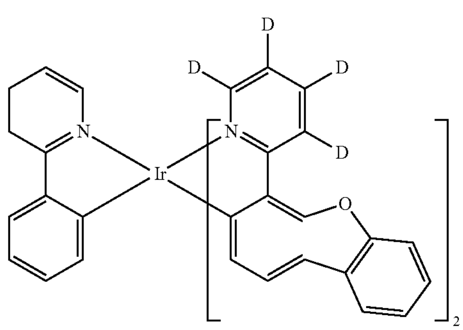
-continued
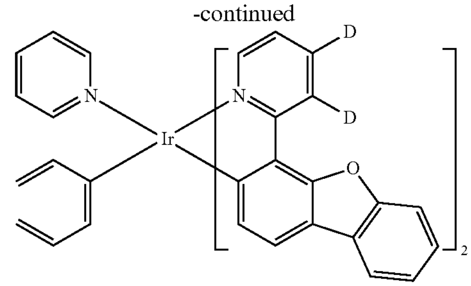
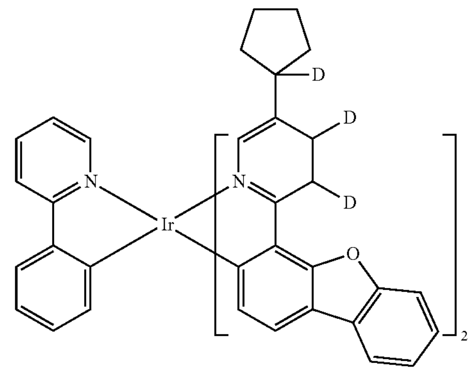
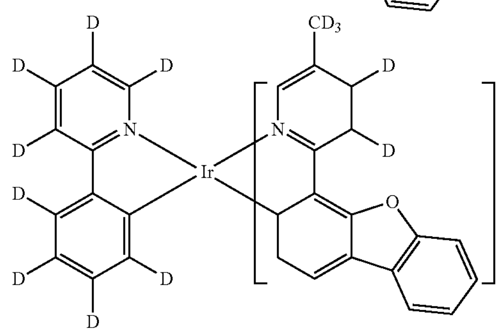
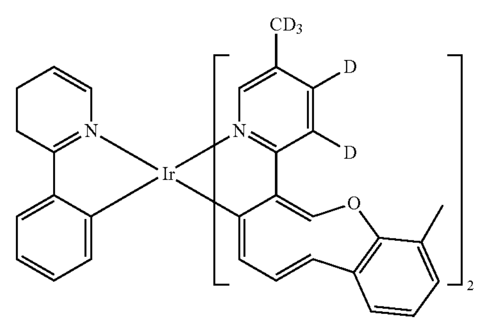
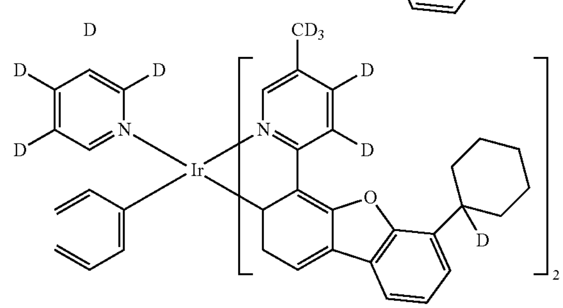

-continued
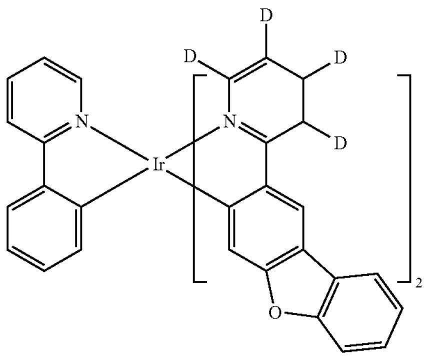
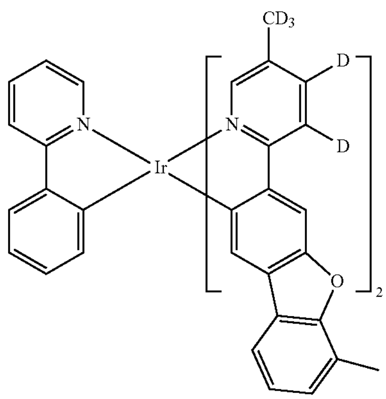
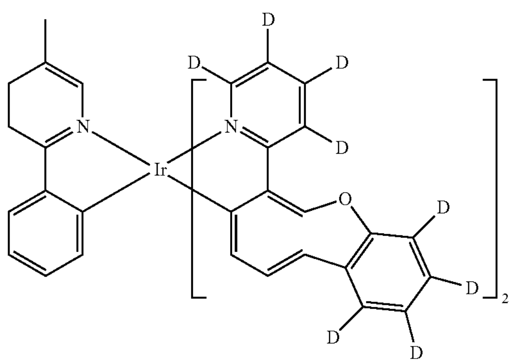
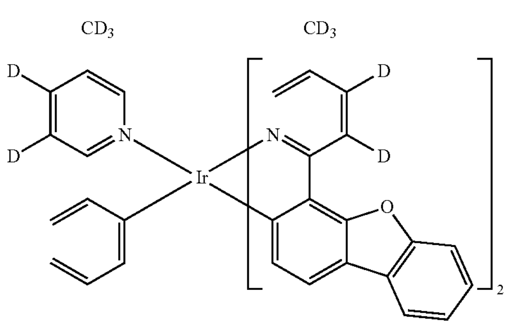
-continued
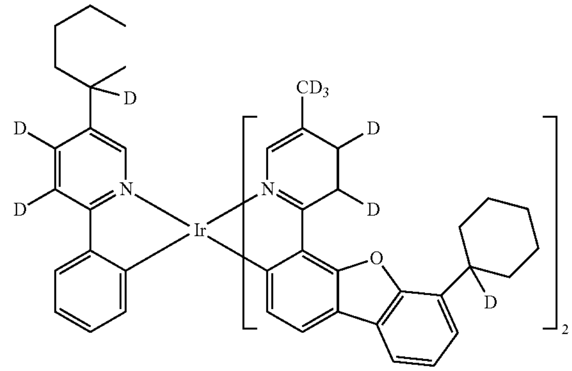
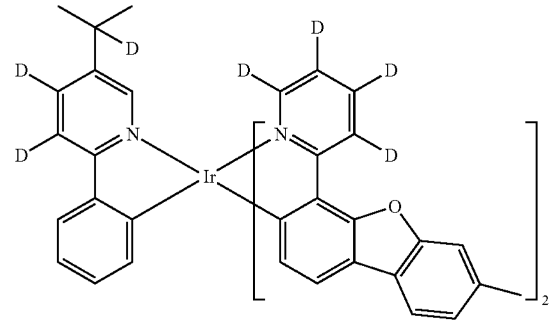
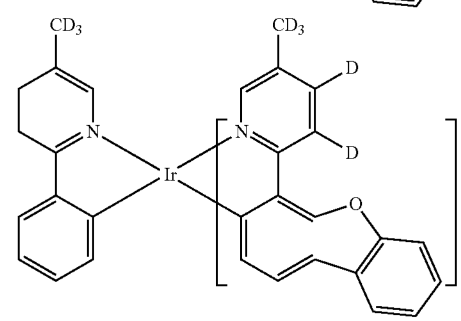
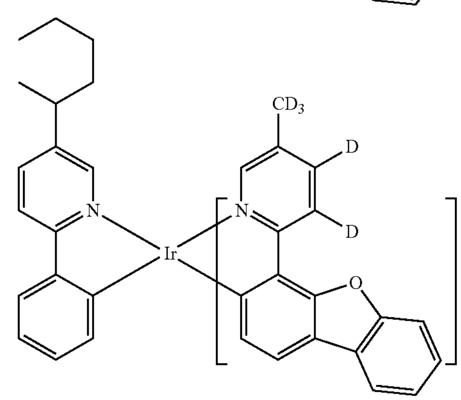
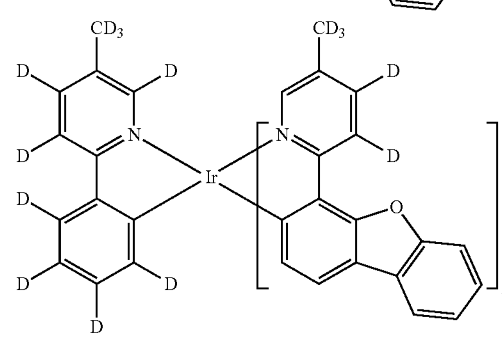

-continued
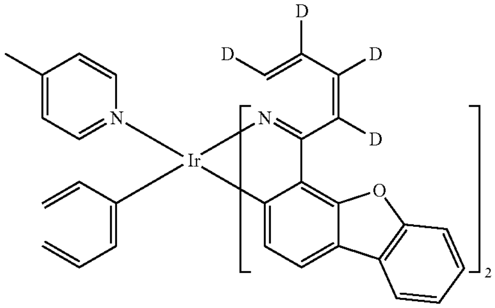
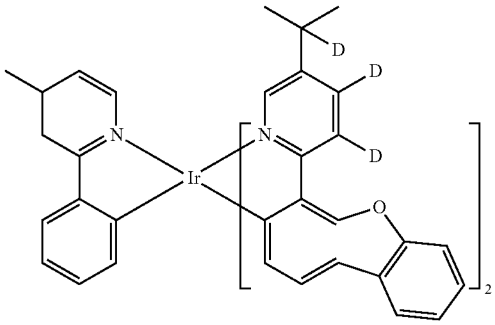
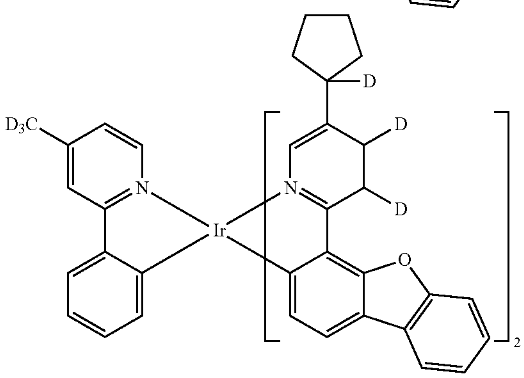
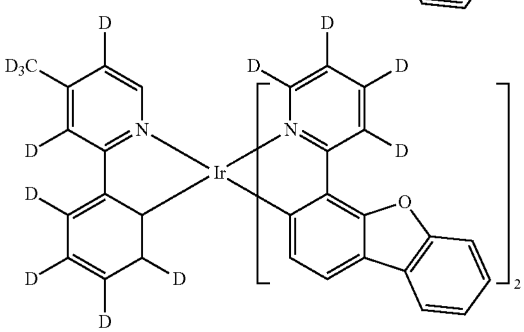
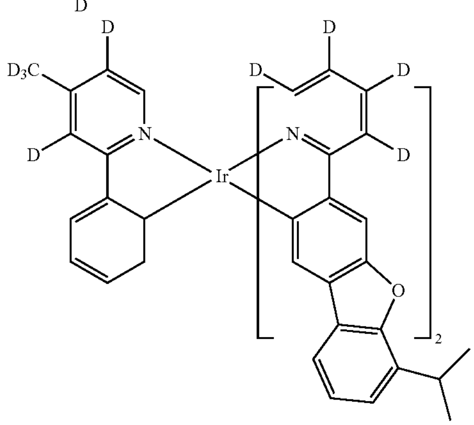
-continued
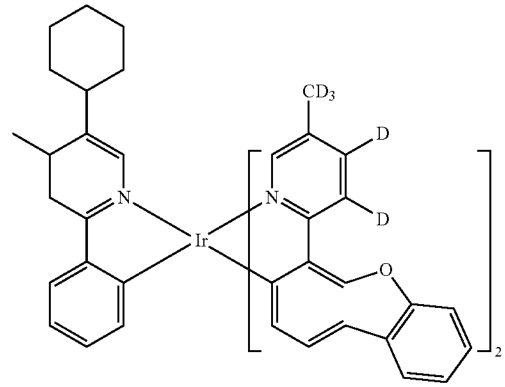
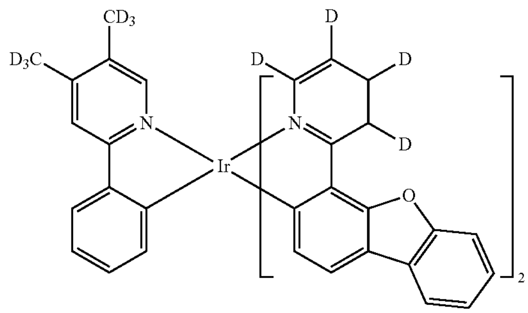
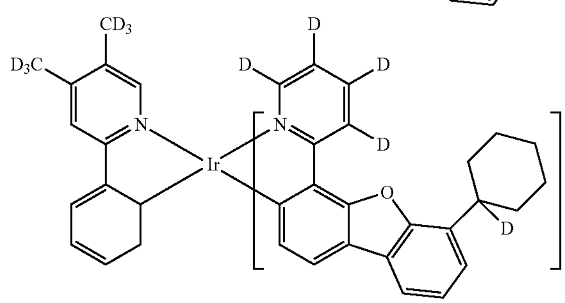
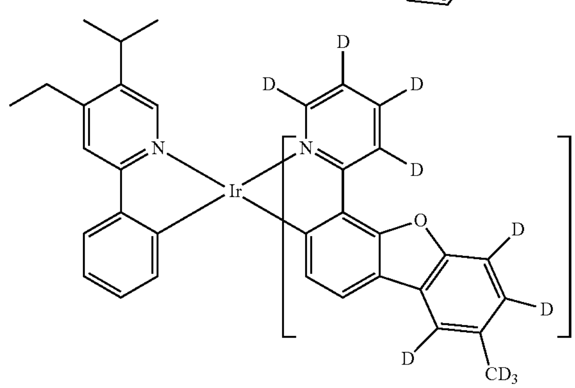
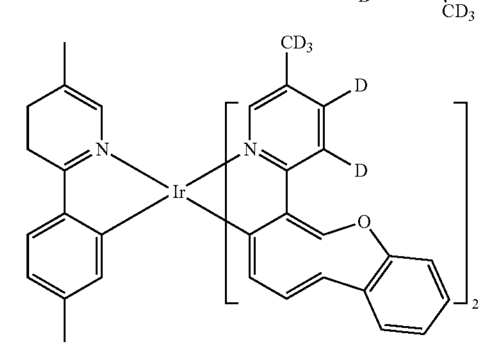

-continued
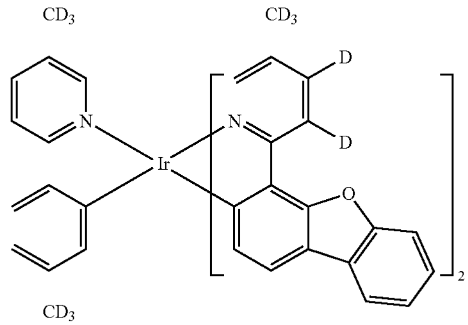
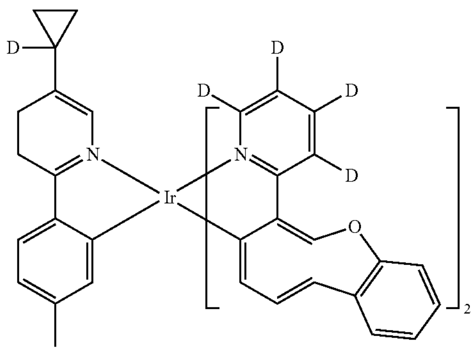
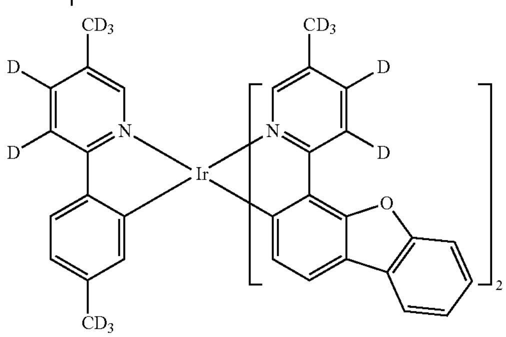
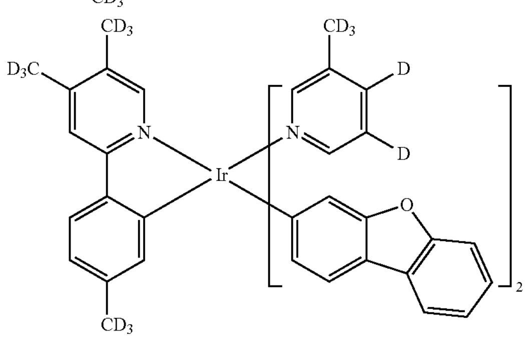
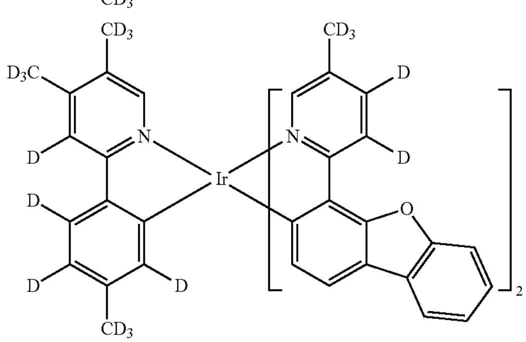
-continued
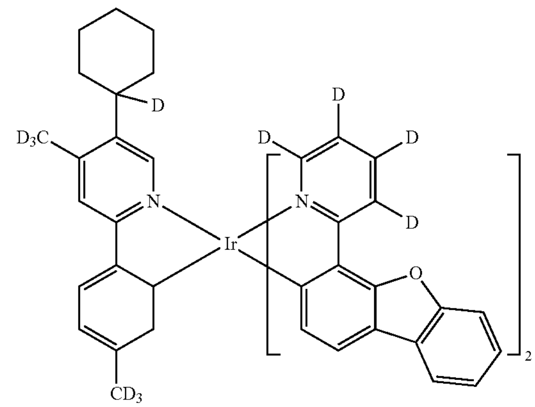
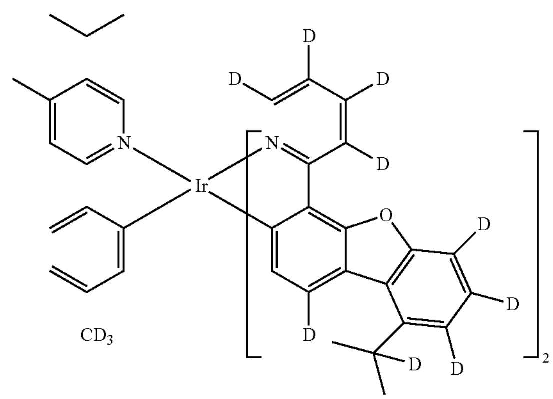
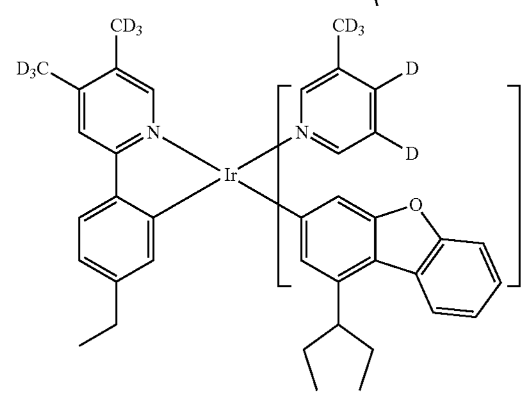
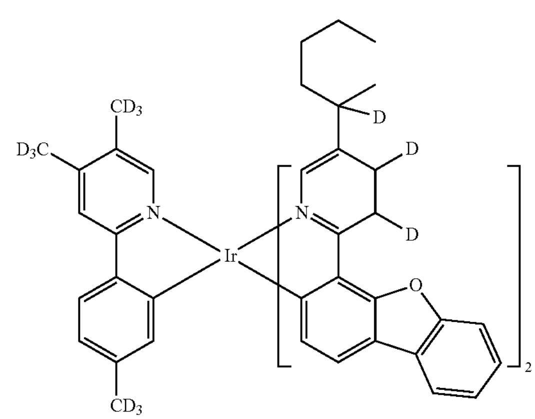

-continued
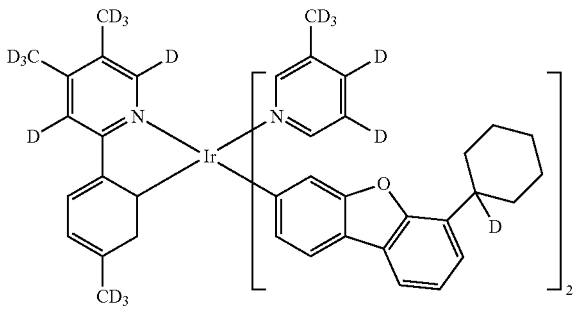
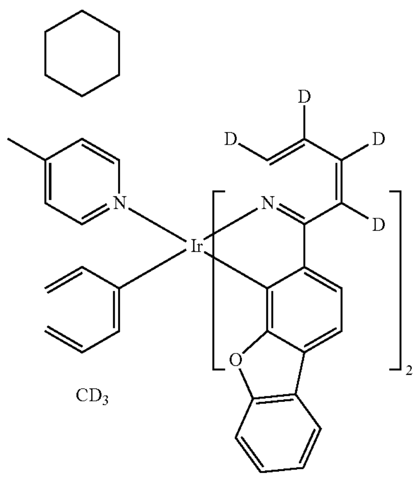
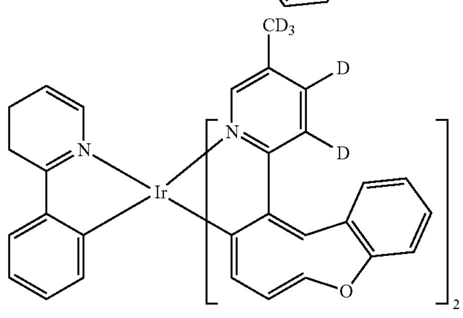
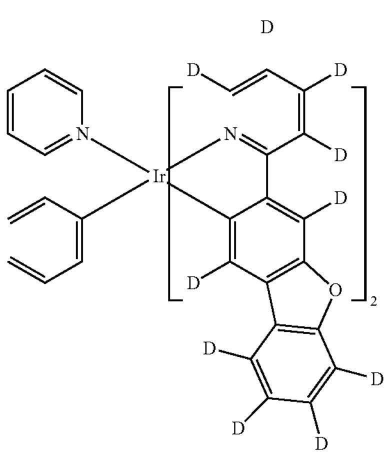
-continued
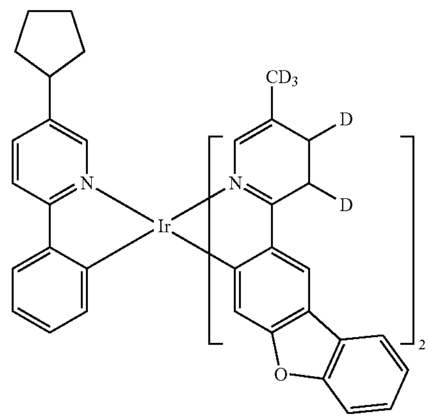
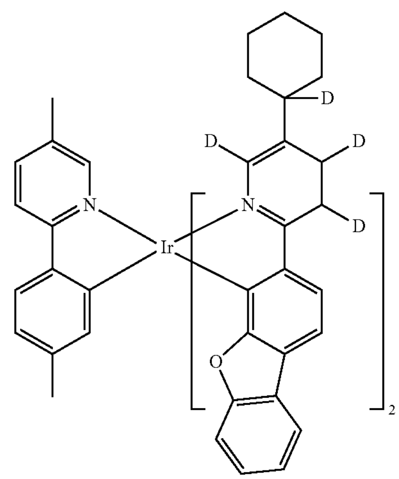
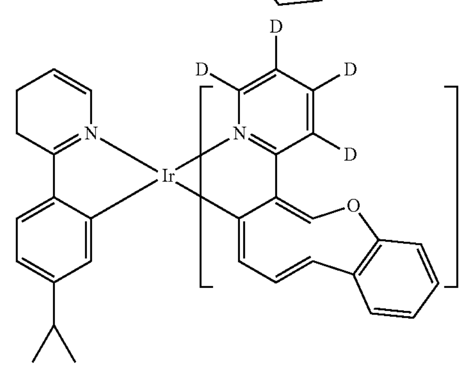
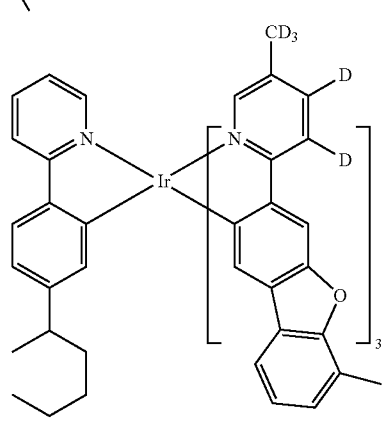

-continued
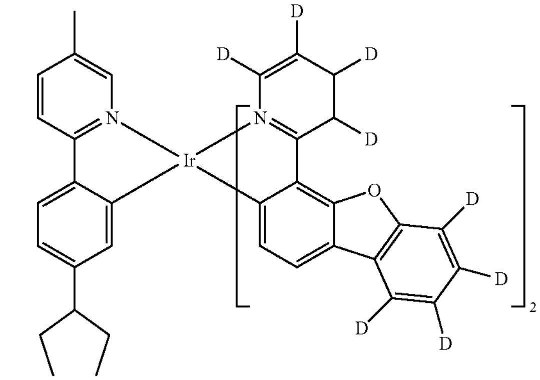
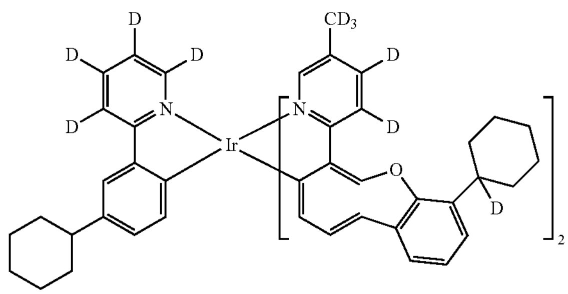
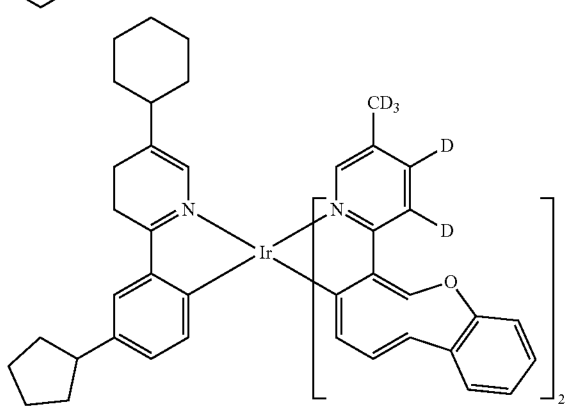
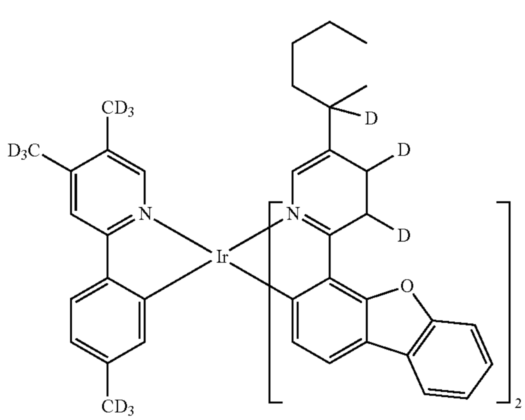
-continued
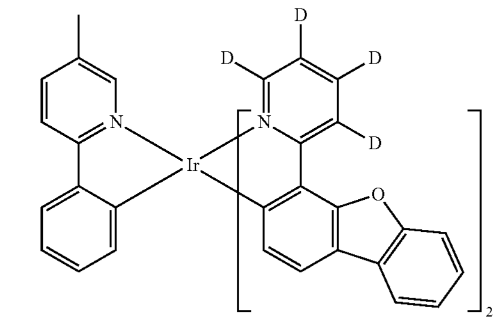
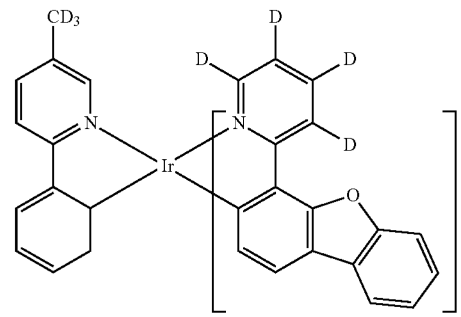
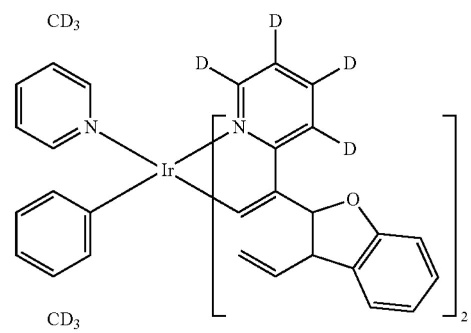
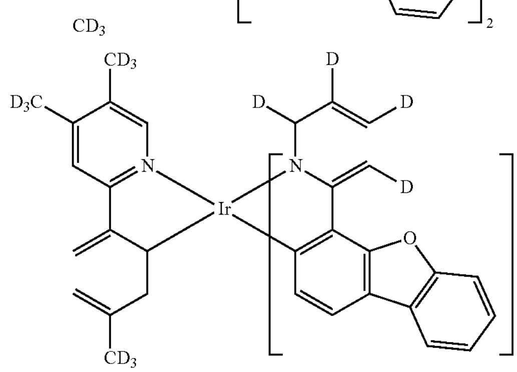
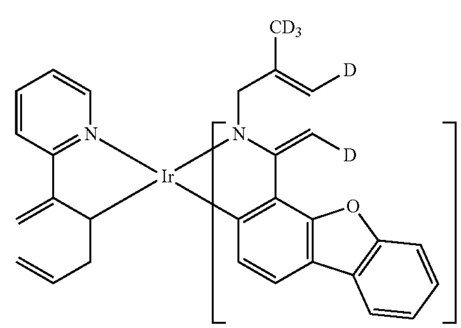

-continued
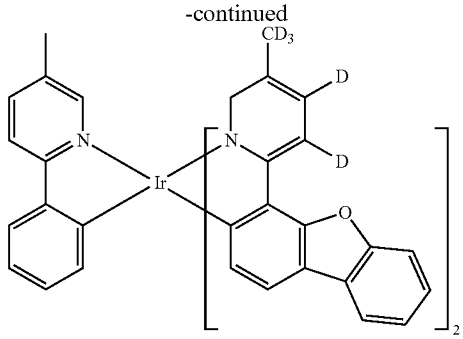
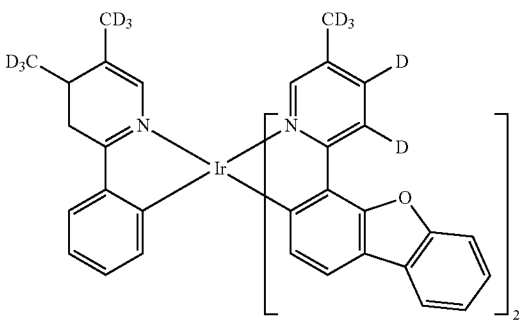
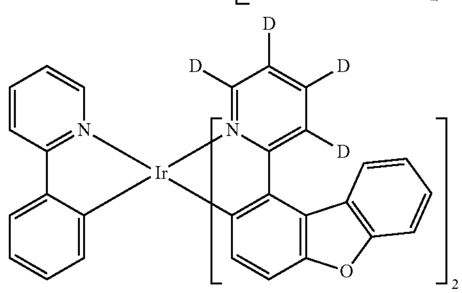
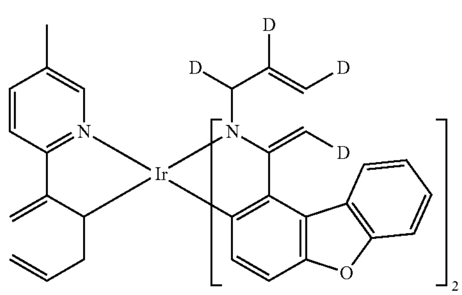
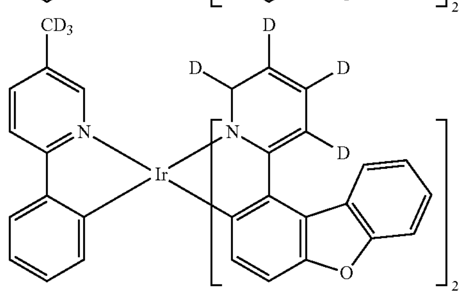
-continued
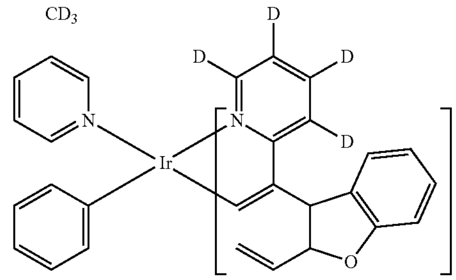
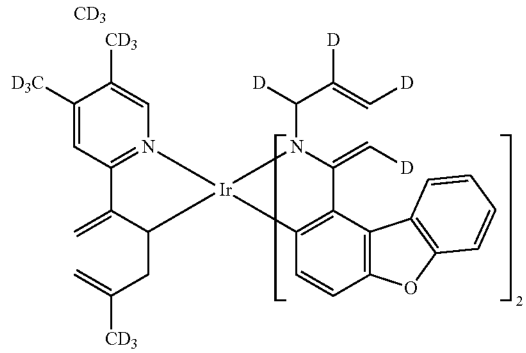
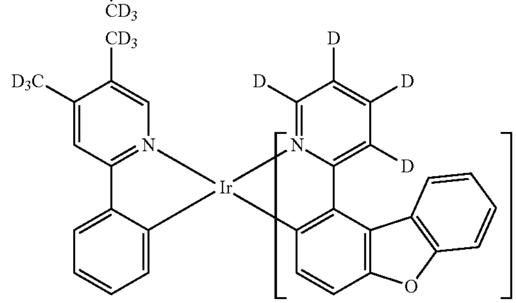
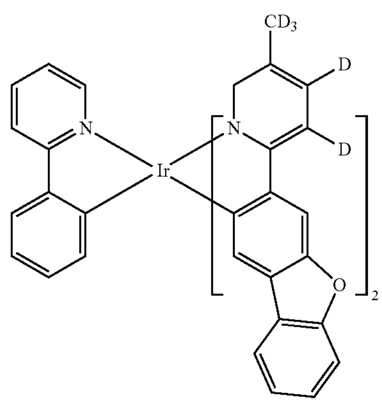
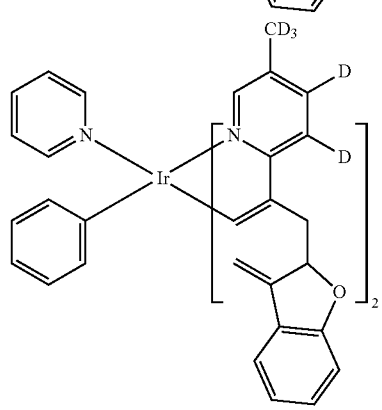

-continued
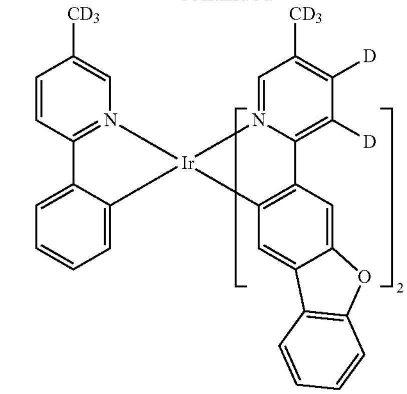
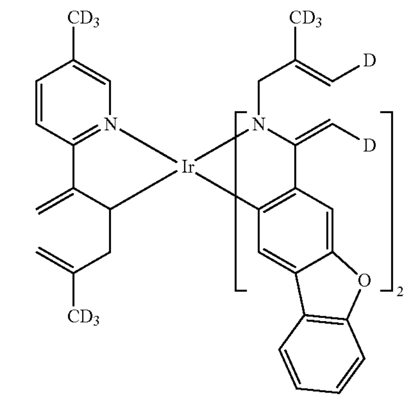
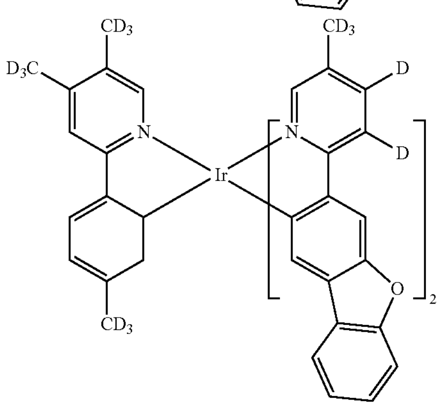
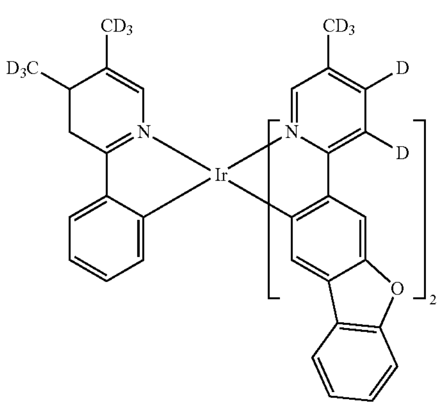
-continued
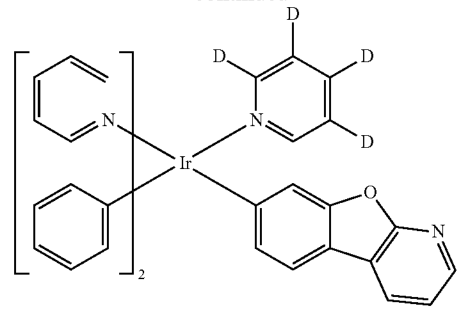
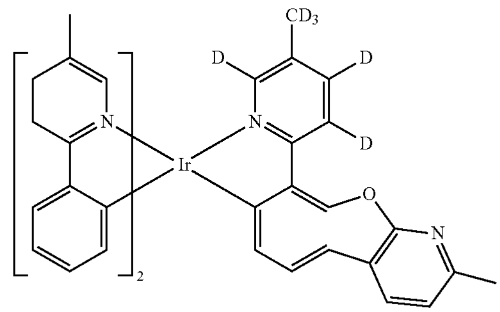
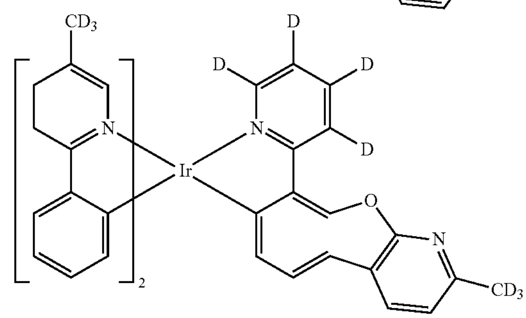
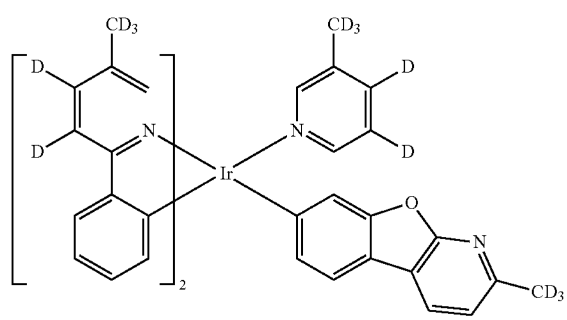
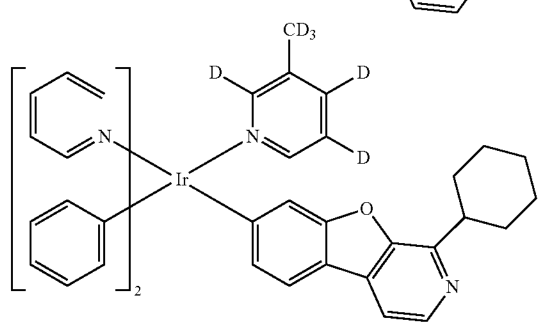

-continued
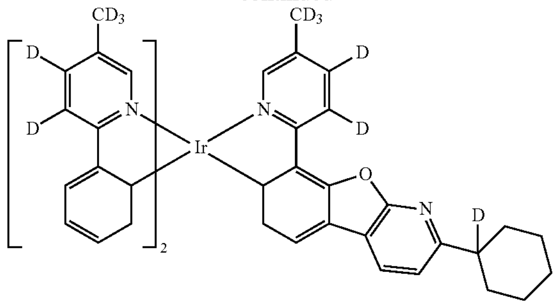
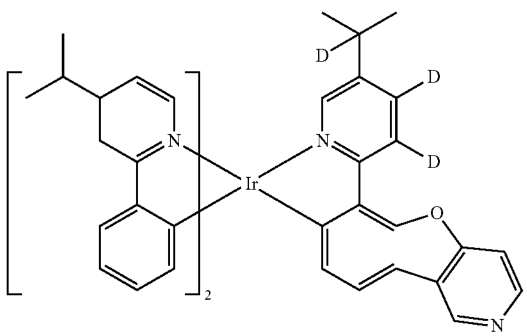
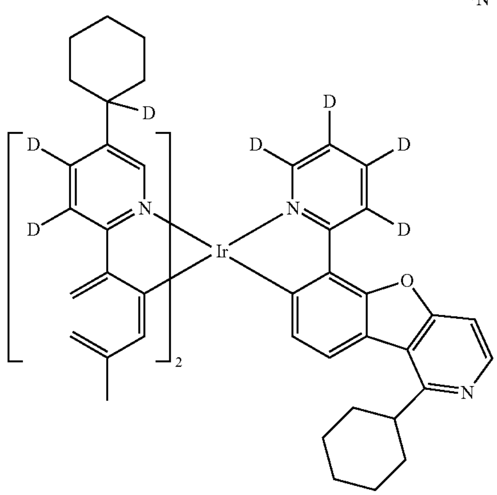
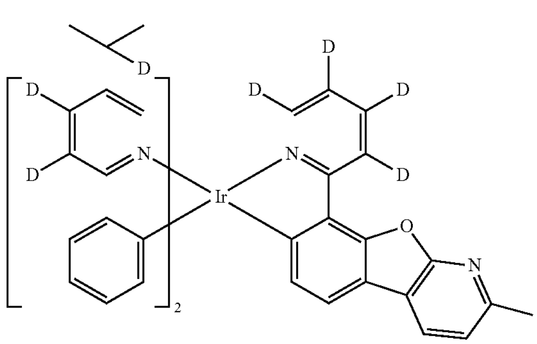
-continued
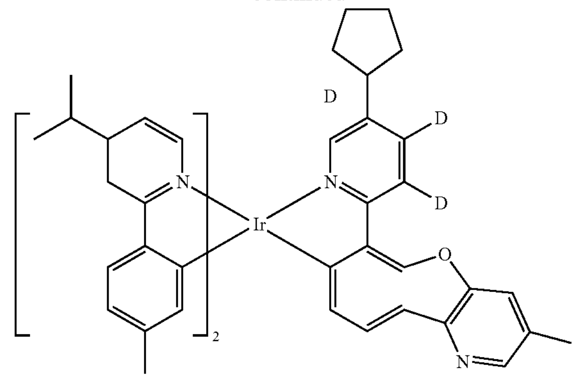
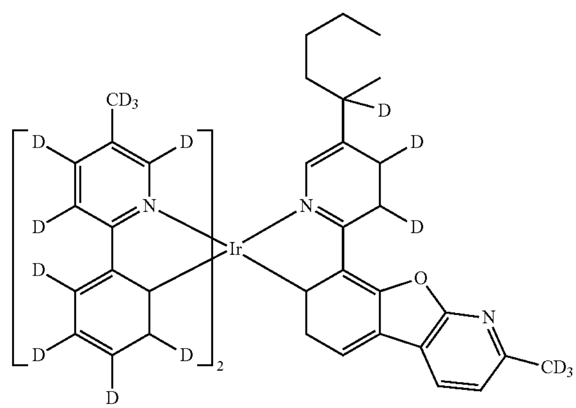
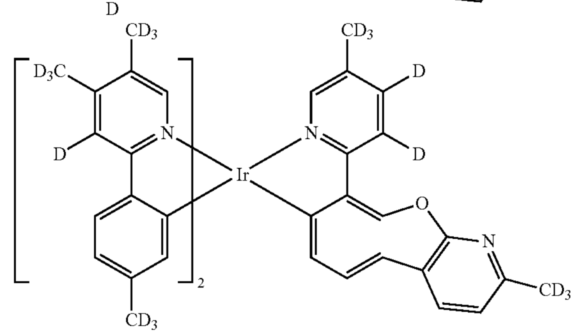
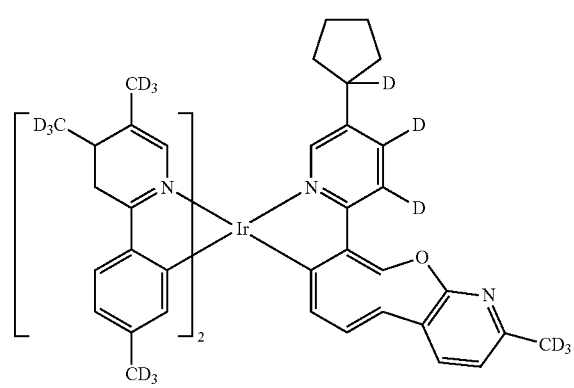

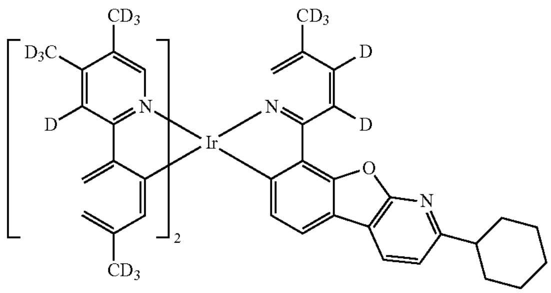
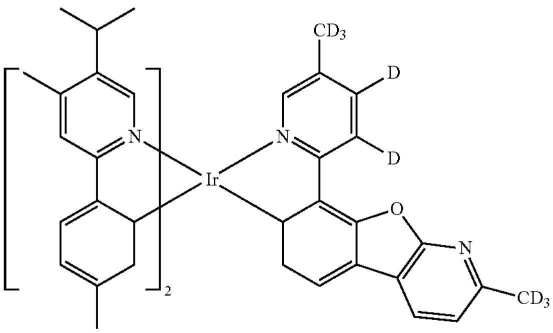
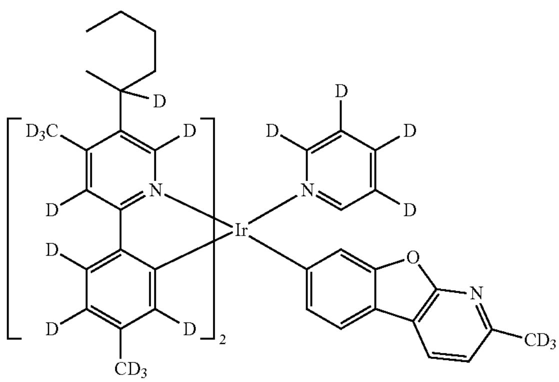
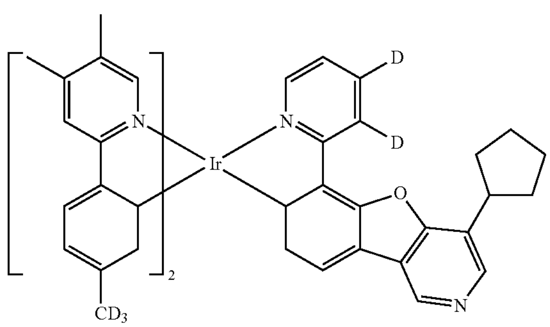
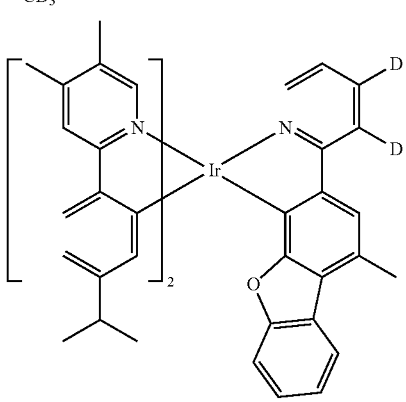
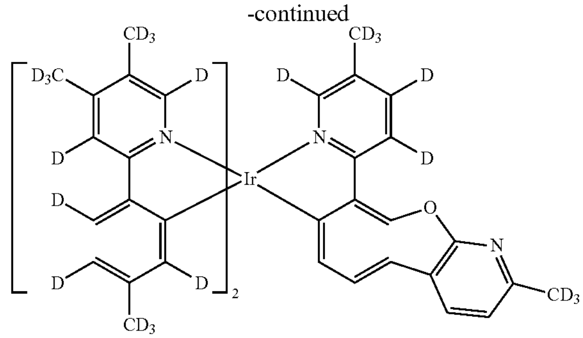
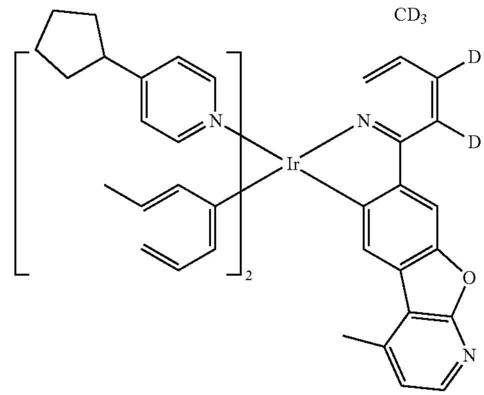
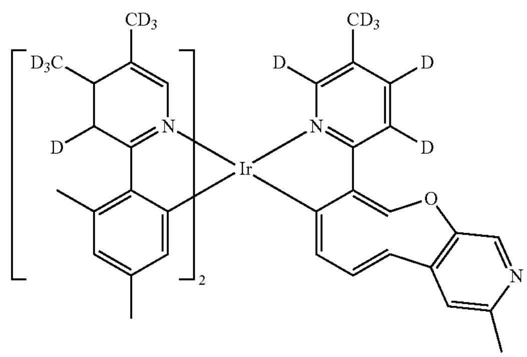
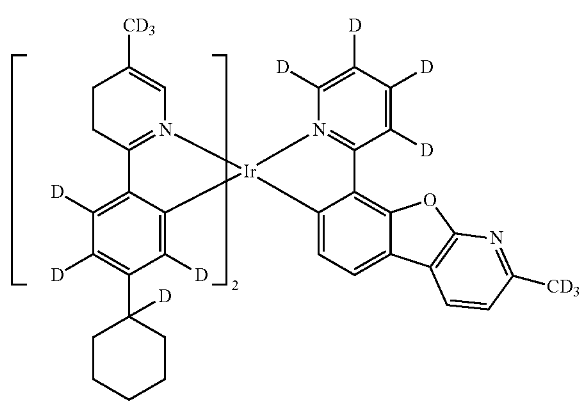

-continued
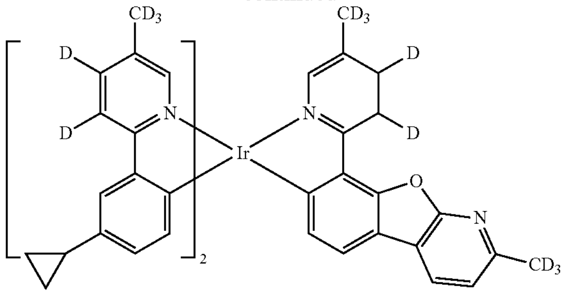
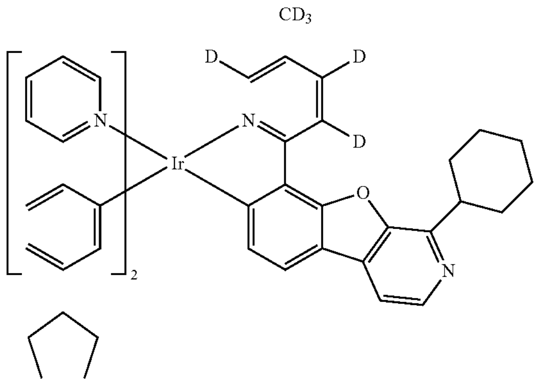
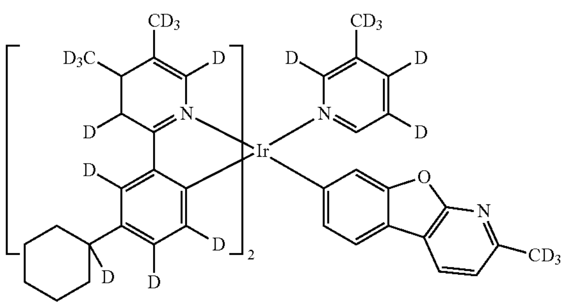
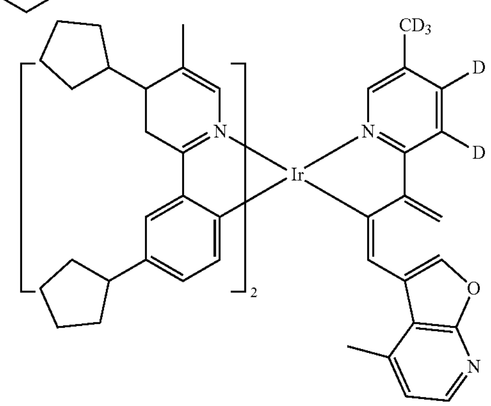
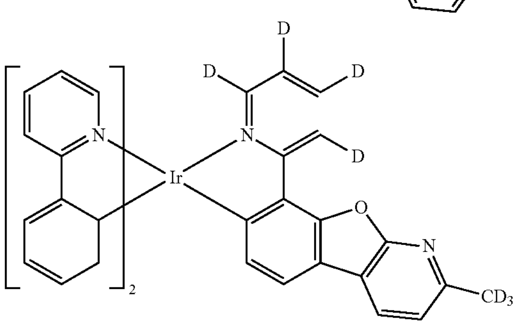
-continued
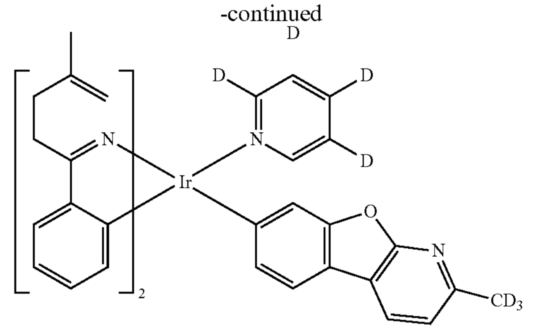
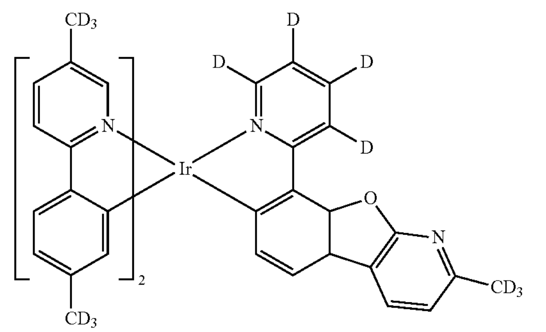
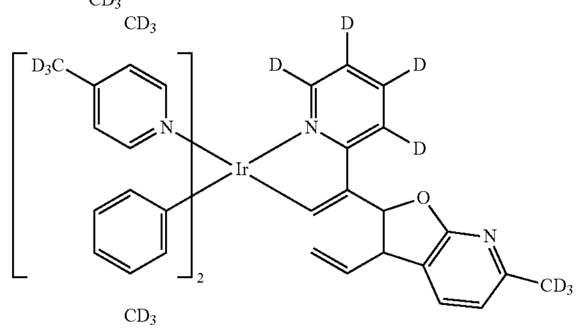
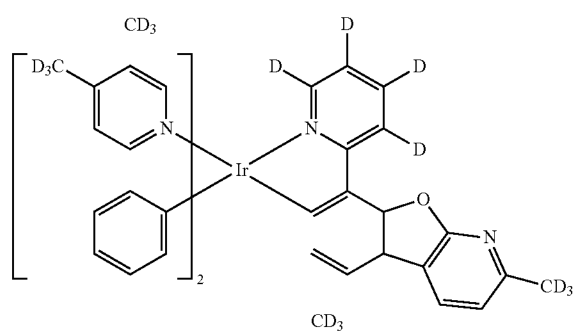
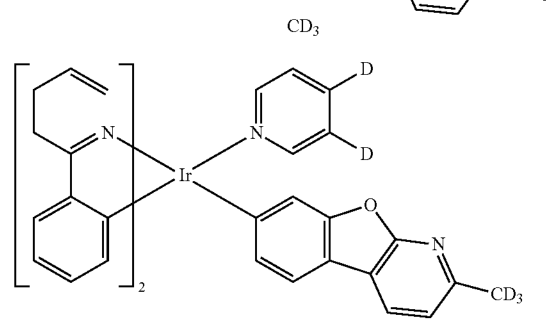

-continued
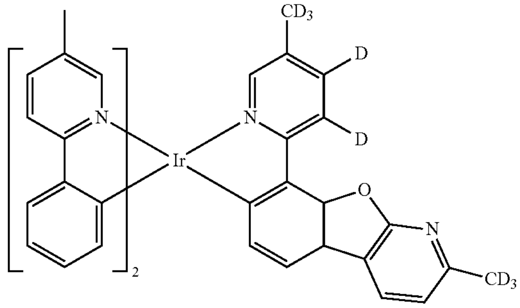
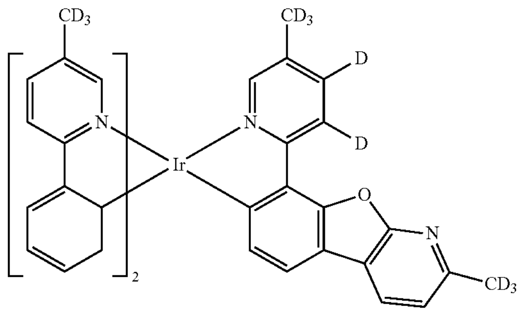
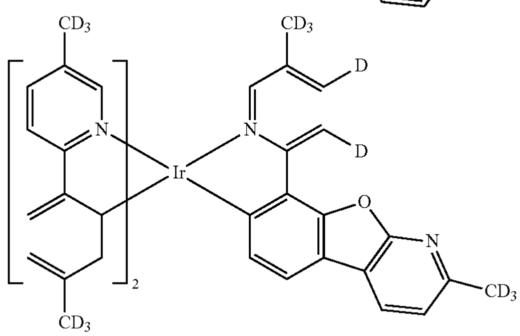
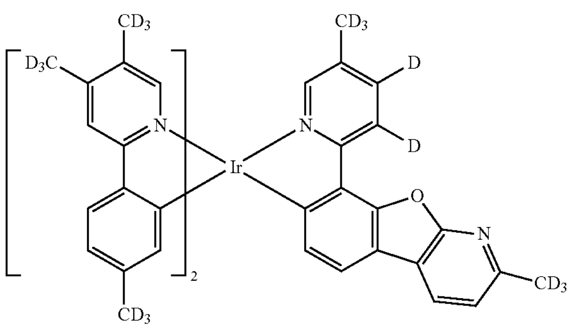
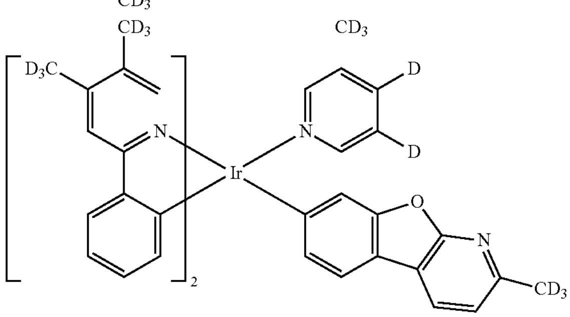
-continued
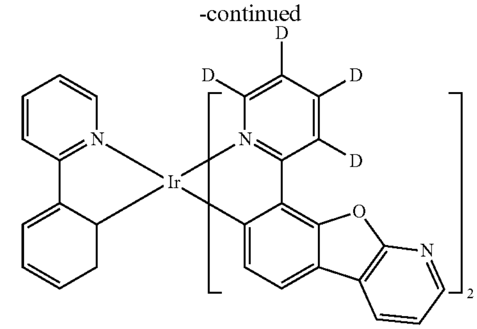
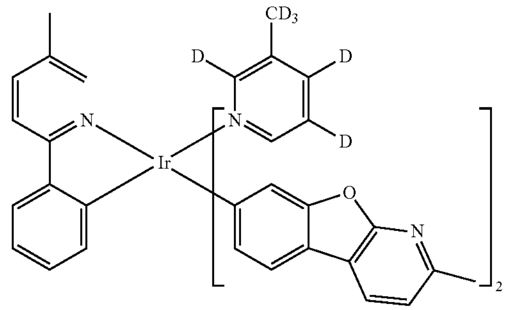
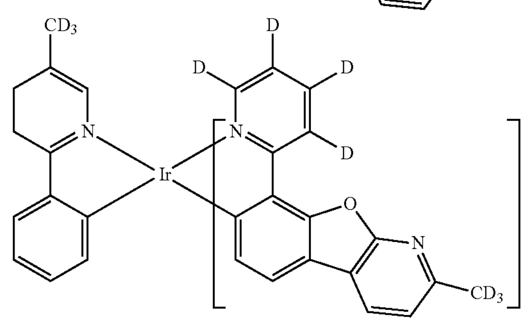
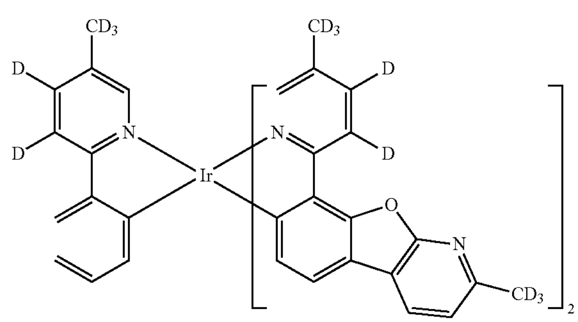
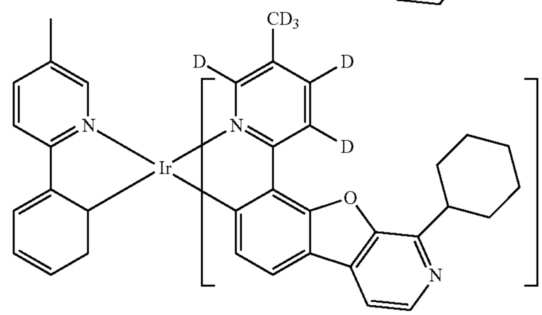

-continued
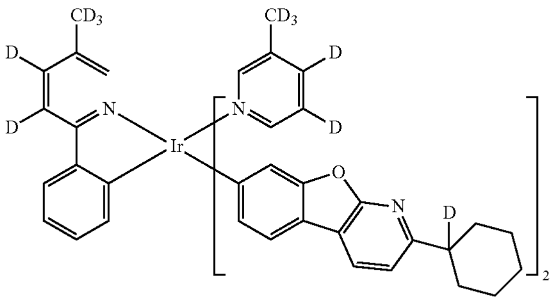
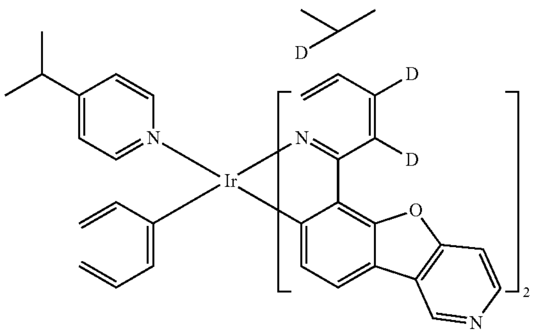
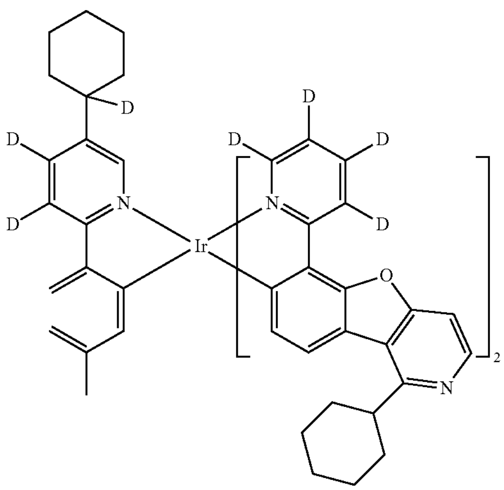
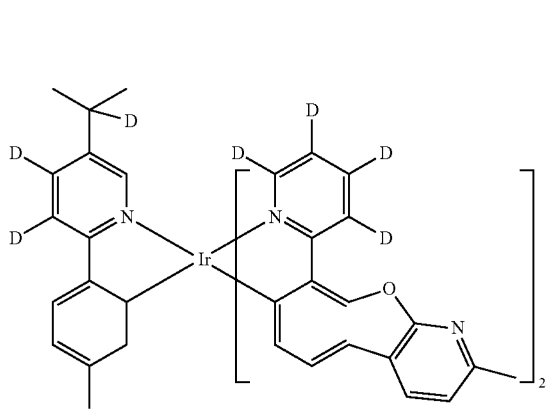
-continued
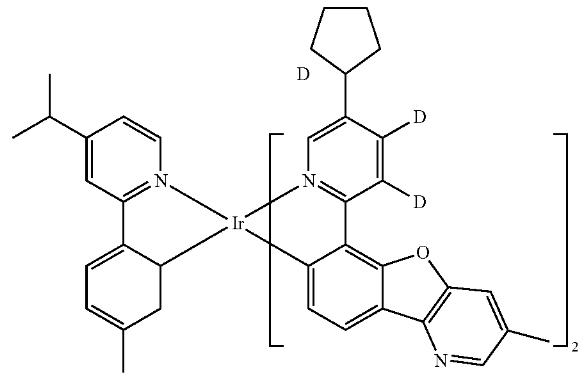
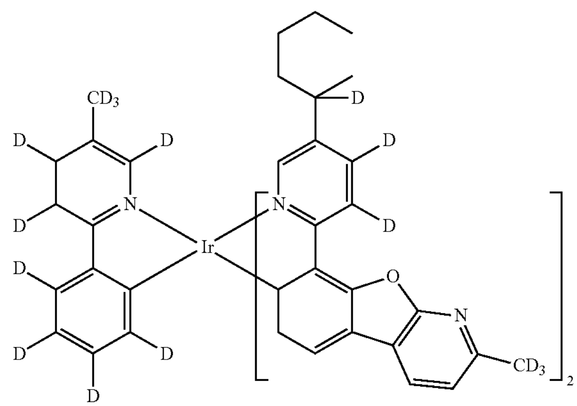
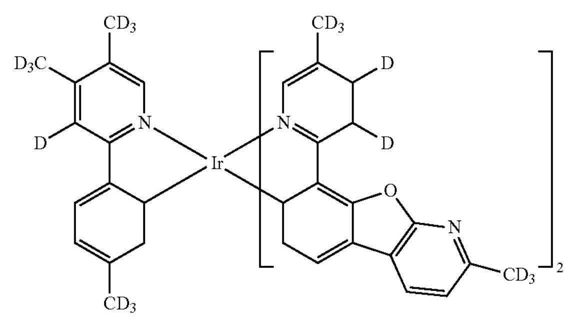
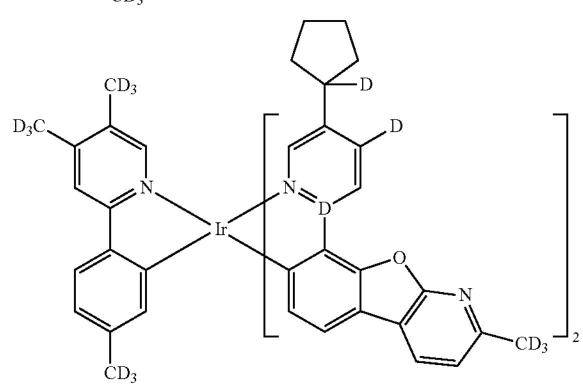

-continued
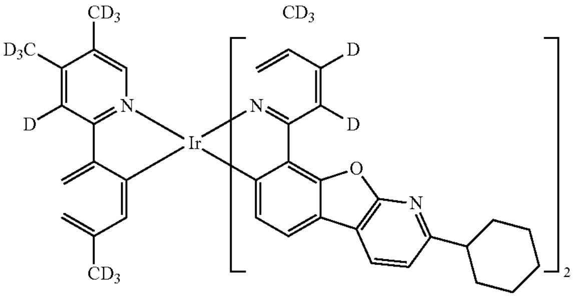
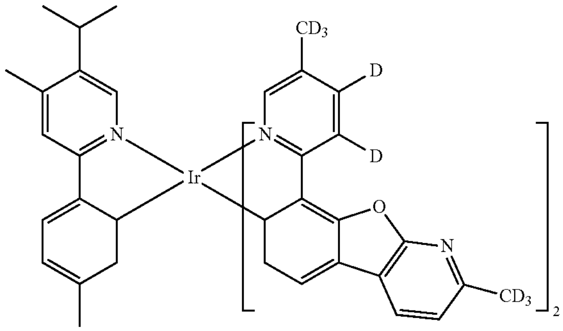
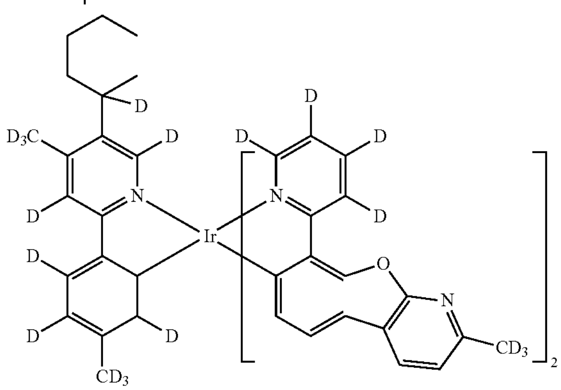
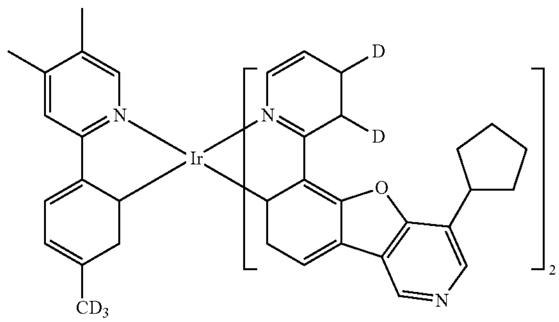
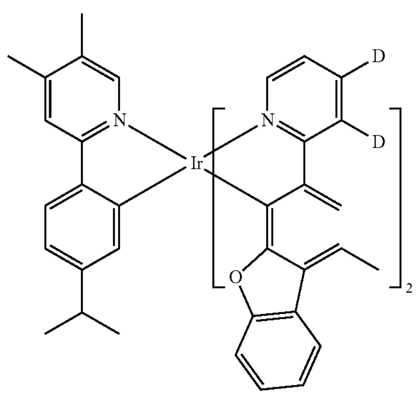
-continued
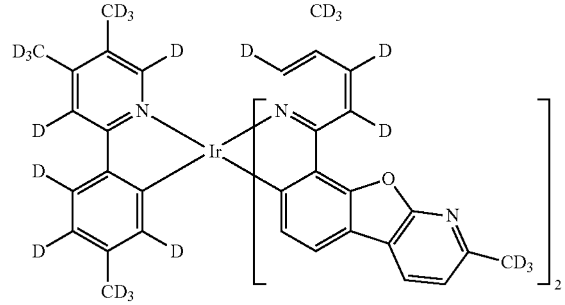
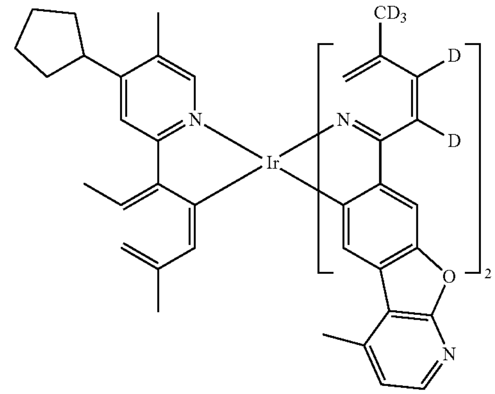
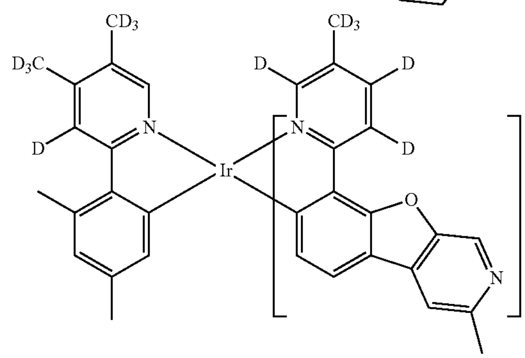
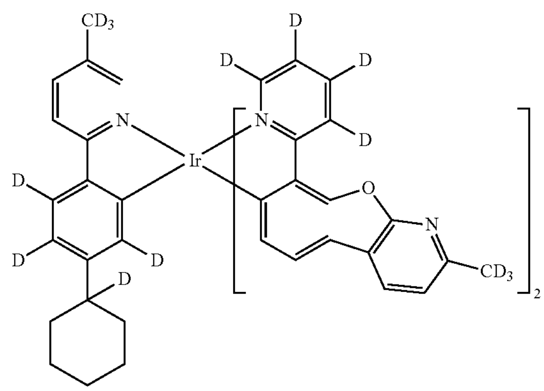
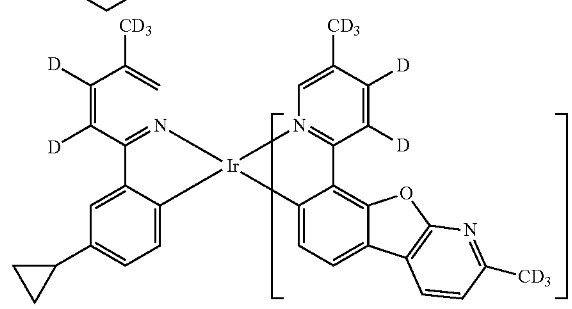

-continued
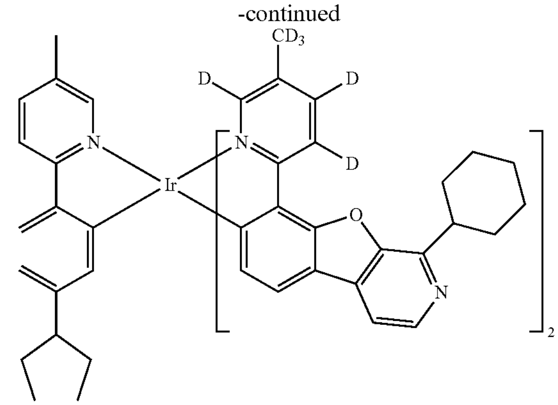
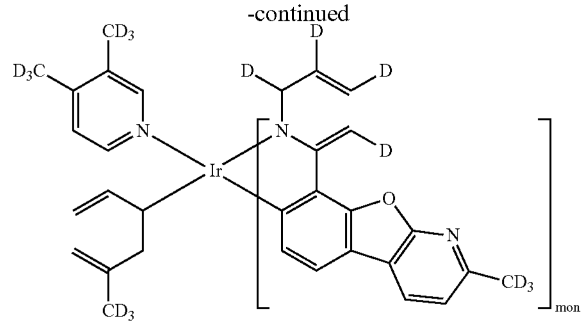
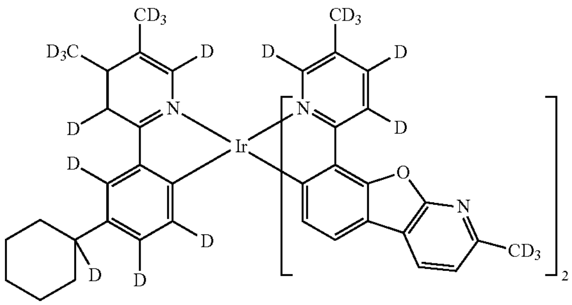
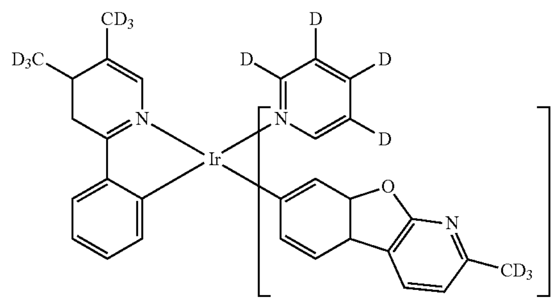
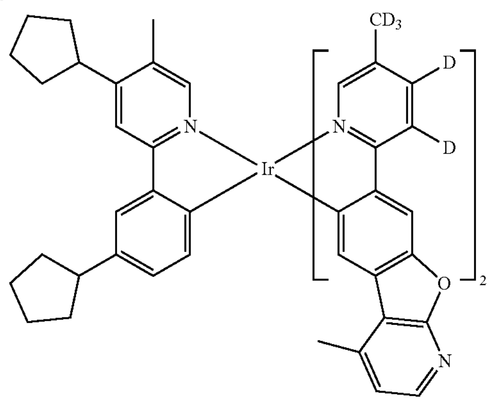
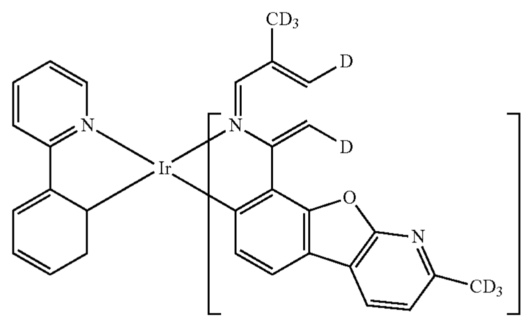
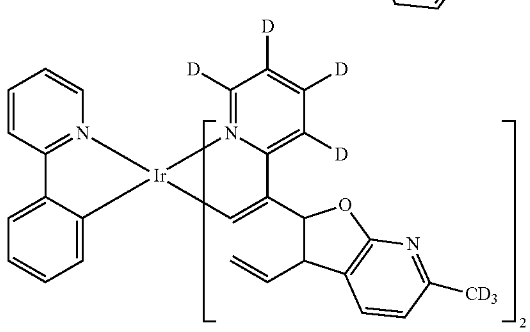
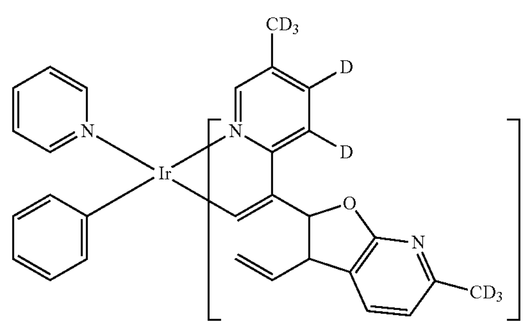
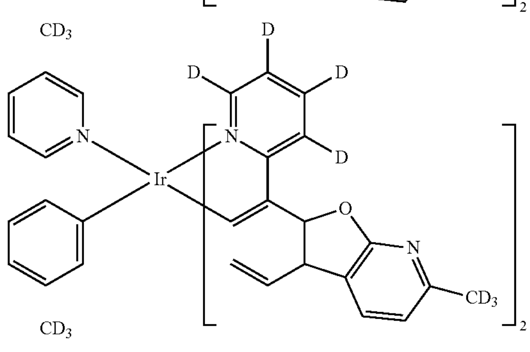
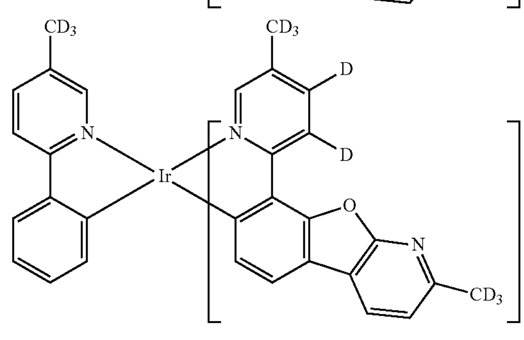

-continued
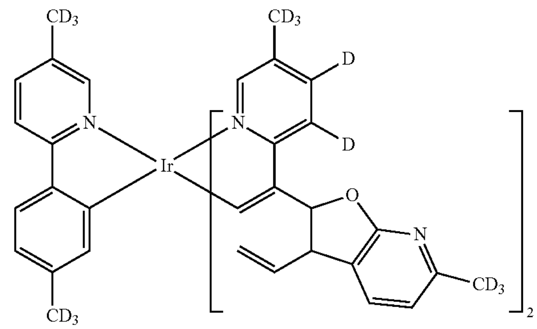
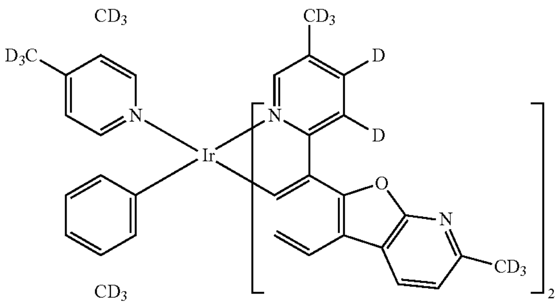
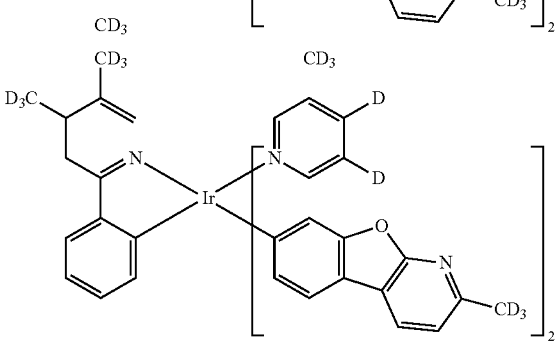
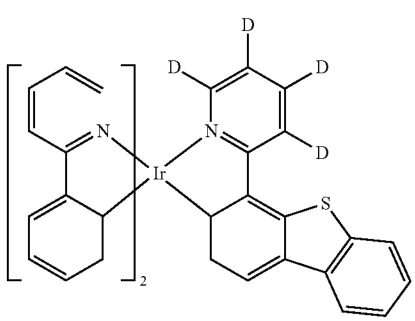
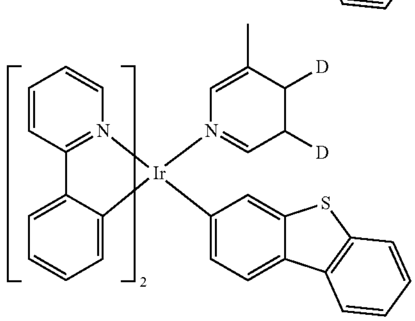
-continued
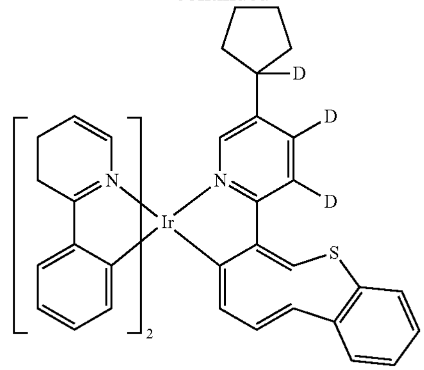
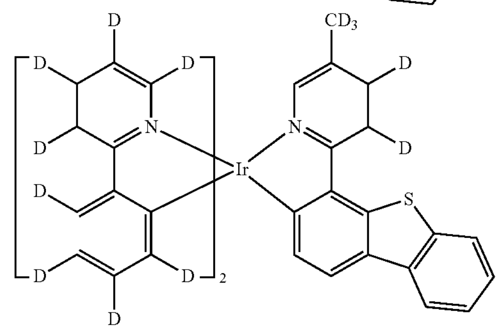
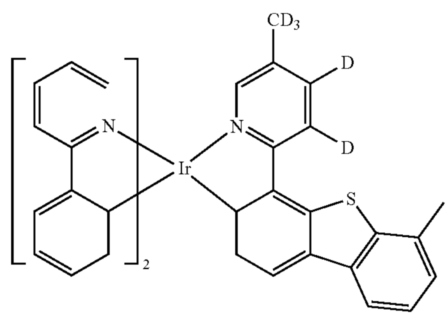
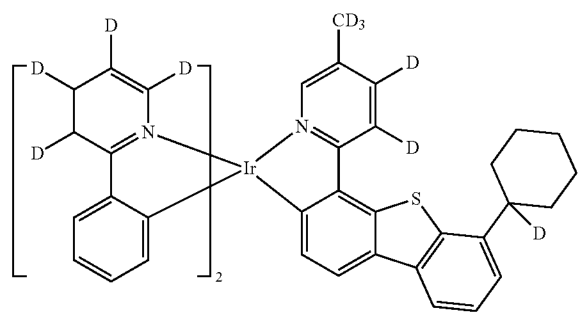
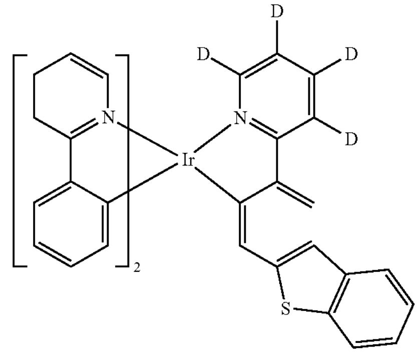

-continued
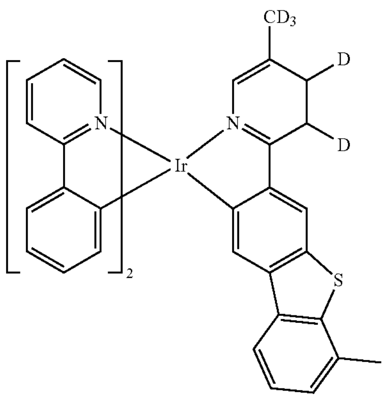
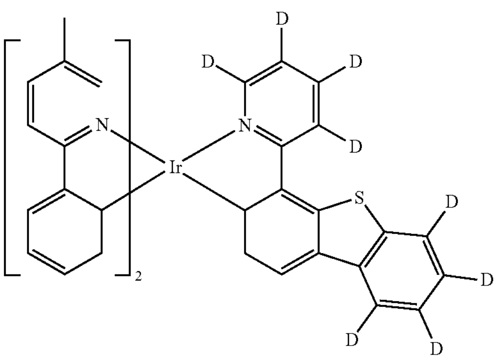
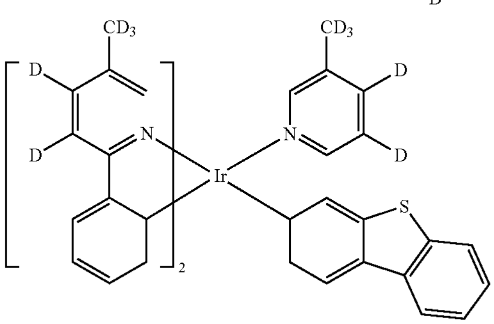
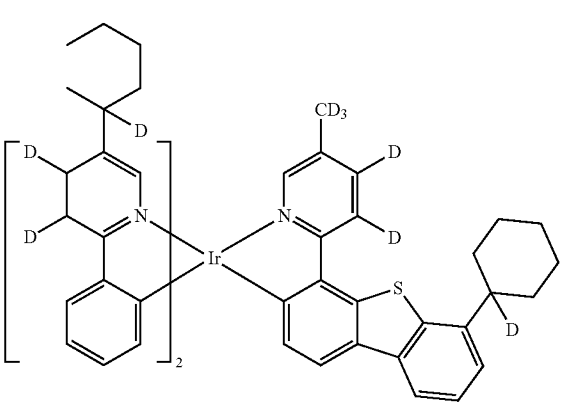
-continued
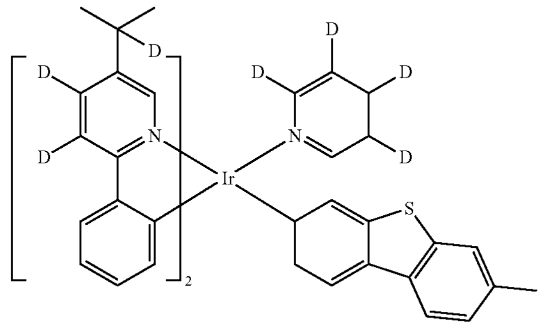
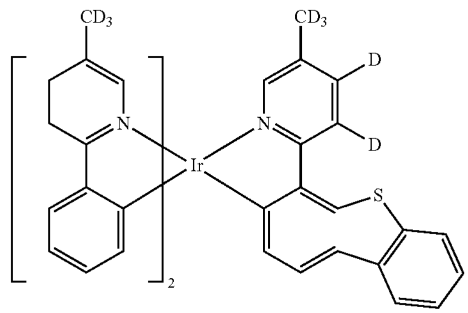
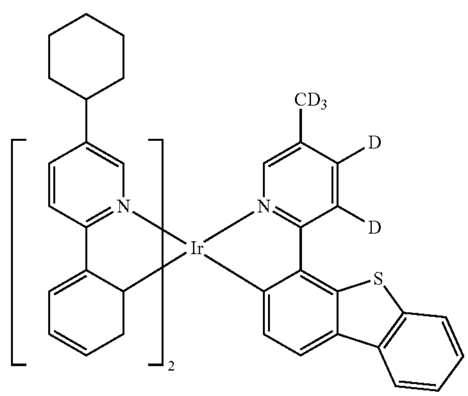
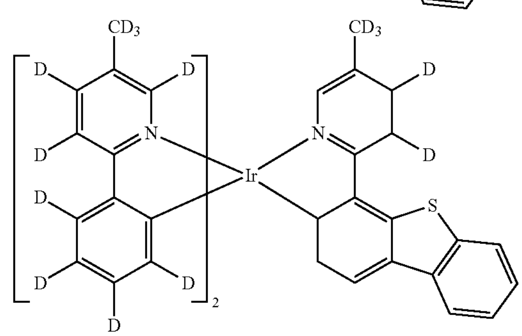
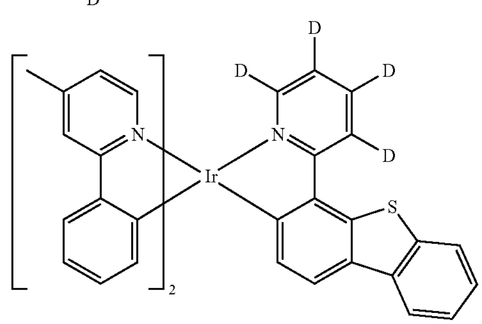

-continued
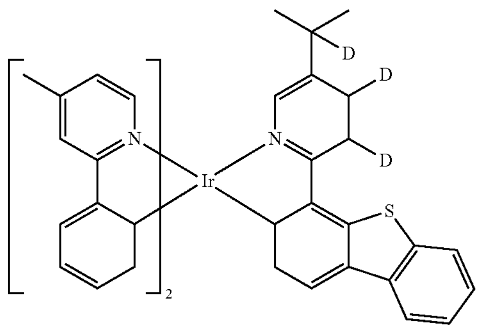
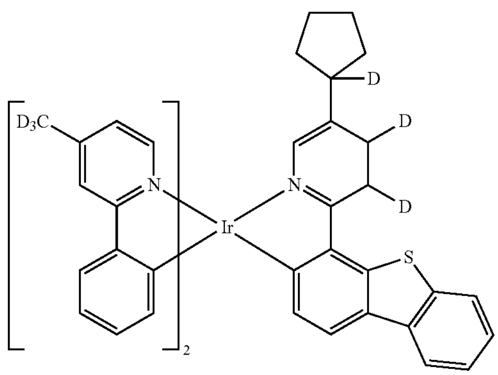
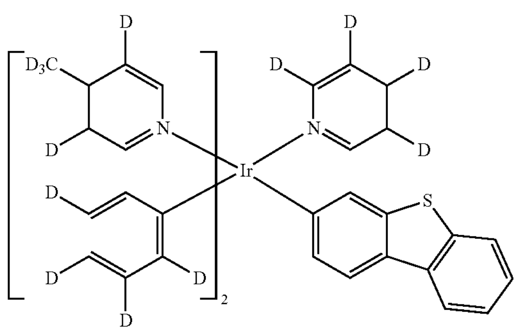
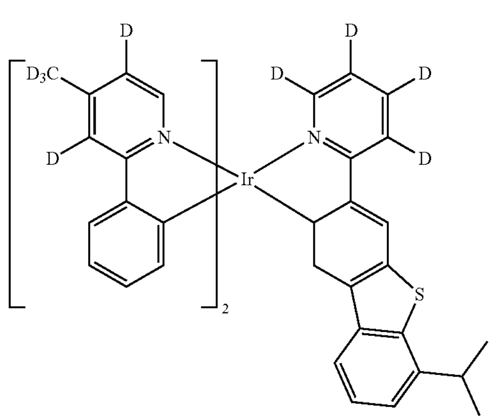
-continued
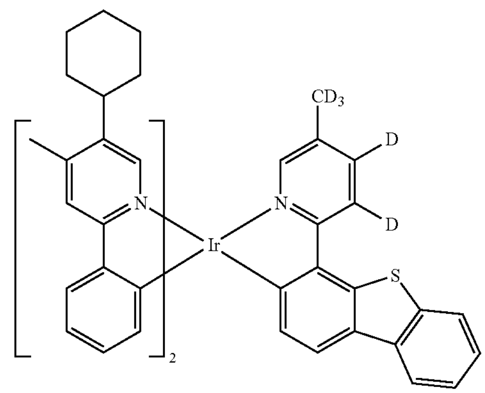
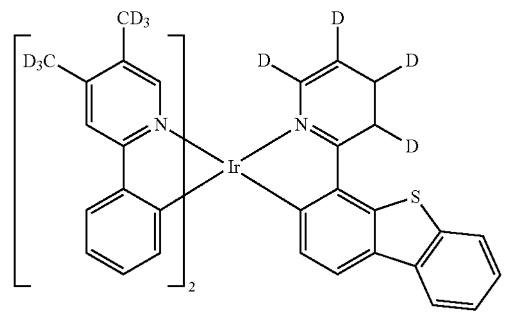
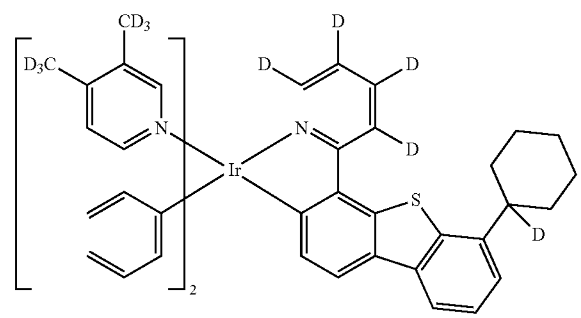
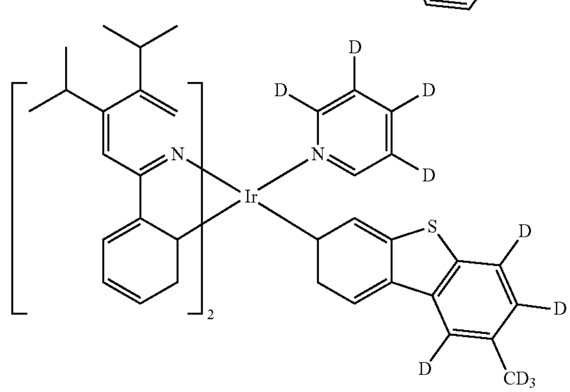
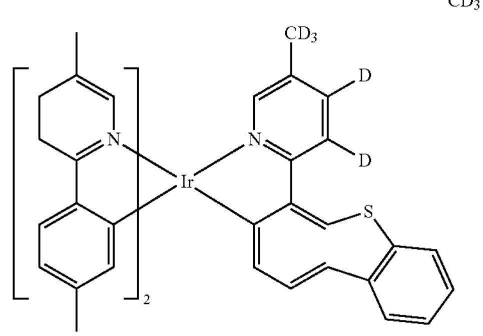

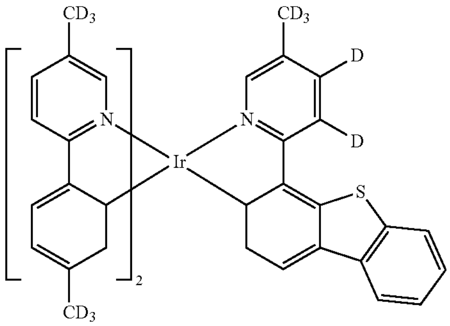
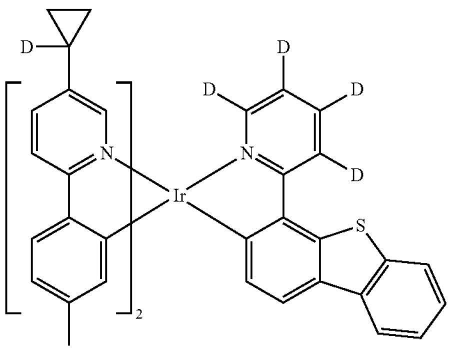
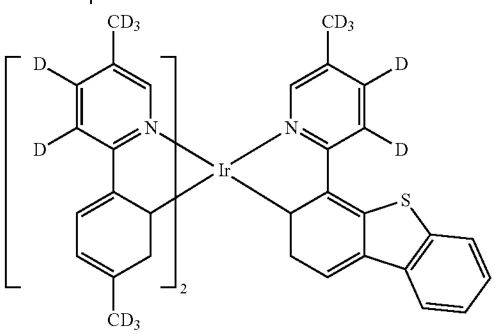
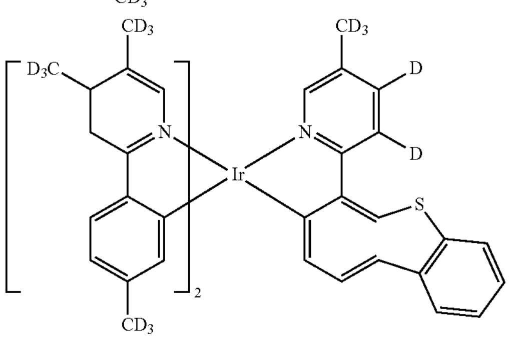
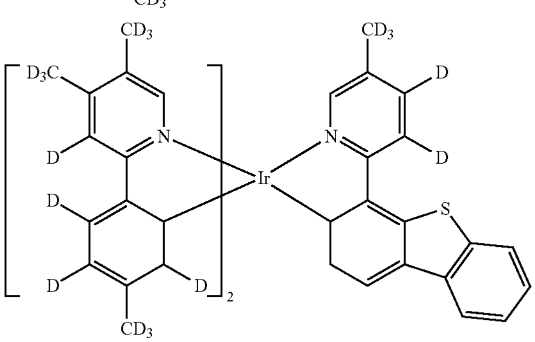
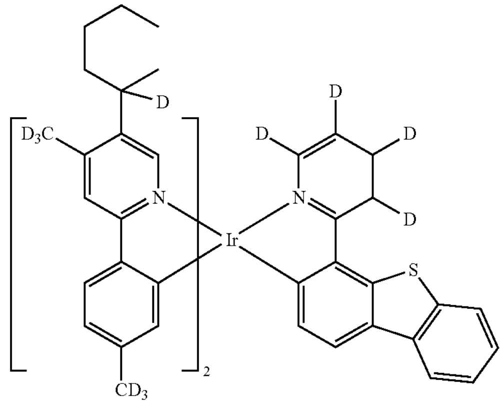
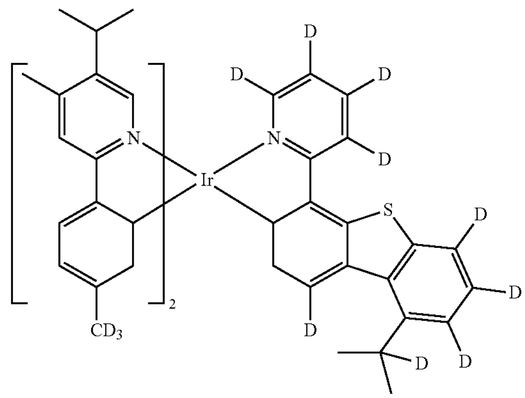
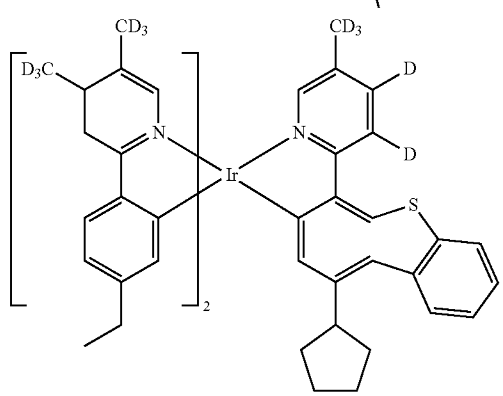
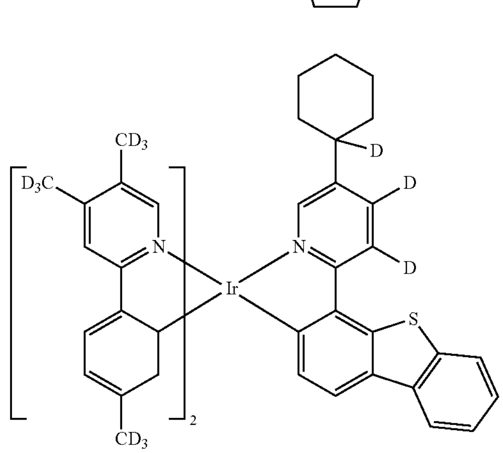

-continued
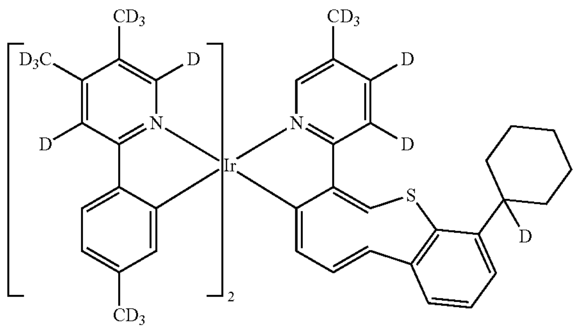
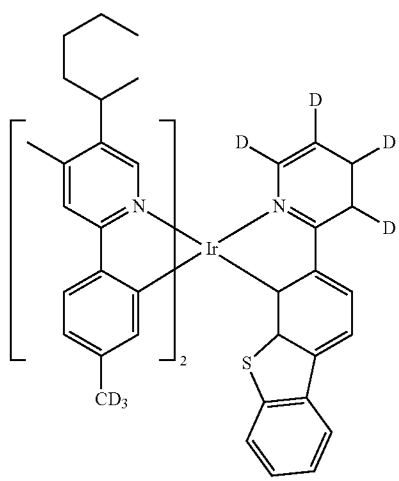
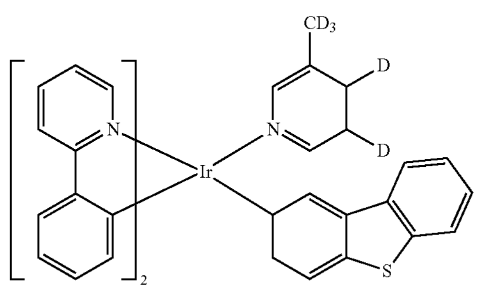
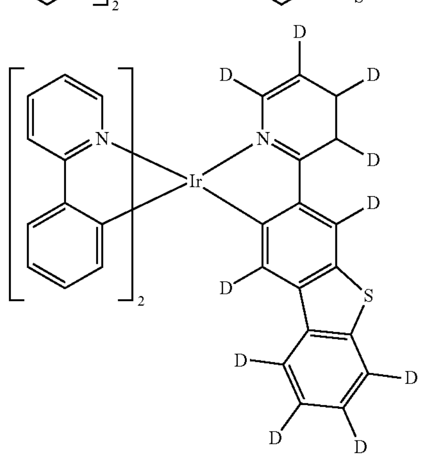
-continued
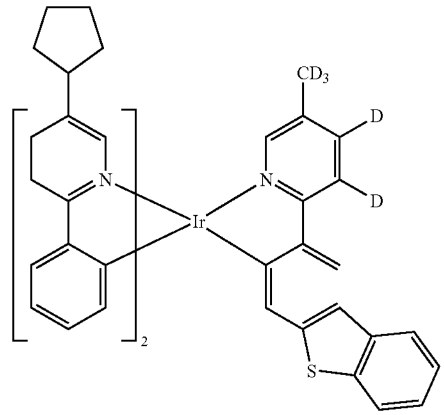
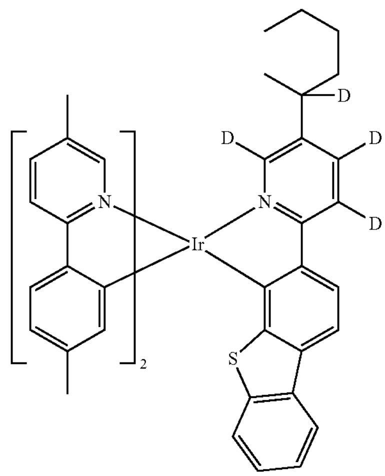
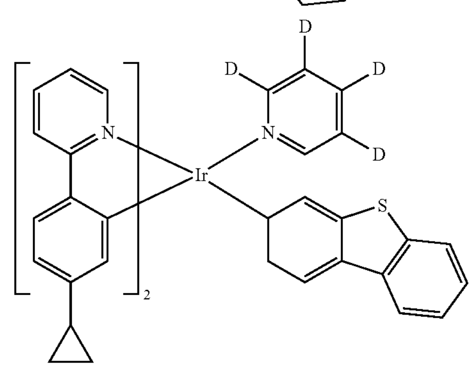
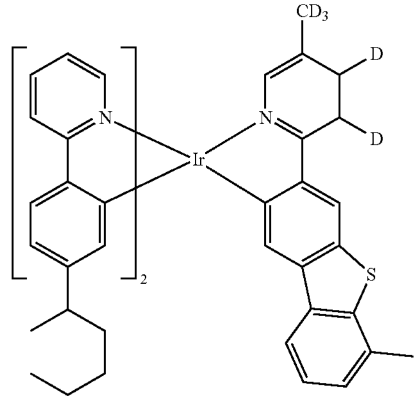

-continued
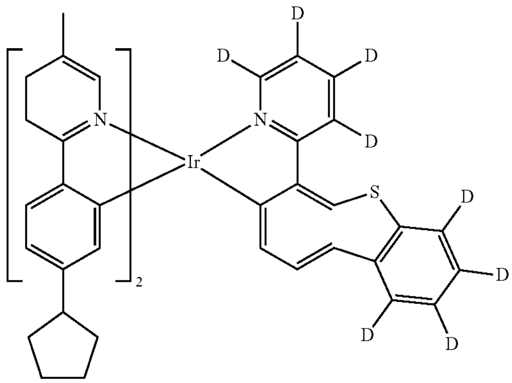
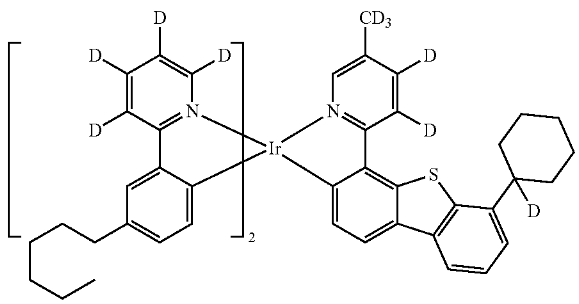
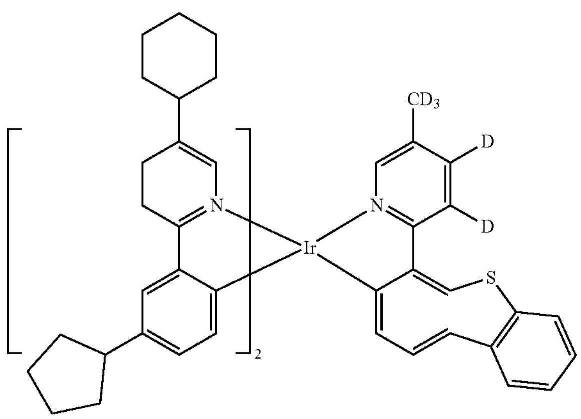
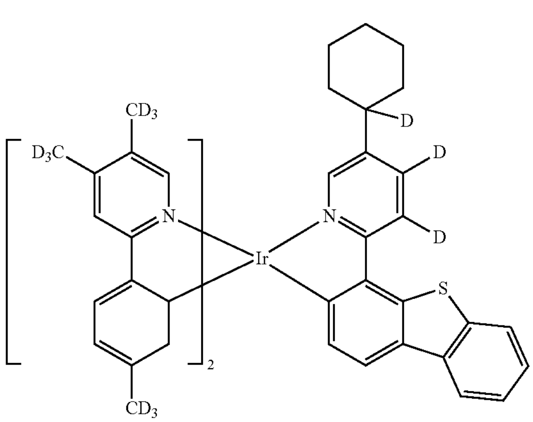
-continued
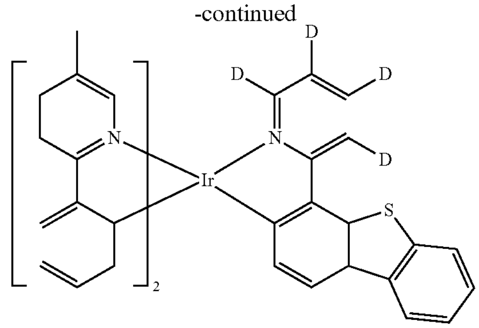
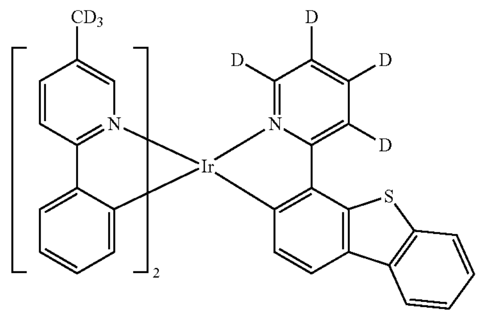
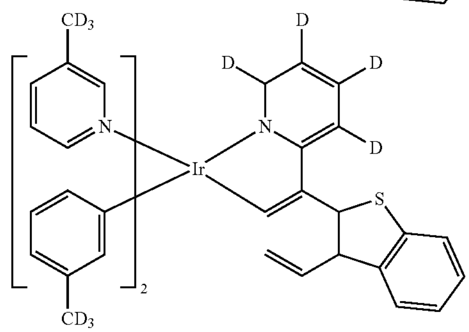
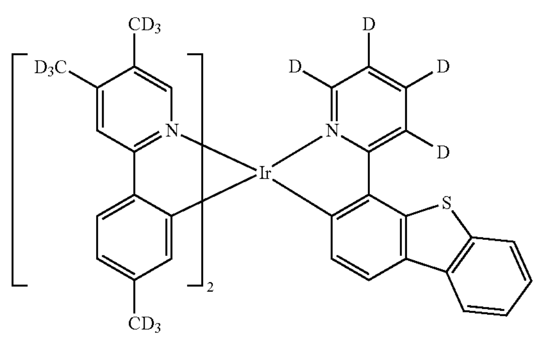
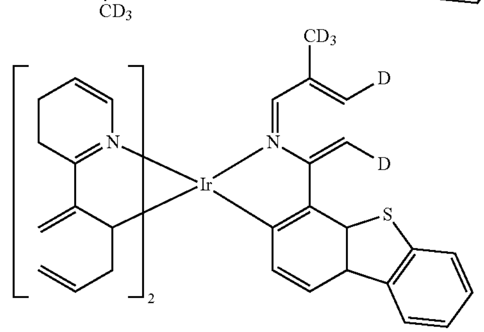

-continued
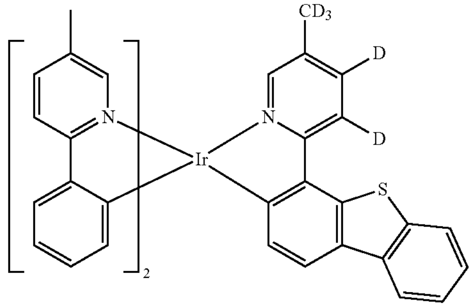
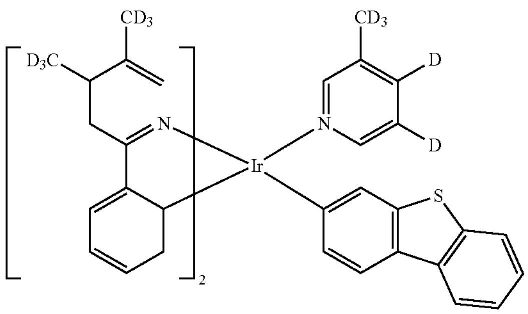
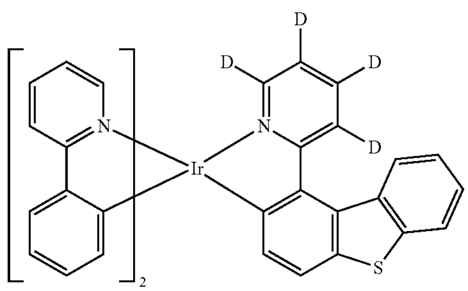
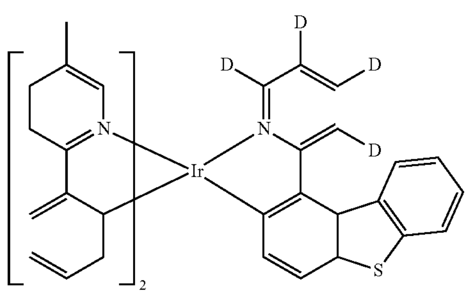
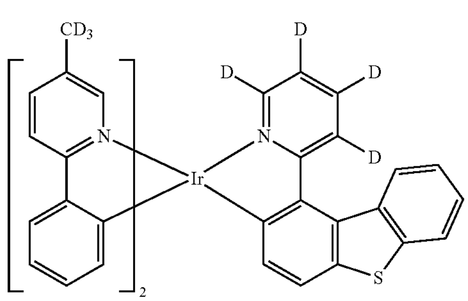
-continued
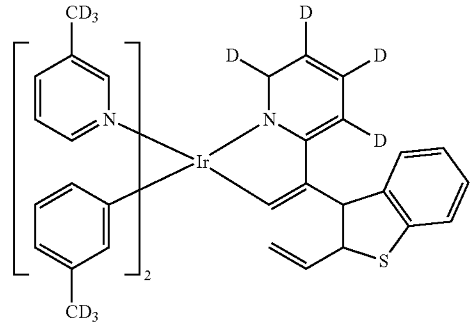
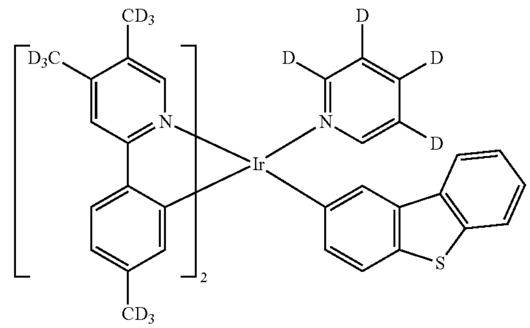
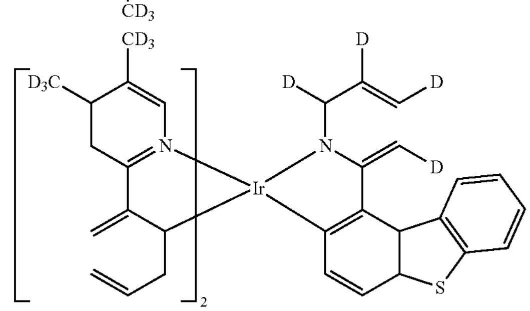
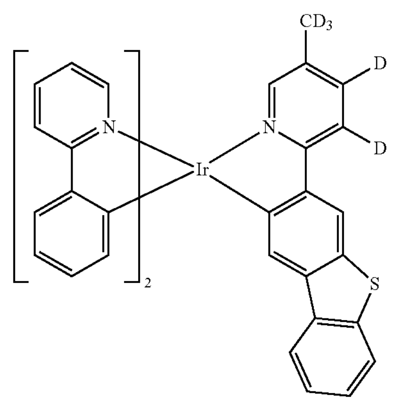
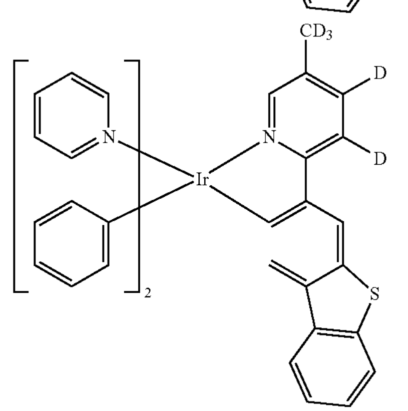

-continued
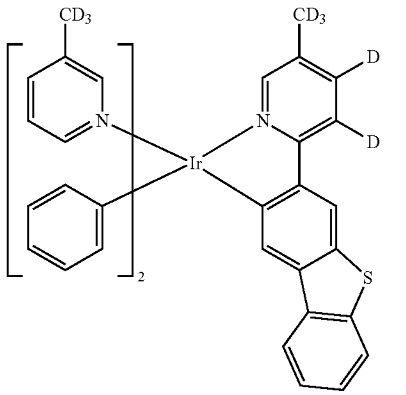
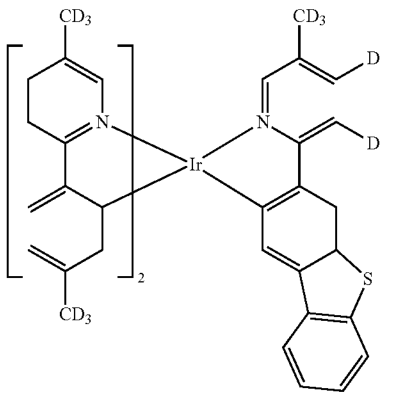
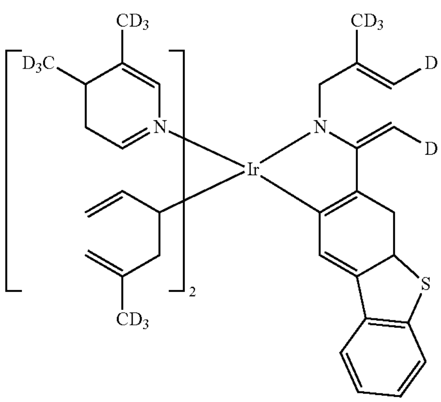
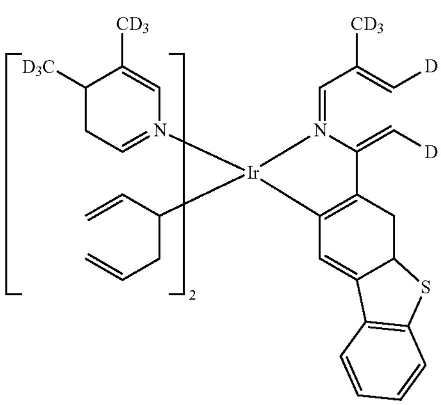
-continued
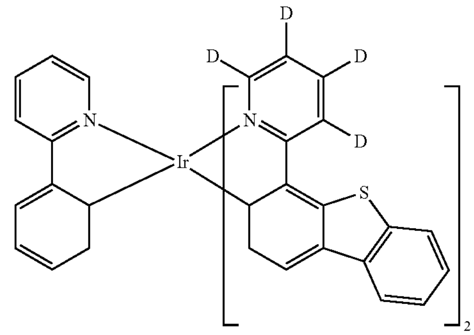
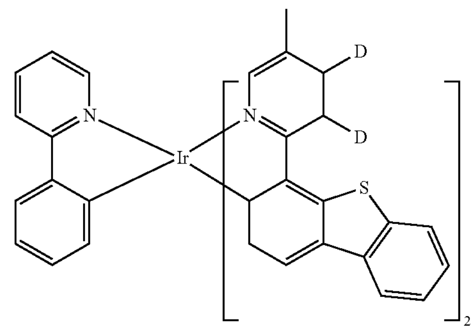
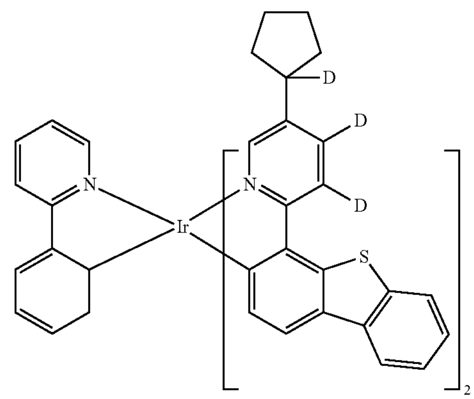
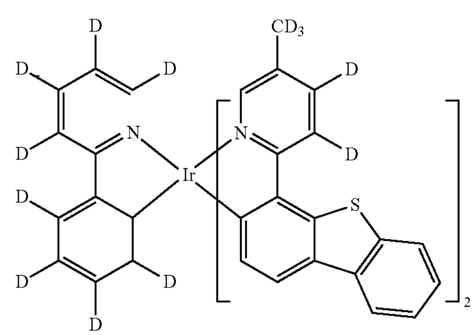
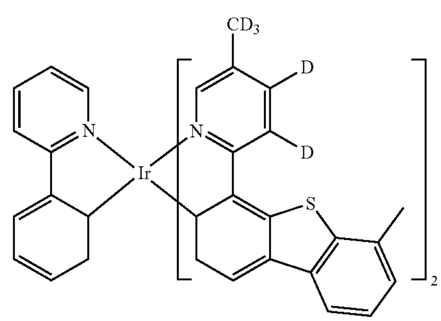

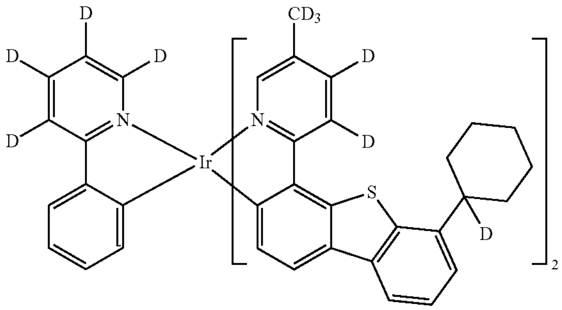
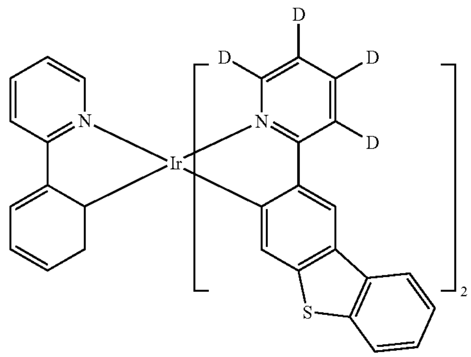
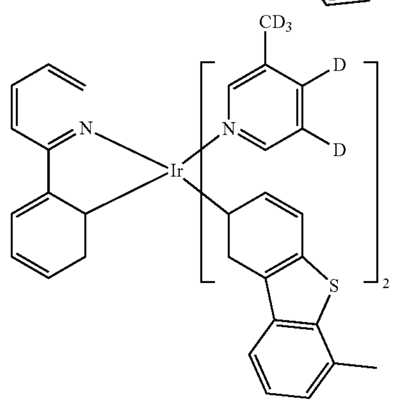
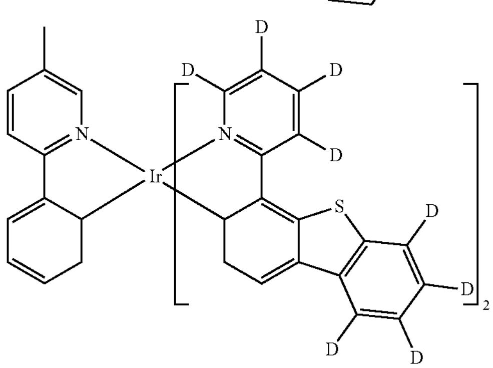
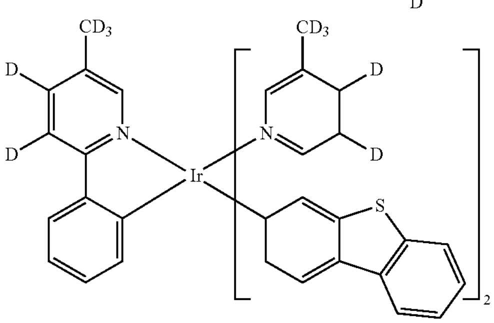
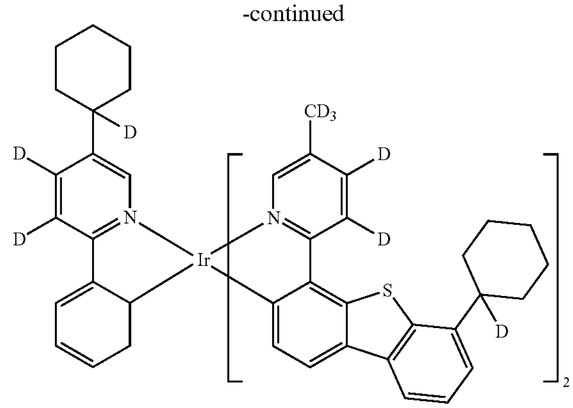
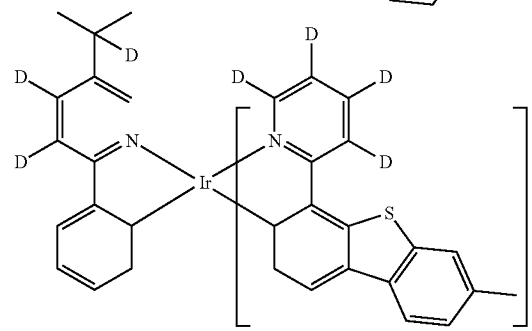
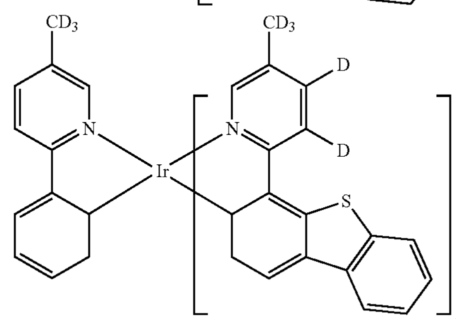
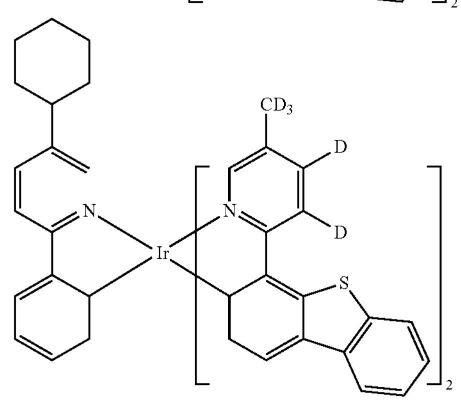
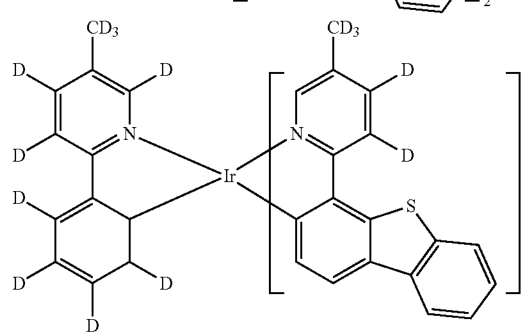

-continued
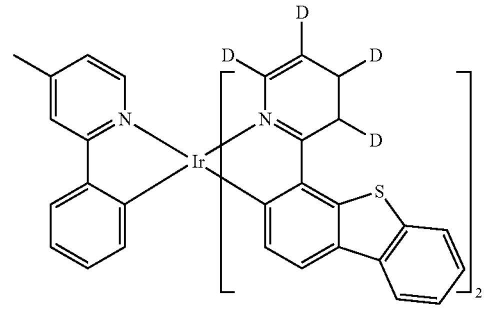
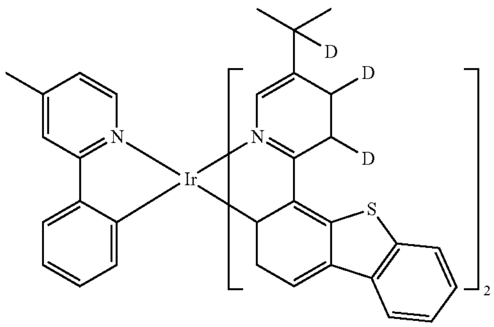
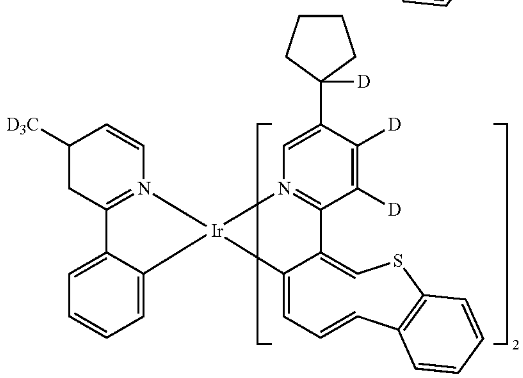
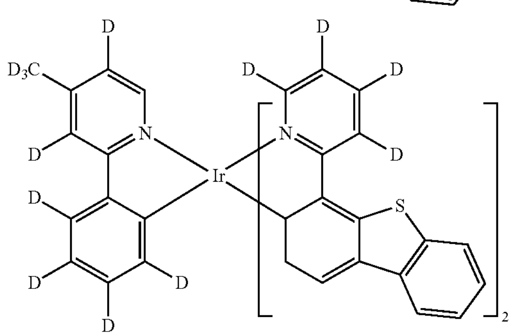
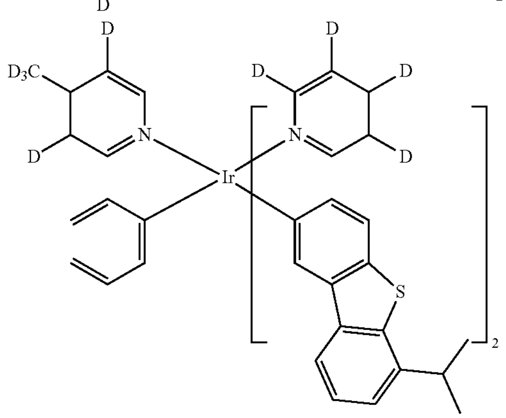
-continued
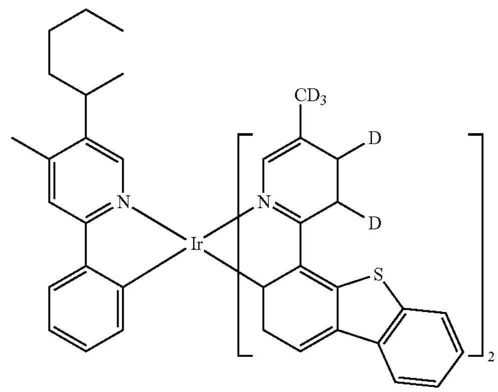
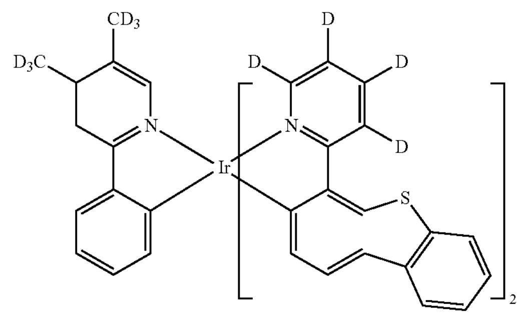
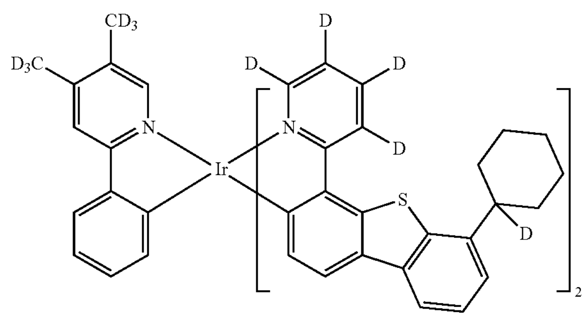
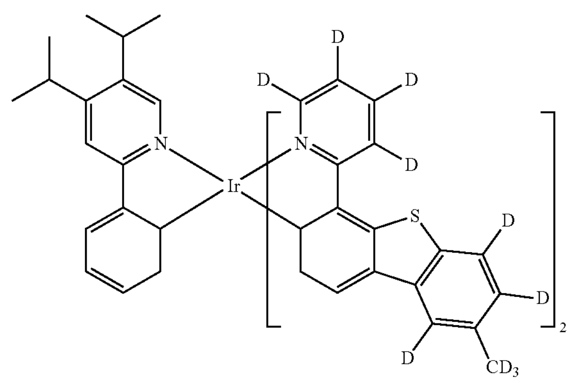
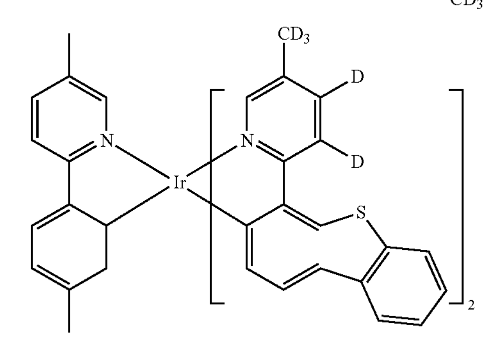

-continued
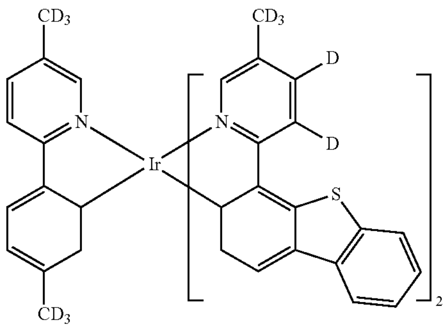
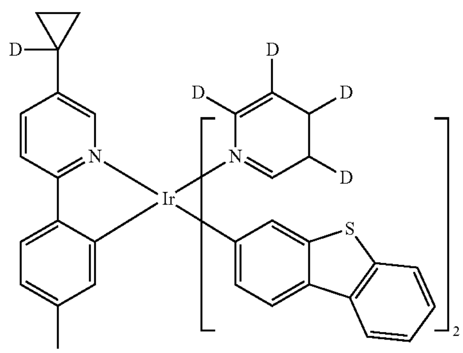
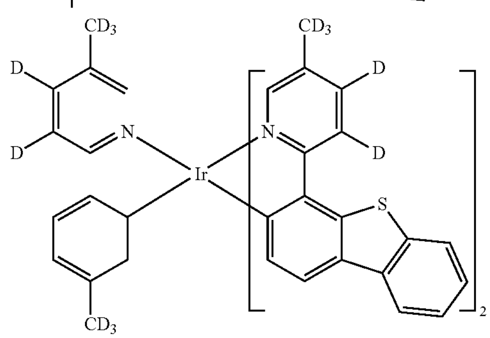
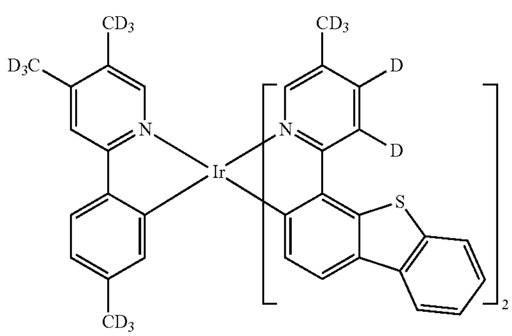
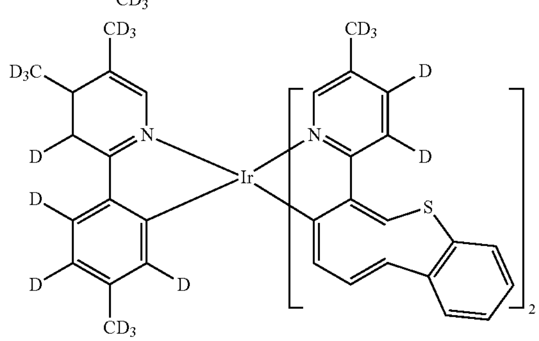
-continued
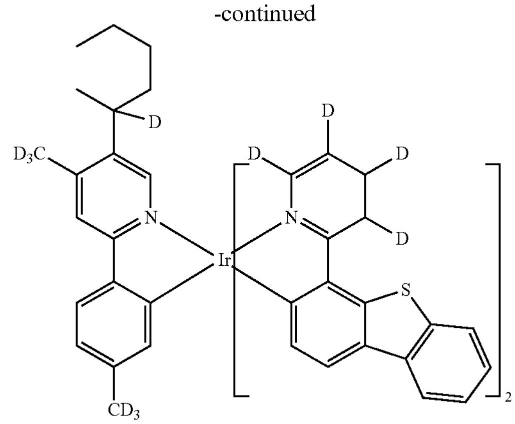
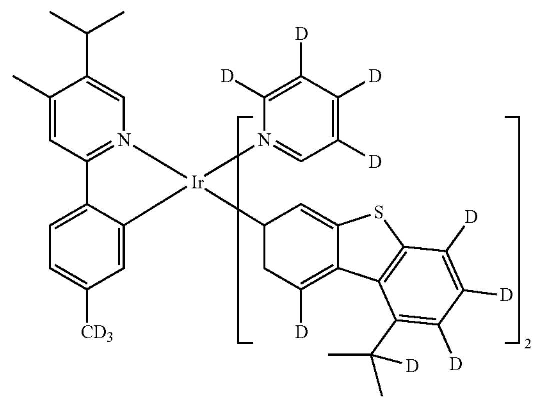
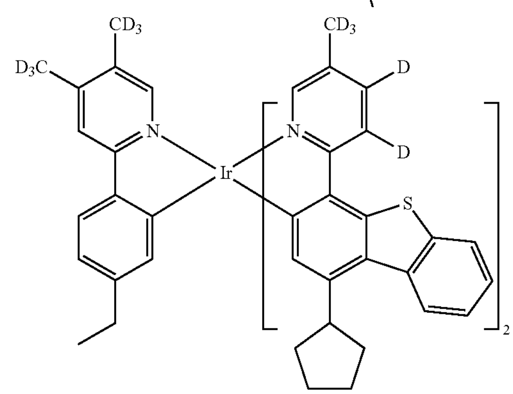
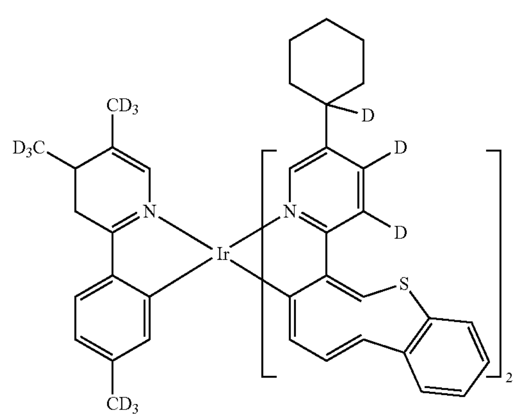

-continued
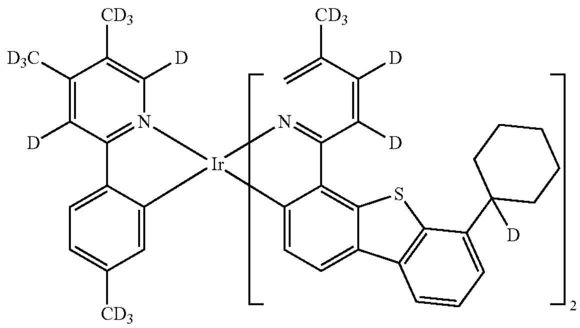
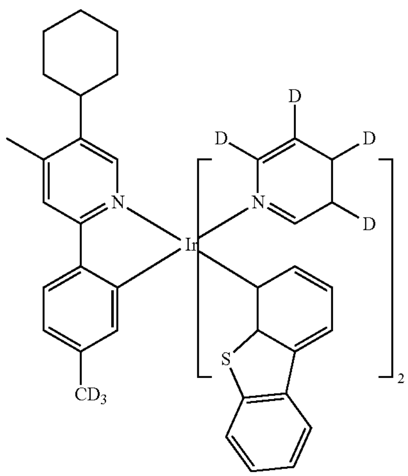
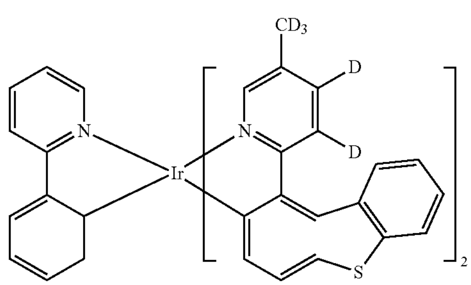
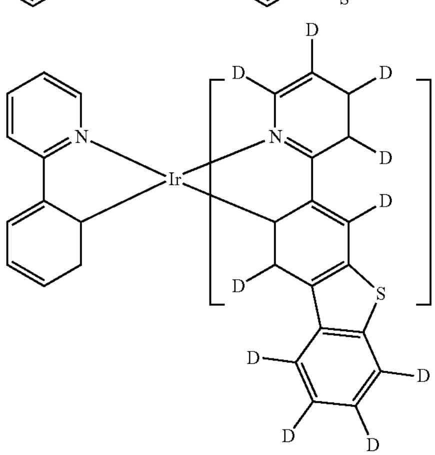
-continued
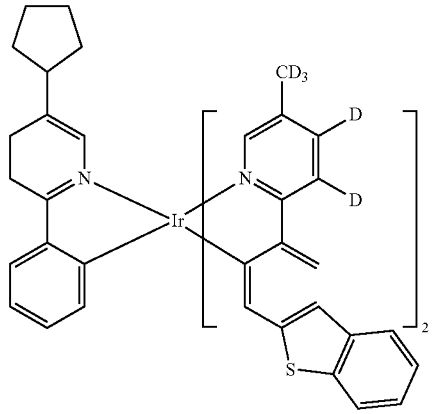
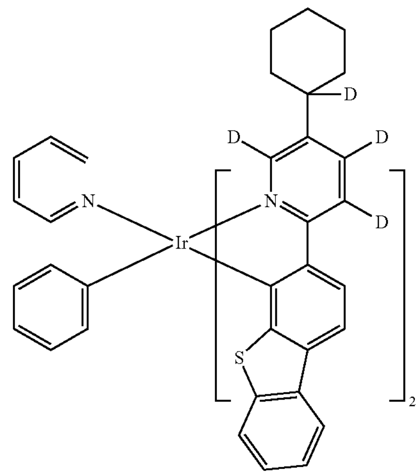
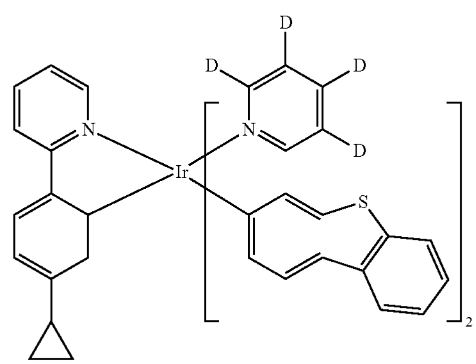
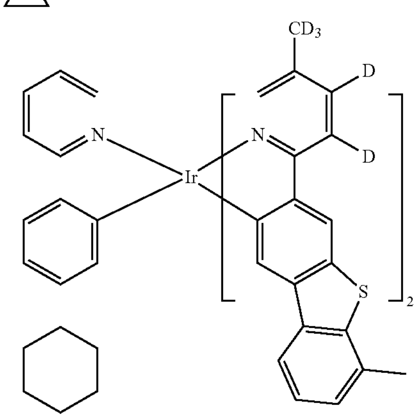

-continued
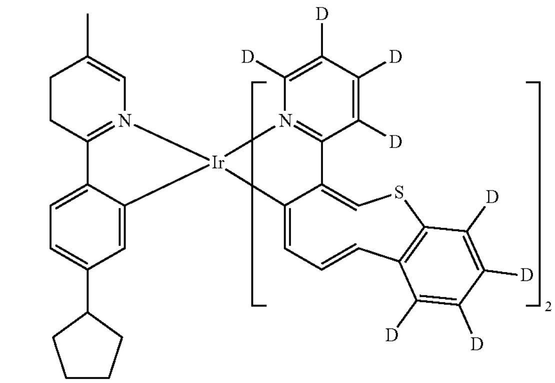
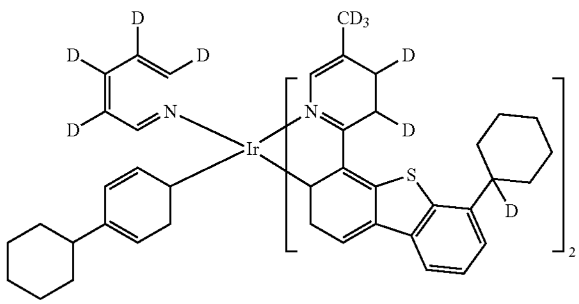
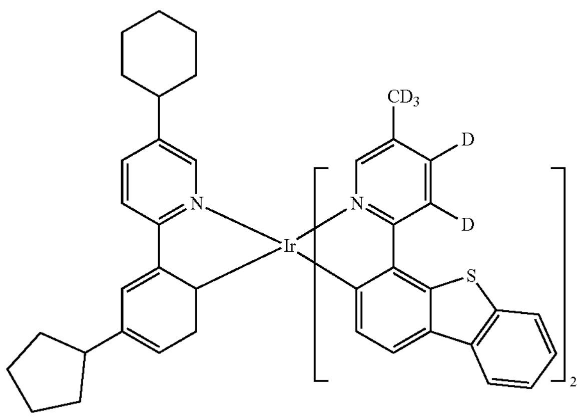
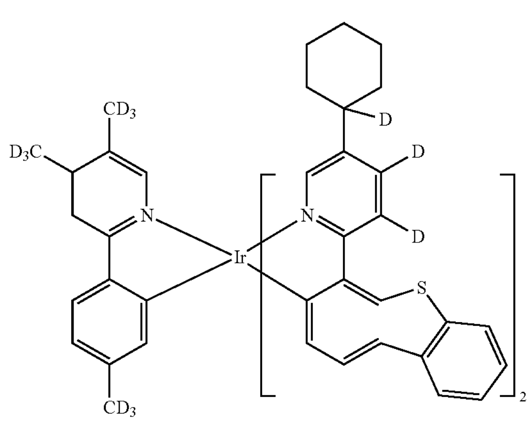
-continued
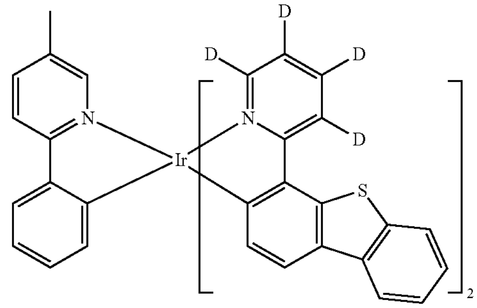
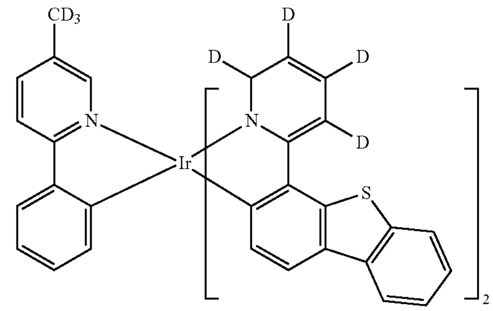
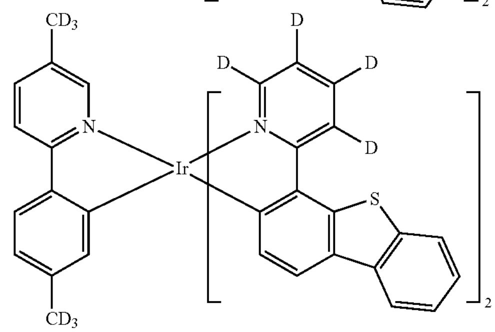
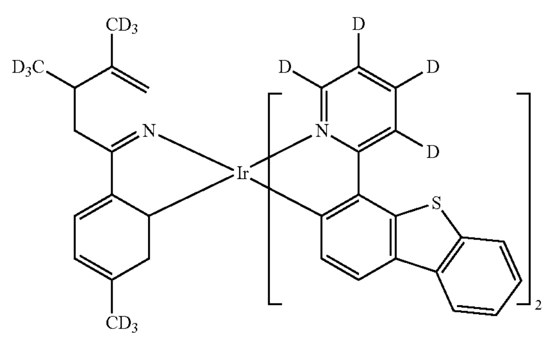
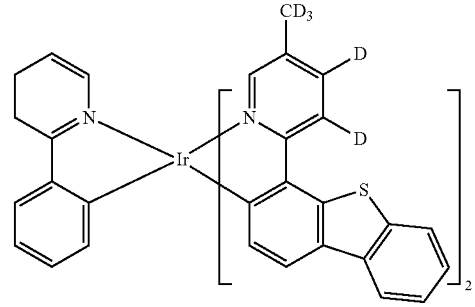

-continued
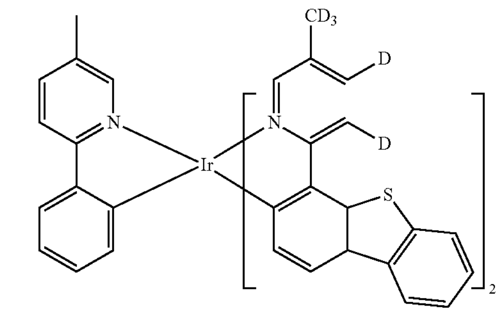
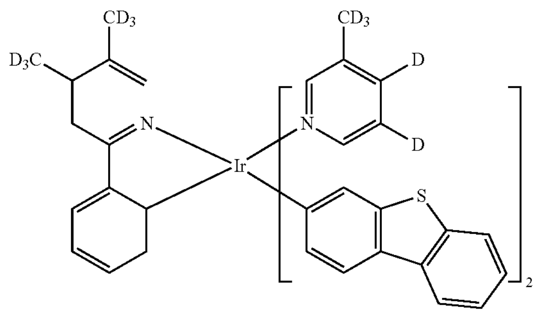
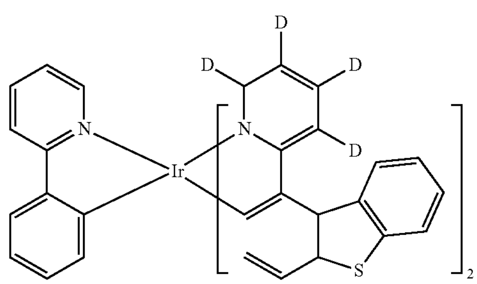
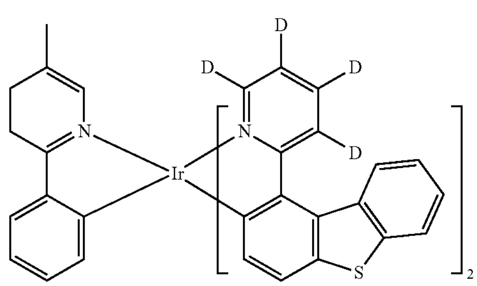
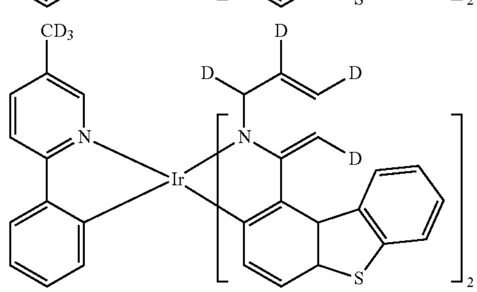
-continued
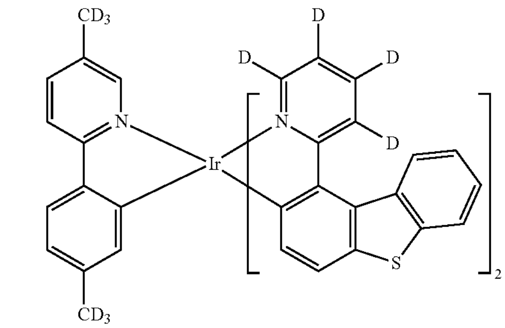
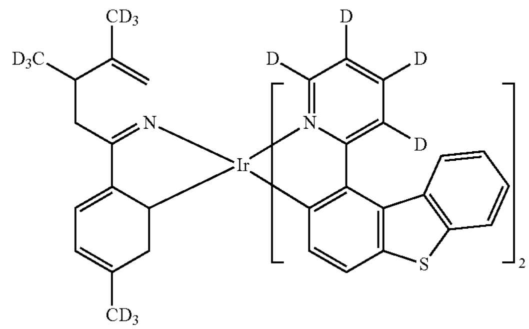
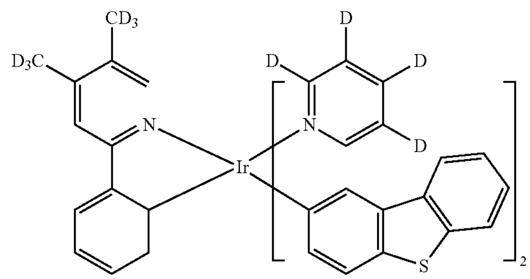
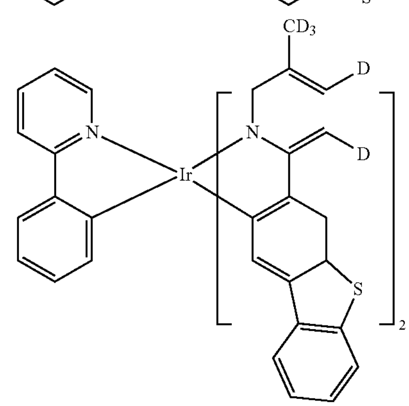
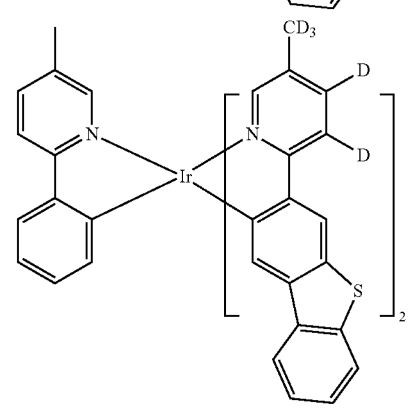

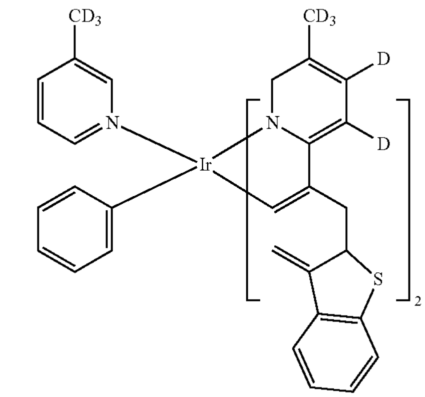
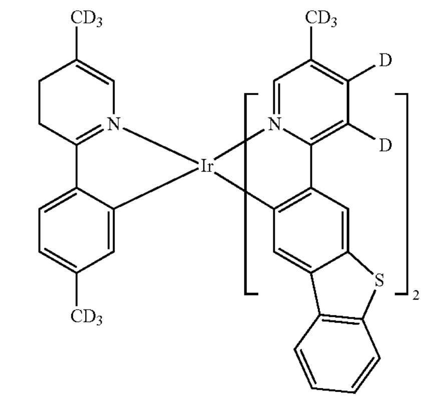
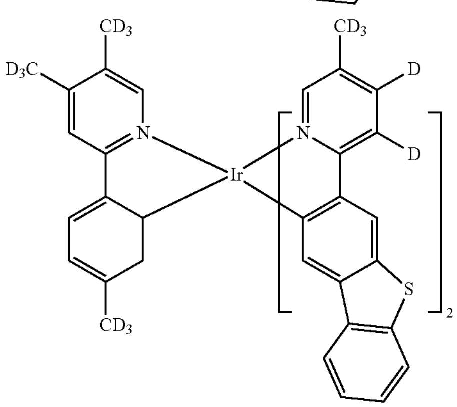
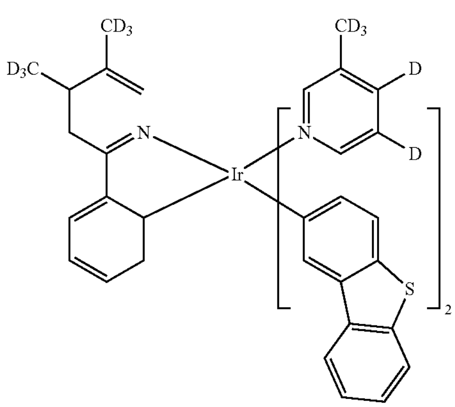
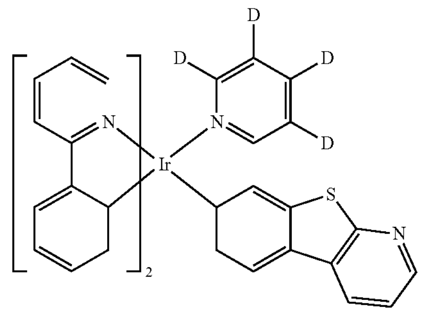
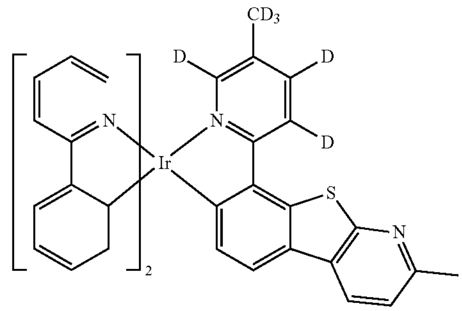
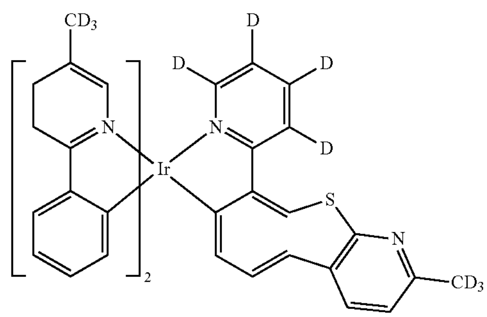
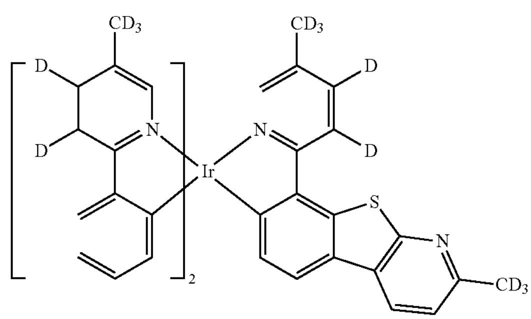
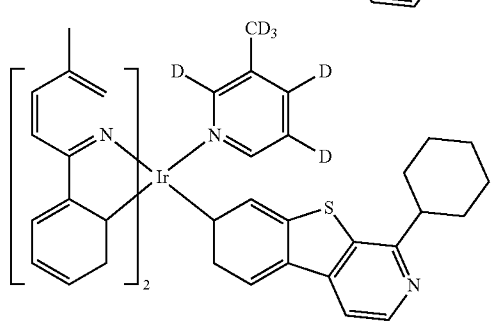

-continued
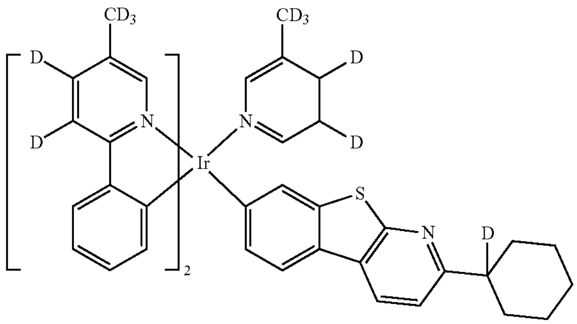
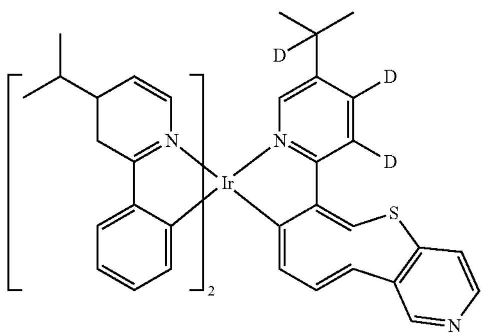
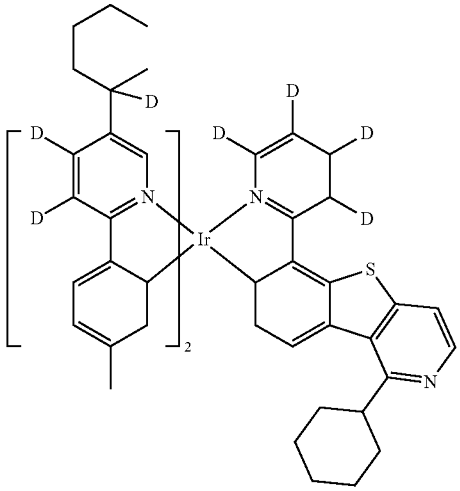
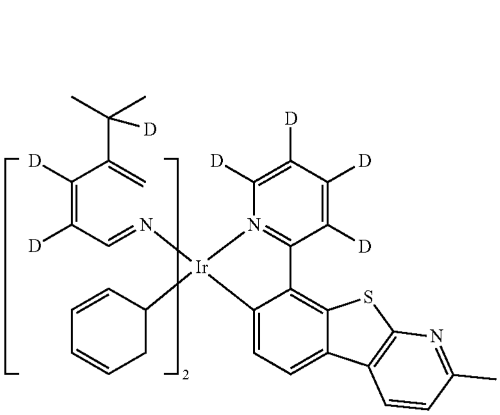
-continued
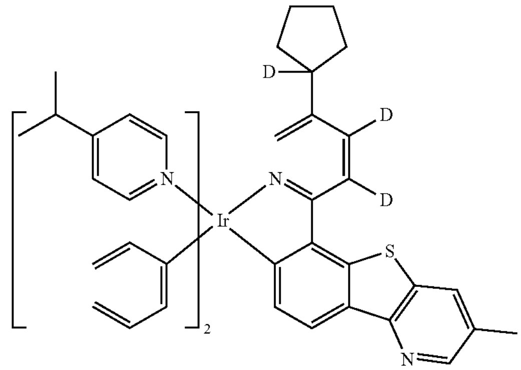
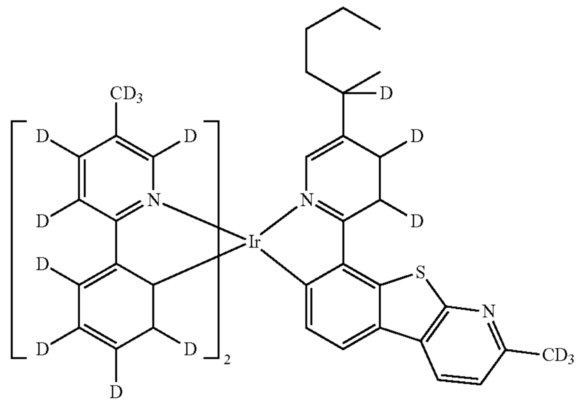
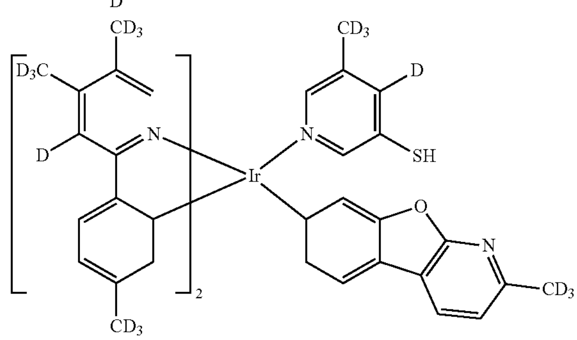
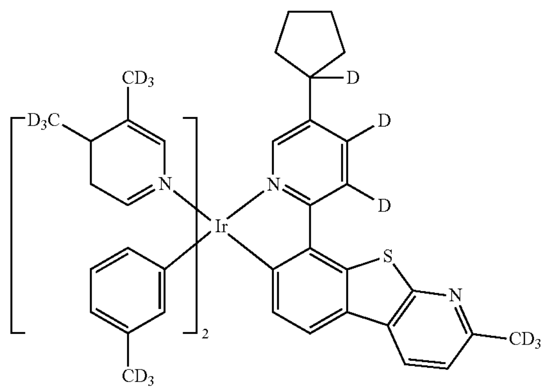

-continued
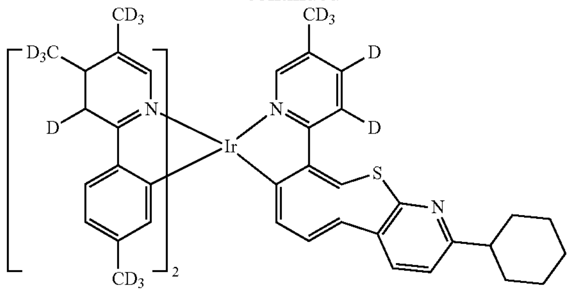
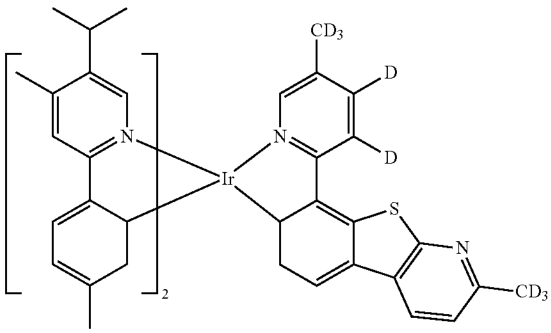
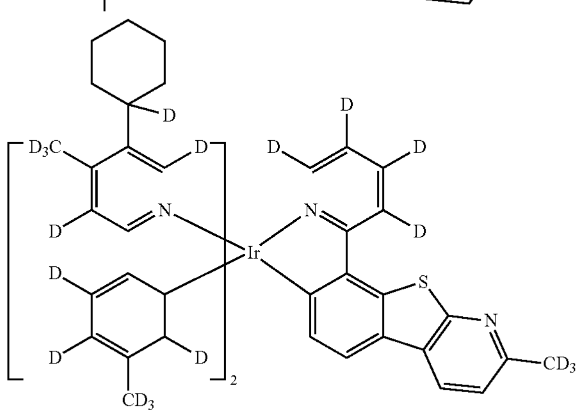
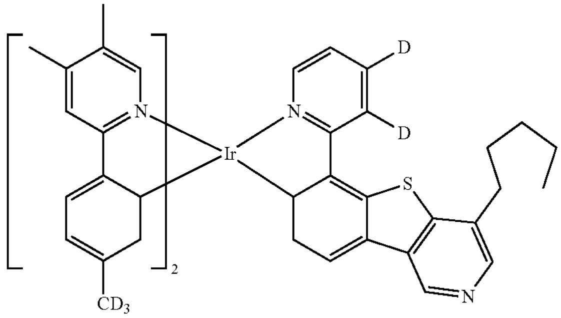
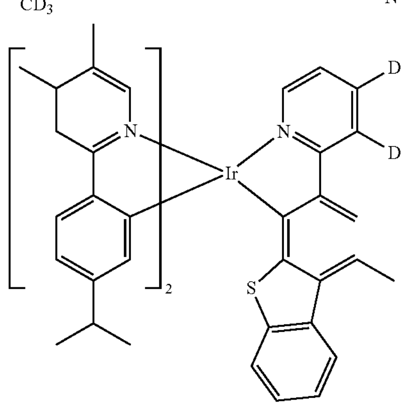
-continued
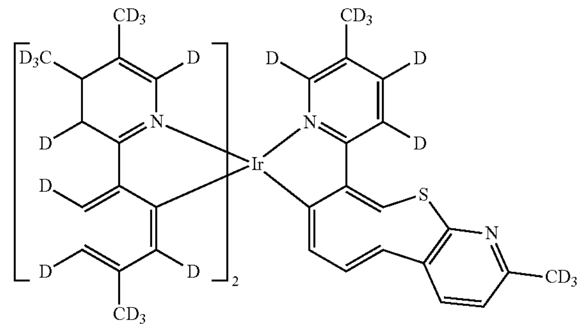
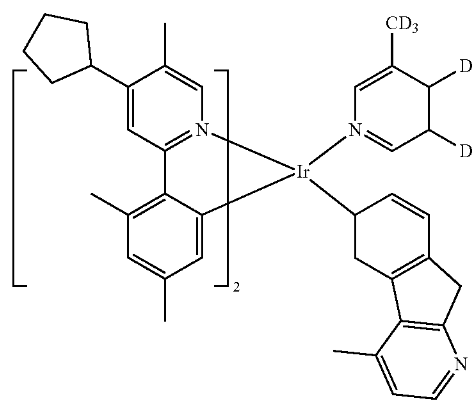
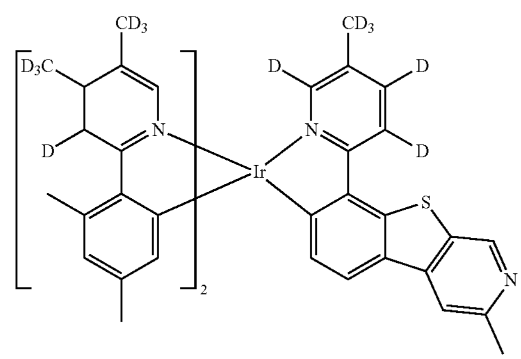
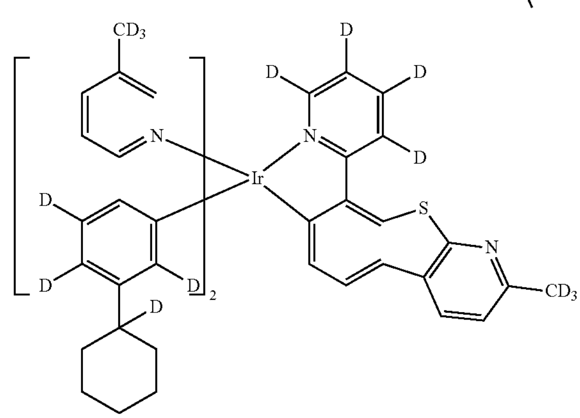

-continued
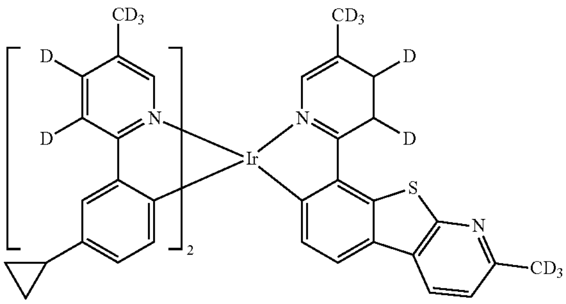
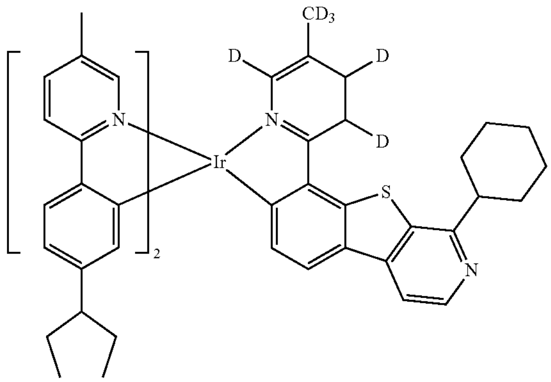
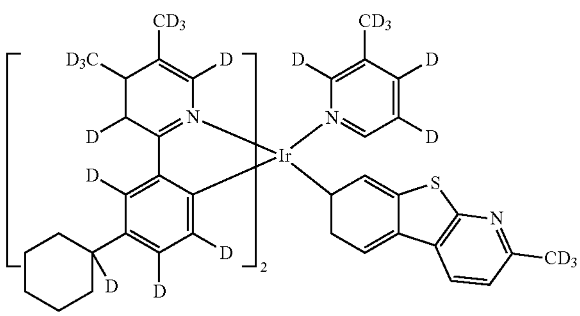
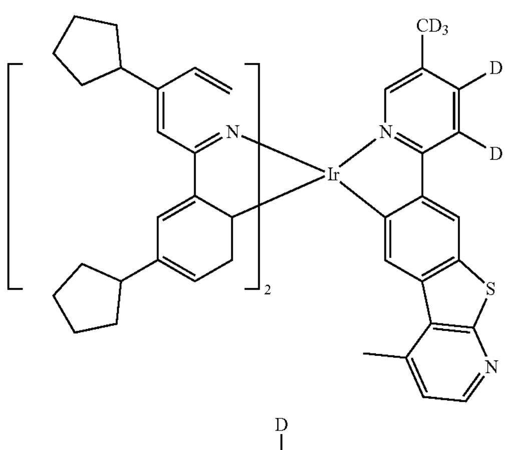
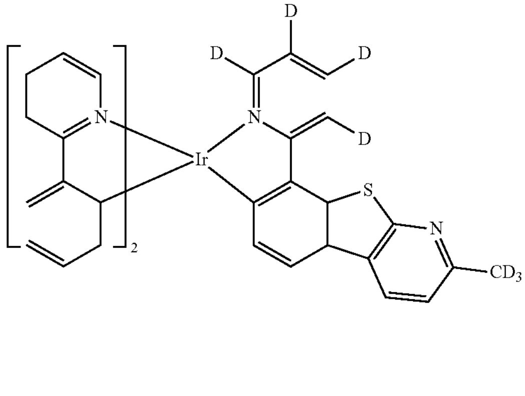
-continued
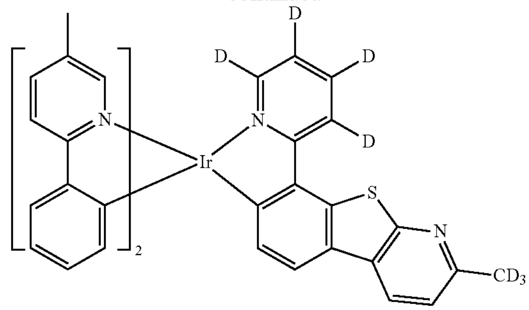
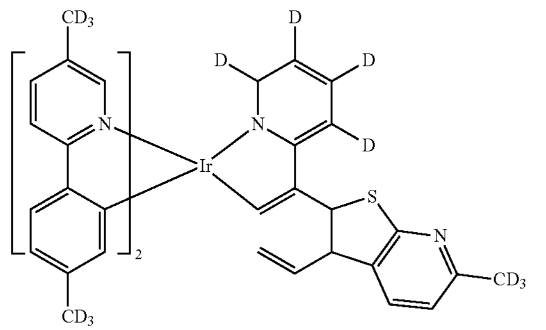
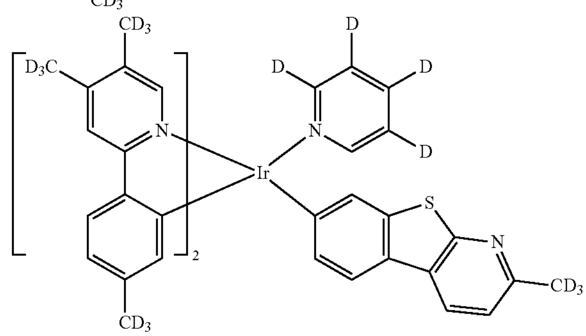
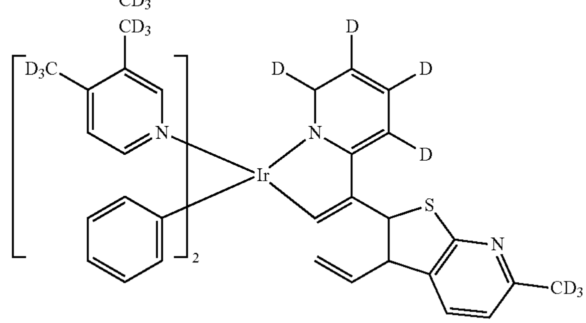
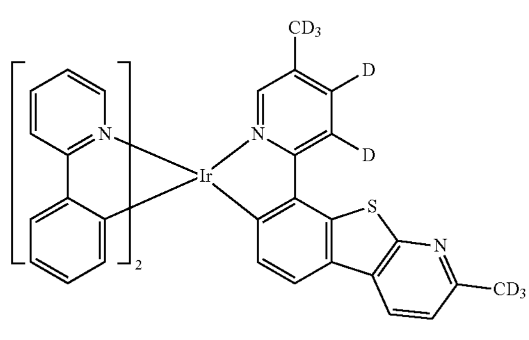

-continued
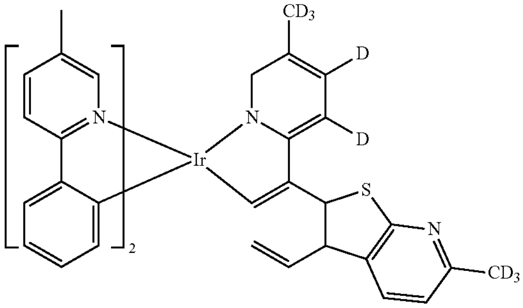
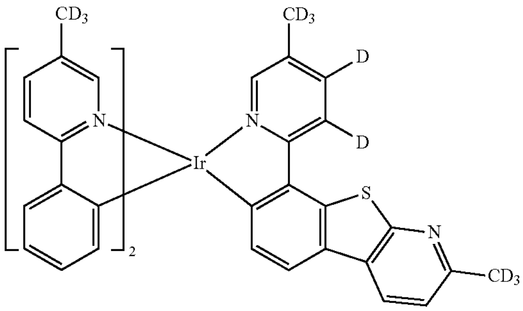
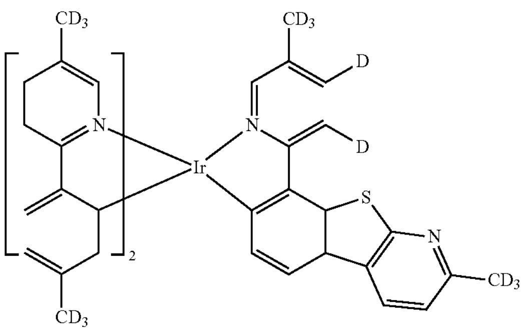
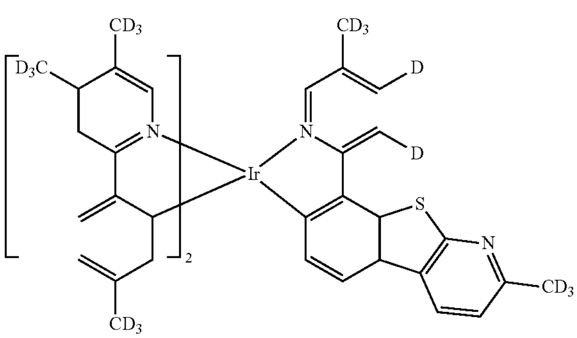
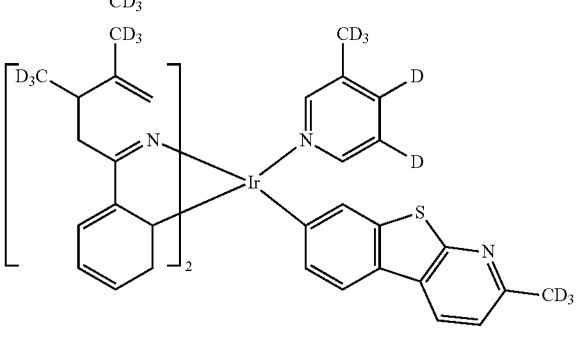
-continued
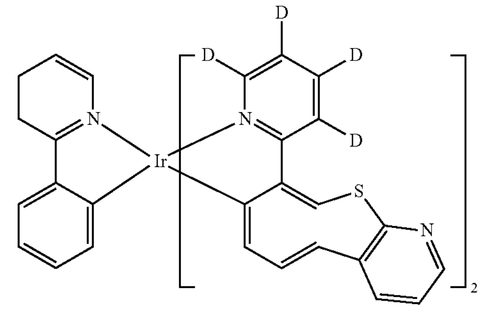
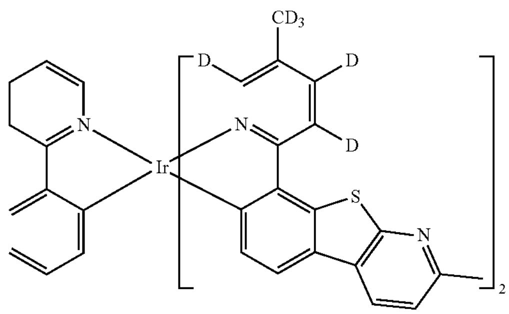
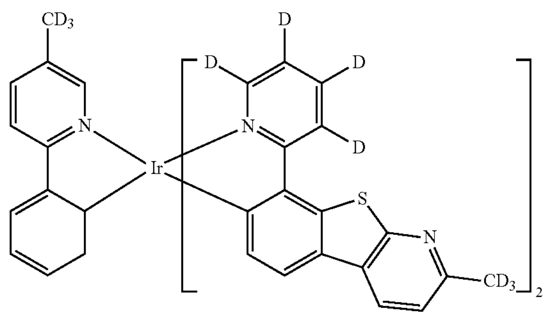
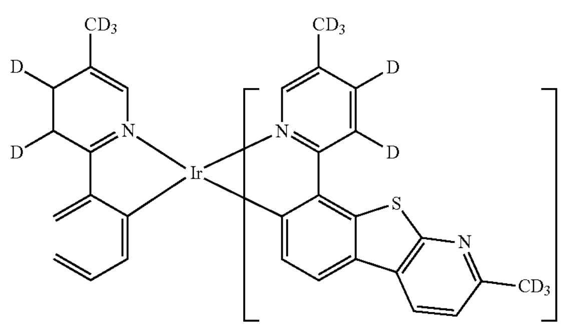
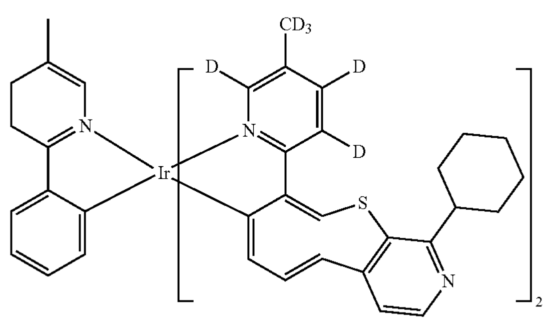

-continued
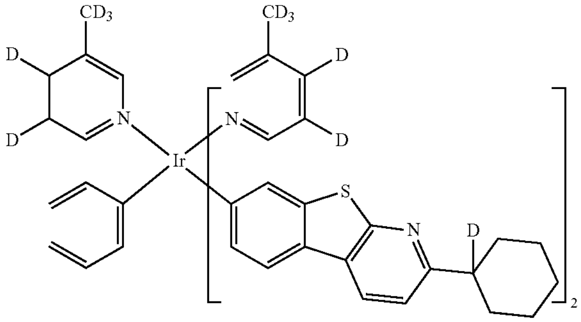
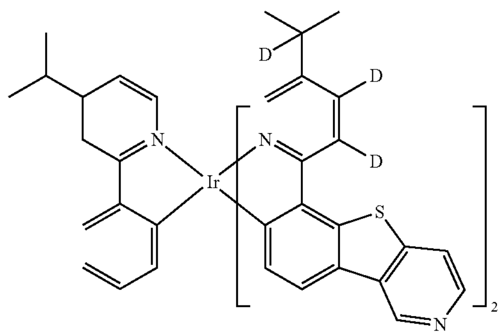
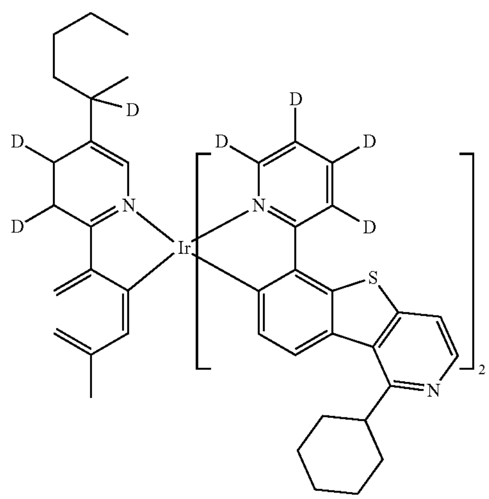
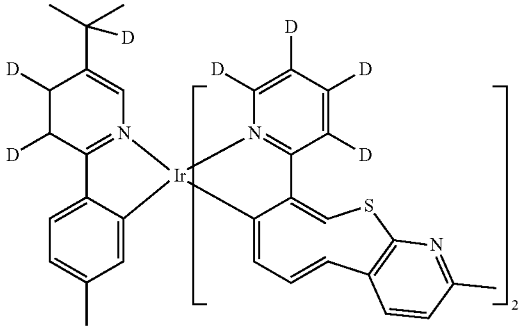
-continued
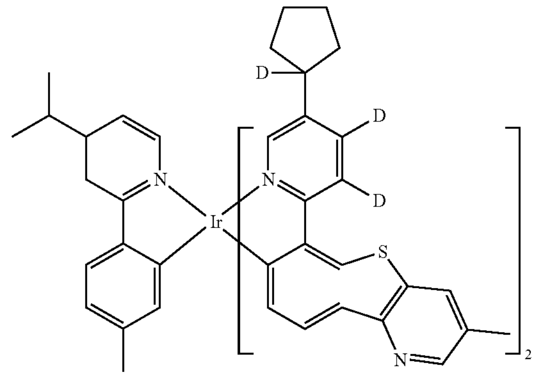
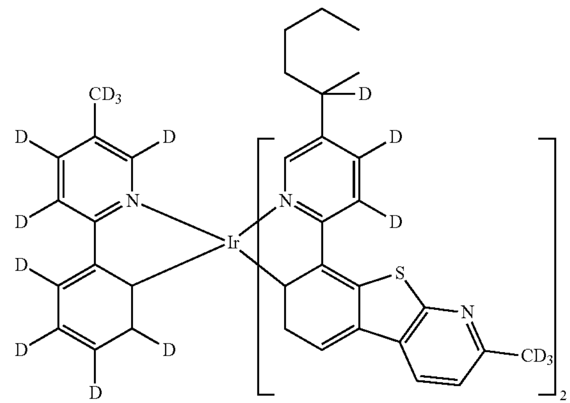
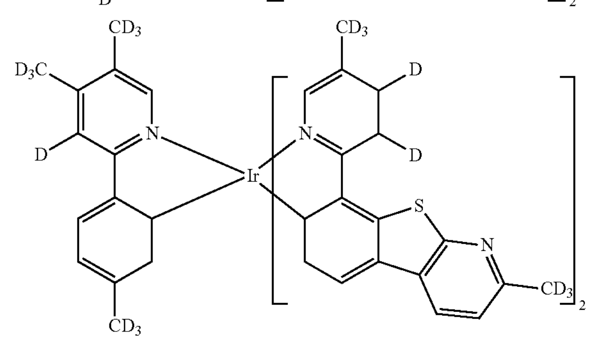
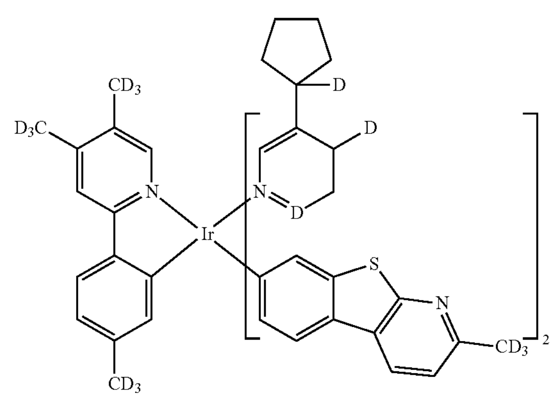

-continued
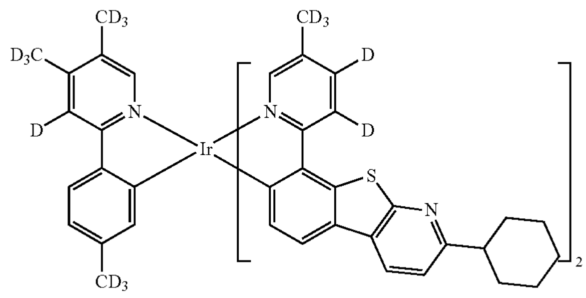
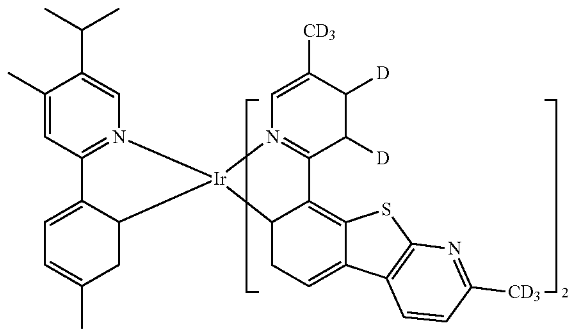
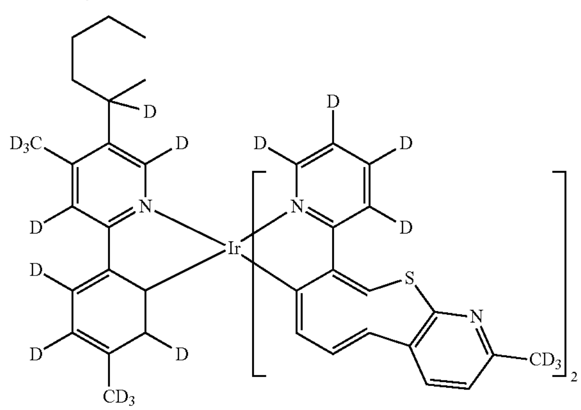
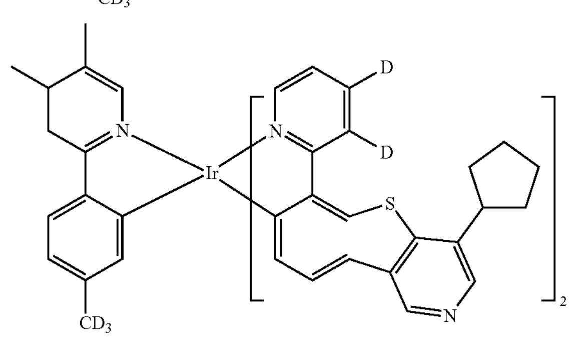
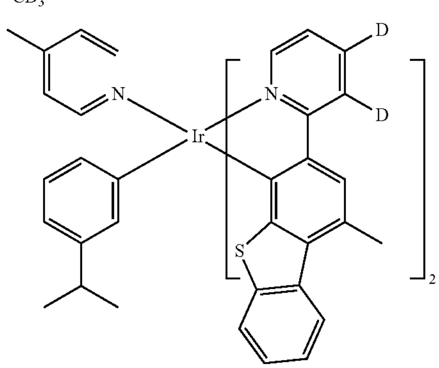
-continued
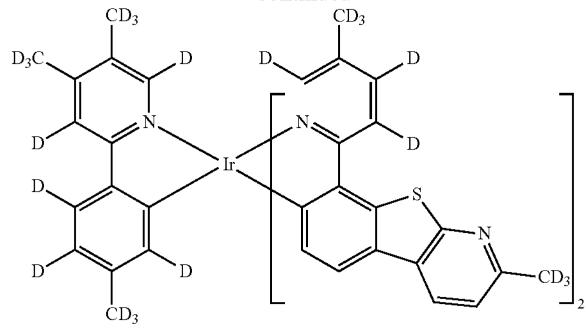
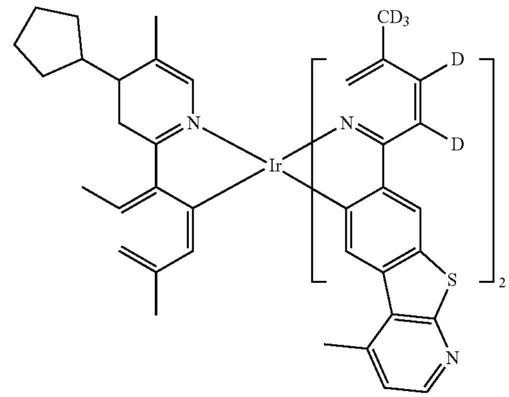
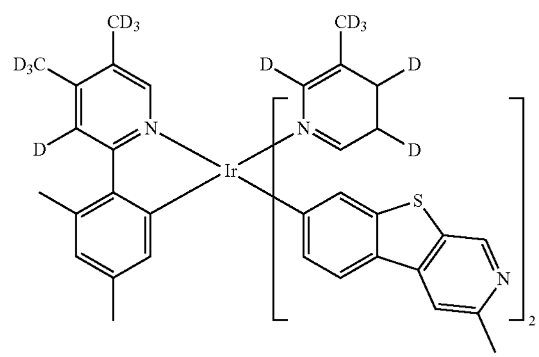
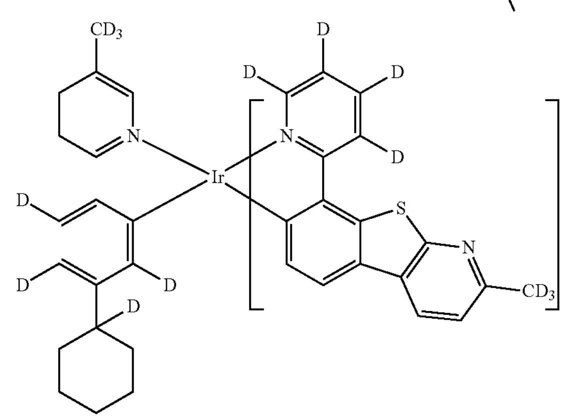

-continued
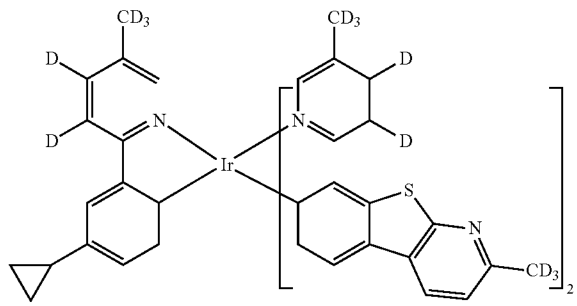
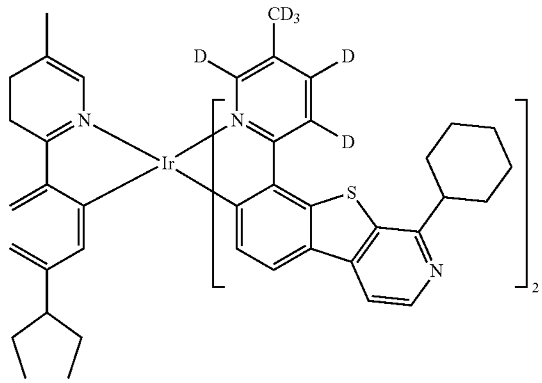
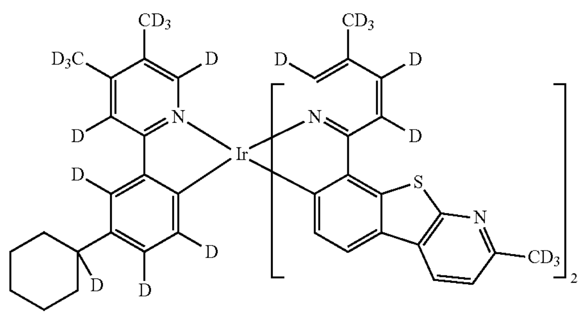
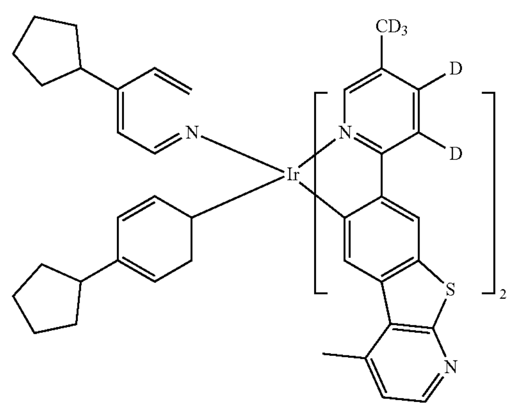
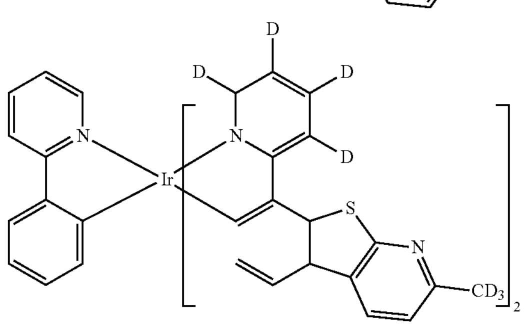
-continued
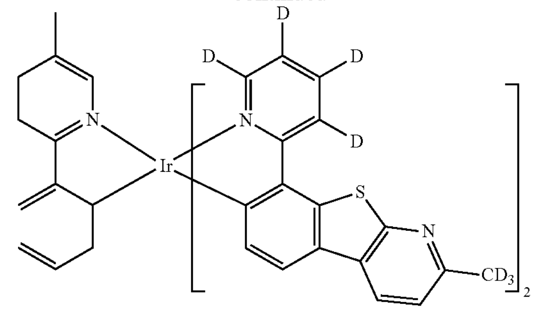
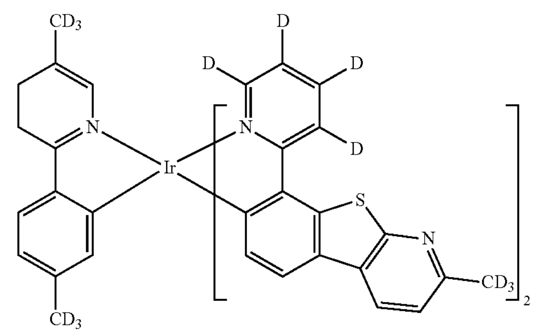
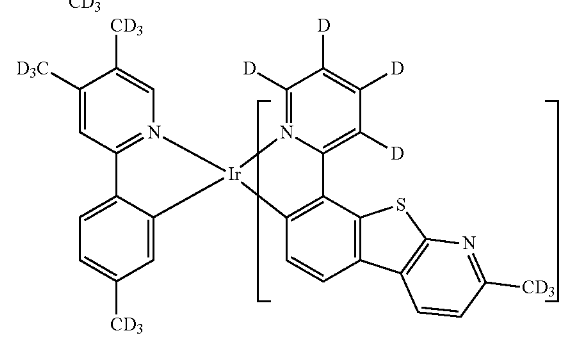
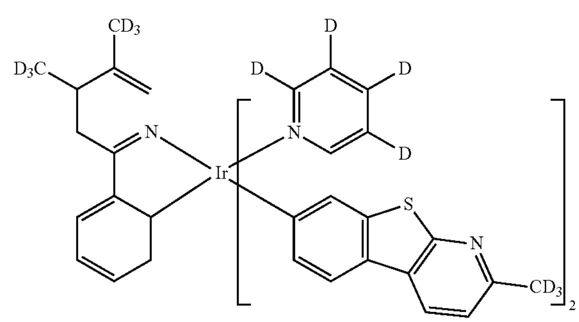
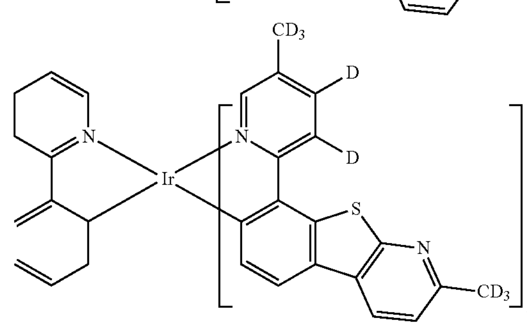

-continued

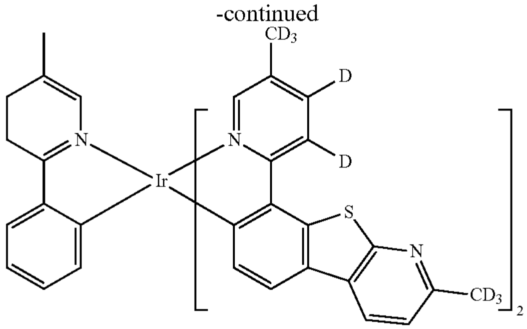

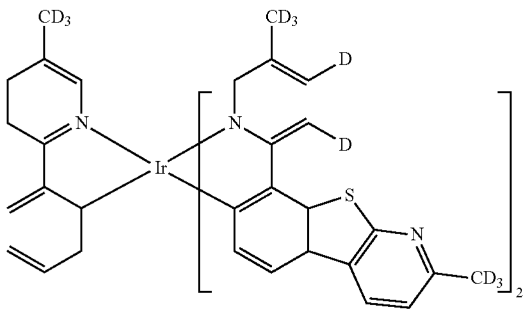

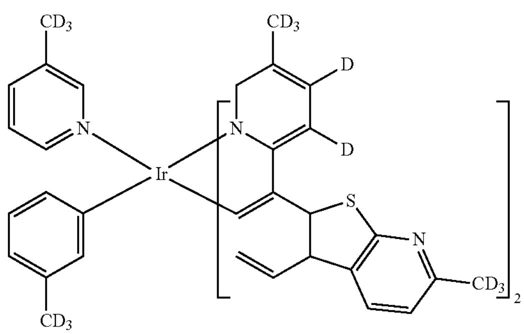

-continued

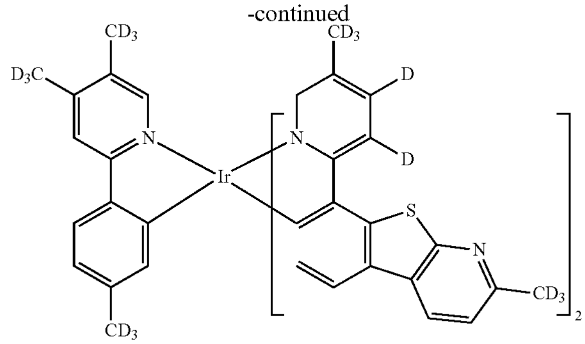

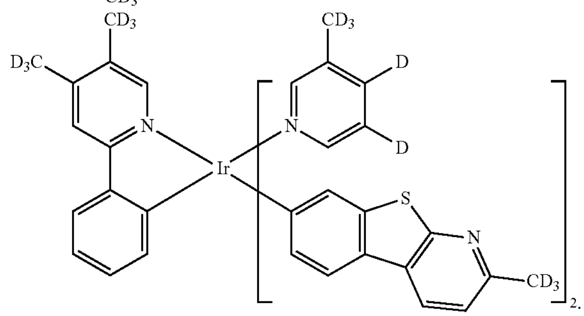

9. An organic light emitting device, comprising:

a first electrode;

a second electrode provided opposite to the first electrode; and one or more organic material layers provided between the first electrode and the second electrode, wherein one or more one layers of the organic material layers comprise the compound.

10. An organic light emitting device, comprising:

a first electrode;

a second electrode provided opposite to the first electrode; and one or more organic material layers provided between the first electrode and the second electrode, wherein one or more one layers of the organic material layers comprise the compound of claim 8.

* * * * *